(12) United States Patent
Kippelen et al.

(10) Patent No.: US 9,203,030 B2
(45) Date of Patent: Dec. 1, 2015

(54) RECYCLABLE ORGANIC SOLAR CELLS ON SUBSTRATES COMPRISING CELLULOSE NANOCRYSTALS (CNC)

(71) Applicants: Georgia Tech Research Corporation, Atlanta, GA (US); Perdue Research Foundation, West Lafayette, IN (US); The United States of America as Represented by the Secretary of Agriculture, Washington, DC (US)

(72) Inventors: Bernard Kippelen, Decatur, GA (US); Canek Fuentes-Hernandez, Atlanta, GA (US); Yinhua Zhou, Atlanta, GA (US); Robert Moon, Marietta, GA (US); Jeffrey P. Youngblood, West Lafayette, IN (US)

(73) Assignees: Georgia Tech Research Corporation, Atlanta, GA (US); Purdue Research Foundation, West Lafayette, IN (US); The United States of America as Represented by the Secretary of Agriculture, Washington, DC (US)

( * ) Notice: Subject to any disclaimer, the term of this patent is extended or adjusted under 35 U.S.C. 154(b) by 0 days.

(21) Appl. No.: 14/221,369

(22) Filed: Mar. 21, 2014

(65) Prior Publication Data

US 2014/0202517 A1 Jul. 24, 2014

Related U.S. Application Data

(63) Continuation-in-part of application No. 14/117,965, filed as application No. PCT/US2012/038125 on May 12, 2012, now Pat. No. 9,076,768.

(60) Provisional application No. 61/486,368, filed on May
(Continued)

(51) Int. Cl.
*H01L 51/42* (2006.01)
*H01L 31/04* (2014.01)
(Continued)

(52) U.S. Cl.
CPC ............. *H01L 51/0046* (2013.01); *B82Y 10/00* (2013.01); *H01L 31/0224* (2013.01);
(Continued)

(58) Field of Classification Search
CPC .............. H01L 51/0034; H01L 51/442; H01L 51/4253; H01L 31/0224; H01L 31/04
See application file for complete search history.

(56) References Cited

U.S. PATENT DOCUMENTS

2002/0132563 A1* 9/2002 Luo et al. .................... 451/41
2006/0131567 A1* 6/2006 Liu et al. ..................... 257/40
(Continued)

FOREIGN PATENT DOCUMENTS

KR 20050001312 A * 6/2005

OTHER PUBLICATIONS

Zhao et al., "6.5% Efficiency of Polymer Solar Cells Based on poly(3-hexylthiophene) and Indene-C60 Bisadduct by Device Optimization", Advanced Materials, 22 (2010): pp. 4355-4358.*
(Continued)

*Primary Examiner* — Michele Fan
(74) *Attorney, Agent, or Firm* — Troutman Sanders, LLP; Ryan A. Schneider; Mark Lehi Jones

(57) ABSTRACT

Recyclable organic solar cells are disclosed herein. Systems and methods are further disclosed for producing, improving performance, and for recycling the solar cells. In certain example embodiments, the recyclable organic solar cells disclosed herein include: a first electrode; a second electrode; a photoactive layer disposed between the first electrode and the second electrode; an interlayer comprising a Lewis basic oligomer or polymer disposed between the photoactive layer and at least a portion of the first electrode or the second electrode; and a substrate disposed adjacent to the first electrode or the second electrode. The interlayer reduces the work function associated with the first or second electrode. In certain example embodiments, the substrate comprises cellulose nanocrystals that can be recycled. In certain example embodiments, one or more of the first electrode, the photoactive layer, and the second electrode may be applied by a film transfer lamination method.

17 Claims, 98 Drawing Sheets

PEIE

Related U.S. Application Data 16, 2011, provisional application No. 61/591,370, filed on Jan. 27, 2012, provisional application No. 61/608,408, filed on Mar. 8, 2012, provisional application No. 61/804,410, filed on Mar. 22, 2013.

(51) Int. Cl.
*H01L 51/00* (2006.01)
*H01L 31/0224* (2006.01)
*H01L 51/44* (2006.01)
*B82Y 10/00* (2011.01)

(52) U.S. Cl.
CPC .............. *H01L31/04* (2013.01); *H01L 51/004* (2013.01); *H01L 51/0034* (2013.01); *H01L 51/0097* (2013.01); *H01L 51/442* (2013.01); *H01L 51/0036* (2013.01); *H01L 51/0047* (2013.01); *H01L 51/4253* (2013.01); *Y02E 10/549* (2013.01); *Y10T 29/49821* (2015.01)

(56) References Cited

U.S. PATENT DOCUMENTS

| | | | |
|---|---|---|---|
| 2007/0267055 A1* | 11/2007 | Gaudiana et al. | 136/244 |
| 2008/0264488 A1* | 10/2008 | Balasubramanian et al. | 136/263 |
| 2009/0004402 A1* | 1/2009 | Ho et al. | 427/510 |
| 2009/0256117 A1* | 10/2009 | Seshadri et al. | 252/500 |
| 2011/0039078 A1* | 2/2011 | Brennan Fournet et al. | 428/195.1 |
| 2011/0278559 A1* | 11/2011 | Brown et al. | 257/40 |
| 2015/0017432 A1* | 1/2015 | Shoseyov et al. | 428/336 |

OTHER PUBLICATIONS

Zhou, Y.H. et al., "A Universal Method to Produce Low-Work Function Electrodes for Organic Electronics," Science, vol. 336, 2012, pp. 327-332.

Hu, Liangbing et al., "Transparent and conductive paper from nanocellulose fibers," Energy Environ. Sci., vol. 6, 2013, pp. 513-518.

Strange, Marianne et al., "Biodegradable polymer solar cells," Sol. Energy Mater. Sol. Cells, vol. 92, 2008, pp. 805-813.

Wang, Fei et al., "Papery solar cells based on dielectric/metal hybrid transparent cathode," Sol. Energy Mater. sol. Cells, vol. 94, 2010, pp. 1270-1274.

Kim, Tae-Soo et al., "Solution-processible polymer solar cells fabricated on a papery substrate," Phys. Status Solidi RRL, vol. 6, No. 1, 2012, pp. 13-15.

Hubler, Arved et al., "Printed Paper Photovoltaic Cells," Adv. Energy Mater., vol. 1, 2011, pp. 1018-1022.

Tobjork, Daniel et al., "Paper Electronics," Adv. Mater., vol. 23, 2011, pp. 1935-1961.

Wang, Xiangjun et al., "High-Performance Metal-Free Solar Cells Using Stamp Transfer Printed Vapor Phase Polymerized Poly (3,4-Ethylenedioxythiophene) Top Anodes," Adv. Funct. Mater., vol. 22, 2012, pp. 1454-1460.

Gupta, Dhritiman et al., "Efficient Polymer Solar Cells on Opaque Substrates with a Laminated PEDOT:PSS Top Electrode," Adv. Funct. Mater., vol. 3, 2013, pp. 782-787.

Moon, Robert J. et al., "Cellulose nanomaterials review: structure, properties and nanocomposites," Chem. Soc. Rev., vol. 40, 2011, pp. 3941-3994.

Okahisa, Yoko et al., "Composites Science and Technology," Comp. Sci. Tech., vol. 69, 2009, pp. 1958-1961.

\* cited by examiner

PEI

PEI

US 9,203,030 B2

RECYCLABLE ORGANIC SOLAR CELLS ON SUBSTRATES COMPRISING CELLULOSE NANOCRYSTALS (CNC)

RELATED APPLICATIONS

This application is a Continuation-In-Part of a U.S. nonprovisional patent application Ser. No. 14/117,965 filed on 15 Nov. 2013, entitled: "Systems and Methods for Producing Low Work Function Electrodes," which is a U.S. National Phase 371 application of international application No. PCT/US2012/038125, filed May 12, 2012 having the same title, the contents of which are hereby incorporated by reference in their entirety.

This application is related to provisional application Ser. No. 61/804,410 filed on 22 Mar. 2013, entitled: "Recyclable Organic Solar Cells on Crystalline Nanocellulose Substrates," the contents of which are hereby incorporated by reference in its entirety.

This application is related to provisional application Ser. No. 61/486,368 filed on 16 May 2011, entitled: "Reduction of the Work Function of Conductive Polymers, Metals, and Metal-Oxides by Water Soluble Polymeric Modifiers and their Application for Organic Electronics," the contents of which are hereby incorporated by reference in their entirety.

This application is also related to provisional application Ser. No. 61/591,370 filed on 27 Jan. 2012, entitled: "Photovoltaic Module with High Effective Area and Methods of Fabrication Thereof," the contents of which are hereby incorporated by reference in their entirety.

This application is also related to provisional application Ser. No. 61/608,408 filed on 8 Mar. 2012, entitled "Reduction of the Work Function of Conductive Polymers, Metals and Metal-Oxides by Water Soluble Polymeric Modifiers and their Applications for Organic Electronics," the contents of which are hereby incorporated by reference in their entirety.

STATEMENT REGARDING FEDERALLY SPONSORED RESEARCH OR DEVELOPMENT

This invention was made with Government support under the following Grant Numbers: DMR-0120967, awarded by the National Science Foundation; N00014-11-1-0313, awarded by the US Navy Office of Naval Research; N00014-04-1-0120, awarded by the US Navy; DE-SC0001084, awarded by the US Department of Energy; Grant No. FA9550-09-1-0418, awarded by the Air Force Office of Scientific Research; Grant No. 12-JV-11111122-098, awarded by the US Department of Agriculture-Forest Service; Grant No. 11-JV-11111129-118, awarded by USDA-Forest Service; and Grant No. FA9550-11-1-0162, awarded by the Air Force Office of Scientific Research. The Government has certain rights in the invention.

FIELD OF THE INVENTION

This invention generally relates to recyclable organic solar cells on substrates comprising cellulose nanocrystals (CNC).

BACKGROUND OF THE INVENTION

Organic solar cells show much promise as an alternative to silicon-based solar cells because of their light weight, potential for low-cost fabrication, and their mechanical flexibility. One goal for commercial viability of organic solar cells is to produce devices having power conversion efficiencies (PCEs) comparable to their silicon-based counterparts. Another goal is to produce devices that have long lifetimes. Despite the low PCEs and short lifetimes associated with early devices, recent cost-analysis studies suggest that organic solar cells could become competitive with other solar cell technologies if modules with PCE of 5% and a 5 year lifetime could be produced. Over the last decade, the power conversion efficiency (PCE) of small-area organic solar cells has improved from values around 3.5% up to 10.6%, making such solar cells a viable technology.

Polyethylene terephthalate (PET), polyethylene naphthalate (PEN), or polyethersulfone (PES), have been used for the demonstration of flexible organic solar cells. However, from a life-cycle perspective, these petroleum-based substrates are typically expensive and environmentally less attractive than easily recyclable or biodegradable substrates. A need exists for renewable and/or environmentally friendly materials for the realization of a sustainable solar cell technology.

BRIEF SUMMARY OF THE INVENTION

Some or all of the above needs may be addressed by certain embodiments of the invention. Embodiments of the disclosed technology include recyclable organic solar cells on substrates comprising cellulose nanocrystals (CNC). According to certain example implementations, the substrate materials may be synthesized from low-cost, environmentally friendly, recyclable materials. Example embodiments disclosed herein may further provide a method for recycling certain components of organic solar cell.

According to an exemplary embodiment of the disclosed technology, a recyclable organic solar cell is provided. The recyclable organic solar cell includes: a first electrode; a second electrode; a photoactive layer disposed between the first electrode and the second electrode; an interlayer comprising a Lewis basic oligomer or polymer disposed between the photoactive layer and at least a portion of the first electrode or the second electrode; and a substrate disposed adjacent to the first electrode or the second electrode. According to an example implementation of the disclosed technology, the interlayer reduces the work function associated with the first or second electrode. In certain example embodiments, the substrate comprises cellulose nanocrystals that can be recycled. In certain example embodiments, one or more of the first electrode, the photoactive layer, and the second electrode may be applied by a film transfer lamination method.

According to an exemplary embodiment of the disclosed technology, a recyclable organic solar cell module is provided. The module includes a plurality of solar cell elements, each solar cell element including: a first electrode; a second electrode; a photoactive layer disposed between the first electrode and the second electrode; an interlayer comprising a Lewis basic oligomer or polymer disposed between the photoactive layer and at least a portion of the first electrode or the second electrode; and a substrate disposed adjacent to the first electrode or the second electrode. Each solar cell element of the module is configured with an associated polarity based at least in part on an arrangement and orientation of the interlayer. In an example implementation, the first electrodes of adjacent solar cell elements x(N) and x(N+1) are connected in a first plane, and the second electrodes of adjacent solar cell elements x(N+1) and x(N+2) are connected in a second plane, wherein x and N are integers.

According to an exemplary embodiment of the disclosed technology, a method is provided for recycling an organic solar cell, the method includes immersing, in a room-temperature water-based liquid, a recyclable solar cell comprising: a first electrode; a second electrode; a photoactive layer disposed between the first electrode and the second electrode; an interlayer comprising a Lewis basic oligomer or polymer disposed between the photoactive layer and at least a portion of the first electrode or the second electrode; and a water-soluble substrate disposed adjacent to the first electrode or the second electrode. The method further includes continuing the immersion until the water-soluble substrate substantially disintegrates; and filtering the liquid to remove solid residue.

According to an exemplary embodiment of the disclosed technology, a method is provided for producing a recyclable solar cell using film transfer lamination. The method includes preparing a water-soluble substrate; applying to the water-soluble substrate, a first electrode; depositing on at least a portion of the first electrode, an interlayer comprising a Lewis basic oligomer or polymer; applying to the interlayer, a photoactive layer; and applying to the photoactive layer, a second electrode comprising a conducting polymer. The one or more of the first electrode, the photoactive layer, and the second electrode are applied by film transfer lamination.

Other embodiments, features, and aspects of the invention are described in detail herein and are considered a part of the claimed inventions. Other embodiments, features, and aspects can be understood with reference to the following detailed description, accompanying drawings, and claims.

BRIEF DESCRIPTION OF THE FIGURES

Reference will now be made to the accompanying figures and flow diagrams, which are not necessarily drawn to scale, and wherein:

FIG. 119 shows a device structure of an inverted solar cell and chemical structure of P3HT and $PC_{60}BM$, according to an exemplary embodiment of the invention.

FIG. 120 shows J-V characteristics of a solar cell in dark and under AM 1.5 100 mW/cm$^2$ illumination, according to an exemplary embodiment of the invention.

FIG. 121 shows a device structure of an inverted solar cell and chemical structure of P3HT and ICBA, according to an exemplary embodiment of the invention.

FIG. 122 shows J-V characteristics of a solar cell in the dark and under AM 1.5 100 mW/cm$^2$ illumination, according to an exemplary embodiment of the invention.

FIG. 123 shows a device structure of an inverted solar cell and chemical structure of pentacene and $C_{60}$, according to an exemplary embodiment of the invention.

FIG. 124 shows J-V characteristics of a solar cell in dark and under AM 1.5 100 mW/cm$^2$ illumination, according to an exemplary embodiment of the invention.

FIG. 125 shows a device structure of an inverted solar cell and chemical structure of CuPc and $C_{60}$, according to an exemplary embodiment of the invention.

FIG. 126 shows J-V characteristics of a solar cell in the dark and under AM 1.5 100 mW/cm$^2$ illumination, according to an exemplary embodiment of the invention.

FIG. 127 shows a device structure of an inverted solar cell and chemical structure of P3HT and $PC_{60}BM$, according to an exemplary embodiment of the invention.

FIG. 128 shows J-V characteristics of a solar cell in dark and under AM 1.5 100 mW/cm² illumination, according to an exemplary embodiment of the invention.

FIG. 129 shows a device structure of a solar cell and chemical structure of PAAm, P3HT and $PC_{60}BM$, according to an exemplary embodiment of the invention.

FIG. 130 shows J-V characteristics of a solar cell in dark and under AM 1.5 100 mW/cm² illumination, according to an exemplary embodiment of the invention.

Figure 131:
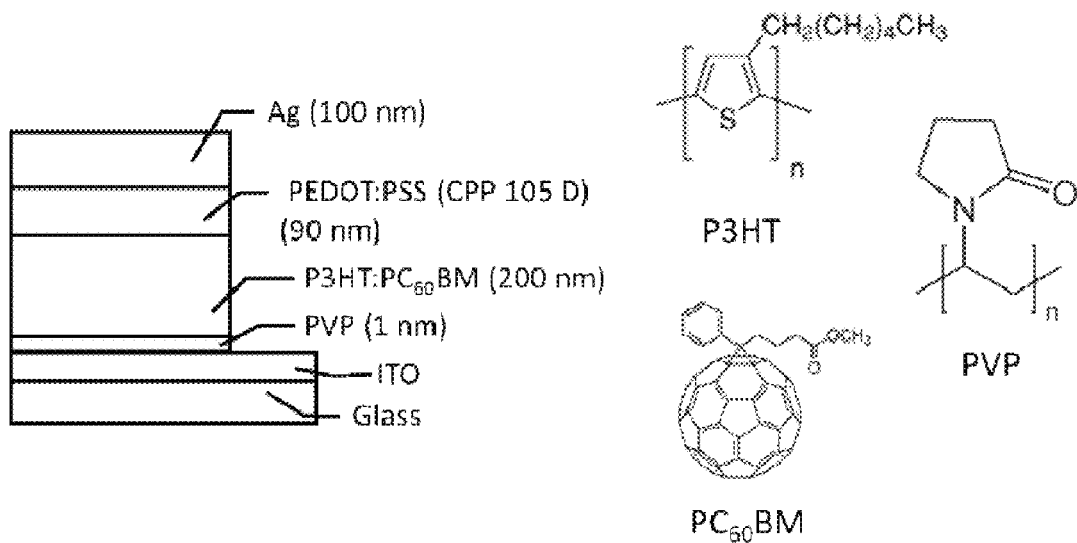

FIG. 131 shows a device structure of a solar cell and chemical structure of PVP, P3HT and $PC_{60}BM$, according to an exemplary embodiment of the invention.

Figure 132:
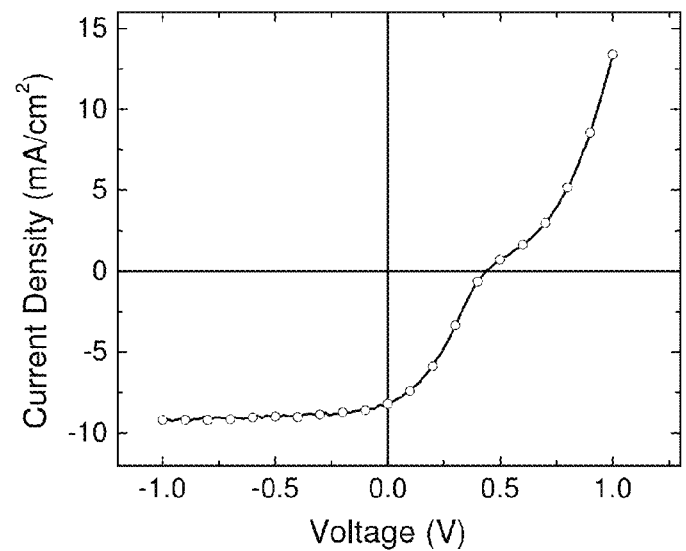

FIG. 132 shows J-V characteristics of a newly fabricated solar cell under AM 1.5 100 mW/cm² illumination, according to an exemplary embodiment of the invention.

Figure 133:
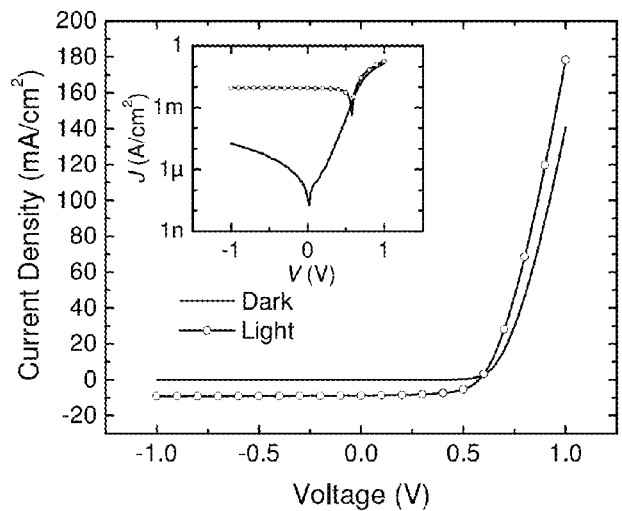

FIG. 133 shows J-V characteristics of a solar cell exposed under solar simulator for 20 min under AM 1.5 100 mW/cm² illumination, according to an exemplary embodiment of the invention.

Figure 134:
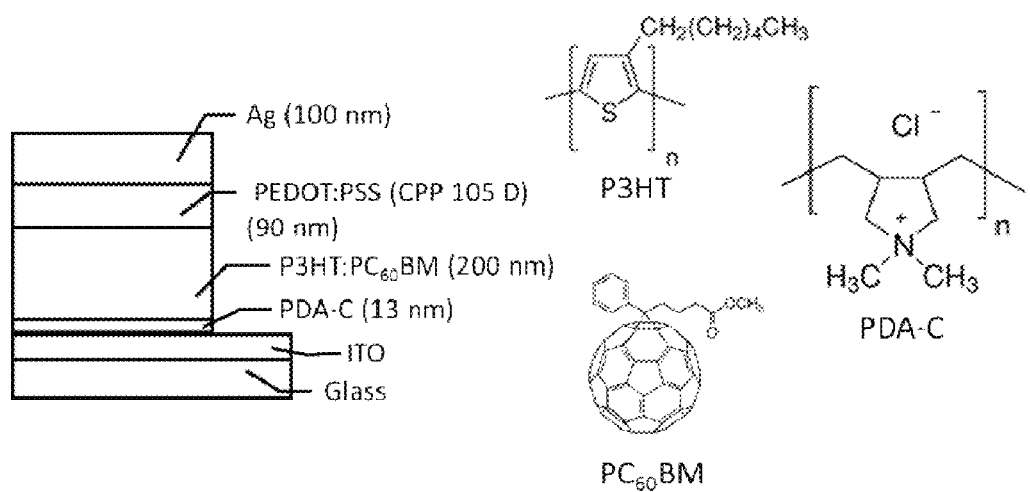

FIG. 134 shows a device structure of a solar cell and chemical structure of PDA-C, P3HT and $PC_{60}BM$, according to an exemplary embodiment of the invention.

Figure 135:
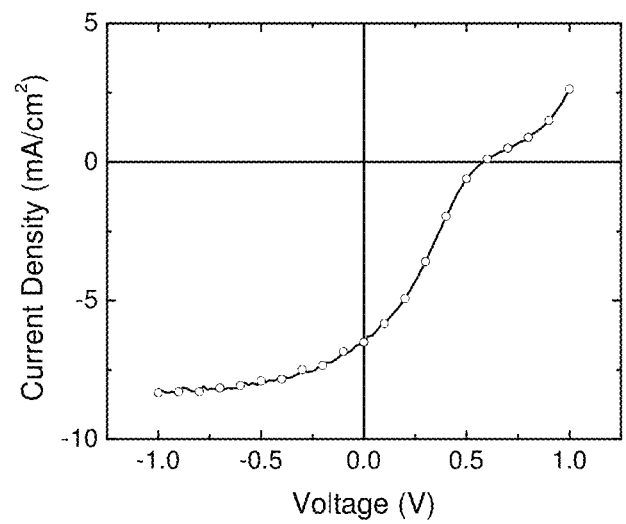

FIG. 135 shows J-V characteristics of a newly fabricated solar cell under AM 1.5 100 mW/cm² illumination, according to an exemplary embodiment of the invention.

Figure 136:
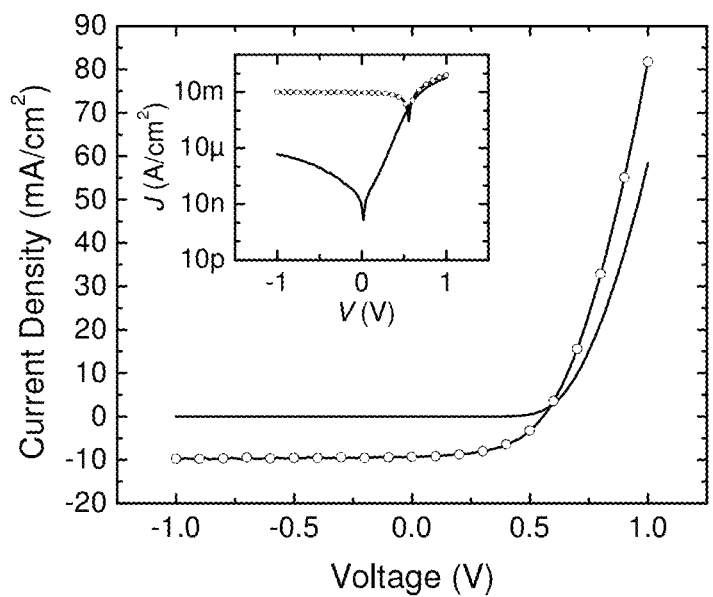

FIG. 136 shows J-V characteristics of a solar cell exposed under solar simulator for 150 min under AM 1.5 100 mW/cm² illumination, according to an exemplary embodiment of the invention.

Figure 137:
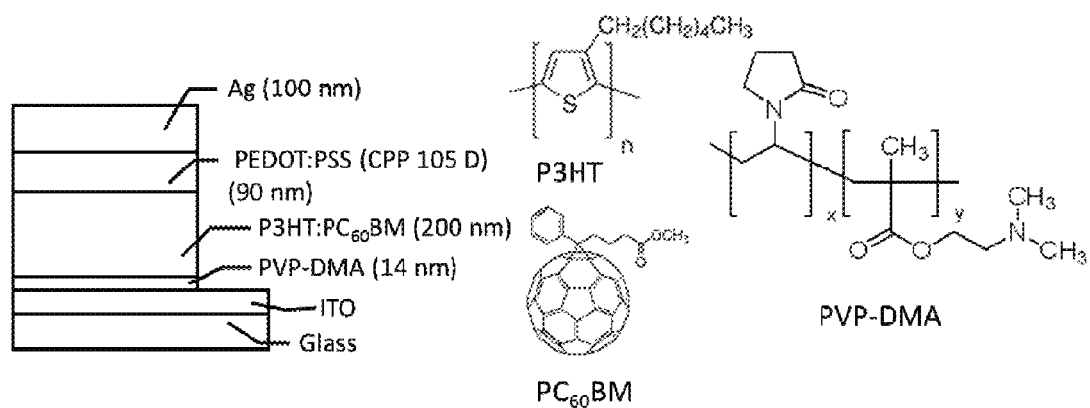

FIG. 137 shows a device structure of a solar cell and chemical structure of PVP-DMA, P3HT and $PC_{60}BM$, according to an exemplary embodiment of the invention.

Figure 138:
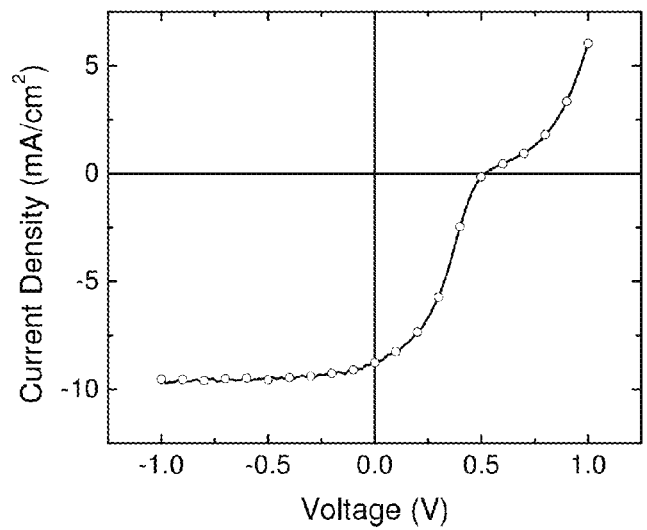

FIG. 138 shows J-V characteristics of a newly fabricated solar cell under AM 1.5 100 mW/cm² illumination, according to an exemplary embodiment of the invention.

Figure 139:
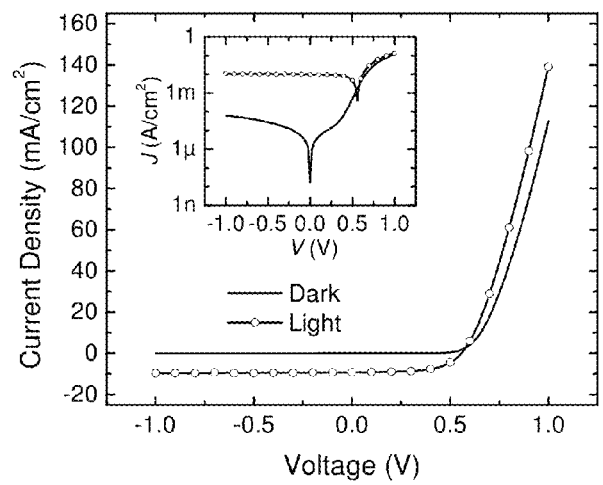

FIG. 139 shows J-V characteristics of a solar cell exposed under solar simulator for 36 min under AM 1.5 100 mW/cm² illumination, according to an exemplary embodiment of the invention.

Figure 140:
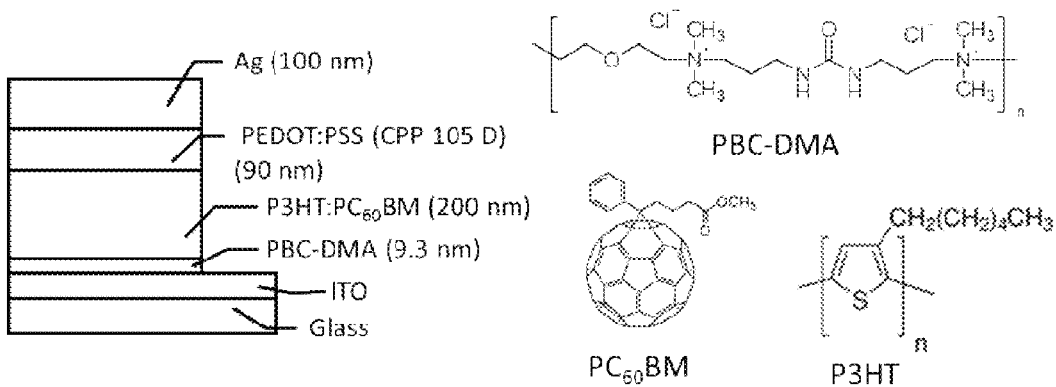

FIG. 140 shows a device structure of a solar cell and chemical structure of PBC-DMA, P3HT and $PC_{60}BM$, according to an exemplary embodiment of the invention.

Figure 141:
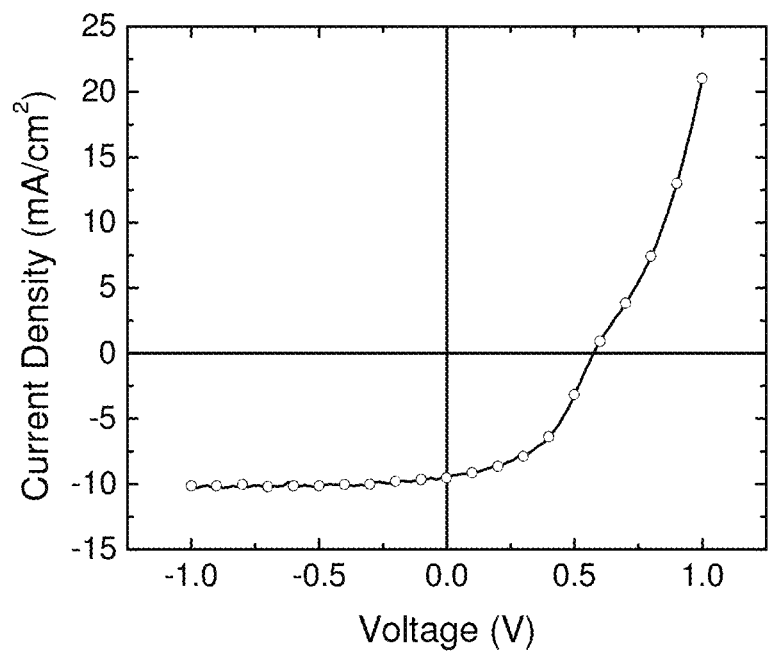

FIG. 141 shows J-V characteristic of a newly fabricated solar cell under AM 1.5 100 mW/cm² illumination.

Figure 142:
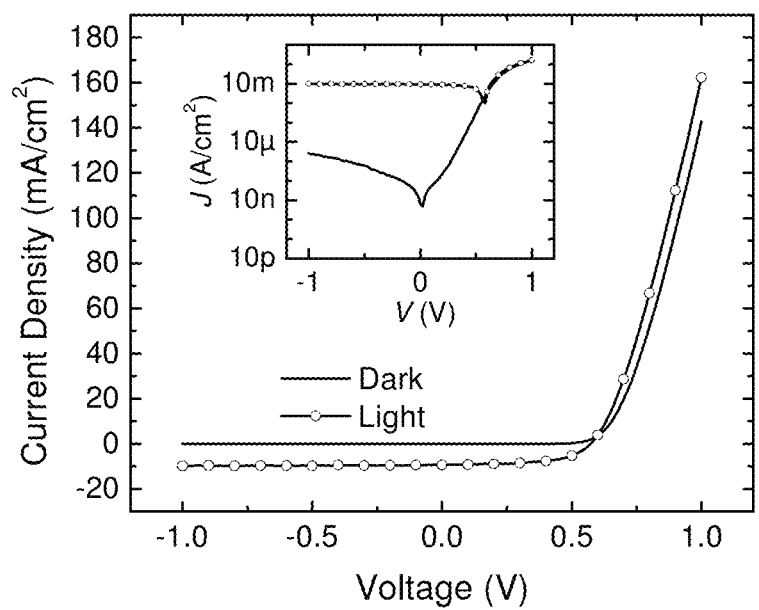

FIG. 142 shows J-V characteristics of a solar cell exposed under solar simulator for 5 min under AM 1.5 100 mW/cm² illumination, according to an exemplary embodiment of the invention.

Figure 143:
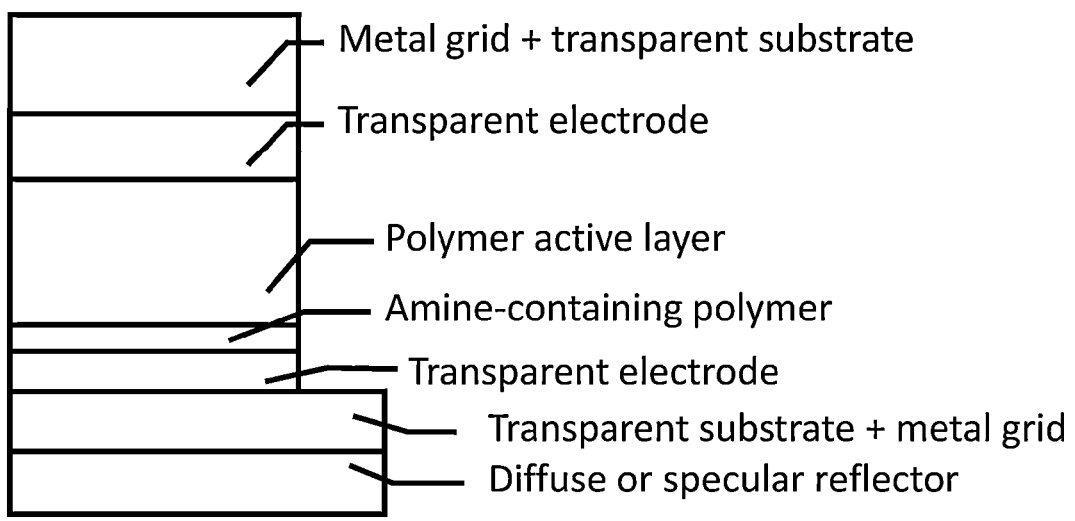

FIG. 143 shows an OPV structure, according to exemplary embodiments of the invention.

Figure 144:
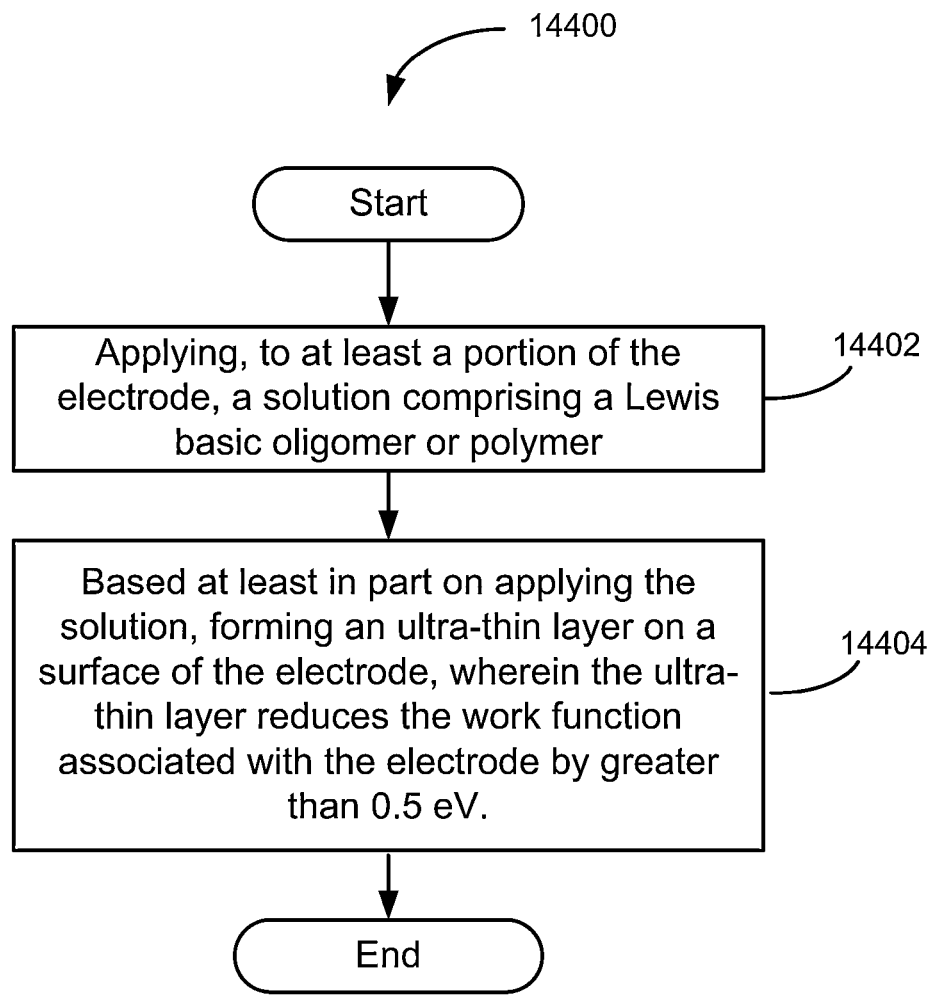

FIG. 144 depicts a flow-diagram of a method, according to an exemplary embodiment of the invention.

Figure 145:
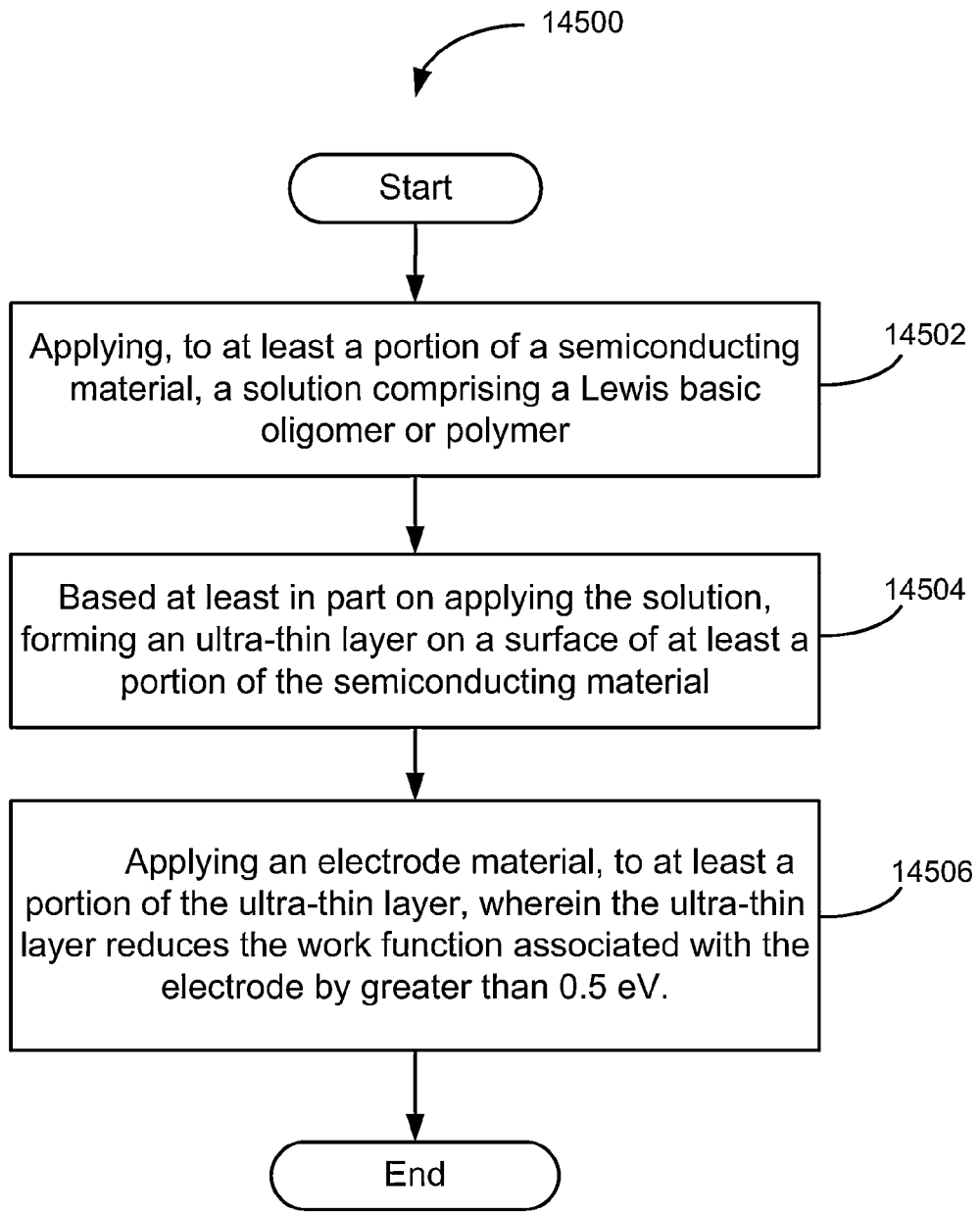

FIG. 145 depicts flow-diagram of another method, according to an exemplary embodiment of the invention.

Figure 146:
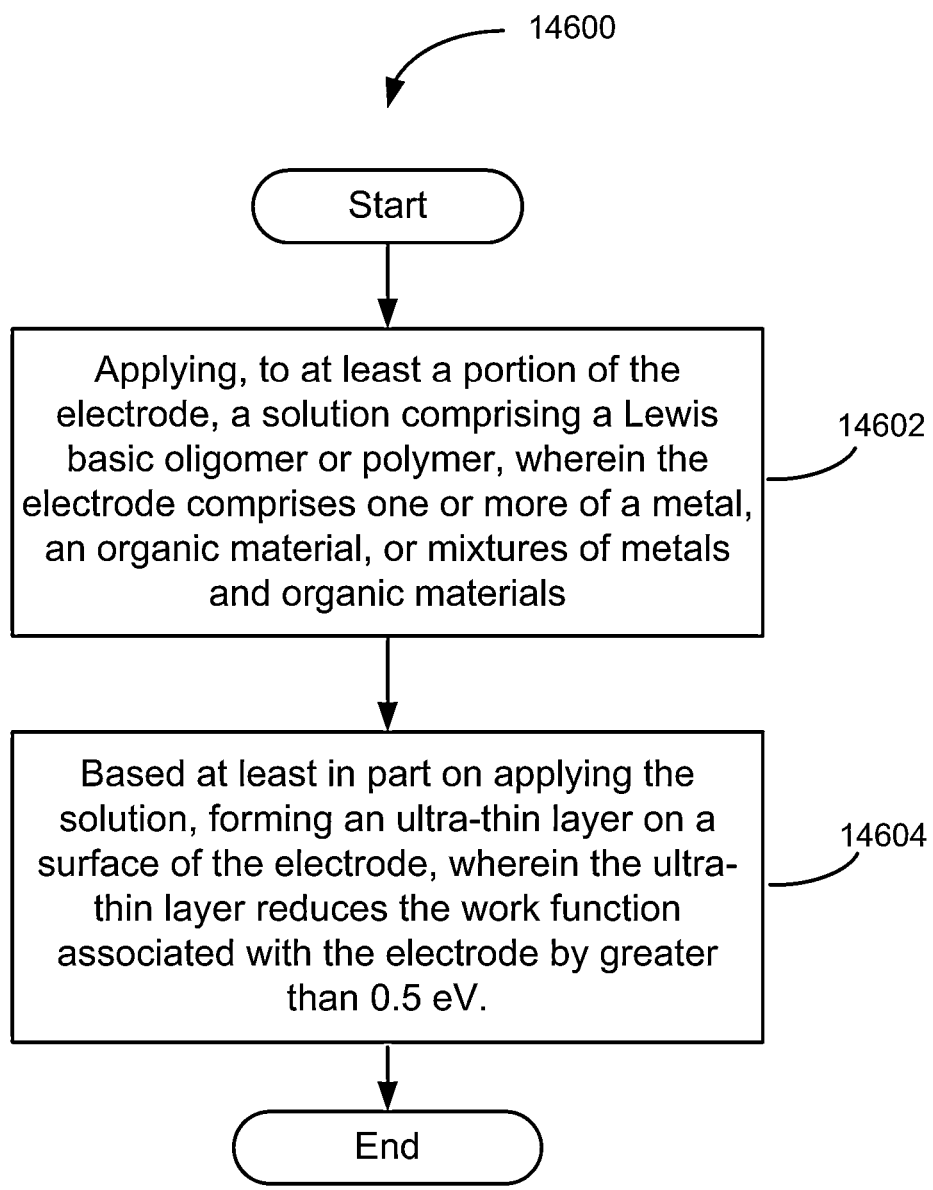

FIG. 146 depicts a flow-diagram of another method, according to an exemplary embodiment of the invention.

Figure 147:
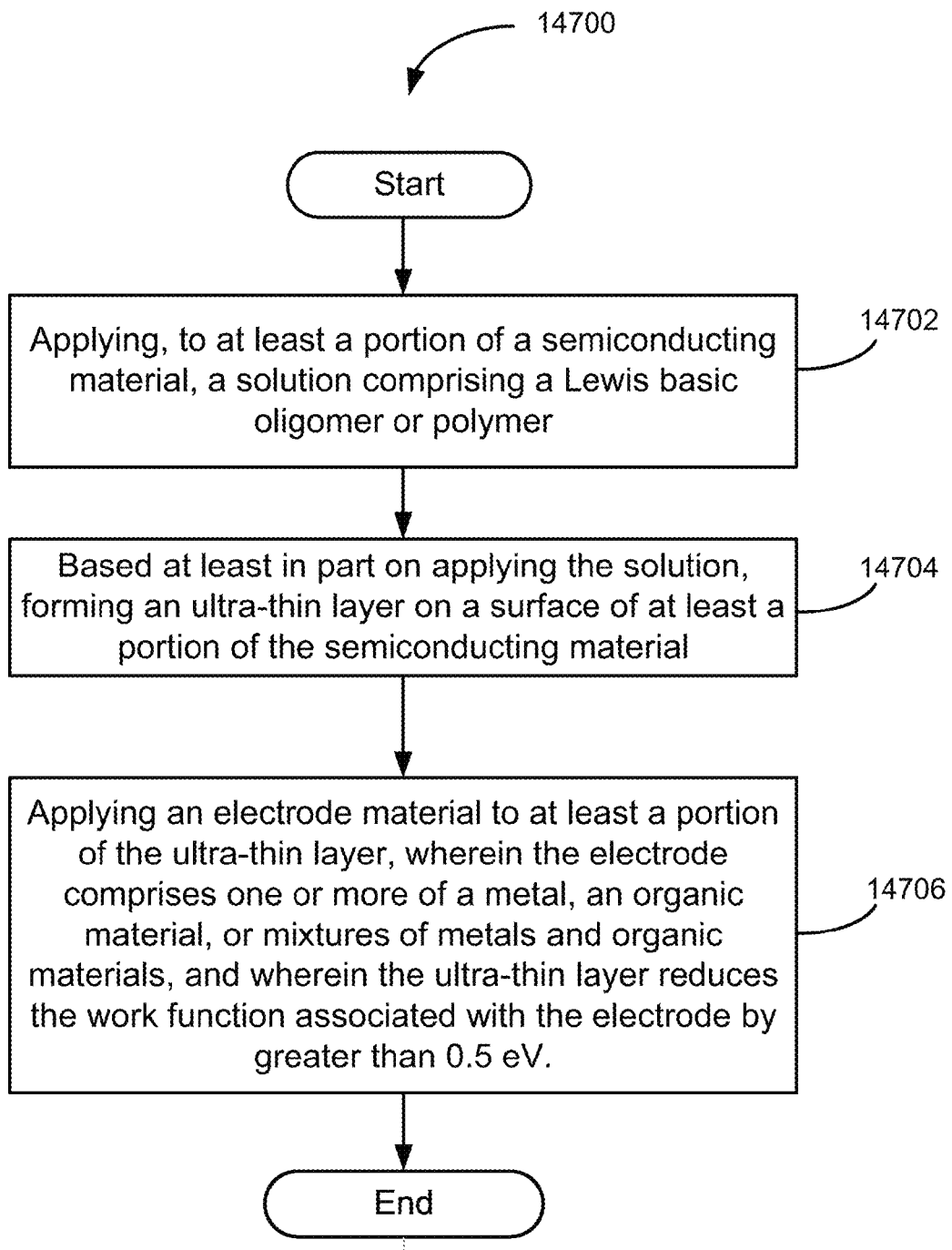

FIG. 147 depicts a flow-diagram of another method, according to an exemplary embodiment of the invention.

Figure 148:
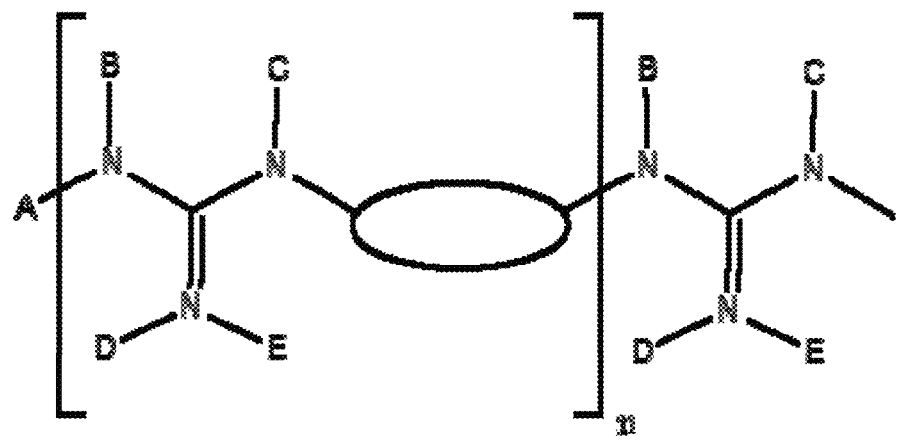

FIG. 148 depicts polymer scheme for containing a guanidine group, according to an exemplary embodiment of the invention.

Figure 149:
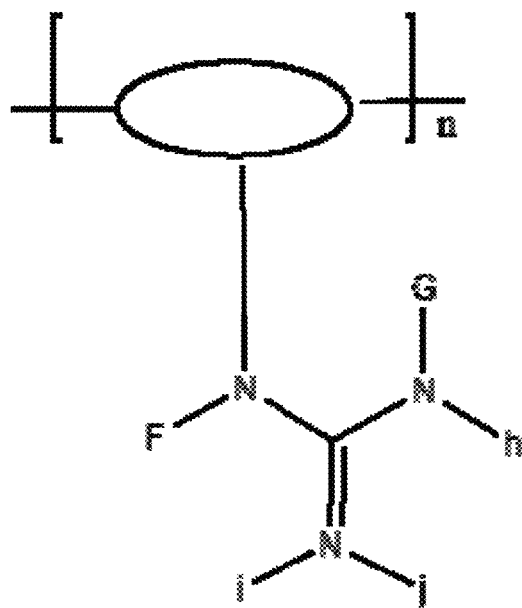

FIG. 149 depicts another polymer scheme containing a guanidine group, according to an exemplary embodiment of the invention.

Figure 150:
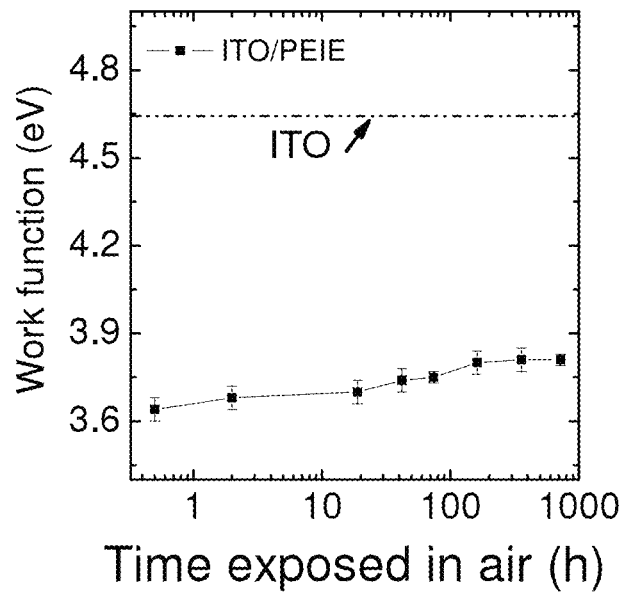

FIG. 150 shows a work function of ITO/PEIE (10 nm) after exposed in ambient air for various cumulative exposure times, according to an exemplary embodiment of the invention.

Figure 151:
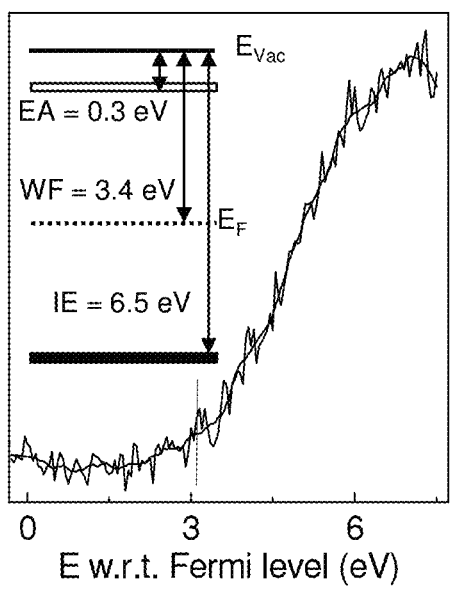

FIG. 151 shows IPES spectrum of a layer of PEIE (10 nm) on top of Au; inset shows the energy levels of PEIE.

Figure 152:
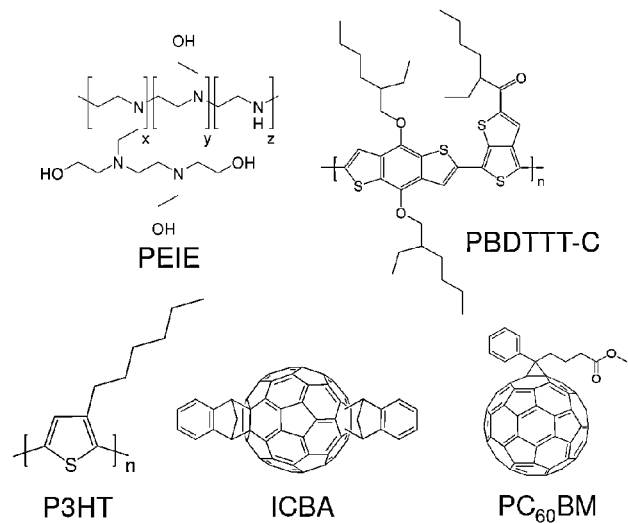

FIG. 152 shows a structure of tandem solar cells and chemical structure of PEIE, P3HT ICBA, PBDTTT-C and $PC_{60}BM$, according to an exemplary embodiment of the invention.

Figure 153:
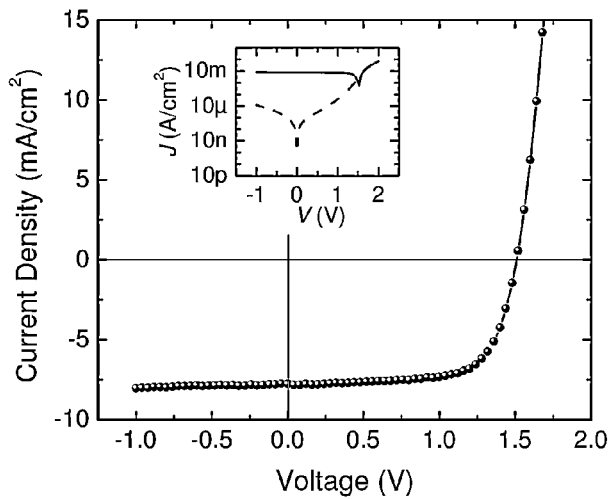

FIG. 153 shows J-V characteristics of a device in the dark and under AM 1.5 100 mW/cm² illumination, according to an exemplary embodiment of the invention.

Figure 154:
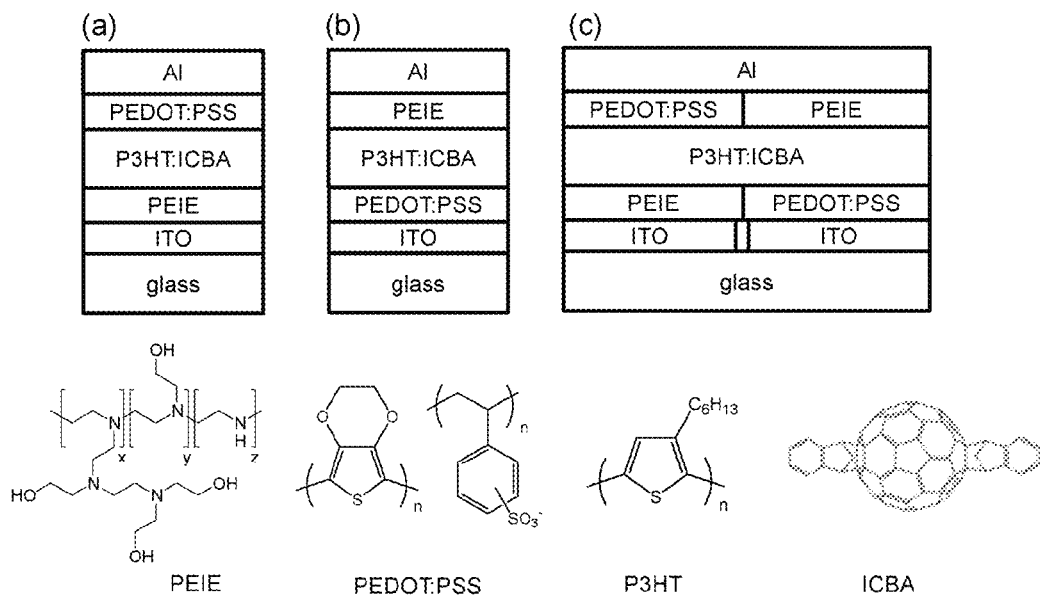

FIG. 154 shows a structure of inverted and conventional reference single solar cells, a solar cell module and chemical structure of PEIE, P3HT ICBA, PBDTTT-C and $PC_{60}BM$, according to an exemplary embodiment of the invention.

Figure 155:
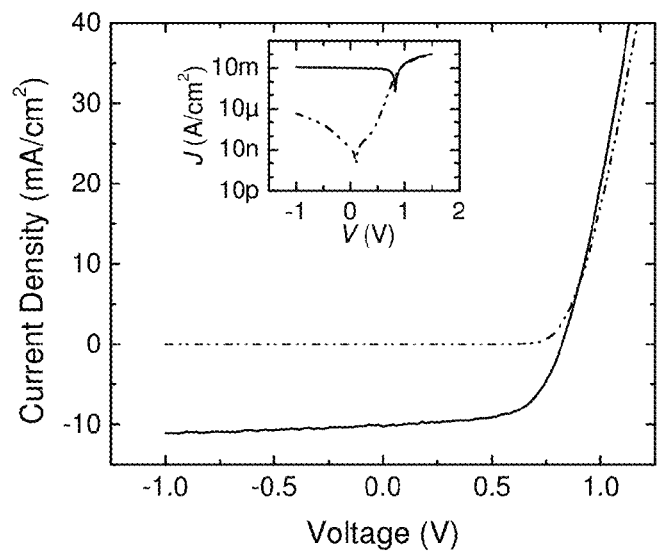

FIG. 155 shows J-V characteristics of a reference inverted single solar cell (glass/ITO/PEIE/P3HT:ICBA/PEDOT:PSS/Al) in dark and under AM 1.5 100 mW/cm² illumination, according to an exemplary embodiment of the invention.

Figure 156:
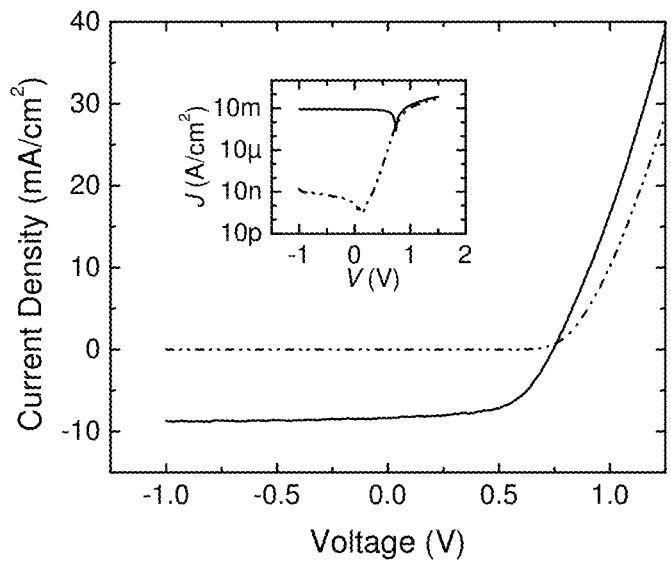

FIG. 156 shows J-V characteristics of a reference conventional single solar cell (glass/ITO/PEDOT:PSS/P3HT:ICBA/PEIE/Al) in dark and under AM 1.5 100 mW/cm² illumination.

Figure 157:
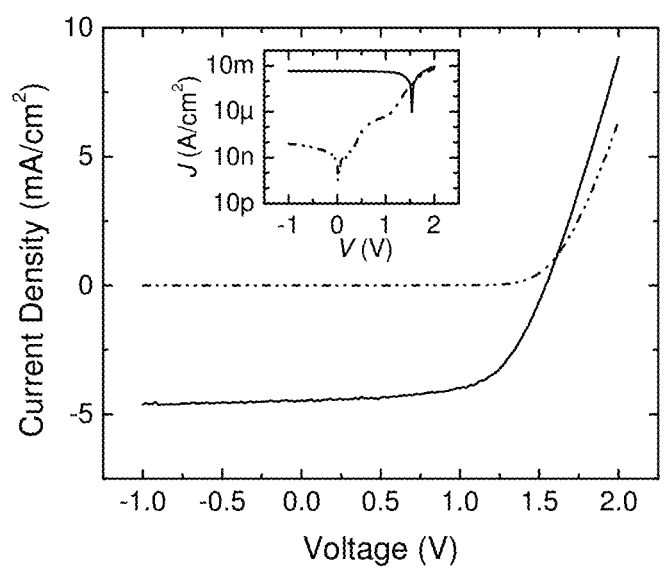

FIG. 157 shows J-V characteristics of a solar cell module in dark and under AM 1.5 100 mW/cm² illumination, according to an exemplary embodiment of the invention.

Figure 158:
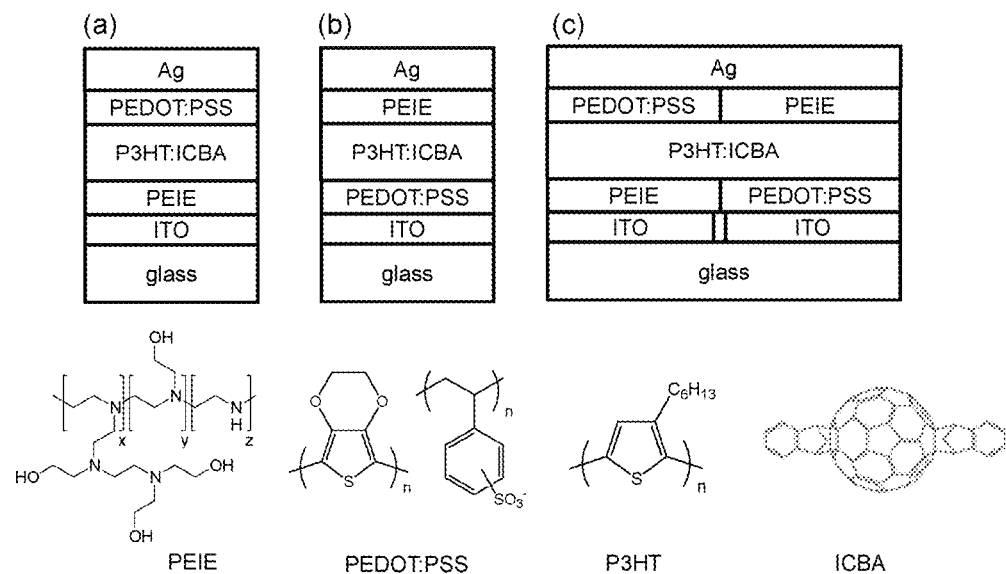

FIG. 158 shows a structure of (a) inverted, (b) conventional reference single solar cells, (c) a solar cell module and chemical structure of PEIE, P3HT ICBA, PBDTTT-C and PC60BM, according to an exemplary embodiment of the invention.

Figure 159:
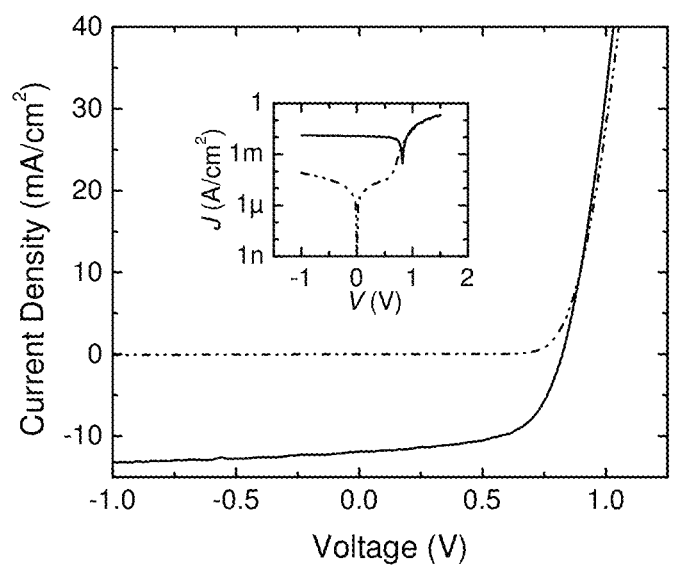

FIG. 159 shows J-V characteristics of a reference inverted single solar cell (glass/ITO/PEIE/P3HT:ICBA/PEDOT:PSS/Ag) in dark and under AM 1.5 100 mW/cm² illumination, according to an exemplary embodiment of the invention.

Figure 160:
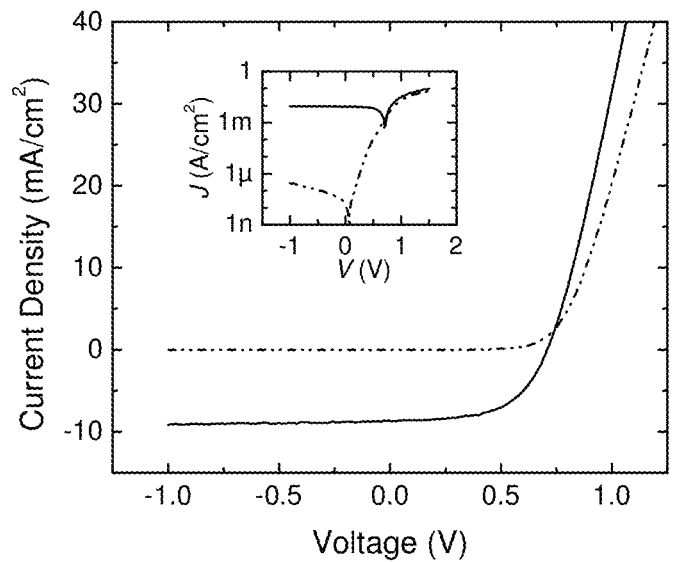

FIG. 160 shows J-V characteristics of reference conventional single solar cell (glass/ITO/PEDOT:PSS/P3HT:ICBA/PEIE/Ag) in dark and under AM 1.5 100 mW/cm² illumination.

Figure 161:
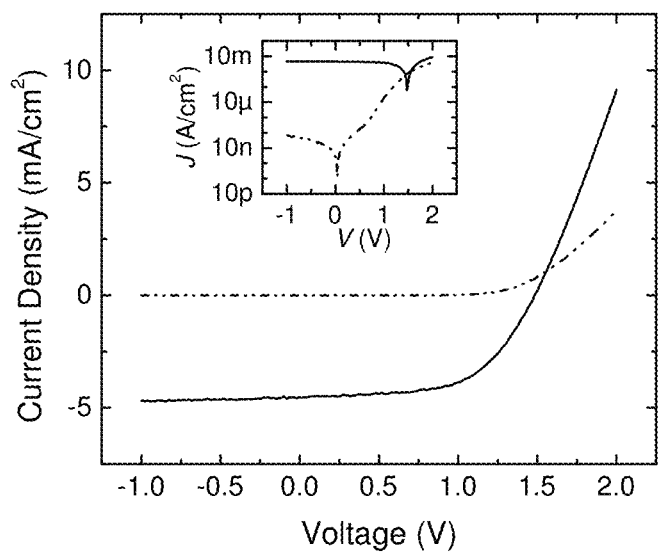

FIG. 161 shows J-V characteristics of a solar cell module in dark and under AM 1.5 100 mW/cm² illumination, according to an exemplary embodiment of the invention.

Figure 162:
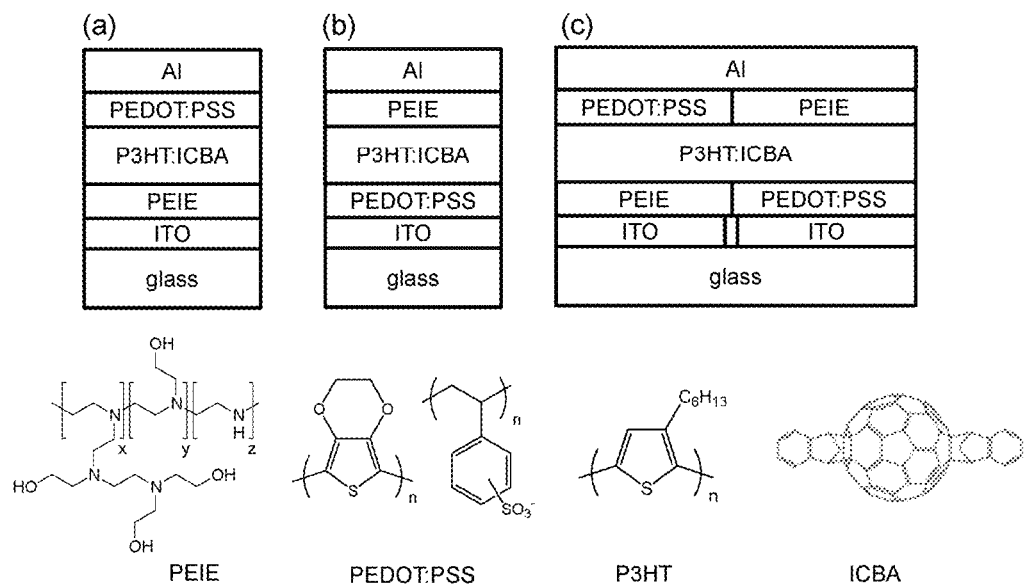

FIG. 162 shows a structure of (a) an inverted, (b) conventional reference single solar cells, (c) solar cell module, and chemical structure of PEIE, P3HT ICBA, PBDTTT-C and PC60BM, according to an exemplary embodiment of the invention.

Figure 163:
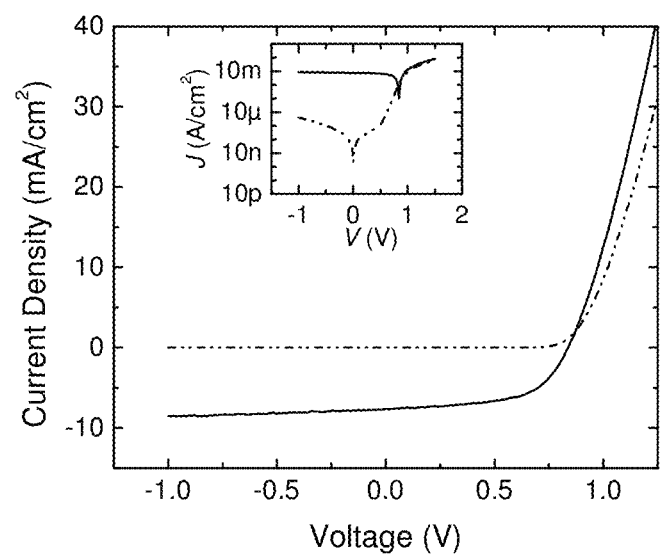

FIG. 163 shows J-V characteristics of a reference inverted single solar cell (glass/ITO/PEIE/P3HT:ICBA/PEDOT:PSS/Al) in dark and under AM 1.5 100 mW/cm² illumination, according to an exemplary embodiment of the invention.

Figure 164:
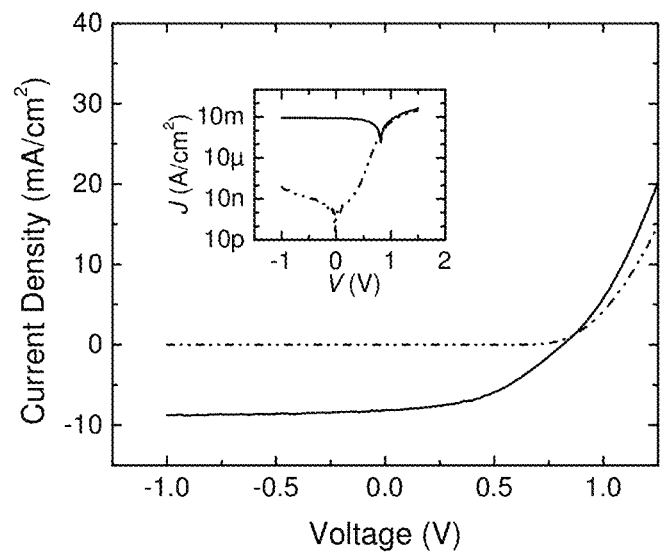

FIG. 164 shows J-V characteristics of reference conventional single solar cell (glass/ITO/PEDOT:PSS/P3HT:ICBA/PEIE/Al) in dark and under AM 1.5 100 mW/cm² illumination.

Figure 165:
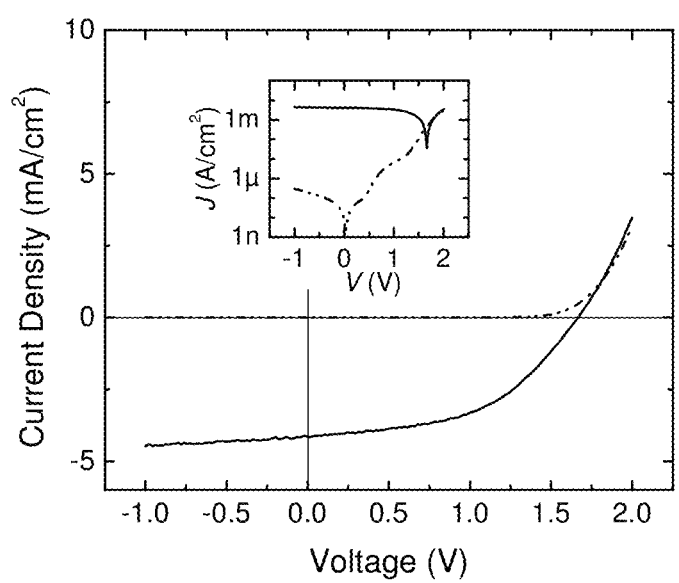

FIG. 165 shows J-V characteristics of a solar cell module in dark and under AM 1.5 100 mW/cm² illumination, according to an exemplary embodiment of the invention.

Figure 166:
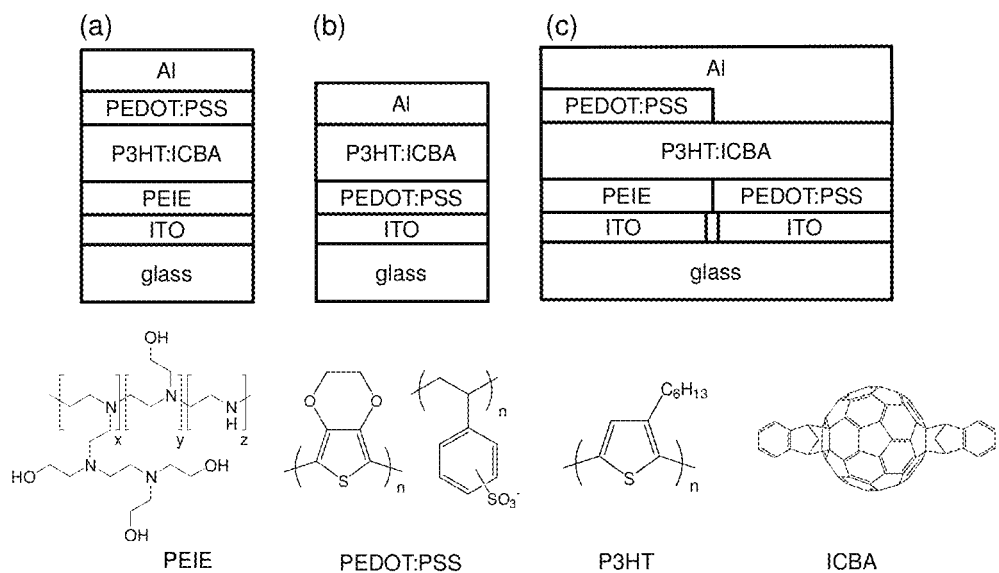

FIG. 166 shows a structure of (a) an inverted, (b) conventional reference single solar cells, (c) a solar cell module, and chemical structure of PEIE, P3HT ICBA, PBDTTT-C and PC60BM, according to an exemplary embodiment of the invention.

Figure 167:
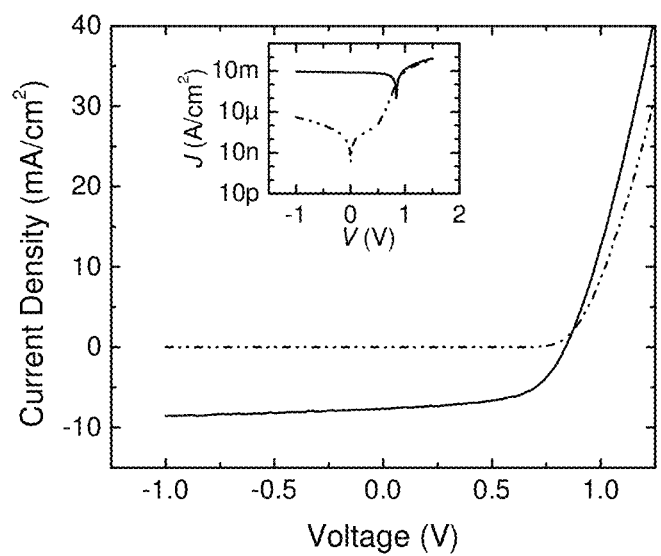

FIG. 167 shows J-V characteristics of a reference inverted single solar cell (glass/ITO/PEIE/P3HT:ICBA/PEDOT:PSS/

Al) in dark and under AM 1.5 100 mW/cm² illumination, according to an exemplary embodiment of the invention.

Figure 168:
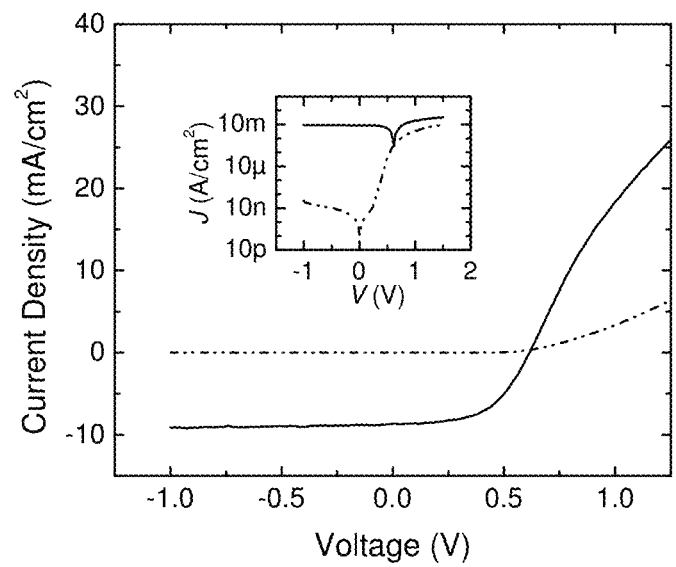

FIG. 168 shows J-V characteristics of a reference conventional single solar cell (glass/ITO/PEDOT:PSS/P3HT:ICBA/Al) in dark and under AM 1.5 100 mW/cm² illumination.

Figure 169:
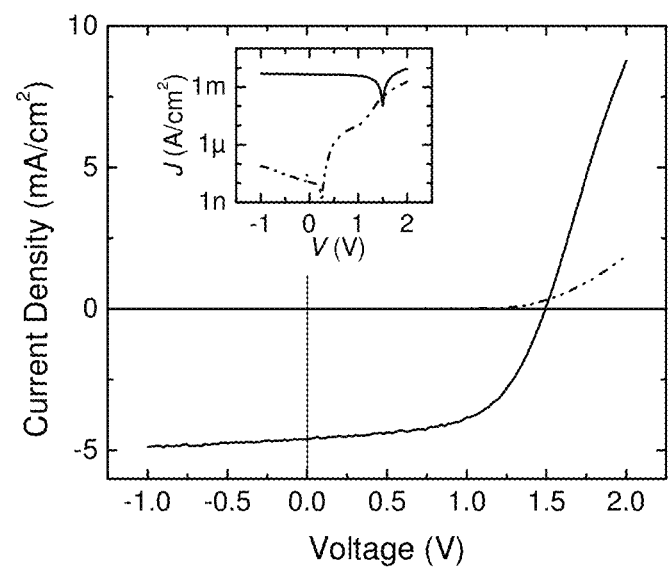

FIG. 169 shows J-V characteristics of a solar cell module in dark and under AM 1.5 100 mW/cm² illumination, according to an exemplary embodiment of the invention.

Figure 170:
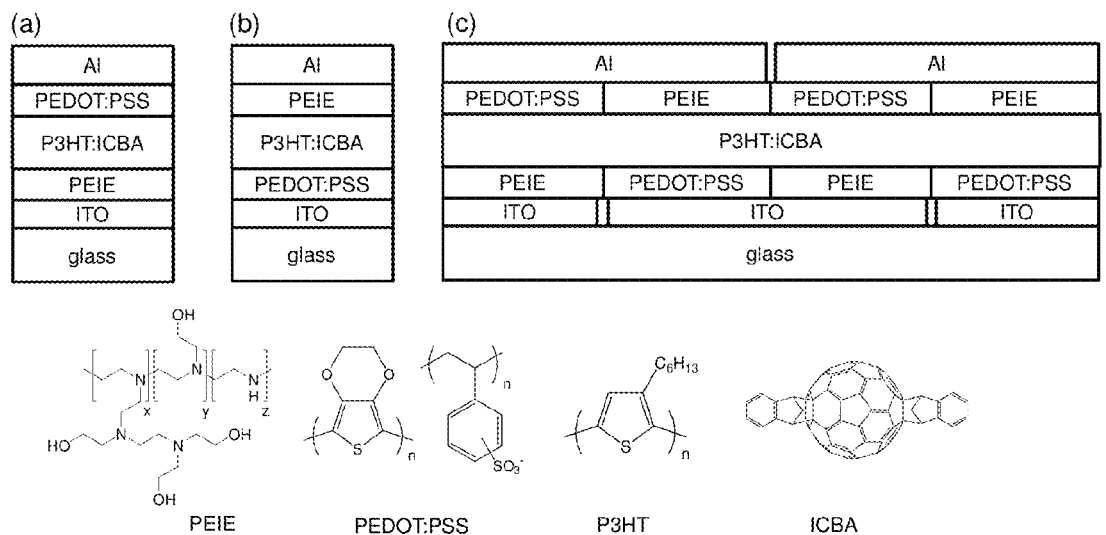

FIG. 170 shows a structure of (a) an inverted, (b) conventional reference single solar cell, (c) a four-cell solar module, and chemical structure of PEIE, P3HT ICBA, PBDTTT-C and PC60BM, according to an exemplary embodiment of the invention.

Figure 171:
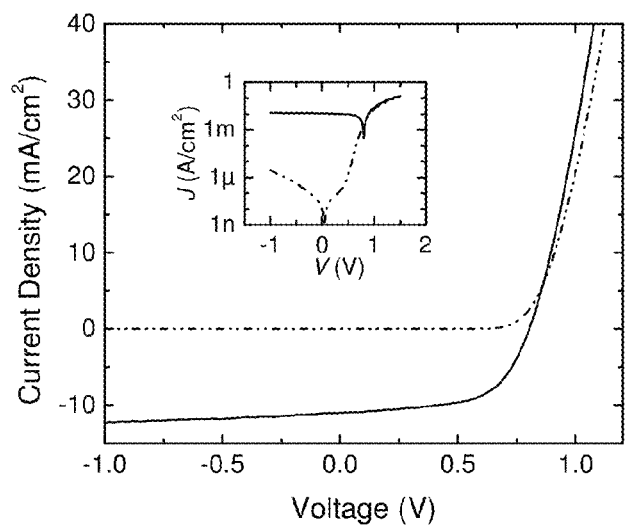

FIG. 171 shows J-V characteristics of a reference inverted single solar cell (glass/ITO/PEIE/P3HT:ICBA/PEDOT:PSS/Al) in dark and under AM 1.5 100 mW/cm² illumination, according to an exemplary embodiment of the invention.

Figure 172:
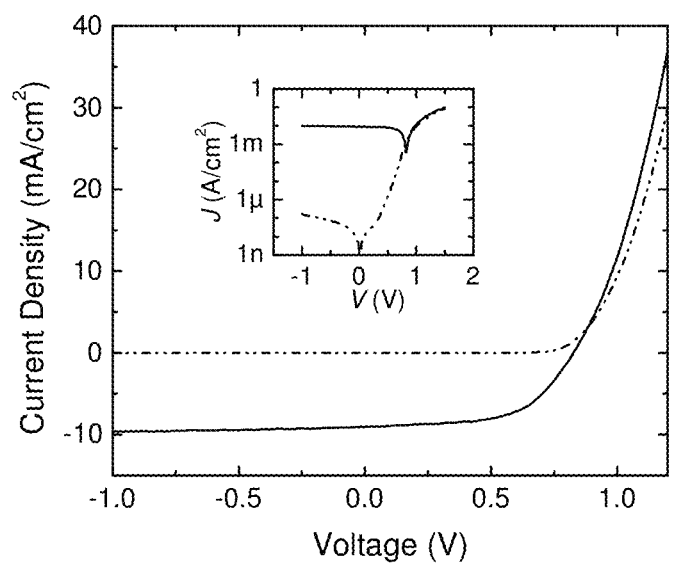

FIG. 172 shows J-V characteristics of a reference conventional single solar cell (glass/ITO/PEDOT:PSS/P3HT:ICBA/PEIE/Al) in dark and under AM 1.5 100 mW/cm² illumination.

Figure 173:
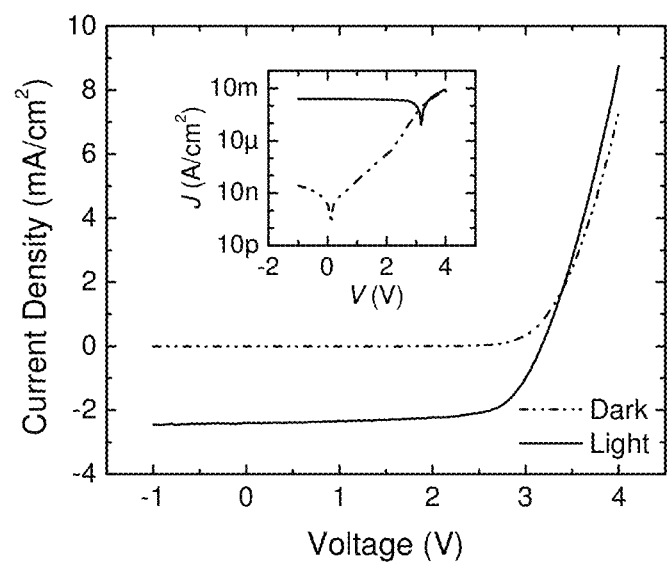

FIG. 173 shows J-V characteristics of a solar cell module in dark and under AM 1.5 100 mW/cm² illumination, according to an exemplary embodiment of the invention.

Figure 174:
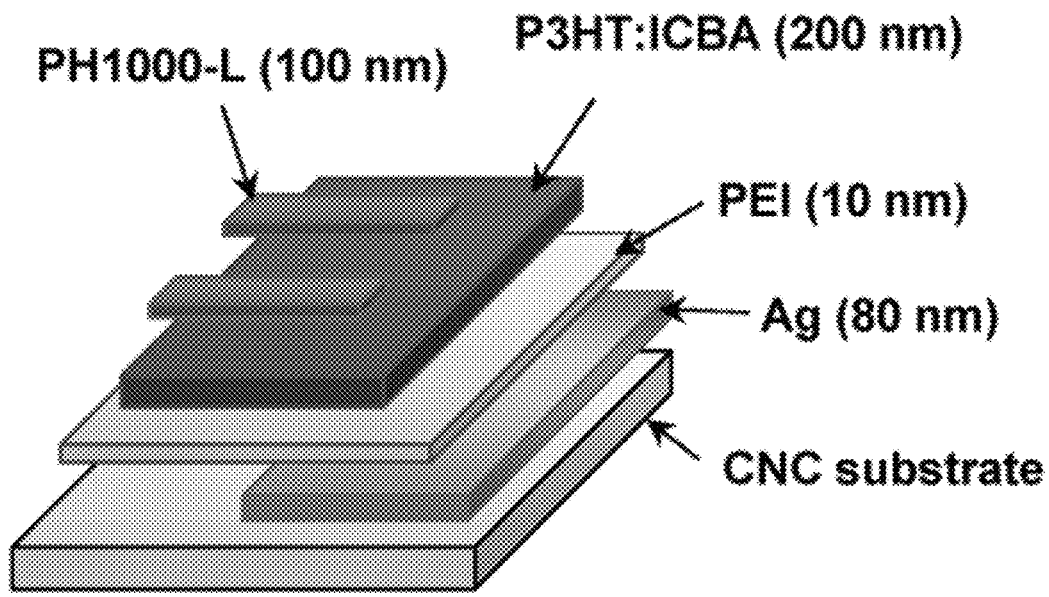

FIG. 174 shows an example solar cell structure on a CNC substrate: CNC/Ag/PEI/P3HT:ICBA/PH1000-L where PH1000-L indicates the PEDOT:PSS PH1000 top electrode prepared by film-transfer lamination.

Figure 175:
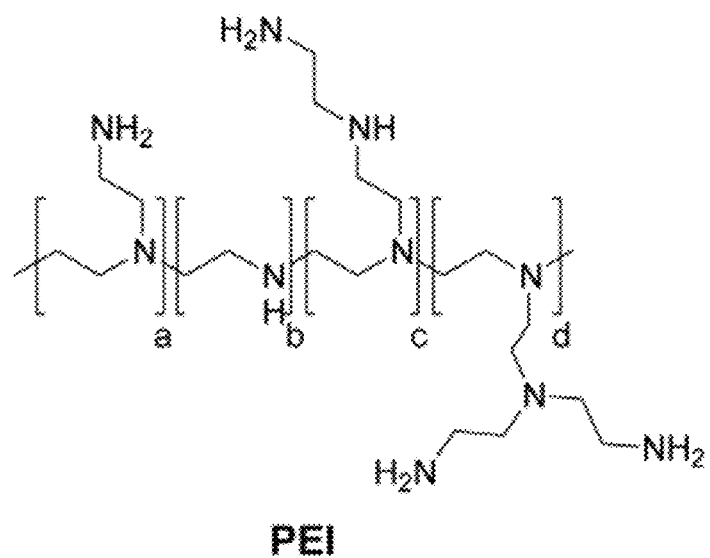

FIG. 175 shows a chemical structure of branched polyethylenimine used to lower the work function of the Ag electrode.

Figure 176:
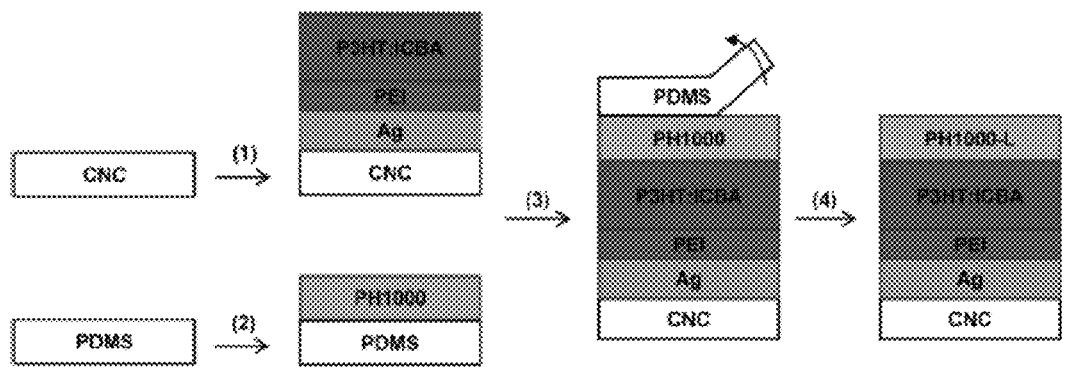

FIG. 176 depicts an example fabrication procedure of recyclable solar cells on a CNC substrate.

Figure 177:
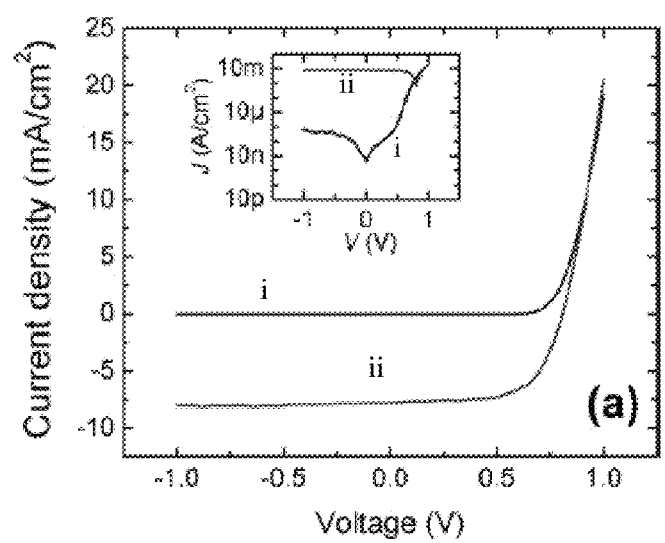

FIG. 177 shows J-V characteristics (i) in the dark and (ii) under 100 mW/cm² of AM1.5G illumination for a solar cell on a CNC substrate. The insets are the J-V characteristics (i) in the dark, and (ii) under illumination on a semi-logarithmic scale.

Figure 178:
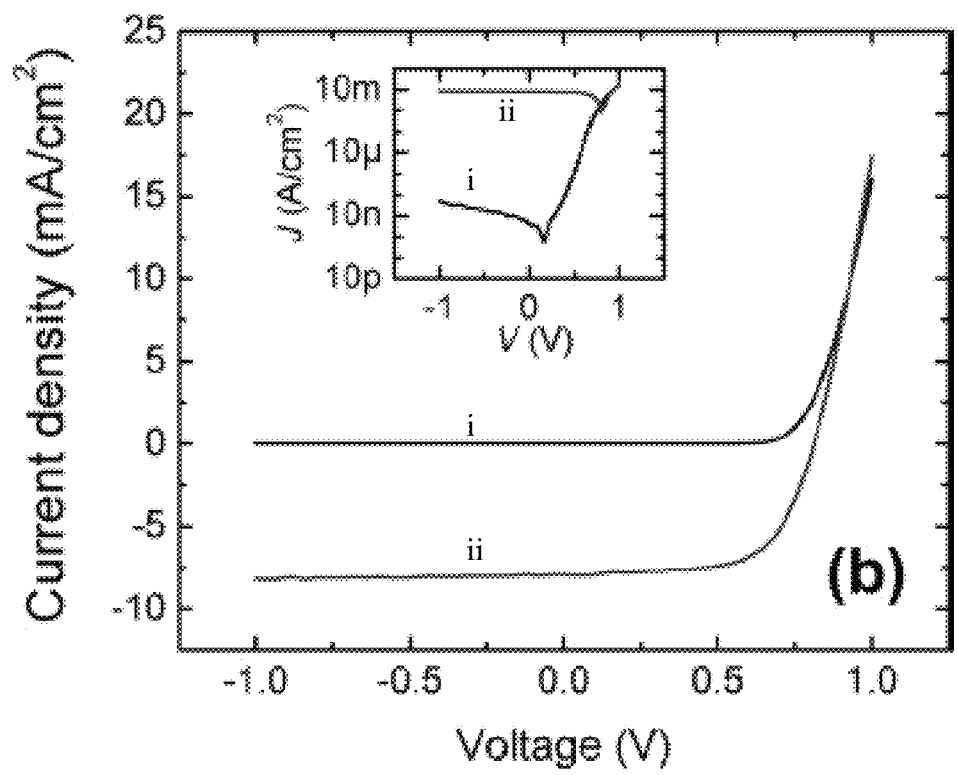

FIG. 178 shows J-V characteristics (i) in the dark and (ii) under 100 mW/cm² of AM1.5G illumination for a solar cell on a PES substrate (Ref. Device). The insets are the J-V characteristics (i) in the dark, and (ii) under illumination on a semi-logarithmic scale.

Figure 179:
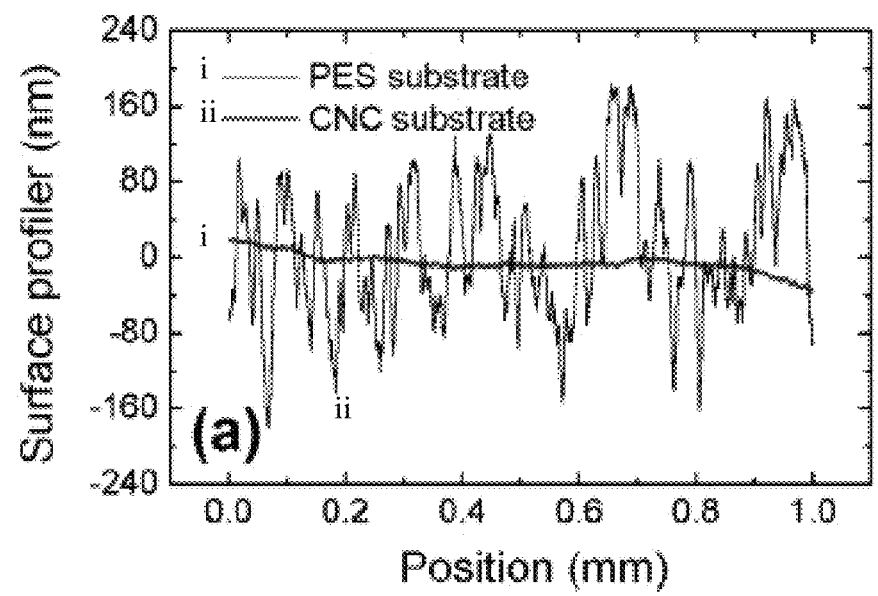

FIG. 179 shows a surface profile of (i) PES and (ii) CNC example substrates.

Figure 180:
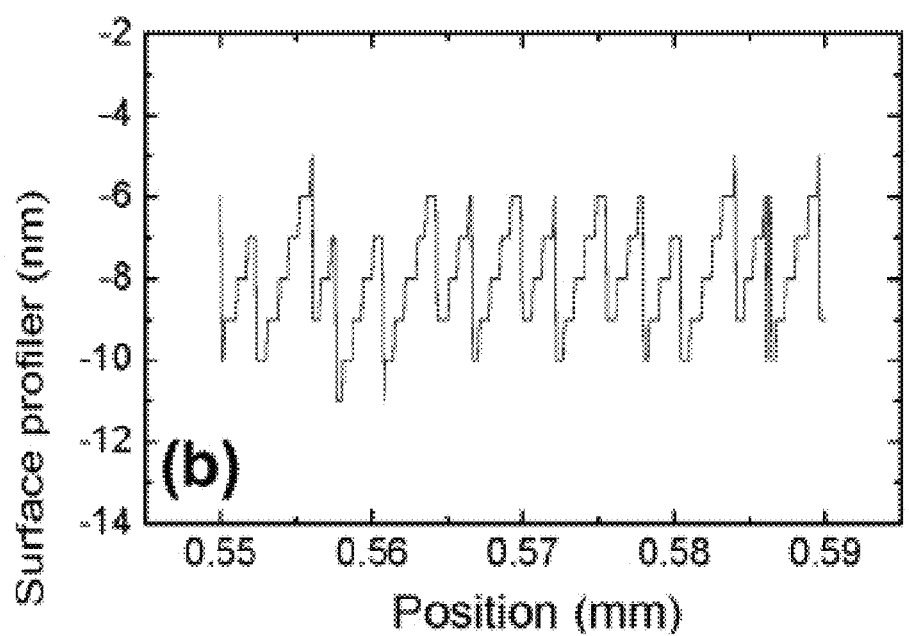

FIG. 180 Shows an enlarged surface profile of a PES substrate.

Figure 181:
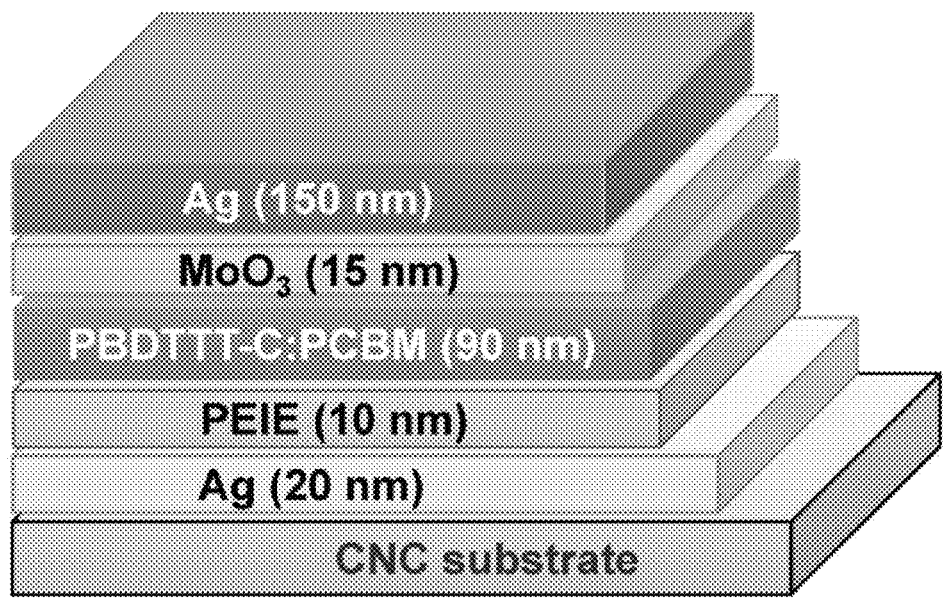

FIG. 181 shows a device structure of an example solar cell on a CNC substrate.

Figure 182:
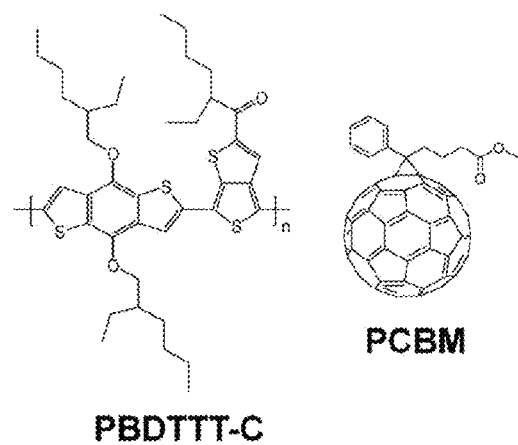

FIG. 182 shows a chemical structure of PBDTTT-C and PCBM.

Figure 183:
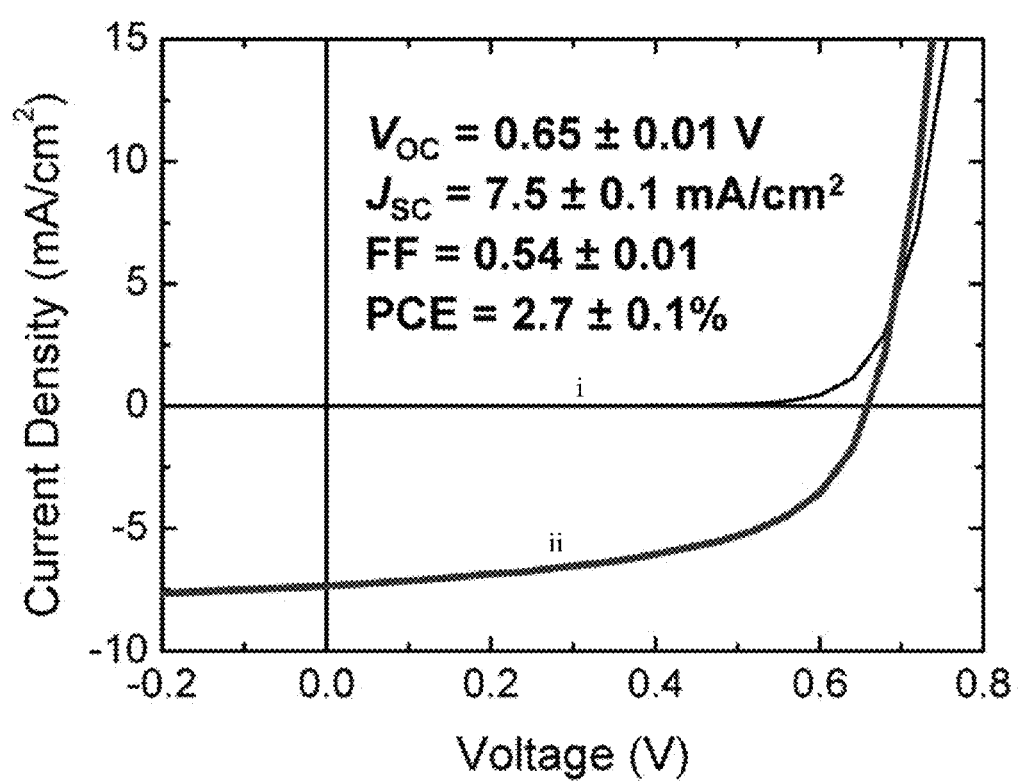

FIG. 183 shows J-V characteristics of an example solar cell on a CNC substrate (i) in the dark, and (ii) under 95 mW/cm² of AM1.5 illumination.

Figure 184:
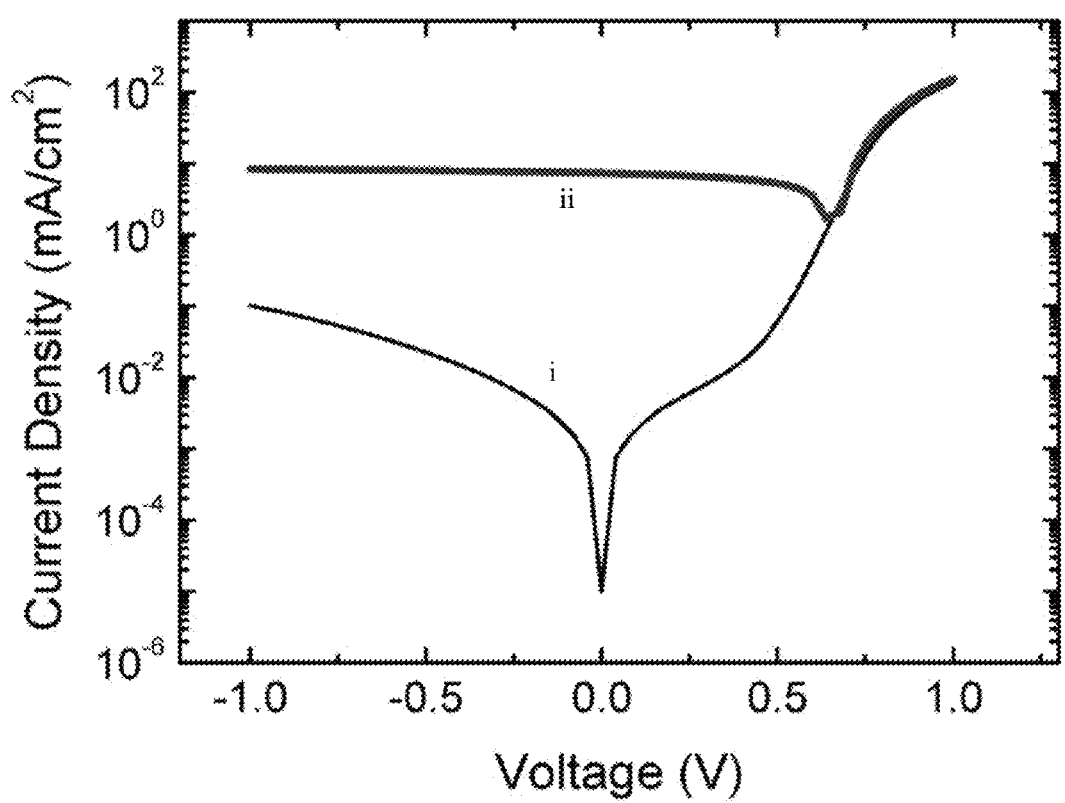

FIG. 184 shows J-V characteristics, as in FIG. 183, but on a semi-logarithmic scale (i) in the dark, and (ii) under illumination.

Figure 185:
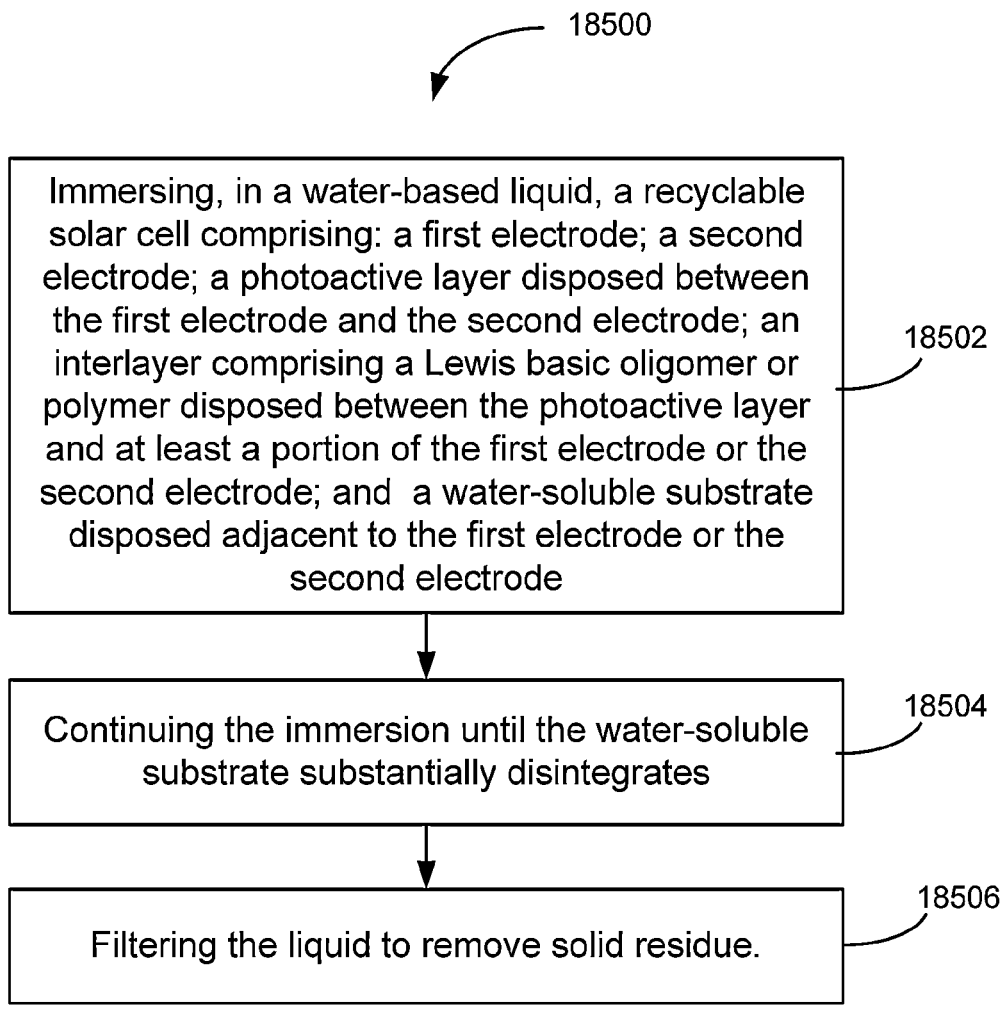

FIG. 185 is a flow-diagram of a method for recycling an organic solar cell, according to an example embodiment of the disclosed technology.

Figure 186:
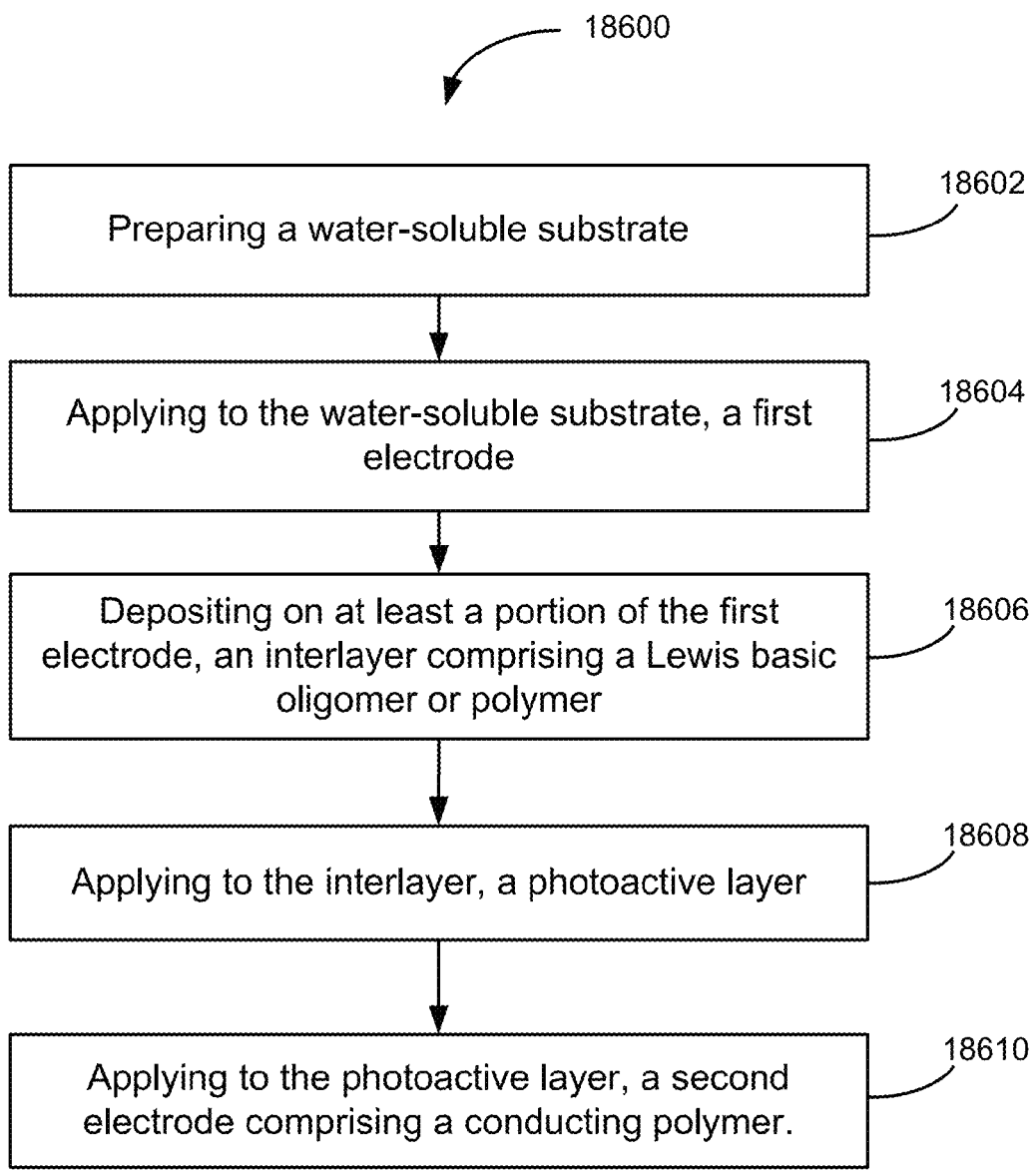

FIG. 186 is a flow diagram of a method for producing a recyclable solar cell using film transfer lamination, according to an example embodiment of the disclosed technology.

DETAILED DESCRIPTION OF THE INVENTION

Embodiments of the invention will be described more fully hereinafter with reference to the accompanying drawings, in which embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

In the following description, numerous specific details are set forth. However, it is to be understood that embodiments of the invention may be practiced without these specific details. In other instances, well-known methods, structures and techniques have not been shown in detail in order not to obscure an understanding of this description. The term "exemplary" herein is used synonymous with the term "example" and is not meant to indicate excellent or best. References to "one embodiment," "an embodiment," "exemplary embodiment," "various embodiments," etc., indicate that the embodiment(s) of the invention so described may include a particular feature, structure, or characteristic, but not every embodiment necessarily includes the particular feature, structure, or characteristic. Further, repeated use of the phrase "in one embodiment" does not necessarily refer to the same embodiment, although it may.

As used herein, unless otherwise specified the use of the ordinal adjectives "first," "second," "third," etc., to describe a common object, merely indicate that different instances of like objects are being referred to, and are not intended to imply that the objects so described must be in a given sequence, either temporally, spatially, in ranking, or in any other manner.

Recyclable organic solar cells are disclosed herein. Systems and methods are further disclosed for producing, improving performance, and for recycling the solar cells. In certain example embodiments, the recyclable organic solar cells disclosed herein include: a first electrode; a second electrode; a photoactive layer disposed between the first electrode and the second electrode; an interlayer comprising a Lewis basic oligomer or polymer disposed between the photoactive layer and at least a portion of the first electrode or the second electrode; and a substrate disposed adjacent to the first electrode or the second electrode. According to example implementations of the disclosed technology, the substrate includes a cellulose nanocrystals material that can be recycled. In certain example embodiments, one or more of the first electrode, the photoactive layer, and the second electrode may be applied by a film transfer lamination method.

According to an example implementation of the disclosed technology, the interlayer may include polyethylenimine (PEI). As will be discussed in detail, and with reference to many examples presented herein, the interlayer reduces the work function associated with the first or second electrode. According to example implementations, the interlayer reduces the work function associated with the first electrode or the second electrode by greater than 0.5 eV. According to an example embodiment, the photoactive layer may include poly(3-hexylthiophene): Indene-C60 Bis-Adduct (P3HT:ICBA).

In certain example implementations, the first and/or second electrodes associated with the recyclable organic solar cell disclosed herein can include, alone or in any combination, one or more of an organic material, a polymer, a metal, a transparent conductive metal-oxide, graphene, metal nanorods, metal particles, metal oxide particles, carbon nanotubes, or a mixture thereof. For example, the second electrode may include a conducting polymer comprising poly(3,4-ethylenedioxythiophene):poly(styrenesulfonate) (PEDOT:PSS).

A module that includes a plurality of solar cells is disclosed herein, according to an example implementation of the disclosed technology. The module includes a plurality of solar cell elements, each solar cell element including: a first electrode; a second electrode; a photoactive layer disposed between the first electrode and the second electrode; an interlayer comprising a Lewis basic oligomer or polymer disposed between the photoactive layer and at least a portion of the first electrode or the second electrode; and a substrate disposed adjacent to the first electrode or the second electrode. Each solar cell element of the module is configured with an associated polarity based at least in part on an arrangement and orientation of the interlayer. In an example implementation, the first electrodes of adjacent solar cell elements x(N) and x(N+1) are connected in a first plane, and the second electrodes of adjacent solar cell elements x(N+1) and x(N+2) are connected in a second plane, wherein x and N are integers.

According to an exemplary embodiment of the disclosed technology, a method is provided for recycling an organic solar cell, the method includes immersing, in a room-temperature water-based liquid, a recyclable solar cell comprising: a first electrode; a second electrode; a photoactive layer disposed between the first electrode and the second electrode; an interlayer comprising a Lewis basic oligomer or polymer disposed between the photoactive layer and at least a portion of the first electrode or the second electrode; and a water-soluble substrate disposed adjacent to the first electrode or the second electrode. The method further includes continuing the immersion until the water-soluble substrate substantially disintegrates; and filtering the liquid to remove solid residue. Certain example implementations may include rinsing the filtered solid residues with a rinsing fluid such as chlorobenzene. In certain embodiments, the rinsing dissolves the photoactive layer.

According to an exemplary embodiment of the disclosed technology, a method is provided for producing a recyclable solar cell using film transfer lamination. The method includes preparing a water-soluble substrate; applying to the water-soluble substrate, a first electrode; depositing on at least a portion of the first electrode, an interlayer comprising a Lewis basic oligomer or polymer; applying to the interlayer, a photoactive layer; and applying to the photoactive layer, a second electrode comprising a conducting polymer. The one or more of the first electrode, the photoactive layer, and the second electrode are applied by film transfer lamination.

According to an example implementation of the disclosed technology, preparing a water-soluble substrate comprises preparing a crystalline cellulose substrate. According to an example implementation of the disclosed technology, the interlayer comprises polyethylenimine (PEI) and wherein the interlayer reduces the work function associated with the first electrode by greater than 0.5 eV. In certain embodiments, the first electrode comprises one or more of an organic material, a polymer, a metal, a transparent conductive metal-oxide, graphene, metal nanorods, metal particles, metal oxide particles, carbon nanotubes, or a mixture thereof. In an example implementation, the second electrode comprises poly(3,4-ethylenedioxythiophene):poly(styrenesulfonate) (PEDOT:PSS). In an example implementation, the photoactive layer includes poly(3-hexylthiophene):Indene-C60 Bis-Adduct (P3HT:ICBA).

The reader may wish to refer to FIGS. 175-186, and sections m1-m2 (towards the end of the detailed description) for an in-depth discussion of the claimed inventions, experimental results and various disclosed embodiments of the recyclable organic solar cells.

A complete discussion of certain preliminary aspects of the disclosed technology, as presented in U.S. patent application Ser. No. 14/117,965 (incorporated herein by reference) are presented in the following sections.

Certain embodiments of the invention may enable methods and devices for producing devices with electrodes that have low-work functions. Currently, so called low-work-function metals (such as calcium, magnesium, barium) may be used as electron-collecting or electrode-injection electrodes, but they easily oxidize when exposed to air. This severely limits the device stability in a regular atmosphere and hinders the potential of these technologies. On the other hand, despite having better air stability, noble metals, transparent conducting oxides and conductive polymers, typically do not have a work function that is low enough to make them efficient electron injection or collection electrodes. Hence, there is a need for new materials and processes that allow the development of low-work-function electrodes which can be processed at low cost, do not hinder the potential for good optical transparency and which have good air stability.

Certain embodiments of the invention may enable methods and devices for reducing a work function of an electrode. One example method includes applying, to at least a portion of one of the electrodes or to a photoactive layer, a solution comprising a Lewis basic oligomer or polymer; and based at least in part on applying the solution, forming an ultra-thin layer on a surface of the electrode, wherein the ultra-thin layer reduces the work function associated with the electrode by greater than 0.5 eV.

According to an exemplary embodiment of the invention, another method is provided for reducing a work function of an electrode. The method includes applying, to at least a portion of the electrode, a solution comprising a Lewis basic oligomer or polymer, wherein the electrode comprises one or more of a metal, an organic material, or mixtures of metals and organic materials; and based at least in part on applying the solution, forming an ultra-thin layer on a surface of the electrode, wherein the ultra-thin layer reduces the work function associated with the electrode by greater than 0.5 eV.

According to an exemplary embodiment of the invention, another method is provided for reducing a work function of an electrode. The method includes applying, to at least a portion of a semiconducting material, a solution comprising a Lewis basic oligomer or polymer; based at least in part on applying the solution, forming an ultra-thin layer on a surface of at least a portion of the semiconducting material; and applying an electrode material to at least a portion of the ultra-thin layer, wherein the electrode comprises one or more of a metal, an organic material, or mixtures of metals and organic materials, and wherein the ultra-thin layer reduces the work function associated with the electrode by greater than 0.5 eV.

According to an exemplary embodiment of the invention, a device is provided. The device includes a semiconductor; at least one electrode disposed adjacent to the semiconductor and configured to transport electrons in or out of the semiconductor; and an ultra-thin layer disposed between the semiconductor and the at least one electrode, the ultra-thin layer comprising an oligomer or polymer wherein the ultra-thin layer reduces the work function associated with the electrode by greater than 0.5 eV.

Exemplary embodiments of the invention relate to the use and processing of ultra-thin polymeric and other types of layers to reduce the work function of metals, noble metals, transparent metal oxides, and conducting polymers. For example, water-soluble polymeric modifiers can be processed from solution and can reduce the work function of high-work-function electrodes by up to 1.3 eV, making them good electron collecting or injecting electrodes. The modified electrodes can be used for the fabrication of organic photovoltaics (OPV), organic light-emitting diodes (OLED) and organic field-effect transistors (OFET), which show good performance as well as good air stability. Exemplary embodiments of the invention may be utilized for reducing the work function of electrodes that include one or more of an organic material, one or more polymers, a noble metal, a transparent conductive metal-oxide, graphene, metal nanorods, metal particles, metal oxide particles, or mixtures thereof.

Exemplary embodiments of the invention include methods for applying a thin-film work function modifying layer such that a device's electrode is adjacent to the thin-film work function modifying layer. In one embodiment, the thin-film work function modifying layer is applied to an electrode layer first, and then subsequent layers may be added to the thin-film. In other exemplary embodiments of the invention, the thin-film modifying layer may be applied to a semiconductor material first, and then an electrode may be applied to the thin-film work function modifying layer. In certain exemplary embodiments, the electrode may be either metal, organic material, or a combination of both. According to certain exemplary embodiments a device is provided with an electrode modified by the thin-film work function modifying layer.

Exemplary embodiments include a method for depositing a solution of an amine polymer layer on a first electrode, thereby reducing the work function of the first electrode, and depositing at least one organic semiconducting layer on the amine polymer layer. The organic semiconducting layer may be solution or vapor deposited. In certain exemplary embodiments, the amine polymer surface modifiers are water-soluble and may be solution deposited by methods known in the art including spin-coating, dip coating, ink-jet printing, screen printing, brushing, etc. In some embodiments, the first electrode may be a conductive material chosen from, for example, noble metals, transparent conducting oxides, or organic conductors (e.g., graphene or conducting polymers). In some embodiments, the amine polymer contains only aliphatic amine functional groups. In other embodiments, the amine polymer comprises primary amine pendant groups and a second or tertiary amine backbone.

According to exemplary embodiment of the invention, the reduction of the work function of several classes of conductive materials may be up to 1.8 eV, which is superior to other methods known in the art. In some embodiments, the work function achieved by the amine polymer surface modification is stable in air at temperatures of up to 190° C., which makes it ideal for the processing of electronic and optoelectronic devices on flexible substrates. Other embodiments are organic diodes, sensors, memories, photodetectors, OPVs, OLEDs, or OFETs made by the methods as described herein.

Exemplary embodiments of the invention include an organic electronic device having a first electrode, an amine polymer layer, at least one organic semiconductor layer, and a second electrode, where the work function of the first electrode is about 1 eV lower than without the amine polymer layer. In some embodiments, the work function of the first electrode modified by the amine polymer layer is less than 4 eV. In other embodiments, the work function is less than 3.6 eV. In some embodiments, the first electrode is a noble metal, a transparent conducting oxide, graphene, or an organic conductor and the amine layer has only aliphatic amine (e.g., primary, secondary, or tertiary amine) functional groups. In certain exemplary embodiments, the organic semiconductor layer may be, for example, a vapor deposited small molecule, a solution or vapor deposited oligomer, or a solution deposited polymer.

Other embodiments include a article having: a substrate; a conducting layer comprising a noble metal, a transparent conducting metal oxide, graphene, or an organic conductor; and an amine polymer layer, where the work function of the conducting layer is at least 1 eV lower than without the amine polymer layer. The amine polymer may have primary, secondary, or tertiary amines.

Certain exemplary embodiments include an organic electronic device comprising a first organic conductor electrode, an amine polymer layer, at least one organic semiconductor layer, and a second organic conductor electrode. In other embodiments, an organic electronic device comprises a polymer substrate, a first organic conductor electrode, at least one organic semiconductor, and a second organic conductor electrode. In some embodiments, the organic electronic device further comprises an amine polymer layer between the first organic conductor electrode and the at least one organic semiconductor, where the first organic conductor electrode has a work function lower than without the amine polymer layer. The organic electronic device may be, for example, a sensor, memory, photodetector, OLED, OPV, or OFET. Other embodiments include a conformable organic photovoltaic device. The conformable device may be conformed, for example, to a roll with radius of at least 3.5 mm without significant reduction in power conversion efficiency (PCE). The composition of the organic semiconductor layer in organic photovoltaic devices can be modified, for example, to select the optical wavelength/s of light that is/are absorbed as is known in the art.

Over the past decade, it has been recognized that the nature of the contact between molecular or polymeric semiconductors and conductive materials is complex, often difficult to understand and optimize. The work function of a conductive material can be altered by molecular adsorption which modifies the work function of the conductor through what is commonly known as the "pillow effect", making the work function dependent on the device processing conditions. Organic semiconductors typically have electron affinities with low values, typically in the range of 2-4 eV, which makes the fabrication of ohmic contacts difficult with metals and conductors that have good environmental stability. Furthermore, during the formation of an interface, chemical reactions, the diffusion of molecular species and other physical or chemical interactions can lead to the formation of reacted or diffuse interfaces where interface states and interface dipoles can severely alter the energetic alignment of the molecular orbitals of the organic semiconductors. The complexity of these interfaces underscore the difficulty of finding reliable ways to modify the work function of air-stable conducting materials that at the same time, provide an electrical interface for either the efficient collection or injection of carriers and which can be processed at low-cost.

In general, noble metals, transparent conducting oxides and conductive polymers do not have a work function that is low enough to make them efficient electron injection or collection electrodes. To date, low-work function electrodes have been realized by following two approaches. In the first approach, conductive metal-oxides with a relatively low work function are used, such as ZnO, $In_2O_3$, aluminum doped zinc oxide or indium zinc oxide. OPVs and metal-oxide thin-film transistors have been demonstrated following this approach, but OLEDs have not been demonstrated because common electron transport materials used have low value electron affinities compared with the typical work functions of these conductive metal-oxide electrodes.

According to exemplary embodiments of the invention, conductive layers can be modified by using an ultrathin layer of a molecule or a polymer. The ultrathin layer may create surface dipoles that, if pointing in the proper direction, can induce vacuum level shifts that reduce the work function of the underneath conductive material. One approach for reducing an electrode work function is to chemically link such dipolar molecules by using self-assembled monolayer's (SAMs). Following this approach, the work function of ITO has been increased or decreased. However, while SAM's offer a route to improve the stability of the work function modification, their processing is very slow, require specific surface chemistry that enable the reaction with the SAM molecules and their coverage density is very sensitive to the surface roughness of the conductive materials.

In another approach it was demonstrated that the work function of indium tin oxide (ITO) could be increased from 4.4 eV to 5.1 eV by treating the ITO with an acidic material such as $H_3PO_4$ or decreased to 3.9 eV when treated with a base such as $N(C_4H_3)_4OH$. Amine-containing small molecules have been used to show up to 0.9 eV reductions of the work function of ITO, Au and conducting polymers [Poly(3, 4-ethylenedioxythiophene):poly(styrenesulfonate), PEDOT: PSS]. However, in these examples, modification of the work function was either achieved with small molecules that are generally processed by physical vapor deposition techniques that require high vacuum, or by exposing the conductors to saturated vapors of small molecules. These processing conditions are limiting and present challenges for the manufacturing of devices over large areas at low production cost. In addition, these small molecules are soluble in common organic solvents which may prevent the solution-processing on organic layers on top of them. Coverage, reproducibility and stability of the work function modification following these approaches where small-molecules are adsorbed at the surface of the conductive material remain challenging issues and are addressed by certain exemplary embodiments of the invention.

According to exemplary embodiments of the invention, a polymer may be utilized as a backbone for an electrode work-function modifying material. In an exemplary embodiment, the material may contain a guanidine group that is oligomeric or polymeric where the polymer may be linear or branched. A polymer backbone, according to this exemplary embodiment, is illustrated in FIG. 148. FIG. 149 depicts the use of as a pendent group for attaching the guanidine group, according to an exemplary embodiment of the invention. In certain exemplary embodiment, the nitrogen atoms with the guanidine group not specifically involved in bonding to the polymer may themselves be substituted with a linear, cyclic or branched alkyl or aryl or hetero aryl group, or hydrogen. Therefore A, B, C, D, E, F, G, H, I, and J may independently be selected from H, a linear cyclic, or branched alkyl group containing between 1 and 2 carbon atoms, or an aryl or heteroaryl group.

As used herein, "alkyl" refers to a straight-chain or branched saturated hydrocarbon group. Examples of alkyl groups include methyl (Me), ethyl (Et), propyl (e.g., n-propyl and iso-propyl), butyl (e.g., n-butyl, iso-butyl, sec-butyl, tert-butyl), pentyl groups (e.g., n-pentyl, iso-pentyl, neopentyl), and the like. In various embodiments, an alkyl group can have 1 to 30 carbon atoms, for example, 1-20 carbon atoms (i.e., Ci-20 alkyl group). In some embodiments, an alkyl group can have 1 to 6 carbon atoms, and can be referred to as a "lower alkyl group." Examples of lower alkyl groups include methyl, ethyl, propyl (e.g., n-propyl and iso-propyl), and butyl groups (e.g., n-butyl, iso-butyl, sec-butyl, tert-butyl). In some embodiments, alkyl groups can be substituted with 1-5 R1 groups and R1 is as defined herein.

As used herein, "heteroatom" refers to an atom of any element other than carbon or hydrogen and includes, for example, nitrogen, oxygen, silicon, sulfur, phosphorus, and selenium.

As used herein, "heteroaryl" refers to an aromatic monocyclic ring system containing at least one ring heteroatom selected from oxygen (O), nitrogen (N), sulfur (S), silicon (Si), and selenium (Se), or a polycyclic ring system wherein at least one of the rings present in the ring system is aromatic and contains at least one ring heteroatom. A heteroaryl group, as a whole, can have, for example, from 5 to 16 ring atoms and contain 1-5 ring heteroatoms (i.e., 5-16 membered heteroaryl group). In some embodiments, heteroaryl groups can be substituted with one or more terminal R1 groups, where R1 is as defined herein. Both substituted and unsubstituted heteroaryl groups described herein can comprise between 1-30, or 1-20 carbon atoms, including the R1 substituents.

Exemplary embodiments of the invention include a method for reducing a work function of an electrode by applying, to at least a portion of the electrode, a solution comprising a Lewis basic oligomer or polymer; and based at least in part on applying the solution, forming an ultra-thin layer on a surface of the electrode, wherein the ultra-thin layer reduces the work function associated with the electrode by greater than 0.5 eV.

Those skilled in the art will recognize that a Lewis base is an atomic or molecular species where the highest occupied molecular orbital (HOMO) is highly localized. Typical Lewis bases are conventional amines such as ammonia and alkyl amines. Other common Lewis bases include pyridine and its derivatives. Some of the main classes of Lewis bases include, but are not limited to: (1) amines of the formula $NH_3$-xRx where R=alkyl or aryl; (2) pyridine and its derivatives; (3) phosphines of the formula $PR_3$-xAx, where R=alkyl, A=aryl; and (4) compounds of O, S, Se and Te in oxidation state 2, including water, ethers, and ketones.

The most common Lewis bases are anions. The strength of Lewis basicity correlates with the pKa of the parent acid. For example, acids with high pKa's give good Lewis bases, and weaker acid have a stronger conjugate base.

Examples of Lewis bases based on the general definition of electron pair donor include, but are not limited to (1) simple anions, such as H— and F—; (2) other lone-pair-containing species, such as H2O, NH3, HO—, and CH3-; (3) complex anions, such as sulfate; and (3) electron rich π-system Lewis bases, such as ethyne, ethene, and benzene.

Other embodiments include a method for reducing a work function of an electrode by applying, to at least a portion of a semiconducting material, a solution comprising a Lewis basic oligomer or polymer, and based at least in part on applying the solution, forming an ultra-thin layer on a surface of at least a portion of the semiconducting material; and applying an electrode material, to at least a portion of the ultra-thin layer, wherein the ultra-thin layer reduces the work function associated with the electrode by greater than 0.5 eV.

Other embodiments include a method for reducing a work function of an electrode by applying, to at least a portion of the electrode, a solution comprising a Lewis basic oligomer or polymer, wherein the electrode comprises one or more of a metal, an organic material, or mixtures of metals and organic materials, and, based at least in part on applying the solution, forming an ultra-thin layer on a surface of the electrode, wherein the ultra-thin layer reduces the work function associated with the electrode by greater than 0.5 eV.

Other embodiments include a method for reducing a work function of an electrode by applying, to at least a portion of a semiconducting material, a solution comprising a Lewis basic oligomer or polymer, and based at least in part on applying the solution, forming an ultra-thin layer on a surface of at least a portion of the semiconducting material; and applying an electrode material to at least a portion of the ultra-thin layer, wherein the electrode comprises one or more of a metal, an organic material, or mixtures of metals and organic materials, and wherein the ultra-thin layer reduces the work function associated with the electrode by greater than 0.5 eV.

In certain exemplary embodiments, forming the ultra-thin layer from the solution reduces the work function associated with the electrode, wherein the work function is stable in ambient air and varies by less than 20 percent over a period of greater than 10 hours after forming the ultra thin layer. In certain exemplary embodiments, forming the ultra-thin layer comprises forming, on the electrode, an insulating layer having a thickness less than 100 nm, preferably less than 50 nm and more preferably less than 25 nm. According to exemplary embodiments, the ultra-thin layer includes forming, on the electrode, an insulating layer having a thickness less than 10 nm and preferably less than 5 nm. According to certain exemplary embodiments, applying the solution includes applying a Lewis basic oligomer or polymer comprising nitrogen in a trivalent state bonded to carbon in a tetravalent state. In certain exemplary embodiments, applying the solution includes applying a Lewis basic oligomer or polymer comprising oxygen in a divalent state bonded to carbon in a tetravalent state. In certain exemplary embodiments, applying the solution comprises applying a Lewis basic oligomer or polymer comprising sulfur in a divalent state bonded to carbon in a tetravalent state. In certain exemplary embodiments, applying the solution comprises applying the Lewis basic oligomer or polymer, wherein the Lewis basic oligomer or polymer comprises molecules having molecular weight greater than 0.1 kDa and less than 1000 kDa. In certain exemplary embodiments, applying the solution to at least a portion of the electrode comprises applying the solution to one or more of an organic material, one or more polymers, a metal, a transparent conductive metal-oxide, graphene, metal nanorods, metal particles, or metal oxide particles, or a mixture thereof. In accordance with exemplary embodiments of the invention, forming the ultra-thin layer reduces the work function associated with the electrode by forming an interfacial dipole at the interface between a surface of the electrode and a surface of the ultra-thin layer.

In an exemplary embodiment of the invention, a device is provided that includes a semiconductor; at least one electrode disposed adjacent to the semiconductor and configured to transport electrons in or out of the semiconductor; and an ultra-thin layer disposed between the semiconductor and the at least one electrode, the ultra-thin layer comprising an oligomer or polymer wherein the ultra-thin layer reduces the work function associated with the electrode by greater than 0.5 eV. In certain exemplary embodiments, the device's electrode work function is stable in ambient air and varies by less than 20 percent over a period of greater than 10 hours.

In certain exemplary embodiments, the comprises one or more of a diode, a photovoltaic, a light-emitting diode, a field-effect transistor, a sensor, a memory, or a photodetector. In certain exemplary embodiments, the device comprises an organic material. In certain exemplary embodiments, the semiconductor comprises a metal-oxide. In certain exemplary embodiments, the semiconductor is an organic semiconductor. In certain exemplary embodiments, the semiconductor and the at least one electrode comprise organic material. In certain exemplary embodiments, all materials and layers of the device are organic-based.

In accordance with certain exemplary embodiments of the invention, the at least one electrode comprises one or more of an organic material, one or more polymers, a metal, a transparent conductive metal-oxide, graphene, metal nanorods, metal particles, or metal oxide particles, or a mixture thereof. In certain exemplary embodiments, the ultra-thin layer comprises an amine polymer. In certain exemplary embodiments, the amine polymer comprises aliphatic amine functional groups. In certain exemplary embodiments, the amine polymer comprises primary amine pendant groups and a second or tertiary amine backbone. In certain exemplary embodiments, the device is flexible and conformable with a bend radius of less than 8 mm. In certain exemplary embodiments, the ultra-thin layer comprises an insulating layer having a thickness less than 50 nm and preferably less than 25 nm. In other exemplary embodiments, the ultra-thin layer comprises an insulating layer having a thickness less than 10 nm and preferably less than 5 nm. In certain exemplary embodiments, the ultra-thin layer comprises nitrogen in a trivalent state bonded to carbon in a tetravalent state. In certain exemplary embodiments, the ultra-thin layer comprises oxygen in a divalent state bonded to carbon in a tetravalent state. In certain exemplary embodiments, the ultra-thin layer comprises sulfur in a divalent state bonded to carbon in a tetravalent state. In certain exemplary embodiments, the ultra-thin layer comprises an oligomer or polymer comprising molecules having molecular weight greater than 0.1 kDa and less than 1000 kDa. In certain exemplary embodiments, the ultra-thin layer reduces the work function associated with the at least one electrode by forming an interfacial dipole at the interface between a surface of the at least one electrode and a surface of the ultra-thin layer.

Various processes and materials may be utilized for reducing a work-function of an electrode material, according to example embodiments of the invention, and will now be described with reference to the accompanying examples, figures and tables.

An example method 14400 for reducing a work function of an electrode will now be described with reference to the flowchart of FIG. 144. The method 14400 starts in block 14402, and according to an example embodiment of the invention, includes applying, to at least a portion of the electrode, a solution comprising a Lewis basic oligomer or polymer. In block 14404, the method 14400 includes, based at least in part on applying the solution, forming an ultra-thin layer on a surface of the electrode, wherein the ultra-thin layer reduces the work function associated with the electrode by greater than 0.5 eV. The method 14400 ends after block 14404.

An example method 14500 for reducing a work function of an electrode will now be described with reference to the flowchart of FIG. 145. The method 14500 starts in block 14502, and according to an example embodiment of the invention, includes applying, to at least a portion of a semiconducting material, a solution comprising a Lewis basic oligomer or polymer. In block 14504, the method 14500 includes, based at least in part on applying the solution, forming an ultra-thin layer on a surface of at least a portion of the semiconducting material. In block 14506, the method 14500 includes applying an electrode material, to at least a portion of the ultra-thin layer, wherein the ultra-thin layer reduces the work function associated with the electrode by greater than 0.5 eV. The method 14500 ends after block 14506.

An example method 14600 for reducing a work function of an electrode will now be described with reference to the flowchart of FIG. 146. The method 14600 starts in block 14602, and according to an example embodiment of the invention, includes applying, to at least a portion of the electrode, a solution comprising a Lewis basic oligomer or polymer, wherein the electrode comprises one or more of a metal, an organic material, or mixtures of metals and organic materials. In block 14604, the method 14600 includes, based at least in part on applying the solution, forming an ultra-thin layer on a surface of the electrode, wherein the ultra-thin layer reduces the work function associated with the electrode by greater than 0.5 eV. The method 14600 ends after block 14604.

An example method 14700 for reducing a work function of an electrode will now be described with reference to the flowchart of FIG. 147. The method 14700 starts in block 14702, and according to an example embodiment of the invention, includes applying, to at least a portion of a semi-conducting material, a solution comprising a Lewis basic oligomer or polymer. In block 14704, the method 14700 includes, based at least in part on applying the solution, forming an ultra-thin layer on a surface of at least a portion of the semiconducting material. In block 14706, the method 14700 includes applying an electrode material to at least a portion of the ultra-thin layer, wherein the electrode comprises one or more of a metal, an organic material, or mixtures of metals and organic materials, and wherein the ultra-thin layer reduces the work function associated with the electrode by greater than 0.5 eV. The method 14700 ends after block 14706.

Technical Effects

According to example embodiments, certain technical effects can be provided, such as creating certain systems and methods for producing recyclable organic solar cells. Example embodiments of the invention can provide the further technical effects of providing systems and methods for an interlayer within the solar cell that reduces the work function associated with the first or second electrode of the solar cell. Example embodiments of the invention can provide the further technical effects of providing recyclable organic solar cells that utilize a recyclable substrates comprising cellulose nanocrystals (CNC). Example embodiments of the invention can provide the further technical effects of providing systems and methods for applying one or more of the first electrode, the photoactive layer, and the second electrode of the solar cell by a film transfer lamination method.

Example embodiments of the invention can provide the further technical effects of providing systems and methods for reducing a work function associated with an electrode. Example embodiments of the invention can provide the further technical effects of providing systems and methods for manufacturing electronic devices that are partially or totally made from organic materials.

EXAMPLES

Examples A1-A8

Use of PEIE to Reduce the Work Function of High Work-Function Electrodes

Figure 1:
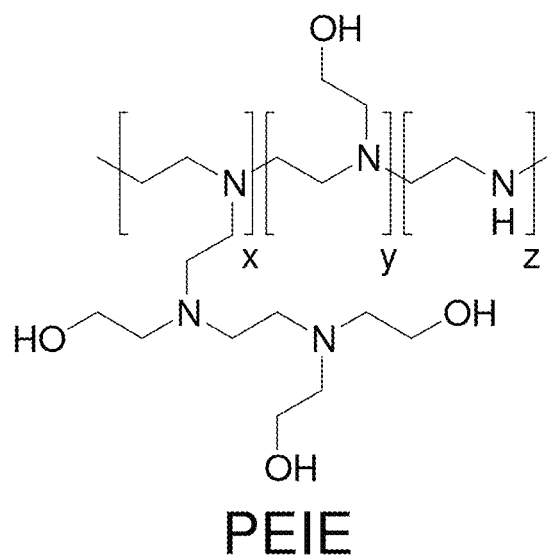
FIG. 1 depicts the chemical structure of polyethylenimine ethoxylated (PEIE).

FIG. 1 depicts the chemical structure of polyethylenimine ethoxylated (PEIE), which may be utilized to reduce the work function of high work-function electrodes, according to exemplary embodiments of the invention.

Example A1

Work Function Reduction of Indium Tin Oxide (ITO) by PEIE

Figure 2:
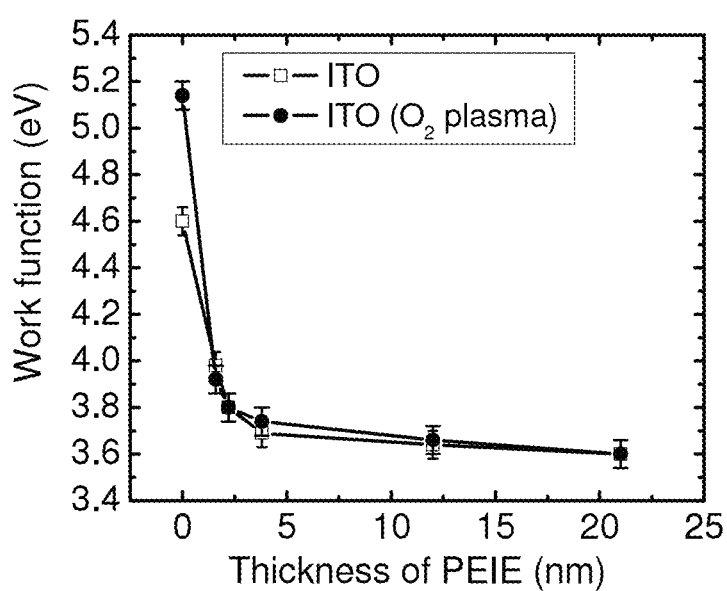
FIG. 2 shows the work function of indium tin oxide (ITO) modified by PEIE with different thicknesses, according to an exemplary embodiment of the invention.

FIG. 2 shows the measured work function reduction of indium tin oxide (ITO) modified by different thickness of PEIE, according to exemplary embodiments of the invention.

In experiments, Indium tin oxide (ITO)-coated glass substrates (Colorado Concept Coatings LLC) with a sheet resistivity of ~15 Ω/sq were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths. For some ITO substrates, $O_2$ plasma treatment was applied for three minutes.

Polyethylenimine, 80% ethoxylated (PEIE) (Mw=70,000 g/mol), which was dissolved in $H_2O$ with a concentration of 35-40 wt. % when received from Aldrich, was diluted into methoxyethanol to weight concentrations of 0.05%, 0.1%, 0.2%, 0.5% and 1%. Then these solutions were spin coated onto cleaned ITO substrates and plasma-treated ITO substrates at a speed of 5000 rpm for 1 min and an acceleration of 1000 rpm/s. Then these samples were annealed at 120° C. for 10 min on hotplate in ambient air. For thicknesses measurement, another set of samples were prepared on silicon wafer substrates prepared under the same condition on ITO substrates. Thicknesses were measured to be 1.6, 2.2, 3.8, 12, 21 nm by spectroscopic ellipsometry (J. A. Woollam Co.). The work function of the ITO/PEIE samples was measured in air using a Kelvin probe (Besocke Delta Phi) and averaged over three locations. A highly ordered pyrolytic graphite (HOPG) sample with a work function of 4.5 eV was used as the reference sample.

Example A2

Work Function Reduction of ITO/ZnO by PEIE

Figure 3:
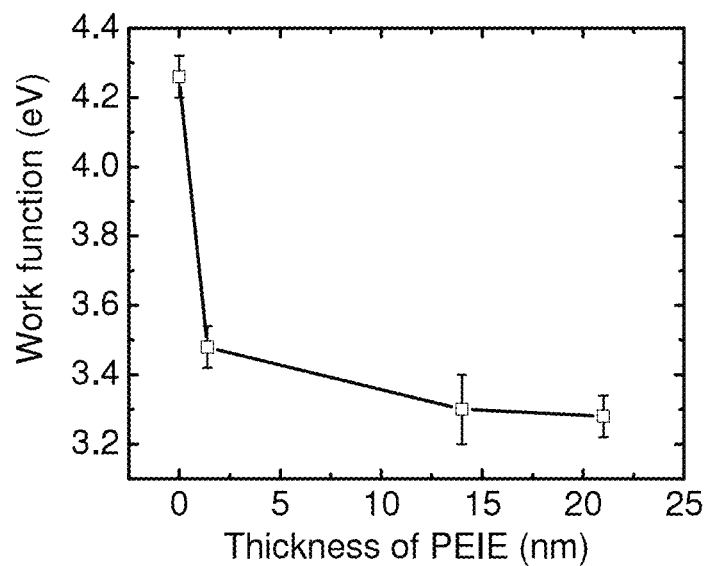
FIG. 3 shows the work function of fluorine-doped tin oxide (FTO) modified by PEIE with different thicknesses, according to an exemplary embodiment of the invention.

FIG. 3 shows the work function of ITO/ZnO modified by PEIE with different thicknesses, according to exemplary embodiments of the invention. In a study of reducing the work function of ITO/ZnO by PEIE, indium tin oxide (ITO)-coated glass (Colorado Concept Coatings LLC) with a sheet resistivity of ~15 Ω/sq was used as substrate. The substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths. ZnO films (200 cycles) were deposited on the cleaned ITO substrates with pulses of $H_2O$ for 15 ms and diethylzinc for 15 ms at 200° C. using an ALD system (Savannah 100, Cambridge NanoTech, Cambridge, Mass.). The thickness of ZnO was 25 nm, measured using a profilometer (Dektak 6M Stylus, Veeco, Plainview, N.Y.).

Polyethylenimine, 80% ethoxylated (PEIE) (Mw=70,000 g/mol), which was dissolved in $H_2O$ with a concentration of 35-40 wt % when received from Aldrich, was diluted into methoxyethanol to weight concentrations of 0.05%, 0.5% and 1%. Then these solutions were spin coated onto the ITO/ZnO substrates at a speed of 5000 rpm for 1 min and an acceleration of 1000 rpm/s. Then these samples were annealed at 120° C. for 10 min on hotplate in ambient air. For thicknesses measurement, another set of samples were prepared on silicon wafer substrates prepared under the same condition on ITO/ZnO substrates. Thicknesses were measured to be 1.4, 14 and 21 nm using spectroscopic ellipsometry (J. A. Woollam Co.).

The work function of the ITO/ZnO/PEIE samples was measured in air using a Kelvin probe (Besocke Delta Phi) and averaged over three locations. A highly ordered pyrolytic graphite (HOPG) sample with a work function of 4.5 eV was used as the reference sample.

Example A3

Work Function Reduction of Fluorine-Doped Tin Oxide (FTO) by PEIE

Fluorine-doped tin oxide (FTO) glass substrates (TEC-15, Hartford Glass Co. Inc) with a sheet resistivity of ~15 Ω/sq were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths. For some FTO substrates, $O_2$ plasma treatment was applied for three minutes.

Polyethylenimine, 80% ethoxylated (PEIE) (Mw=70,000 g/mol), which was dissolved in $H_2O$ with a concentration of 35-40 wt. % when received from Aldrich, was diluted into methoxyethanol to weight concentrations of 0.05% and 0.5%. Then these solutions were spin coated onto cleaned FTO substrates and plasma-treated ITO substrates at a speed of 5000 rpm for 1 min and an acceleration of 1000 rpm/s. Then these samples were annealed at 120° C. for 10 min on hotplate in ambient air. For thicknesses measurement, another set of samples were prepared on silicon wafer substrates prepared under the same condition on ITO substrates. Thicknesses were measured to be 1.6 and 12 nm by spectroscopic ellipsometry (J. A. Woollam Co.).

The work function of the FTO/PEIE samples was measured in air using a Kelvin probe (Besocke Delta Phi) and averaged over three locations. A highly ordered pyrolytic graphite (HOPG) sample with a work function of 4.5 eV was used as the reference sample. Work function of FTO modified by PEIE is summarized in Table 1.

TABLE 1

Work function reduction of Fluorine-doped tin oxide (FTO) by PEIE

| Samples | Work function (eV) |
| --- | --- |
| Clean FTO | 4.68 ± 0.04 |
| FTO with $O_2$ plasma treatment | 5.34 ± 0.06 |
| FTO/PEIE (1.6 nm) | 3.98 ± 0.06 |
| FTO/PEIE (12 nm) | 3.80 ± 0.06 |

Example A4

Work Function Reduction of Conducting Polymer PEDOT:PSS by PEIE

Microscope glasses and indium tin oxide (ITO)-coated glass (Colorado Concept Coatings LLC) with a sheet resistivity of ~15 Ω/sq were used as substrate. The substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths. Substrates were treated by $O_2$ for 3 min to tune the surface becoming hydrophilic.

High conductivity PEDOT:PSS PH1000 (CLEVIOS™ PH 1000, HC Stack Inc., MA) with 5% DMSO was spin coated microscope glass substrates at a speed of 1000 rpm for 30 s and an acceleration of 1000 rpm/s and annealed at 140° C. for 10 min on a hot plate in air. Its thickness was 130 nm, measured using a profilometer (Dektak 6M Stylus, Veeco, Plainview, N.Y.).

Low conductivity PEDOT:PSS 4083 (CLEVIOS™ P VP AI 4083) was spin coated on ITO glass substrates at a speed of 5000 rpm for 1 min and an acceleration of 1000 rpm/s and annealed at 140° C. for 10 min on a hot plate in air. It thickness was 40 nm.

Polyethylenimine, 80% ethoxylated (PEIE) (Mw=70, 000), which was dissolved in $H_2O$ with a concentration of 35-40 wt. % when received from Aldrich, was diluted into methoxyethanol to a weight concentration of 0.5%. The solution was spin coated onto glass/PH1000 and ITO glass/PEDOT:PSS 4083 samples at a speed of 5000 rpm for 1 min and an acceleration of 1000 rpm/s. Then these samples were annealed at 120° C. for 10 min on hotplate in ambient air. For thicknesses measurement, another set of samples were prepared on silicon wafer substrates prepared under the same condition on ITO substrates. Thicknesses were measured to be 12 nm by spectroscopic ellipsometry (J. A. Woollam Co.).

The work function of all the samples was measured in air using a Kelvin probe (Besocke Delta Phi) and averaged over three locations. A highly ordered pyrolytic graphite (HOPG) sample with a work function of 4.5 eV was used as the reference sample. Work function of PEDOT:PSS modified by PEIE is summarized in Table 2.

TABLE 2

Work function reduction of PEDOT:PSS by PEIE

| Samples | Work function (eV) |
| --- | --- |
| PH1000 | 4.90 ± 0.06 |
| PH1000/PEIE (12 nm) | 3.58 ± 0.06 |
| ITO/PEDOT:PSS 4083 | 5.00 ± 0.06 |
| ITO/PEDOT:PSS 4083/PEIE (12 nm) | 3.60 ± 0.06 |

Example A5

Work Function Reduction of Au by PEIE

Microscope glasses substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths.

Ti (10 nm)/Au (60 nm) was deposited on glass substrates by e-beam deposition (AXXIS, Kurt J. Lesker).

Polyethylenimine, 80% ethoxylated (PEIE) (Mw=70,000 g/mol), which was dissolved in $H_2O$ with a concentration of 35-40 wt. % when received from Aldrich, was diluted into methoxyethanol to the weight concentration of 0.5%. Then the solution was spin coated onto glass/Ti/Au at a speed of 5000 rpm for 1 min and an acceleration of 1000 rpm/s and annealed at 120° C. for 10 min on hot plate in ambient air. The thickness of PEIE was 12 nm determined by spectroscopic ellipsometry (J. A. Woollam Co.).

Work function of the Au/PEIE samples was measured in air using a Kelvin probe (Besocke Delta Phi) and averaged three locations. A highly ordered pyrolytic graphite (HOPG) sample with a work function of 4.5 eV was used as the reference sample. Work function of Au modified by PEIE is summarized in Table 3.

TABLE 3

Work function reduction of Au by PEIE

| Samples | Work function (eV) |
|---|---|
| Au | 5.26 ± 0.06 |
| Au/PEIE (12 nm) | 3.90 ± 0.06 |

Example A6

Work Function Reduction of Ag by PEIE

Microscope glasses substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths.

Ag (150 nm) was deposited on glass substrates using a vacuum thermal evaporation system (SPECTROS, Kurt J. Lesker).

Polyethylenimine, 80% ethoxylated (PEIE) (Mw=70,000 g/mol), which was dissolved in $H_2O$ with a concentration of 35-40 wt. % when received from Aldrich, was diluted into methoxyethanol to the weight concentration of 0.5%. It was spin coated onto the substrates at a speed of 5000 rpm for 1 min and an acceleration of 1000 rpm/s. Then these samples were annealed at 100° C. for 10 min on hotplate in ambient air. Its thickness was measured to be 10 nm by spectroscopic ellipsometry (J. A. Woollam Co.).

Work function of the Ag/PEIE samples was measured in air using a Kelvin probe (Besocke Delta Phi) and averaged three locations. A highly ordered pyrolytic graphite (HOPG) sample with a work function of 4.5 eV was used as the reference sample. Work function of Ag modified by PEIE is summarized in Table 4.

TABLE 4

Work function reduction of Ag by PEIE

| Samples | Work function (eV) |
|---|---|
| Ag | 4.60 ± 0.06 |
| Ag/PEIE (10 nm) | 3.70 ± 0.06 |

Example A7

Work Function Reduction of Graphene by PEIE

Polyethylenimine, 80% ethoxylated (PEIE) (Mw=70,000 g/mol), which was dissolved in $H_2O$ with a concentration of 35-40 wt. % when received from Aldrich, was diluted into methoxyethanol to the weight concentration of 0.5%. It was spin coated onto the substrates at a speed of 5000 rpm for 1 min and an acceleration of 1000 rpm/s. Then these samples were annealed at 100° C. for 10 min on hotplate in ambient air. Its thickness was measured to be 10 nm by spectroscopic ellipsometry (J. A. Woollam Co.).

Work function of the Ag/PEIE samples was measured in air using a Kelvin probe (Besocke Delta Phi) and averaged three locations. A highly ordered pyrolytic graphite (HOPG) sample with a work function of 4.5 eV was used as the reference sample. Work function of graphene modified by PEIE is summarized in Table 5.

TABLE 5

Work function reduction of graphene by PEIE

| Samples | Work function (eV) |
|---|---|
| Graphene | 4.54 ± 0.06 |
| Graphene/PEIE(10 nm) | 3.80 ± 0.10 |

Example A8-A12

Characterization of PEIE-Modified Electrodes by UPS and XPS

Example A8

ITO (without Plasma Treatment) Modified by PEIE

Polyethylenimine, 80% ethoxylated (PEIE) (Mw=70,000 g/mol), which was dissolved in $H_2O$ with a concentration of 35-40 wt. % when received from Aldrich, was diluted into methoxyethanol to the weight concentration of 0.5% or 0.05%. It was spin coated onto the ITO substrates at a speed of 5000 rpm for 1 min, yielding a thickness of 1.6 nm and 12 nm, respectively. Then these samples were transferred into an ultra-high vacuum (UHV) analysis chamber to conduct UPS and XPS measurements. He I (21.22 eV) radiation line from a discharge lamp was used in UPS, with an experimental resolution of 0.15 eV. For composition and chemical analysis the films were measured by XPS using the Al Kα (1486.6 eV) photon line with a spectral resolution of 0.8 eV.

Figure 4:
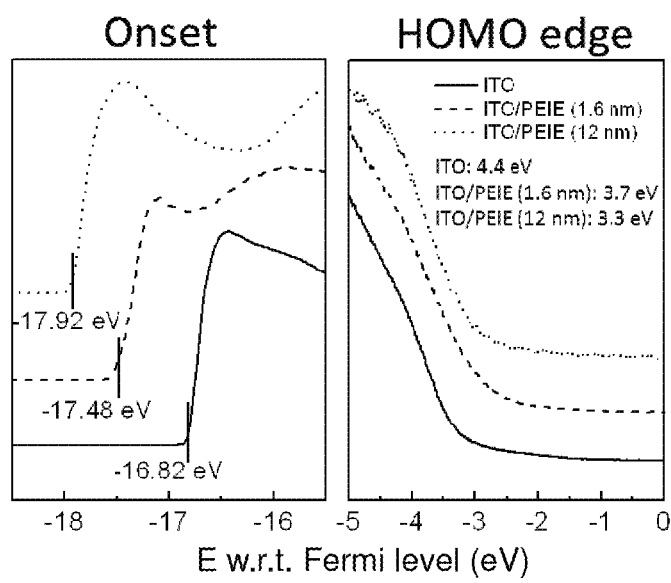
FIG. 4 shows an ultraviolet photoelectron spectroscopy (UPS) spectra of ITO, ITO/PEIE (1.6 nm), and ITO/PEIE (12 nm, according to an exemplary embodiment of the invention.

FIG. 4 shows an ultraviolet photoelectron spectroscopy (UPS) spectra of ITO, ITO/PEIE (1.6 nm), and ITO/PEIE (12 nm, according to an exemplary embodiment of the invention. FIG. 4 shows that the deposition a PEIE layer onto ITO leads to a shift of the photoemission onset towards lower binding energy, corresponding to a downward shift of the vacuum level, and therefore a reduction of the work function. The resulting work function of a 1.6 nm and 12 nm thick PEIE layers on ITO is 3.7 eV and 3.3 eV, respectively.

Figure 5:
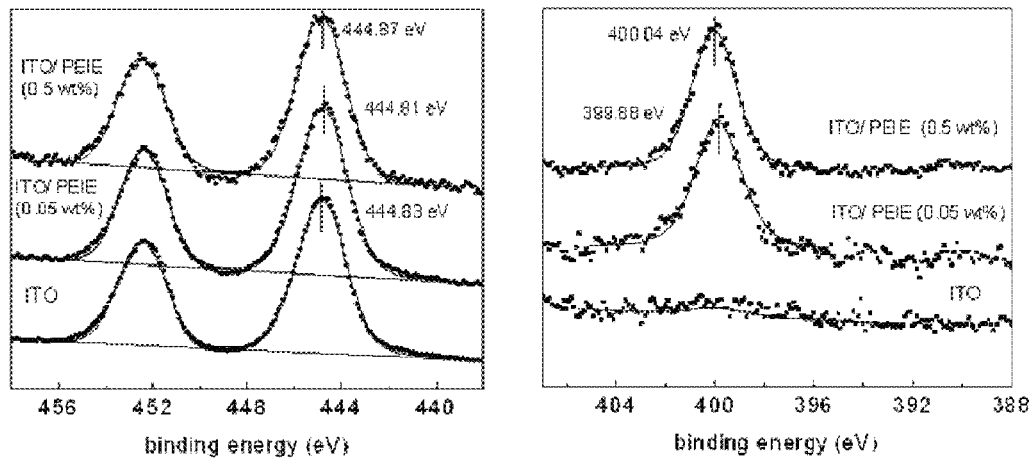
FIG. 5 shows X-ray photoelectron spectroscopy (XPS) spectra of ITO, ITO/PEIE (1.6 nm) and ITO/PEIE (12 nm), according to an exemplary embodiment of the invention. The left panel shows the In 3d core level peaks and right panel shows the N 1s core level peaks.

FIG. 5 shows XPS spectra of ITO, ITO/PEIE (1.6 nm) and ITO/PEIE (12 nm). The left panel of FIG. 5 shows the In 3d core level peaks and right panel shows the N 1s core level peaks. When PEIE was deposited onto ITO no significant shift of the In 3d core level peak was observed as shown in FIG. 5 indicating that there is only a weak or no interaction with the ITO substrate. The N 1s core level peak at around 400 eV (FIG. 5) verifies the thin films deposition of PEIE on ITO.

Example A9

Plasma-Treated ITO Modified by PEIE

Polyethylenimine, 80% ethoxylated (PEIE) (Mw=70,000 g/mol), which was dissolved in $H_2O$ with a concentration of 35-40 wt. % when received from Aldrich, was diluted into methoxyethanol to the weight concentration of 0.5% or 0.05%. It was spin coated onto oxygen plasma-treated (600 W, 600 mTorr, 3 min) ITO substrates at a speed of 5000 rpm for 1 min, yielding a thickness of 1.6 nm and 12 nm, respectively. Then these samples were transferred into an UHV analysis chamber to conduct UPS and XPS measurements. He I (21.22 eV) radiation line from a discharge lamp was used in UPS, with an experimental resolution of 0.15 eV. For composition and chemical analysis the films were measured by XPS using the Al Kα (1486.6 eV) photon line with a spectral resolution of 0.8 eV.

Figure 6:
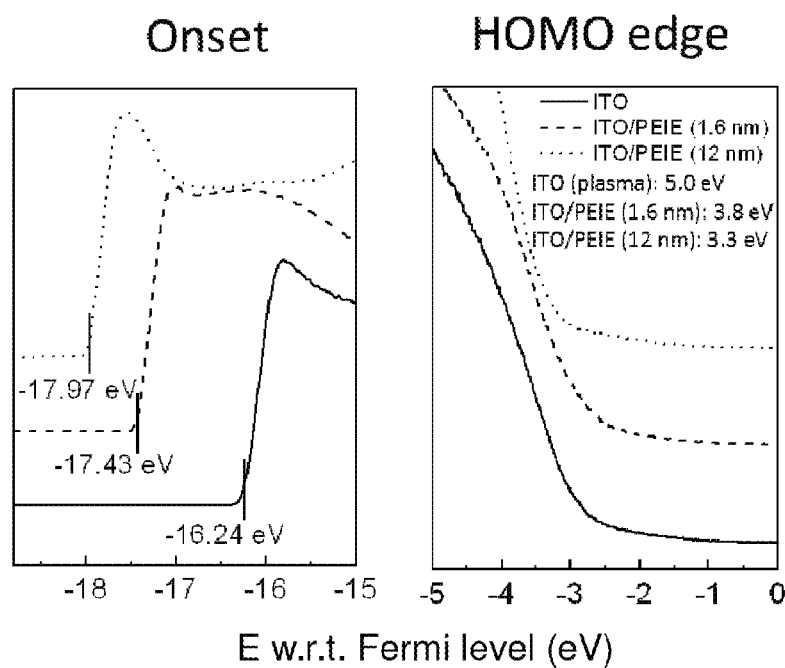
FIG. 6 shows an UPS spectra of ITO, ITO/PEIE (1.6 nm) and ITO/PEIE (12 nm), according to an exemplary embodiment of the invention. The ITO substrate was pretreated with oxygen plasma at 600 W and 600 mTorr for 3 min.

FIG. 6 shows an UPS spectra of ITO, ITO/PEIE (1.6 nm) and ITO/PEIE (12 nm), according to an exemplary embodiment of the invention. The ITO substrate was pretreated with oxygen plasma at 600 W and 600 mTorr for 3 min. FIG. 6 shows that the deposition a PEIE layer onto ITO leads to a shifts of the photoemission onset towards lower binding energy, corresponding to a downward shift of the vacuum level, and therefore a reduction of the work function. The resulting work function of a 1.6 nm and 12 nm thick PEIE layers on oxygen plasma treated ITO is 3.8 eV and 3.3 eV, respectively. When PEIE was deposited onto ITO no significant shift of the In 3d core level peak was observed as shown in FIG. 7 indicating that there is only a weak or no interaction with the ITO substrate.

Figure 7:
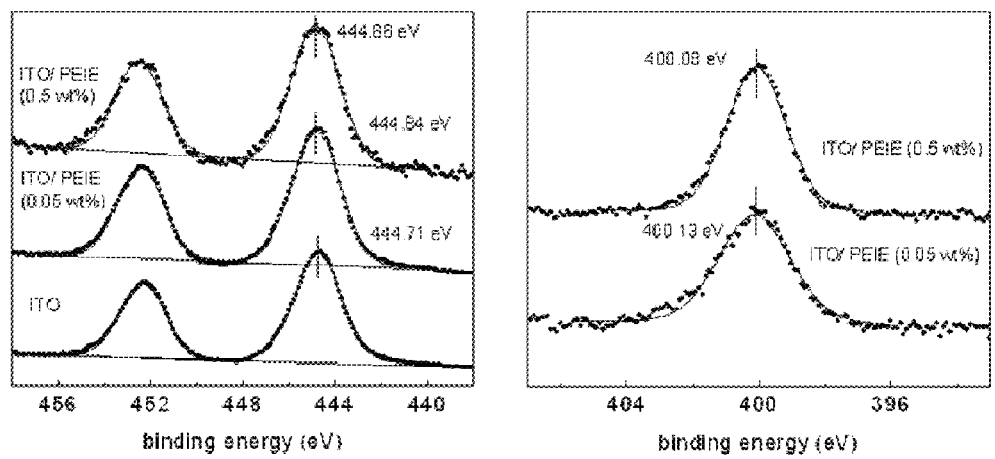
FIG. 7 shows a XPS spectra of ITO, ITO/PEIE (1.6 nm) and ITO/PEIE (12 nm), according to an exemplary embodiment of the invention. Left panel shows the In 3d core level peaks and right panel shows the N 1s core level peaks. The ITO substrate was pretreated with oxygen plasma at 600 W and 600 mTorr for 3 min.

FIG. 7 shows a XPS spectra of ITO, ITO/PEIE (1.6 nm) and ITO/PEIE (12 nm), according to an exemplary embodiment of the invention. Left panel shows the In 3d core level peaks and right panel shows the N 1s core level peaks. The ITO substrate was pretreated with oxygen plasma at 600 W and 600 mTorr for 3 min. The N 1s core level peak at around 400 eV (FIG. 7) verifies the thin films deposition of PEIE on oxygen plasma treated ITO.

Example A10

ZnO Modified by PEIE (10 nm)

Indium tin oxide (ITO)-coated glass (Colorado Concept Coatings LLC) with a sheet resistivity of ~15 Ω/sq was used as substrate. The substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths.

ZnO films (200 cycles) were deposited on the cleaned ITO substrates with pulses of $H_2O$ for 15 ms and diethylzinc for 15 ms at 200° C. using an ALD system (Savannah 100, Cambridge NanoTech, Cambridge, Mass.). The thickness of ZnO was 25 nm, measured using a profilometer (Dektak 6M Stylus, Veeco, Plainview, N.Y.).

Polyethylenimine, 80% ethoxylated (PEIE) (Mw=70,000 g/mol), which was dissolved in $H_2O$ with a concentration of 35-40 wt % when received from Aldrich, was diluted into methoxyethanol to weight concentrations of 0.5%. Then these solutions were spin coated onto the ITO/ZnO substrates at a speed of 5000 rpm for 1 min. Then these samples were annealed at 120° C. for 10 min on hotplate in nitrogen. Then these samples were transferred into an UHV analysis chamber to conduct UPS measurements. He I (21.22 eV) radiation line from a discharge lamp was used in UPS, with an experimental resolution of 0.15 eV.

Figure 8:
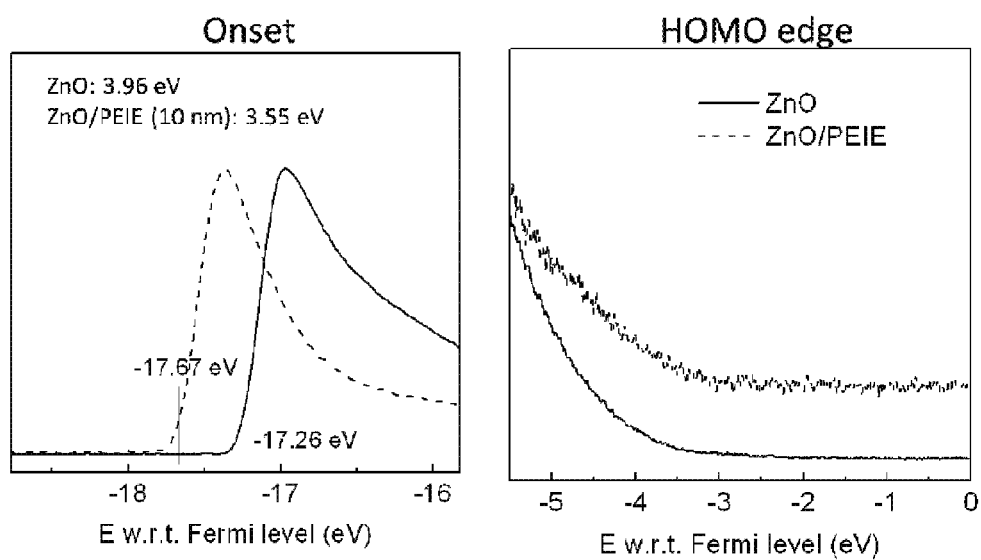
FIG. 8 show UPS spectra of ZnO and ZnO/PEIE (10 nm), according to an exemplary embodiment of the invention.

FIG. 8 show UPS spectra of ZnO and ZnO/PEIE (10 nm), according to an exemplary embodiment of the invention. FIG. 8 shows that the deposition a PEIE layer onto ZnO leads to a shift of the photoemission onset towards lower binding energy, corresponding to a downward shift of the vacuum level, and therefore a reduction of the work function. The resulting work function of ZnO is 3.96 eV and ZnO/PEIE is 3.55 eV.

Example A11

PEDOT:PSS PH1000 Modified by PEIE (10 nm)

Microscope glasses and indium tin oxide (ITO)-coated glass (Colorado Concept Coatings LLC) with a sheet resistivity of ~15 Ω/sq were used as substrate. The substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths. Substrates were treated by $O_2$ for 3 min to tune the surface becoming hydrophilic.

High conductivity PEDOT:PSS PH1000 (CLEVIOS™ PH 1000, HC Stack Inc., MA) with 5% DMSO was spin coated on microscope glass substrates at a speed of 1000 rpm for 30 s and an acceleration of 1000 rpm/s and annealed at 140° C. for 10 min on a hot plate in air. Its thickness was 130 nm, measured using a profilometer (Dektak 6M Stylus, Veeco, Plainview, N.Y.).

Polyethylenimine, 80% ethoxylated (PEIE) (Mw=70, 000), which was dissolved in $H_2O$ with a concentration of 35-40 wt. % when received from Aldrich, was diluted into methoxyethanol to a weight concentration of 0.5%. The solution was spin coated onto glass/PH1000 at a speed of 5000 rpm for 1 min. Then these samples were annealed at 120° C. for 10 min on hotplate in nitrogen. Then these samples were transferred into an UHV analysis chamber to conduct UPS measurements. He I (21.22 eV) radiation line from a discharge lamp was used in UPS, with an experimental resolution of 0.15 eV.

Figure 9:
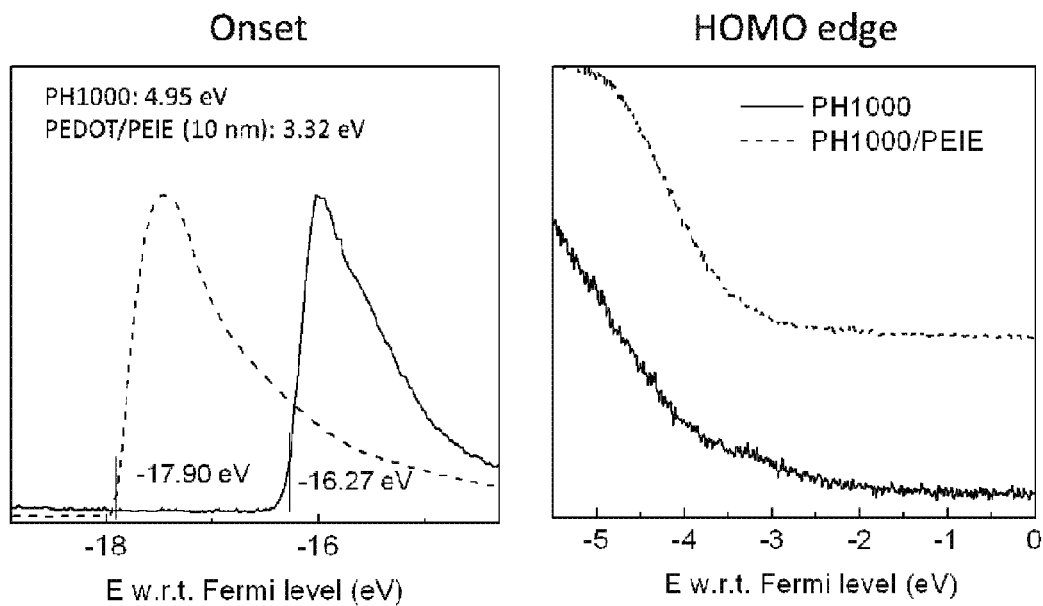
FIG. 9 show UPS spectra of PEDOT:PSS PH1000 and PEDOT:PSS PH1000/PEIE (10 nm), according to an exemplary embodiment of the invention.

FIG. 9 show UPS spectra of PEDOT:PSS PH1000 and PEDOT:PSS PH1000/PEIE (10 nm), according to an exemplary embodiment of the invention. FIG. 9 shows that the deposition a PETE layer onto PEDOT:PSS PH1000 leads to a shifts of the photoemission onset towards lower binding energy, corresponding to a downward shift of the vacuum level, and therefore a reduction of the work function. The resulting work function of PEDOT:PSS PH1000 is 4.95 eV and PEDOT:PSS PH1000/PEIE is 3.32 eV.

Example A12

Au Modified by PEIE

Polyethylenimine, 80% ethoxylated (PEIE) (Mw=70,000 g/mol), which was dissolved in $H_2O$ with a concentration of 35-40 wt. % when received from Aldrich, was diluted into methoxyethanol to the weight concentration of 0.5%. It was spin coated onto Au coated Si substrates at a speed of 5000 rpm for 1 min. Then these samples were transferred into an UHV analysis chamber to conduct UPS and XPS measurements. He I (21.22 eV) radiation line from a discharge lamp was used in UPS, with an experimental resolution of 0.15 eV. For composition and chemical analysis the films were measured by XPS using the Al Kµ(1486.6 eV) photon line with a spectral resolution of 0.8 eV.

Figure 10:
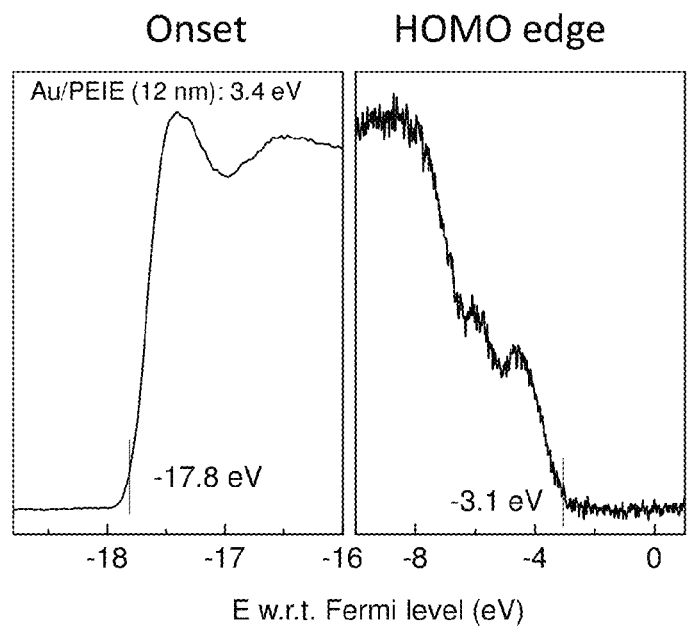
FIG. 10 shows an UPS spectrum of Au/PEIE (12 nm), according to an exemplary embodiment of the invention.

FIG. 10 shows an UPS spectrum of Au/PEIE (12 nm), according to an exemplary embodiment of the invention. FIG. 10 shows that the UPS spectrum of Au/PEIE (12 nm). The photoemission onset at 17.8 eV corresponds to a work function of 3.4 eV.

Figure 11:
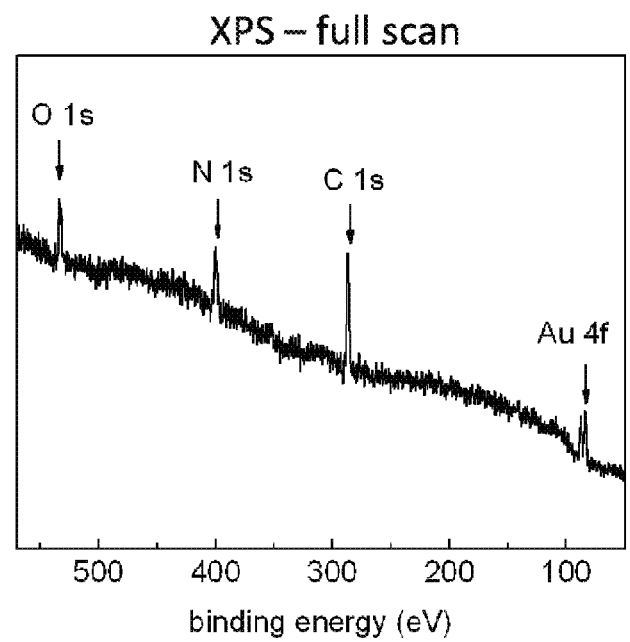
FIG. 11 shows a XPS spectrum of Au/PEIE (12 nm), according to an exemplary embodiment of the invention.

FIG. 11 shows a XPS spectrum of Au/PEIE (12 nm), according to an exemplary embodiment of the invention. The XPS analysis, as shown in FIG. 11, reveals the present of Au which stems from the substrate and O, N and C which corresponds to the PEIE film.

Example A13

Thermal Stability of PEIE on ITO in Air

Indium tin oxide (ITO)-coated glass (Colorado Concept Coatings LLC) with a sheet resistivity of ~15 Ω/sq was used as the substrates. The substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths.

Polyethylenimine, 80% ethoxylated (PEIE) (Mw=70,000 g/mol), which was dissolved in H2O with a concentration of 35-40 wt. % as received from Aldrich, was diluted into methoxyethanol to the weight concentration of 0.5%. PEIE films were spin coated onto cleaned ITO substrates at a speed of 5000 rpm for 1 min and an acceleration of 1000 rpm/s. Then these samples were annealed at different temperatures of 24, 50, 120, 140, 160, 180, 190, 200, 300, 370° C. for 30 min on hotplate in ambient air.

Figure 12:
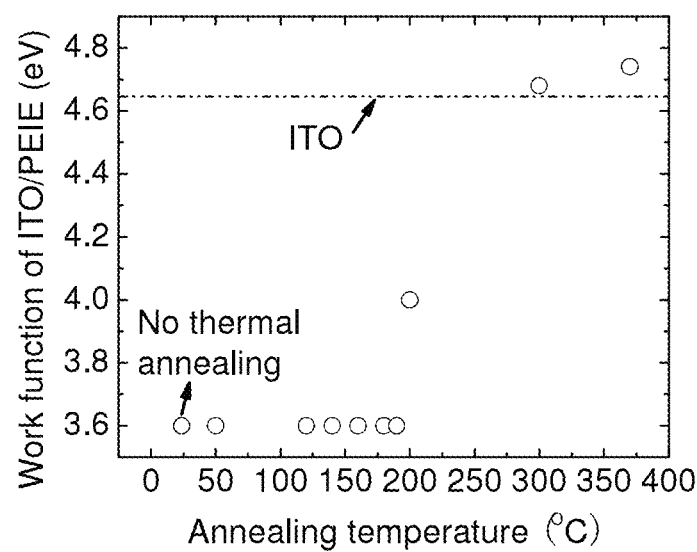
FIG. 12 shows a work function of ITO/PEIE after annealed at different temperature for 30 min in air, according to an exemplary embodiment of the invention.

FIG. 12 shows a work function of ITO/PEIE after annealed at different temperature for 30 min in air, according to an exemplary embodiment of the invention. The work function of these annealed ITO/PEIE samples was measured in air using a Kelvin probe (Besocke Delta Phi). A highly ordered pyrolytic graphite (HOPG) sample with a work function of 4.5 eV was used as the reference sample.

Examples B1-B7

Use of PEI to Reduce the Work Function of High Work-Function Electrodes

Figure 13:
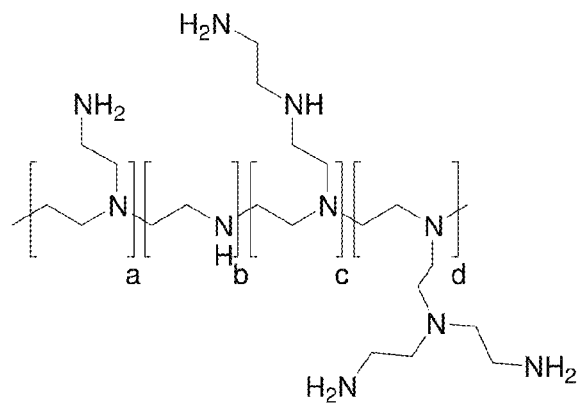
FIG. 13 shows a chemical structure of polyethylenimine (PEI), according to an exemplary embodiment of the invention.

FIG. 13 shows a chemical structure of polyethylenimine (PEI), according to an exemplary embodiment of the invention. The following examples show the work function reduction of an electrode coated with PEI, according to exemplary embodiments of the invention.

Example B1

Work Function Reduction of ITO by PEI with Different Molecular Weight

Indium tin oxide (ITO)-coated glass (Colorado Concept Coatings LLC) with a sheet resistivity of ~15 Ω/sq was used as substrate. The substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths.

Polyethylenimine (PEI, branched, from Aldrich) with different molecular weight of 2000 g/mol, 25000 g/mol and 750000 g/mol, was diluted into methoxyethanol to a weight concentration of 0.5%. Then these solutions were spin coated onto cleaned ITO substrates at a speed of 5000 rpm for 1 min and an acceleration of 1000 rpm/s. Then these samples were annealed at 100° C. for 10 min on hotplate in ambient air. For thicknesses measurement, another set of samples were prepared on silicon wafer substrates prepared under the same condition on ITO substrates. Thicknesses were measured to be 14, 16 and 17 nm of PEI with molecular weight of 2000 g/mol, 25000 g/mol and 750000 g/mol respectively, by spectroscopic ellipsometry (J. A. Woollam Co.).

The work function of the ITO/PEI samples was measured in air using a Kelvin probe (Besocke Delta Phi) and averaged over three locations. A highly ordered pyrolytic graphite (HOPG) sample with a work function of 4.5 eV was used as the reference sample. Work function reduction of ITO by PEI with different molecular weight is summarized in Table 6.

TABLE 6

Work function reduction of ITO by PEI with different molecular weight

| Samples | Work function (eV) |
|---|---|
| ITO | 4.62 ± 0.06 |
| ITO/PEI (Mw = 750,000 g/mol) (17 nm) | 3.50 ± 0.06 |
| ITO/PEI (Mw = 25,000 g/mol) (16 nm) | 3.40 ± 0.06 |
| ITO/PEI (Mw = 20,000 g/mol) (14 nm) | 3.40 ± 0.06 |

Example B2

Work Function Reduction of ITO/ZnO by PEI (Mw=25,000 g/mol)

Indium tin oxide (ITO)-coated glass (Colorado Concept Coatings LLC) with a sheet resistivity of ~15 Ω/sq was used as substrate. The substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths.

ZnO films (200 cycles) were deposited on the cleaned ITO substrates with pulses of $H_2O$ for 15 ms and diethylzinc for 15 ms at 200° C. using an ALD system (Savannah 100, Cambridge NanoTech, Cambridge, Mass.). The thickness of ZnO was 25 nm, measured using a profilometer (Dektak 6M Stylus, Veeco, Plainview, N.Y.).

Polyethylenimine (PEI, branched, from Aldrich) with a molecular weight of 25000 g/mol, was diluted into methoxyethanol to a weight concentration of 0.5%. Then the solution was spin coated onto the glass/ITO/ZnO substrates at a speed of 5000 rpm for 1 min and an acceleration of 1000 rpm/s and annealed at 100° C. for 10 min on hot plate in ambient air. The thickness of PEI was 16 nm determined by spectroscopic ellipsometry (J. A. Woollam Co.).

The work function of ITO/ZnO and ITO/ZnO/PEIE samples were measured in air using a Kelvin probe (Besocke Delta Phi) and averaged over three locations. A highly ordered pyrolytic graphite (HOPG) sample with a work function of 4.5 eV was used as the reference sample. Work function reduction of ITO/ZnO by PEI is shown in Table 7.

TABLE 7

Work function reduction of ITO/ZnO by PEI (Mw = 25,000 g/mol)

| Samples | Work function (eV) |
|---|---|
| ITO/ZnO | 4.30 ± 0.06 |
| ITO/ZnO/PEI (16 nm) | 3.10 ± 0.06 |

Example B3

Work Function Reduction of Fluorine-Doped Tin Oxide (FTO) by PEI (Mw=25,000 g/mol)

Fluorine-doped tin oxide (FTO) glass substrates (TEC-15, Hartford Glass Co. Inc) with a sheet resistivity of ~15 Ω/sq were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths.

Polyethylenimine (PEI, branched, Mw=25,000 g/mol, from Aldrich) with a molecular weight of 25000, was diluted into methoxyethanol to a weight concentration of 0.5%. Then the solution was spin coated onto cleaned FTO substrates at a speed of 5000 rpm for 1 min and an acceleration of 1000 rpm/s. Then these samples were annealed at 120° C. for 10 min on hotplate in ambient air. For thicknesses measurement, another set of samples were prepared on silicon wafer substrates prepared under the same condition on ITO substrates. Thickness of PEI was measured to be 16 nm by spectroscopic ellipsometry (J. A. Woollam Co.).

The work function of the FTO/PEI samples was measured in air using a Kelvin probe (Besocke Delta Phi) and averaged over three locations. A highly ordered pyrolytic graphite (HOPG) sample with a work function of 4.5 eV was used as the reference sample. Work function reduction of FTO by PEI is shown in Table 8.

TABLE 8

Work function reduction of FTO by PEI (Mw = 25,000 g/mol)

| Samples | Work function (eV) |
|---|---|
| Clean FTO | 4.66 ± 0.04 |
| FTO/PEI (16 nm) | 3.60 ± 0.06 |

Example B4

Work Function Reduction of Conducting Polymer PEDOT:PSS by PEI ($M_w$=25,000 g/mol)

Glass substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths. Substrates were treated by $O_2$ for 3 min to tune the surface becoming hydrophilic.

High conductivity PEDOT:PSS PH1000 (CLEVIOS™ PH 1000, HC Stack Inc., MA) with 5% DMSO was spin coated microscope glass substrates at a speed of 1000 rpm for 30 s and an acceleration of 1000 rpm/s and annealed at 140° C. for 10 min on a hot plate in air. Its thickness was 130 nm, measured using a profilometer (Dektak 6M Stylus, Veeco, Plainview, N.Y.).

Polyethylenimine (PEI, branched, from Aldrich) with a molecular weight of 25000 g/mol, was diluted into methoxyethanol to a weight concentration of 0.5%. The solution was spin coated onto glass/PH1000 samples at a speed of 5000 rpm for 1 min and an acceleration of 1000 rpm/s. Then these samples were annealed at 100° C. for 10 min on hotplate in ambient air. Thickness of PEI was measured to be 16 nm by spectroscopic ellipsometry (J. A. Woollam Co.).

The work function of the samples was measured in air using a Kelvin probe (Besocke Delta Phi) and averaged over three locations. A highly ordered pyrolytic graphite (HOPG) sample with a work function of 4.5 eV was used as the reference sample. Work function reduction of PEDOT:PSS by PEI is shown in Table 9.

TABLE 9

Work function reduction of PEDOT:PSS by PEI (Mw = 25,000 g/mol)

| Samples | Work function (eV) |
|---|---|
| PH1000 | 4.90 ± 0.06 |
| PH1000/PEI (16 nm) | 3.88 ± 0.06 |

Example B5

Work Function Reduction of Au by PEI (Mw=25,000 g/mol)

Microscope glasses substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths.

Ti (10 nm)/Au (60 nm) was deposited on glass substrates by e-beam deposition (AXXIS, Kurt J. Lesker).

Polyethylenimine (PEI, branched, from Aldrich) with a molecular weight of 25000 g/mol, was diluted into methoxyethanol to a weight concentration of 0.5%. Then the solution was spin coated onto glass/Ti/Au at a speed of 5000 rpm for 1 min and an acceleration of 1000 rpm/s and annealed at 120° C. for 10 min on hot plate in ambient air. The thickness of PEI was 16 nm determined by spectroscopic ellipsometry (J. A. Woollam Co.).

The work function of the Au/PEI samples was measured in air using a Kelvin probe (Besocke Delta Phi) and averaged three locations. A highly ordered pyrolytic graphite (HOPG) sample with a work function of 4.5 eV was used as the reference sample. Work function reduction of Au by PEI is shown in Table 10.

TABLE 10

Work function reduction of Au by PEI (Mw = 25,000 g/mol)

| Samples | Work function (eV) |
|---|---|
| Au | 5.20 ± 0.06 |
| Au/PEI (16 nm) | 3.94 ± 0.06 |

Example B6

Work Function Reduction of Ag by PEI (Mw=25,000 g/mol)

Microscope glasses substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths.

Ag (150 nm) was deposited on glass substrates using a vacuum thermal evaporation system (SPECTROS, Kurt J. Lesker).

Polyethylenimine (PEI, branched, from Aldrich) with a molecular weight of 25000 g/mol, was diluted into methoxyethanol to a weight concentration of 0.5%. It was spin coated onto the substrates at a speed of 5000 rpm for 1 min and an acceleration of 1000 rpm/s. Then these samples were annealed at 100° C. for 10 min on hotplate in ambient air. Its thickness was measured to be 16 nm by spectroscopic ellipsometry (J. A. Woollam Co.).

The work function of the Ag/PEI samples was measured in air using a Kelvin probe (Besocke Delta Phi) and averaged three locations. A highly ordered pyrolytic graphite (HOPG) sample with a work function of 4.5 eV was used as the reference sample. Work function reduction of Ag by PEI is shown in Table 11.

TABLE 11

Work function reduction of Ag by PEI (Mw = 25,000 g/mol)

| Samples | Work function (eV) |
|---|---|
| Ag | 4.60 ± 0.06 |
| Ag/PEI (16 nm) | 3.60 ± 0.06 |

Examples B7-B11

Characterization of PEI-Modified Electrodes by UPS

Example B7

ITO Modified by PEI (Mw=750,000 g/mol)

Indium tin oxide (ITO)-coated glass (Colorado Concept Coatings LLC) with a sheet resistivity of ~15 Ω/sq was used as substrate. The substrates were cleaned in an ultrasonic bath of detergent water, rinsed with deionized water, and then cleaned in sequential ultrasonic baths of deionized water, acetone, and methanol. Each ultrasonic bath lasted for 20 minutes. Nitrogen was used to dry the substrates after each of the last three baths.

Polyethylenimine (PEI, branched, from Aldrich) with a molecular weight of 750,000 g/mol, was diluted into methoxyethanol to a weight concentration of 0.5%. Then these solutions were spin coated onto cleaned ITO substrates at a speed of 5000 rpm for 1 min. Then the samples were annealed at 100° C. for 10 min on a hotplate in nitrogen. Afterwards these samples were transferred into an UHV analysis chamber to conduct UPS measurements. He I (21.22 eV) radiation line from a discharge lamp was used in UPS, with an experimental resolution of 0.15 eV.

Figure 14:
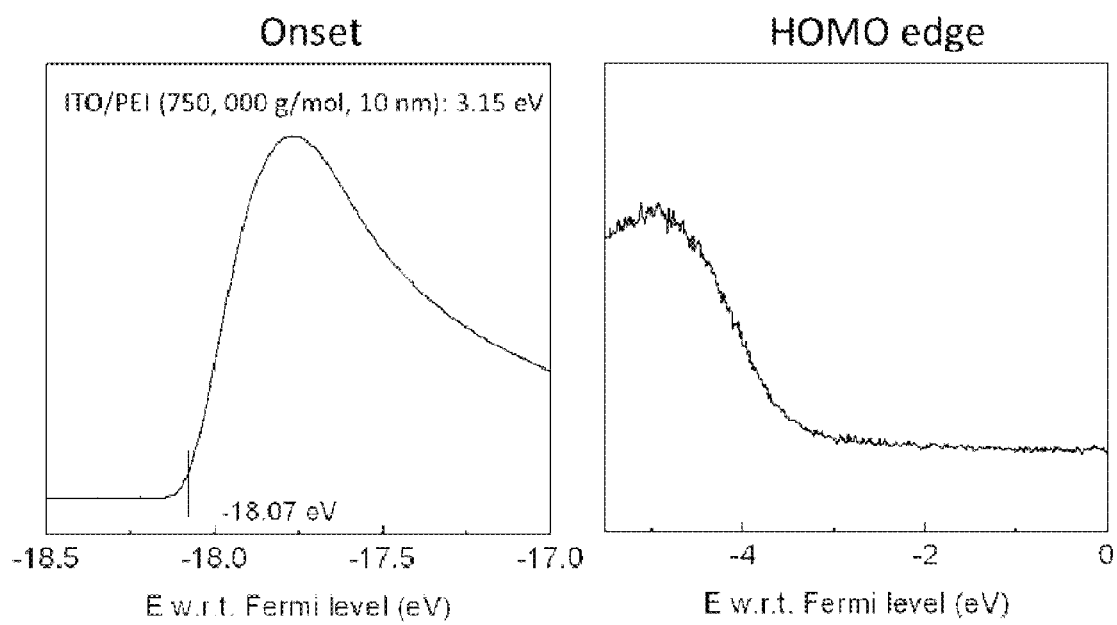
FIG. 14 shows an UPS spectrum of ITO/PEI (750,000 g/mol; 10 nm), according to an exemplary embodiment of the invention.

FIG. 14 shows an UPS spectrum of ITO/PEI (750,000 g/mol; 10 nm), according to an exemplary embodiment of the invention. The photoemission onset at 18.07 eV corresponds to a work function of 3.15 eV.

Example B8

ITO Modified by PEI (Mw=25,000 g/mol)

Indium tin oxide (ITO)-coated glass (Colorado Concept Coatings LLC) with a sheet resistivity of ~15 Ω/sq was used as substrate. The substrates were cleaned in an ultrasonic bath of detergent water, rinsed with deionized water, and then cleaned in sequential ultrasonic baths of deionized water, acetone, and methanol. Each ultrasonic bath lasted for 20 minutes. Nitrogen was used to dry the substrates after each of the last three baths.

Polyethylenimine (PEI, branched, from Aldrich) with a molecular weight of 25,000 g/mol, was diluted into methoxyethanol to a weight concentration of 0.5%. Then these solutions were spin coated onto cleaned ITO substrates at a speed of 5000 rpm for 1 min. Then these samples were annealed at 100° C. for 10 min on hotplate in nitrogen. Afterwards these samples were transferred into an UHV analysis chamber to conduct UPS measurements. He I (21.22 eV) radiation line from a discharge lamp was used in UPS, with an experimental resolution of 0.15 eV.

Figure 15:
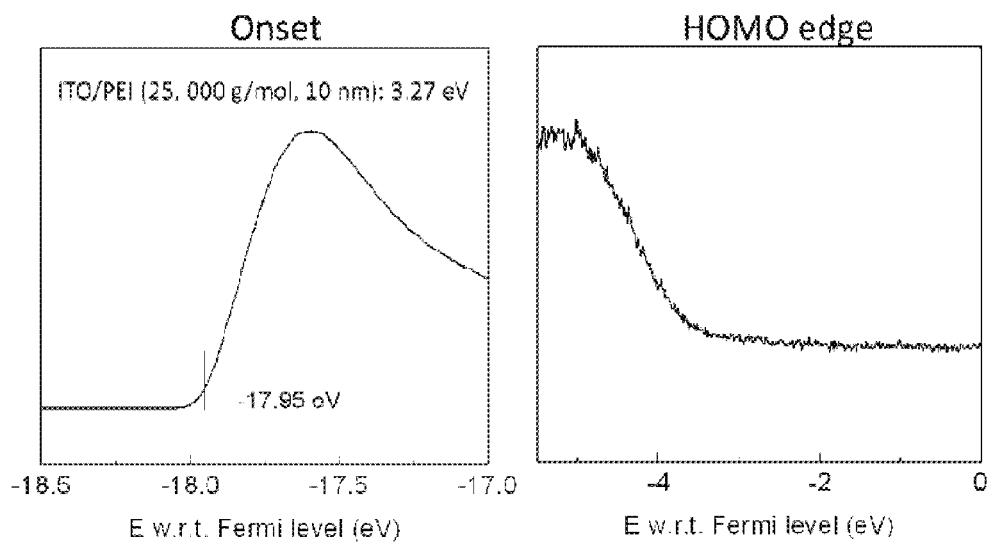
FIG. 15 shows an UPS spectrum of ITO/PEI (25,000 g/mol; 10 nm), according to an exemplary embodiment of the invention.

FIG. 15 shows an UPS spectrum of ITO/PEI (25,000 g/mol; 10 nm), according to an exemplary embodiment of the invention. The photoemission onset at 17.95 eV corresponds to a work function of 3.27 eV.

Example B9

ITO Modified by PEI (Mw=2,000 g/mol)

Indium tin oxide (ITO)-coated glass (Colorado Concept Coatings LLC) with a sheet resistivity of ~15 Ω/sq was used as substrate. The substrates were cleaned in an ultrasonic bath of detergent water, rinsed with deionized water, and then cleaned in sequential ultrasonic baths of deionized water, acetone, and methanol. Each ultrasonic bath lasted for 20 minutes. Nitrogen was used to dry the substrates after each of the last three baths.

Polyethylenimine (PEI, branched, from Aldrich) with a molecular weight of 2,000 g/mol, was diluted into methoxyethanol to a weight concentration of 0.5%. Then these solutions were spin coated onto cleaned ITO substrates at a speed of 5000 rpm for 1 min. Then these samples were annealed at 100° C. for 10 min on hotplate in nitrogen. Afterwards these samples were transferred into an UHV analysis chamber to conduct UPS measurements. He I (21.22 eV) radiation line from a discharge lamp was used in UPS, with an experimental resolution of 0.15 eV.

Figure 16:
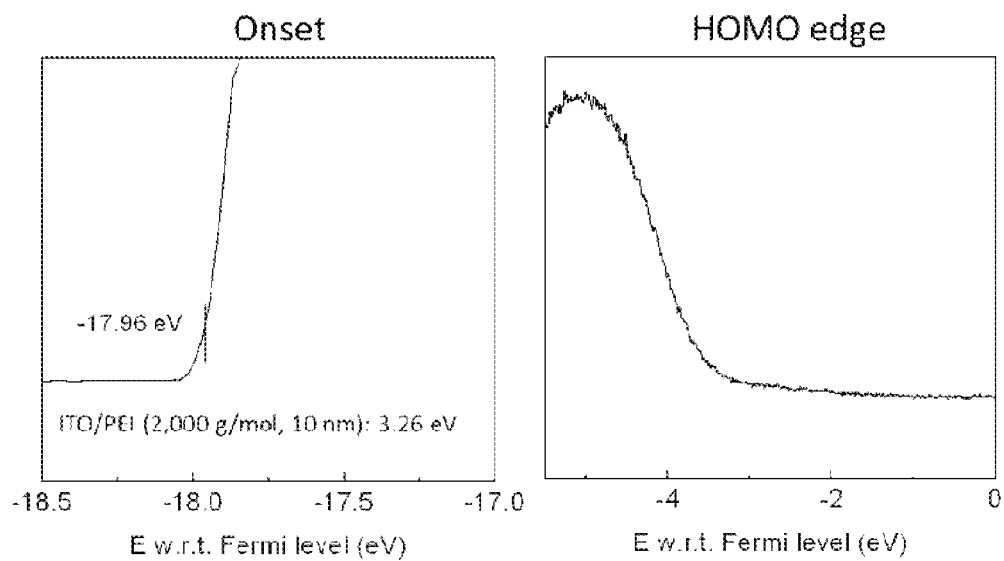
FIG. 16 shows an UPS spectrum of ITO/PEI (2,000 g/mol; 10 nm), according to an exemplary embodiment of the invention.

FIG. 16 shows an UPS spectrum of ITO/PEI (2,000 g/mol; 10 nm), according to an exemplary embodiment of the invention. The photoemission onset at 17.96 eV corresponds to a work function of 3.26 eV.

Example B10

ZnO Modified by PEI (Mw=25,000 g/mol)

Indium tin oxide (ITO)-coated glass (Colorado Concept Coatings LLC) with a sheet resistivity of ~15 Ω/sq was used as substrate. The substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths.

ZnO films (200 cycles) were deposited on the cleaned ITO substrates with pulses of $H_2O$ for 15 ms and diethylzinc for 15 ms at 200° C. using an ALD system (Savannah 100, Cambridge NanoTech, Cambridge, Mass.). The thickness of ZnO was 25 nm, measured using a profilometer (Dektak 6M Stylus, Veeco, Plainview, N.Y.).

Polyethylenimine (PEI, branched, from Aldrich) with a molecular weight of 25,000 g/mol, was diluted into methoxyethanol to a weight concentration of 0.5%. Then the solution was spin coated onto the glass/ITO/ZnO substrates at a speed of 5000 rpm for 1 min and an acceleration of 1000 rpm/s and annealed at 100° C. for 10 min on hot plate in nitrogen. Afterwards these samples were transferred into an UHV analysis chamber to conduct UPS measurements. He I (21.22 eV) radiation line from a discharge lamp was used in UPS, with an experimental resolution of 0.15 eV.

Figure 17:
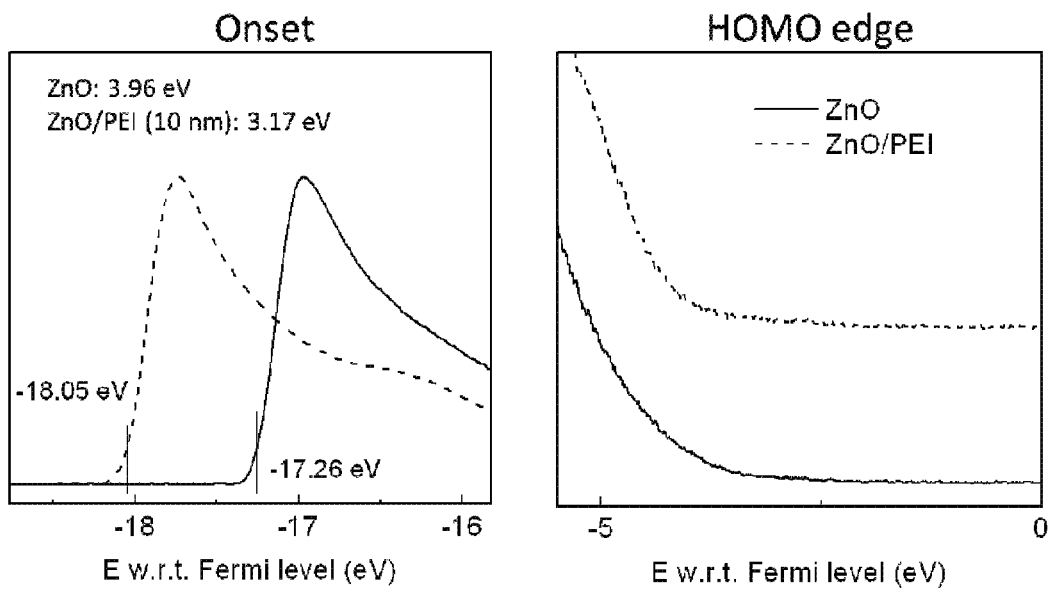
FIG. 17 shows UPS spectra of ZnO and ZnO/PEI (25,000 g/mol; 10 nm), according to an exemplary embodiment of the invention.

FIG. 17 shows UPS spectra of ZnO and ZnO/PEI (25,000 g/mol; 10 nm), according to an exemplary embodiment of the invention. FIG. 17 shows that the deposition PEI onto ZnO leads to a shifts of the photoemission onset towards lower binding energy, corresponding to a downward shift of the vacuum level, and therefore a reduction of the work function. The resulting work function of a ZnO is 3.96 eV and ZnO/PEI (25,000 g/mol; 10 nm) is 3.17 eV.

Example B11

PEDOT:PSS PH1000 Modified by PEI (Mw=25,000 g/mol)

Glass substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths. Substrates were treated by $O_2$ for 3 min to tune the surface becoming hydrophilic.

High conductivity PEDOT:PSS PH1000 (CLEVIOS™ PH 1000, HC Stack Inc., MA) with 5% DMSO was spin coated microscope glass substrates at a speed of 1000 rpm for 30 s and an acceleration of 1000 rpm/s and annealed at 140° C. for 10 min on a hot plate in air. Its thickness was 130 nm, measured using a profilometer (Dektak 6M Stylus, Veeco, Plainview, N.Y.).

Polyethylenimine (PEI, branched, from Aldrich) with a molecular weight of 25,000 g/mol, was diluted into methoxyethanol to a weight concentration of 0.5%. The solution was spin coated onto glass/PH1000 samples at a speed of 5000 rpm for 1 min. Then these samples were annealed at 100° C. for 10 min on hotplate in nitrogen. Afterwards these samples were transferred into an UHV analysis chamber to conduct UPS measurements. He I (21.22 eV) radiation line from a discharge lamp was used in UPS, with an experimental resolution of 0.15 eV.

Figure 18:
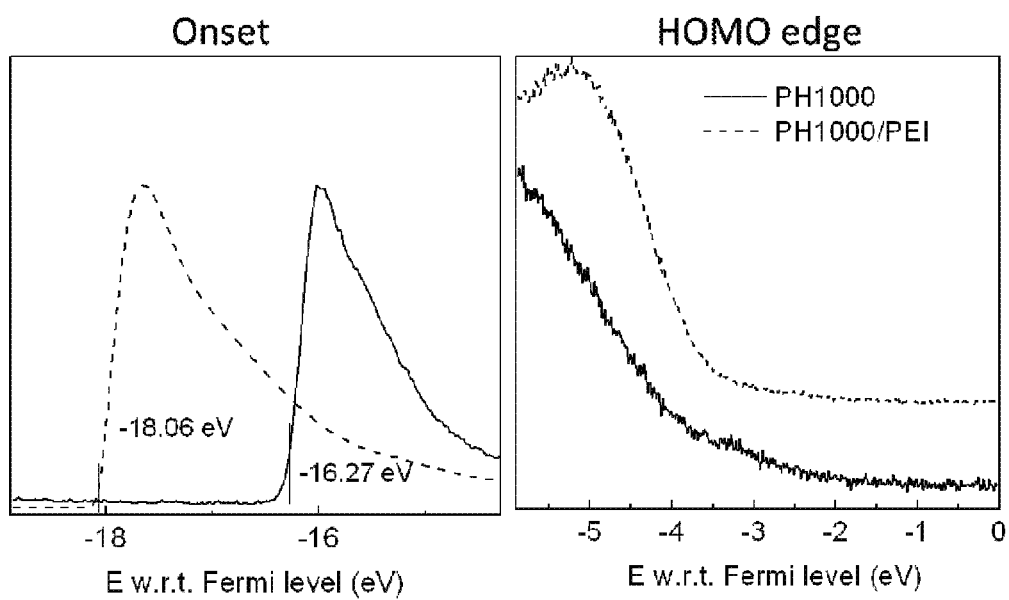
FIG. 18 show UPS spectra of PEDOT:PSS PH1000 and PEDOT:PSS PH1000/PEI (25,000 g/mol), according to an exemplary embodiment of the invention.

FIG. 18 show UPS spectra of PEDOT:PSS PH1000 and PEDOT:PSS PH1000/PEI (25,000 g/mol), according to an exemplary embodiment of the invention. FIG. 18 shows that the deposition PEI onto PEDOT:PSS PH1000 leads to a shifts of the photoemission onset towards lower binding energy, corresponding to a downward shift of the vacuum level, and therefore a reduction of the work function. The resulting work function of a PEDOT:PSS PH1000 is 4.95 eV and PEDOT:PSS PH1000/PEI (25,000 g/mol) is 3.16 eV.

Example B12

Thermal Stability of PEI (Mw=25,000 g/mol) on ITO in Air

Indium tin oxide (ITO)-coated glass (Colorado Concept Coatings LLC) with a sheet resistivity of ~15 Ω/sq was used as the substrates. The substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths.

Polyethylenimine (PEI, branched, Mw 25,000 g/mol, Aldrich) was diluted into methoxyethanol to the weight concentration of 0.5%. Then the solution was spin coated onto cleaned ITO substrates at a speed of 5000 rpm for 1 min and an acceleration of 1000 rpm/s. The thickness of PEI was 16 nm determined by spectroscopic ellipsometry (J. A. Woollam Co.). To test thermal stability of PEI in air, Then these samples were annealed at different temperatures of 24, 50, 120, 150, 160, 180, 200, 300° C. for 30 min on hotplate in ambient air.

Figure 19:
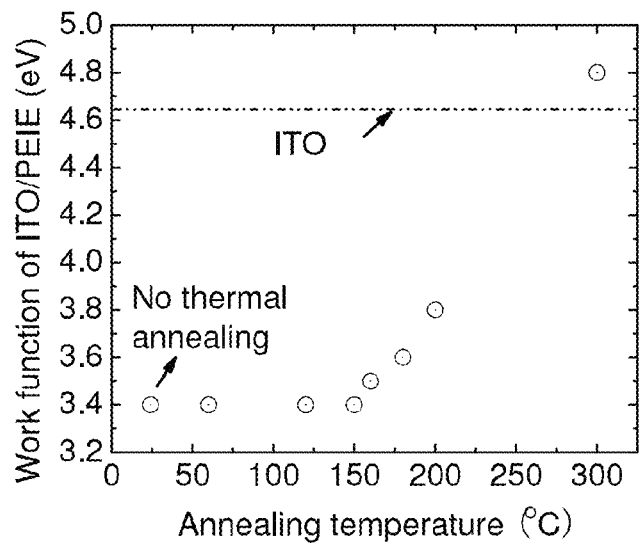
FIG. 19 shows a work function of ITO/PEI after annealed at different temperature for 30 min in air, according to an exemplary embodiment of the invention.

FIG. 19 shows a work function of ITO/PEI after annealed at different temperature for 30 min in air, according to an exemplary embodiment of the invention.

The work function of these annealed ITO/PEI samples was measured in air using a Kelvin probe (Besocke Delta Phi). A highly ordered pyrolytic graphite (HOPG) sample with a work function of 4.5 eV was used as the reference sample.

Examples C1-H1

Use of Other Amine Containing Polymers (FIG. 20) to Reduce the Work Function of ITO Examples C1-G1

Work Function of ITO/Modifiers Measured by Kelvin Probe

Figure 20:
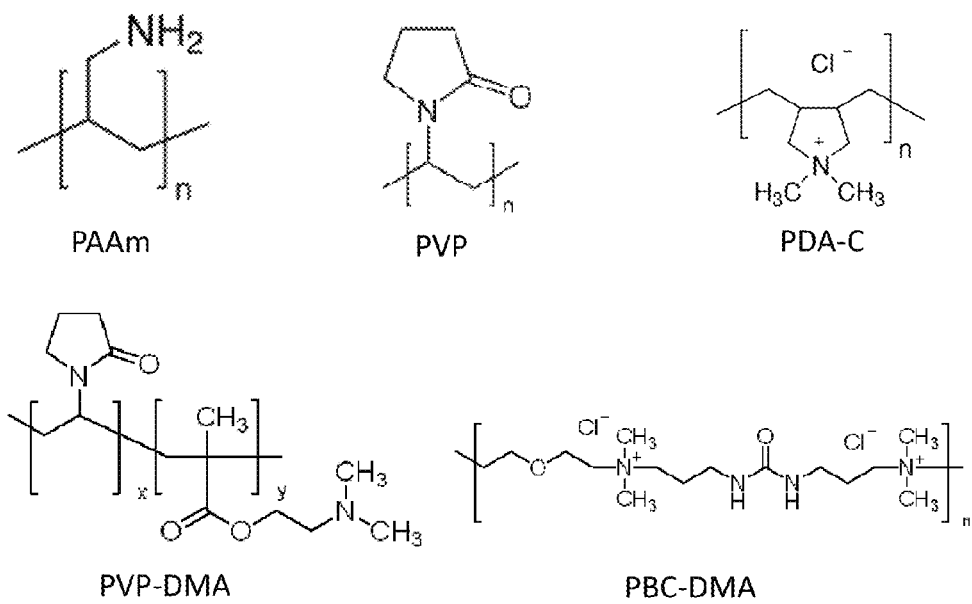
FIG. 20 shows a chemical structure of PAAm, PVP, PDA-C, PVP-DMA and PBC-DMA, according to an exemplary embodiment of the invention.

FIG. 20 shows a chemical structure of PAAm, PVP, PDA-C, PVP-DMA and PBC-DMA, according to an exemplary embodiment of the invention.

Example C1

Work Function Reduction of ITO by Poly(Allylamine) (PAAm)

Indium tin oxide (ITO)-coated glass (Colorado Concept Coatings LLC) with a sheet resistivity of ~15 Ω/sq was used as substrate. The substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths.

Poly(allylamine) (PAAm) solution (Mw=17,000 g/mol), which was dissolved in $H_2O$ with a concentration of 20 wt. % as received from Aldrich, was diluted into methoxyethanol to the weight concentration of 0.05% and 0.5%. Then the solutions were spin coated onto cleaned ITO substrates at a speed of 5000 rpm for 1 min and an acceleration of 1000 rpm/s. Then these samples were annealed at 100° C. for 10 min on hotplate in ambient air. For thicknesses measurement, another set of samples were prepared on silicon wafer substrates prepared under the same condition on ITO substrates. Thicknesses were measured to be 1.3 and 17 nm by using spectroscopic ellipsometry (J. A. Woollam Co.).

The work function of the ITO/PAAm samples was measured in air using a Kelvin probe (Besocke Delta Phi) and averaged over three locations. A highly ordered pyrolytic graphite (HOPG) sample with a work function of 4.5 eV was used as the reference sample. Work function reduction of ITO by PAAm is shown in Table 12.

TABLE 12

| Work function reduction of ITO by PAAm | |
|---|---|
| Samples | Work function (eV) |
| ITO | 4.62 ± 0.06 |
| ITO/PAAm (1.3 nm) | 3.96 ± 0.06 |
| ITO/PAAm (17 nm) | 3.80 ± 0.06 |

Example D1

Work Function Reduction of ITO by Polyvinylpyrrolidone (PVP)

Indium tin oxide (ITO)-coated glass (Colorado Concept Coatings LLC) with a sheet resistivity of ~15 Ω/sq was used as substrate. The substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths.

Polyvinylpyrrolidone (PVP) was dissolved into deionized water with the weight concentration of 0.07%. Then the solutions were spin coated onto cleaned ITO substrates at a speed of 3000 rpm for 1 min and an acceleration of 1000 rpm/s. Then these samples were annealed at 80° C. for 5 min on hotplate in ambient air. For thicknesses measurement, another set of samples were prepared on silicon wafer substrates prepared under the same condition on ITO substrates. Thickness of PVP was measured to be 1.0 nm by using ellipsometry.

The work function of the ITO/PVP samples was measured in air using a Kelvin probe (Besocke Delta Phi) and averaged over three locations. A highly ordered pyrolytic graphite (HOPG) sample with a work function of 4.5 eV was used as the reference sample. Work function of ITO modified by PVP is shown in Table 13.

TABLE 13

| Work function reduction of ITO by PVP | |
|---|---|
| Samples | Work function (eV) |
| ITO | 4.62 ± 0.06 |
| ITO/PVP (1 nm) | 4.20 ± 0.06 |

Example E1

Work Function Reduction of ITO by Poly(Diallyldimethylammonium Chloride) (PDA-C)

Indium tin oxide (ITO)-coated glass (Colorado Concept Coatings LLC) with a sheet resistivity of ~15 Ω/sq was used as substrate. The substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths.

Poly(diallyldimethylammonium chloride) (PDA-C), was dissolved in $H_2O$ with a concentration of 35 wt. % when received from Aldrich. Then, it was further diluted with methoxyethanol to a concentration of 0.5 wt. %. This diluted solution was spin coated onto cleaned ITO substrates at a speed of 5000 rpm for 1 min and an acceleration of 1000 rpm/s and annealed at 120° C. for 10 min on hot plate in ambient air. The thickness of PDA-C was 13 nm, as determined by spectroscopic ellipsometry (J. A. Woollam Co.).

The work function of the ITO/PDA-C samples was measured in air using a Kelvin probe (Besocke Delta Phi) and averaged over three locations. A highly ordered pyrolytic graphite (HOPG) sample with a work function of 4.5 eV was used as the reference sample. Work function reduction of ITO by PDA-C is shown in Table 14.

TABLE 14

| Work function reduction of ITO by PDA-C | |
|---|---|
| Samples | Work function (eV) |
| ITO | 4.62 ± 0.06 |
| ITO/PDA-C (13 nm) | 4.44 ± 0.06 |

Example F1

Work function reduction of ITO by poly(1-vinylpyrrolidone-co-2-dimethylaminoethyl methacrylate) (PVP-DMA)

Indium tin oxide (ITO)-coated glass (Colorado Concept Coatings LLC) with a sheet resistivity of ~15 Ω/sq was used as substrate. The substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths.

Poly(1-vinylpyrrolidone-co-2-dimethylaminoethyl methacrylate) (PVP-DMA) was dissolved in $H_2O$ with a concentration of 19 wt. % when received from Aldrich. Then it was diluted with methoxyethanol to a concentration of 0.5 wt. %. Then the solution was spin coated onto cleaned ITO substrates at a speed of 5000 rpm for 1 min and an acceleration of 1000 rpm/s and annealed at 120° C. for 10 min on hot plate in ambient air. The thickness of PVP-DMA was 14 nm, determined by spectroscopic ellipsometry (J. A. Woollam Co.).

The work function of the ITO/PVP-DMA samples was measured in air using a Kelvin probe (Besocke Delta Phi) and averaged over three locations. A highly ordered pyrolytic graphite (HOPG) sample with a work function of 4.5 eV was used as the reference sample. Work function reduction of ITO by PVP-DMA is shown in Table 15.

TABLE 15

| Work function reduction of ITO by PVP-DMA | |
|---|---|
| Samples | Work function (eV) |
| ITO | 4.62 ± 0.06 |
| ITO/PVP-DMA (14 nm) | 4.20 ± 0.06 |

Example G1

Work function reduction of ITO by poly[bis(2-chloroethyl)ether-alt-1,3-bis[3-(dimethylamino)propyl]urea] quaternized (PBC-DMA)

Indium tin oxide (ITO)-coated glass (Colorado Concept Coatings LLC) with a sheet resistivity of ~15 Ω/sq was used as substrate. The substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths.

Poly[bis(2-chloroethyl)ether-alt-1,3-bis[3-(dimethylamino)propyl]urea] quaternized (PBC-DMA), was dissolved in $H_2O$ with a concentration of 62 wt. % as received from Aldrich, and then diluted with methoxyethanol to a concentration of 0.5 wt. %. Then, the diluted solution was spin coated onto cleaned ITO substrates at a speed of 5000 rpm for 1 min and an acceleration of 1000 rpm/s and annealed at 120° C. for 10 min on hot plate in ambient air. The thickness of PEIE was 9.3 nm, determined by spectroscopic ellipsometry (J. A. Woollam Co.).

The work function of the ITO/PBC-DMA samples was measured in air using a Kelvin probe (Besocke Delta Phi) and averaged over three locations. A highly ordered pyrolytic graphite (HOPG) sample with a work function of 4.5 eV was used as the reference sample. Work function reduction of ITO by PBC-DMA is shown in Table 16.

TABLE 16

Work function reduction of ITO by PBC-DMA

| Samples | Work function (eV) |
|---|---|
| ITO | 4.62 ± 0.06 |
| ITO/PBC-DMA (9.3 nm) | 4.16 ± 0.06 |

Example H1

Work Function of ITO/PAAm (10 nm) Measured by UPS

Indium tin oxide (ITO)-coated glass (Colorado Concept Coatings LLC) with a sheet resistivity of ~15 Ω/sq was used as substrate. The substrates were cleaned in an ultrasonic bath of detergent water, rinsed with deionized water, and then cleaned in sequential ultrasonic baths of deionized water, acetone, and methanol. Each ultrasonic bath lasted for 20 minutes. Nitrogen was used to dry the substrates after each of the last three baths.

Poly(allylamine) (PAAm) solution (Mw=17,000 g/mol), which was dissolved in $H_2O$ with a concentration of 20 wt. % as received from Aldrich, was diluted into methoxyethanol to the weight concentration of 0.5%. Then the solutions were spin coated onto cleaned ITO substrates at a speed of 5000 rpm for 1 min. Then these samples were annealed at 100° C. for 10 min on hotplate in nitrogen. Afterwards these samples were transferred into an UHV analysis chamber to conduct UPS measurements. He I (21.22 eV) radiation line from a discharge lamp was used in UPS, with an experimental resolution of 0.15 eV.

Figure 21:
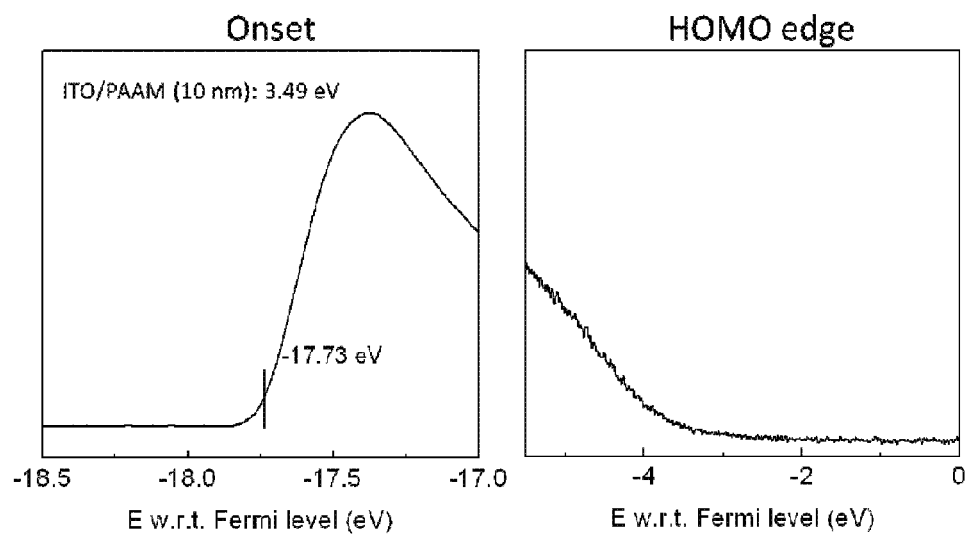
FIG. 21 shows an UPS spectra of ITO/PAAm (17,000 g/mol; 10 nm), according to an exemplary embodiment of the invention.

FIG. 21 shows UPS spectra of ITO/PAAm (17,000 g/mol; 10 nm), according to an exemplary embodiment of the invention. The photoemission onset at 17.73 eV corresponds to a work function of 3.49 eV.

Examples a1-a37

Use of PEIE Modified Electrodes in Organic Devices

Examples a1-a29

Use of PEIE Modified Electrodes in OPVs

Example a1

Figure 22:
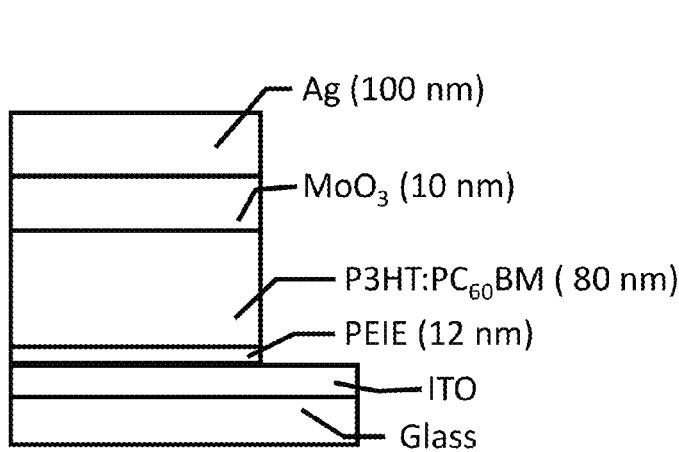
FIG. 22 shows a structure of an inverted solar cell and chemical structure of P3HT and $PC_{60}BM$, according to an exemplary embodiment of the invention.
Figure 22:
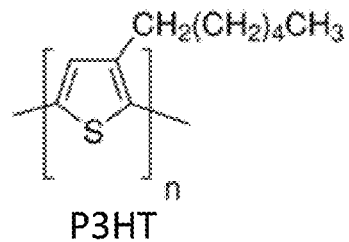
Figure 22:
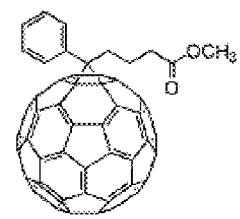

Inverted Solar Cells with ITO/PEIE (12 nm) Bottom Electrode, 80 nm P3HT:$PC_{60}BM$, $MoO_3$/Ag Top Electrode FIG. 22 shows a structure of the inverted solar cells and chemical structure of P3HT and $PC_{60}BM$, according to an exemplary embodiment of the invention.

ITO-coated glass (Colorado Concept Coatings LLC) with a sheet resistivity of ~15 Ω/sq. was used as substrate. The substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths. A 300-nm-thick layer of $SiO_x$ was deposited on the ITO substrate by e-beam deposition (AXXIS, Kurt J. Lesker) to pattern the anode. Next, the substrates were ultrasonicated in isopropanol for 10 minutes, blown dry with nitrogen.

Polyethylenimine, 80% ethoxylated (PEIE) ($M_w$=70,000 g/mol) was dissolved in $H_2O$ with a concentration of 35-40 wt. % as received from Aldrich. Then, it was further diluted into methoxyethanol to a concentration of 0.5 wt. %. The diluted solution was spin coated onto cleaned ITO substrates at 5000 rpm for 1 min and an acceleration of 1000 rpm/s and annealed at 120° C. for 10 min on hotplate in ambient air. The thickness of PETE was 12 nm, determined by spectroscopic ellipsometry (J. A. Woollam Co.).

Substrates were transferred into a $N_2$-filled glove box. The active layer of poly(3-hexylthiophene) (P3HT, 4002-E, B119-90, Rieke Metals, FIG. 22): [6,6]-phenyl $C_{61}$ butyric acid methyl ester ($PC_{60}BM$, Nano-C, FIG. 22) (1:0.7, weight ratio) was filtered through 0.2-μm-pore PTFE filters and spin-coated on each substrate from 17 mg/ml chlorobenzene solution at a speed of 1000 rpm and an acceleration of 10000 rpm/s and annealed at 160° C. for 10 min on hot plate in the glove box. The thickness of the active layer was 80 nm, measured using a profilometer (Dektak 6M Stylus, Veeco, Plainview, N.Y.).

Figure 23:
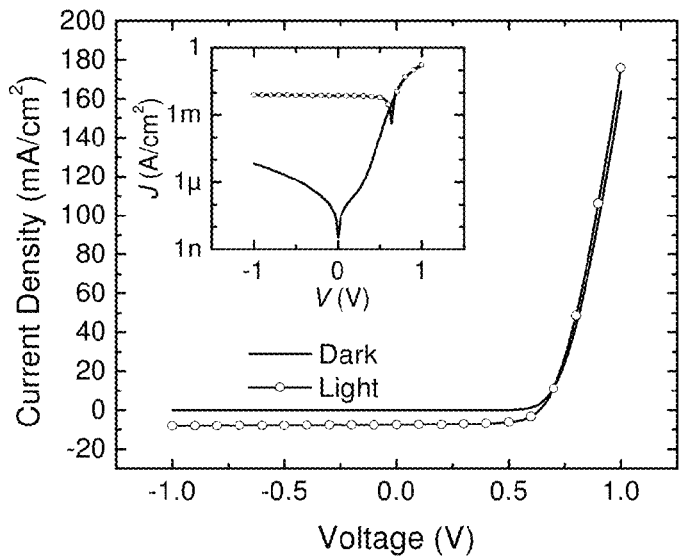
FIG. 23 shows J-V characteristics of a solar cell in dark and under AM 1.5 100 mW/cm$^2$ illumination, according to an exemplary embodiment of the invention.

FIG. 23 shows J-V characteristics of a solar cell in dark and under AM 1.5 100 mW/cm² illumination, according to an exemplary embodiment of the invention, and device performance is summarized in Table 17.

TABLE 17

| Photovoltaic parameters of the inverted solar cells averaged over 5 devices | | | | |
|---|---|---|---|---|
| Sample | $V_{OC}$ (V) | $J_{SC}$ (mA/cm²) | FF | PCE (%) |
| JWS-II-107G | 0.637 ± 0.004 | 7.51 ± 0.13 | 0.65 ± 0.01 | 3.11 ± 0.01 |

Example a2

Figure 24:
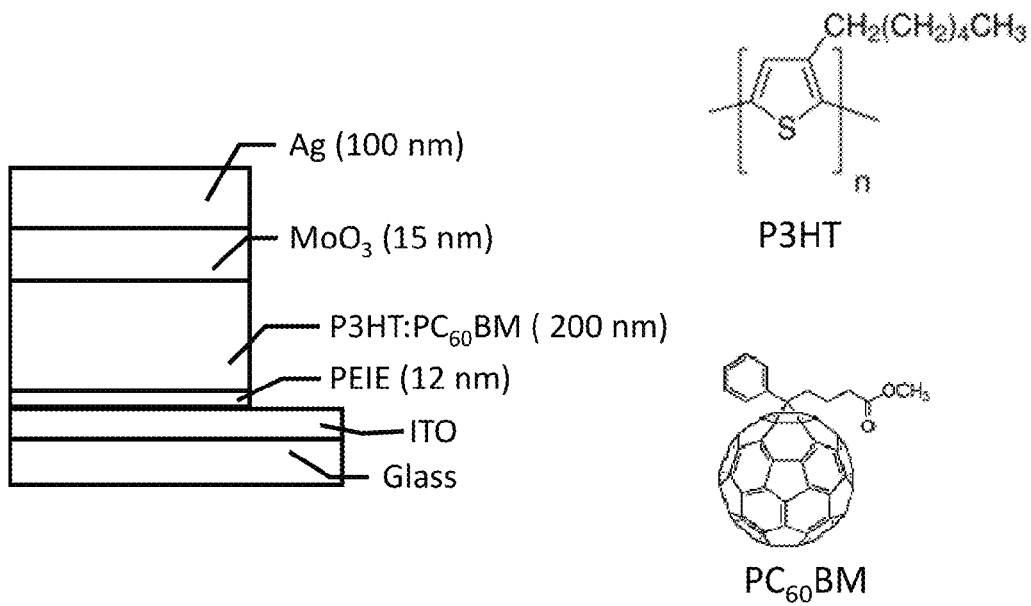
FIG. 24 shows a device structure of an inverted solar cell and chemical structure of P3HT and $PC_{60}BM$, according to an exemplary embodiment of the invention.

Inverted Solar Cells with ITO/PEIE (12 nm) Bottom Electrode, 200 nm P3HT:$PC_{60}BM$, $MoO_3$/Ag Top Electrode FIG. 24 shows a device structure of an inverted solar cell and chemical structure of P3HT and $PC_{60}BM$, according to an exemplary embodiment of the invention.

ITO-coated glass (Colorado Concept Coatings LLC) with a sheet resistivity of ~15 Ω/sq. was used as substrate. The ITO substrates were patterned with kapton tape and etched by acid vapor (1:3 by volume, $HNO_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths.

Polyethylenimine, 80% ethoxylated (PEIE) ($M_w$=70,000 g/mol) was dissolved in $H_2O$ with a concentration of 35-40 wt. % as received from Aldrich. Then, it was further diluted into methoxyethanol to a concentration of 0.5 wt. %. The diluted solution was spin coated onto cleaned ITO substrates at 5000 rpm for 1 min and an acceleration of 1000 rpm/s and annealed at 120° C. for 10 min on hotplate in ambient air. The thickness of PEIE was 12 nm, determined by spectroscopic ellipsometry (J. A. Woollam Co.).

Then, the substrates were transferred into a $N_2$-filled glove box. The active layer of poly(3-hexylthiophene) (P3HT, 4002-E, BI19-90, Rieke Metals, FIG. 24): [6,6]-phenyl $C_{61}$ butyric acid methyl ester ($PC_{60}BM$, Nano-C, FIG. 24) (1:0.7, weight ratio) was filtered through 0.2-μm-pore PTFE filters and spin-coated on each substrate from 34 mg/ml chlorobenzene solution at a speed of 1000 rpm and an acceleration of 10000 rpm/s and annealed at 160° C. for 10 min on hot plate in the glove box. The thickness of the active layer was 200 nm, measured using a profilometer (Dektak 6M Stylus, Veeco, Plainview, N.Y.).

Samples were then loaded into a vacuum thermal evaporation system (SPECTROS, Kurt J. Lesker) connected to the glove box, and a $MoO_3$ (10 nm) and 150 nm of Ag was deposited through a shadow mask at a base pressure of $2\times10^{-7}$ Torr. The effective area of the active layer was 10 $mm^2$. The completed devices were transferred to another nitrogen-filled glove box for electrical measurements in a sealed container.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 $mW/cm^2$ was used as the light source.

Figure 25:
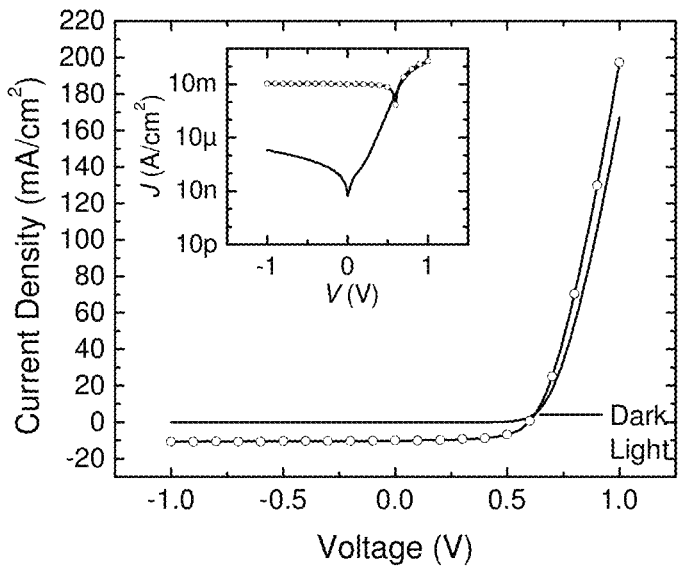
FIG. 25 shows J-V characteristics of the solar cells in dark and under AM 1.5 100 mW/cm$^2$ illumination, according to an exemplary embodiment of the invention.

FIG. 25 shows J-V characteristics of a solar cell in dark and under AM 1.5 100 $mW/cm^2$ illumination, according to an exemplary embodiment of the invention, and device performance is summarized in Table 18.

TABLE 18

Photovoltaic parameters of the inverted solar cells averaged over 5 devices

| Sample | $V_{OC}$ (V) | $J_{SC}$ (mA/cm$^2$) | FF | PCE (%) |
|---|---|---|---|---|
| YHZ-I-150B | 0.591 ± 0.004 | 10.24 ± 0.38 | 0.601 ± 0.013 | 3.64 ± 0.11 |

Example a3

Figure 26:
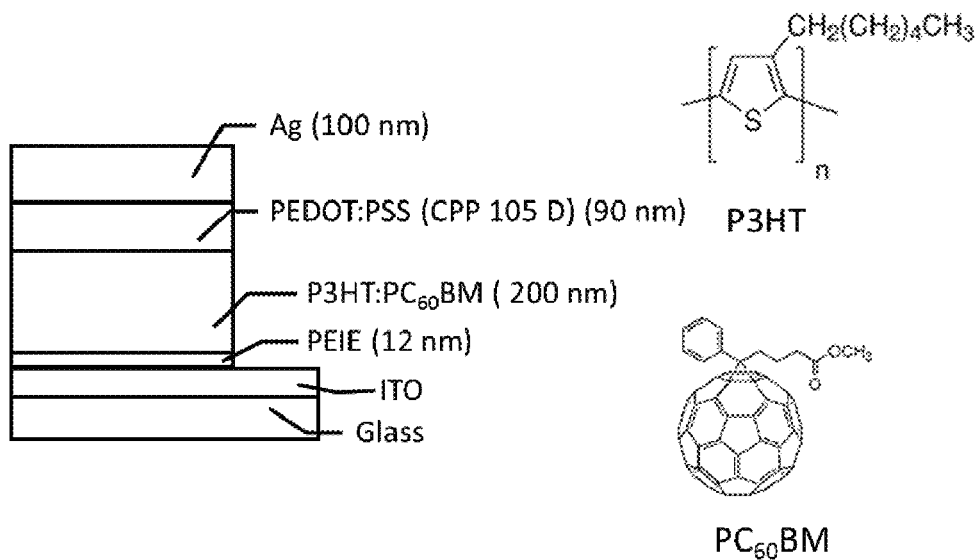
FIG. 26 shows a device structure of an inverted solar cell and chemical structure of P3HT and $PC_{60}BM$.

Inverted Solar Cells with ITO/PEIE (12 nm) Bottom Electrode, 200 nm P3HT:$PC_{60}BM$, PEDOT:PSS/Ag Top Electrode and their Air Stability FIG. 26 shows a device structure of an inverted solar cell and chemical structure of P3HT and $PC_{60}BM$.

ITO-coated glass (Colorado Concept Coatings LLC) with a sheet resistivity of ~15 Ω/sq. was used as substrate. The ITO substrates were patterned with kapton tape and etched by acid vapor (1:3 by volume, $HNO_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths.

Polyethylenimine, 80% ethoxylated (PEIE) ($M_w$=70,000 g/mol) was dissolved in $H_2O$ with a concentration of 35-40 wt. % as received from Aldrich. Then, it was further diluted into methoxyethanol to a concentration of 0.5 wt. %. The diluted solution was spin coated onto cleaned ITO substrates at 5000 rpm for 1 min and an acceleration of 1000 rpm/s and annealed at 120° C. for 10 min on hotplate in ambient air. The thickness of PEIE was 12 nm, determined by spectroscopic ellipsometry (J. A. Woollam Co.).

Then the substrates were transferred into a $N_2$-filled glove box. The active layer of poly(3-hexylthiophene) (P3HT, 4002-E, BJ19-79, Rieke Metals, FIG. 26): [6,6]-phenyl $C_{61}$ butyric acid methyl ester ($PC_{60}BM$, Nano-C, FIG. 26) (1:0.7, weight ratio) was filtered through 0.2-μm-pore PTFE filters and spin-coated on each substrate from 34 mg/ml chlorobenzene solution at a speed of 700 rpm and an acceleration of 10000 rpm/s and annealed at 160° C. for 10 min on hot plate in the glove box. The thickness of the active layer was 200 nm, measured using a profilometer (Dektak 6M Stylus, Veeco, Plainview, N.Y.).

Samples were then transferred out of the glove box and a layer of poly(3,4-ethylenedioxythiophene):poly(styrenesulfonate) (CLEVIOS™ F CPP 105 DM, HC Stack Inc., MA, 90 nm) was spin coated on top of the active layer at a speed of 5000 rpm and an acceleration of 1000 rpm/s. Samples were annealed at 110° C. for 10 min on hot plate in a $N_2$-filled glove box to dry the PEDOT:PSS layer.

Samples were then loaded into a vacuum thermal evaporation system (EvoVac, Angstrom Engineering Inc.), and a 100 nm of Ag was deposited through a shadow mask at a base pressure of $2\times10^{-7}$ Torr. The effective area of the active layer was 10 $mm^2$. The completed devices were transferred to another nitrogen-filled glove box for electrical measurements in a sealed container.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 $mW/cm^2$ was used as the light source.

To test the air stability of the devices, devices were kept in the dark under a regular atmosphere air up to 102 days without encapsulation and their photovoltaic performance was measured periodically by transferring the samples back into a nitrogen-filled glove box.

Figure 27:
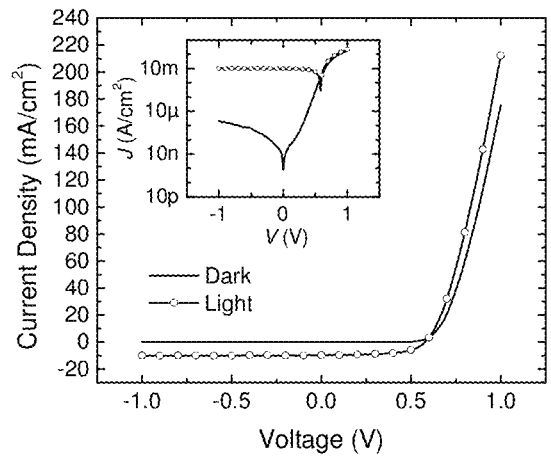
FIG. 27 shows J-V characteristics of a solar cell in dark and under AM 1.5 100 mW/cm$^2$ illumination, according to an exemplary embodiment of the invention.

FIG. 27 shows J-V characteristics of a solar cell in dark and under AM 1.5 100 $mW/cm^2$ illumination, according to an exemplary embodiment of the invention, and device performance is summarized in Table 19.

Figure 28:
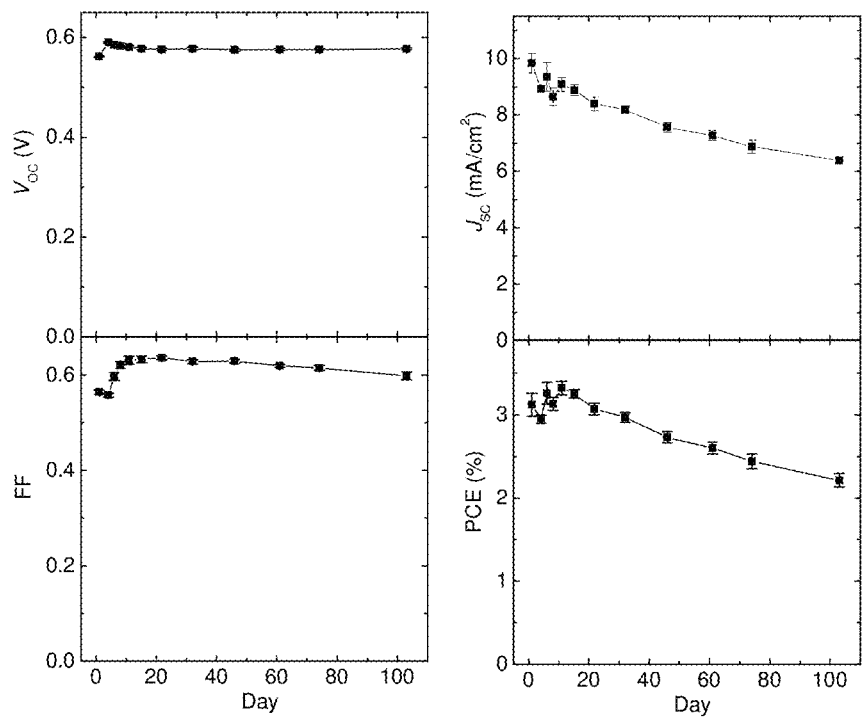
FIG. 28 shows device performances under AM 1.5 100 mW/cm$^2$ illumination after stored in ambient air in dark for different time, according to an exemplary embodiment of the invention.

FIG. 28 shows a device performances under AM 1.5 100 $mW/cm^2$ illumination after stored in ambient air in dark for different time, according to an exemplary embodiment of the invention.

TABLE 19

Photovoltaic parameters of the inverted solar cells averaged over 5 devices

| Sample | $V_{OC}$ (V) | $J_{SC}$ (mA/cm$^2$) | FF | PCE (%) |
|---|---|---|---|---|
| YHZ-I-150D | 0.576 ± 0.004 | 9.57 ± 0.36 | 0.597 ± 0.006 | 3.29 ± 0.12 |

Example a4

Figure 29:
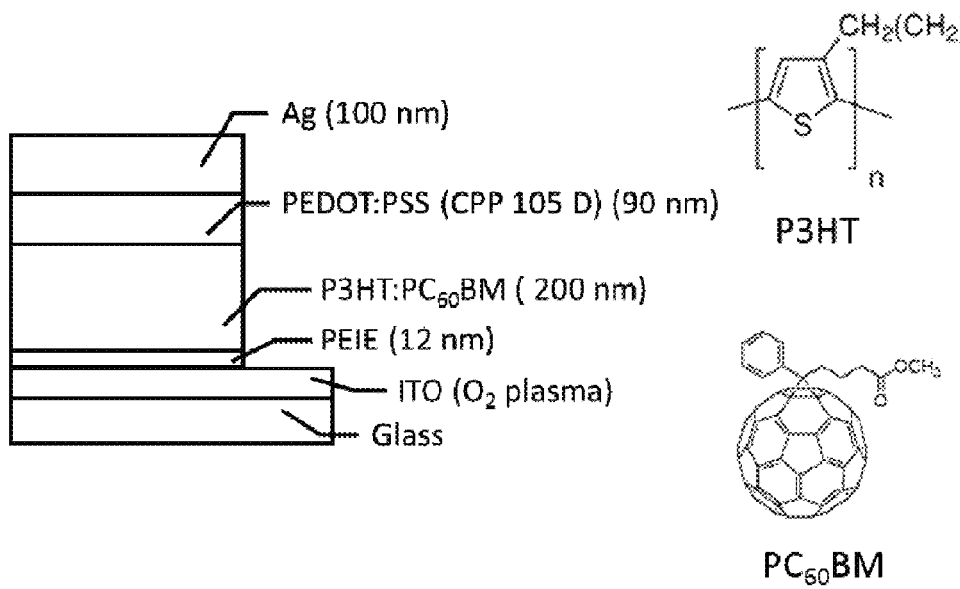
FIG. 29 shows a device structure of an inverted solar cell and chemical structure of P3HT and $PC_{60}BM$, according to an exemplary embodiment of the invention.

Inverted Solar Cells with ITO ($O_2$ Plasma-Treated)/PEIE (12 nm) Bottom Electrode, 200 nm P3HT:$PC_{60}BM$, PEDOT:PSS/Ag Top Electrode FIG. 29 shows a device structure of an inverted solar cell and chemical structure of P3HT and $PC_{60}BM$, according to an exemplary embodiment of the invention.

ITO-coated glass (Colorado Concept Coatings LLC) with a sheet resistivity of ~15 Ω/sq. was used as substrate. The ITO substrates were patterned with kapton tape and etched by acid vapor (1:3 by volume, $HNO_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths. ITO substrates were treatment by $O_2$ plasma for 3 min.

Polyethylenimine, 80% ethoxylated (PEIE) ($M_w$=70,000 g/mol) was dissolved in $H_2O$ with a concentration of 35-40 wt. % as received from Aldrich. Then, it was further diluted into methoxyethanol to a concentration of 0.5 wt. %. The diluted solution was spin coated onto cleaned ITO substrates at 5000 rpm for 1 min and an acceleration of 1000 rpm/s and annealed at 120° C. for 10 min on hotplate in ambient air. The thickness of PEIE was 12 nm, determined by spectroscopic ellipsometry (J. A. Woollam Co.).

Then, the substrates were transferred into a $N_2$-filled glove box. The active layer of poly(3-hexylthiophene) (P3HT, 4002-E, B119-90, Rieke Metals, FIG. 29): [6,6]-phenyl $C_{61}$ butyric acid methyl ester ($PC_{60}BM$, Nano-C, FIG. 29) (1:0.7, weight ratio) was filtered through 0.2-μm-pore PTFE filters and spin-coated on each substrate from 17 mg/ml chlorobenzene solution at a speed of 1000 rpm and an acceleration of 10000 rpm/s and annealed at 160° C. for 10 min on hot plate in the glove box. The thickness of the active layer was 80 nm, measured using a profilometer (Dektak 6M Stylus, Veeco, Plainview, N.Y.).

Samples were then transferred out of the glove box and a layer of poly(3,4-ethylenedioxythiophene):poly(styrenesulfonate) (CLEVIOS™ F CPP 105 DM, HC Stack Inc., MA, 90 nm) was spin coated on top of the active layer at a speed of 5000 rpm and an acceleration of 1000 rpm/s. Samples were annealed at 110° C. for 10 min on hot plate in a $N_2$-filled glove box to dry the PEDOT:PSS layer.

Samples were then loaded into a vacuum thermal evaporation system (EvoVac, Angstrom Engineering Inc.), and a 100 nm of Ag was deposited through a shadow mask at a base pressure of $2\times10^{-7}$ Torr. The effective area of the active layer was 10 $mm^2$. The completed devices were transferred to another nitrogen-filled glove box for electrical measurements in a sealed container.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/$cm^2$ was used as the light source.

Figure 30:
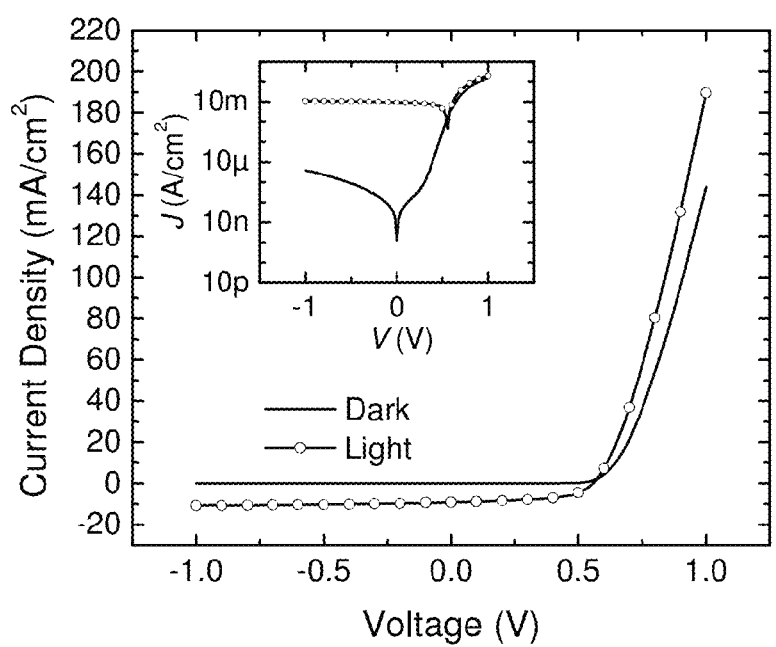
FIG. 30 shows J-V characteristics of a solar cell in dark and under AM 1.5 100 mW/cm$^2$ illumination, according to an exemplary embodiment of the invention.

FIG. 30 shows J-V characteristics of a solar cell in dark and under AM 1.5 100 mW/$cm^2$ illumination, according to an exemplary embodiment of the invention, and device performance is summarized in Table 20.

TABLE 20

Photovoltaic parameters of the inverted solar cells averaged over 5 devices

| Sample | $V_{OC}$ (V) | $J_{SC}$ (mA/$cm^2$) | FF | PCE (%) |
|---|---|---|---|---|
| YHZ-I-149G | 0.558 ± 0.001 | 10.36 ± 0.49 | 0.554 ± 0.008 | 3.20 ± 0.15 |

Example a5

Figure 31:
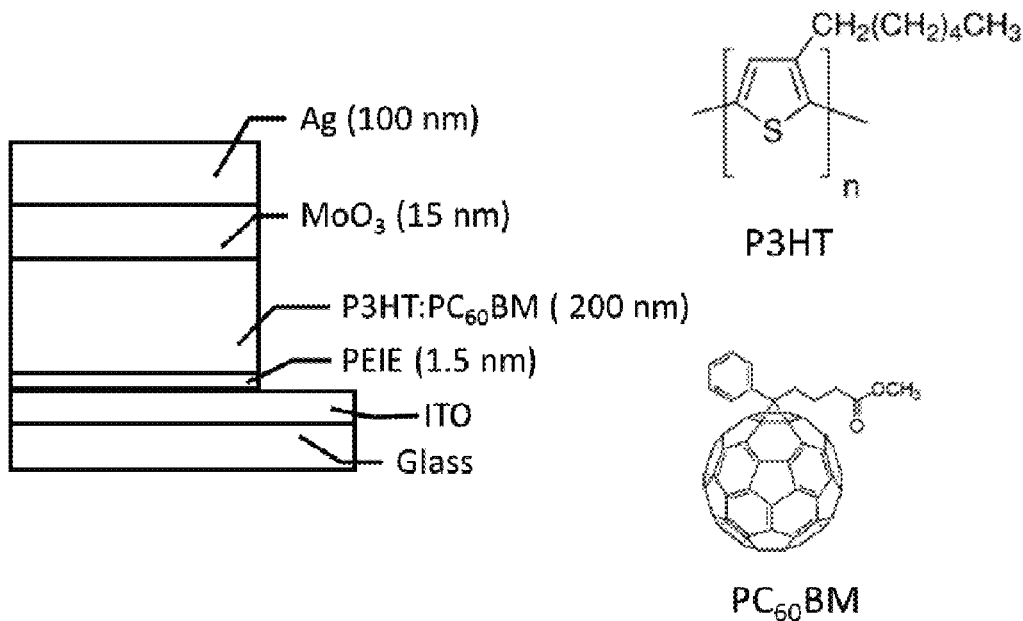
FIG. 31 shows a device structure of an inverted solar cell and chemical structure of P3HT and $PC_{60}BM$, according to an exemplary embodiment of the invention.

Inverted Solar Cells with ITO/PEIE (1.5 nm) Bottom Electrode, 200 nm P3HT:$PC_{60}BM$, $MoO_3$/Ag Top Electrode FIG. 31 shows a device structure of an inverted solar cell and chemical structure of P3HT and $PC_{60}BM$, according to an exemplary embodiment of the invention.

ITO-coated glass (Colorado Concept Coatings LLC) with a sheet resistivity of ~15 Ω/sq. was used as substrate. The ITO substrates were patterned with kapton tape and etched by acid vapor (1:3 by volume, $HNO_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths.

Polyethylenimine, 80% ethoxylated (PEIE) ($M_w$=70,000 g/mol) was dissolved in $H_2O$ with a concentration of 35-40 wt. % as received from Aldrich. Then, it was further diluted into methoxyethanol to a concentration of 0.05 wt. %. The diluted solution was spin coated onto cleaned ITO substrates at 5000 rpm for 1 min and an acceleration of 1000 rpm/s and annealed at 120° C. for 10 min on hotplate in ambient air. The thickness of PETE was 1.5 nm, determined by spectroscopic ellipsometry (J. A. Woollam Co.).

Then, the substrates were transferred into a $N_2$-filled glove box. The active layer of poly(3-hexylthiophene) (P3HT, 4002-E, B119-90, Rieke Metals, FIG. 31): [6,6]-phenyl $C_{61}$ butyric acid methyl ester ($PC_{60}BM$, Nano-C) (1:0.7, weight ratio, FIG. 31) was filtered through 0.2-μm-pore PTFE filters and spin-coated on each substrate from 34 mg/ml chlorobenzene solution at a speed of 1000 rpm and an acceleration of 10000 rpm/s and annealed at 160° C. for 10 min on hot plate in the glove box. The thickness of the active layer was 200 nm, measured using a profilometer (Dektak 6M Stylus, Veeco, Plainview, N.Y.).

Samples were then loaded into a vacuum thermal evaporation system (SPECTROS, Kurt J. Lesker) connected to the glove box, and a $MoO_3$ (10 nm) and 150 nm of Ag was deposited through a shadow mask at a base pressure of $2\times10^{-7}$ Torr. The effective area of the active layer was 10 $mm^2$. The completed devices were transferred to another nitrogen-filled glove box for electrical measurements in a sealed container.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/$cm^2$ was used as the light source.

Figure 32:
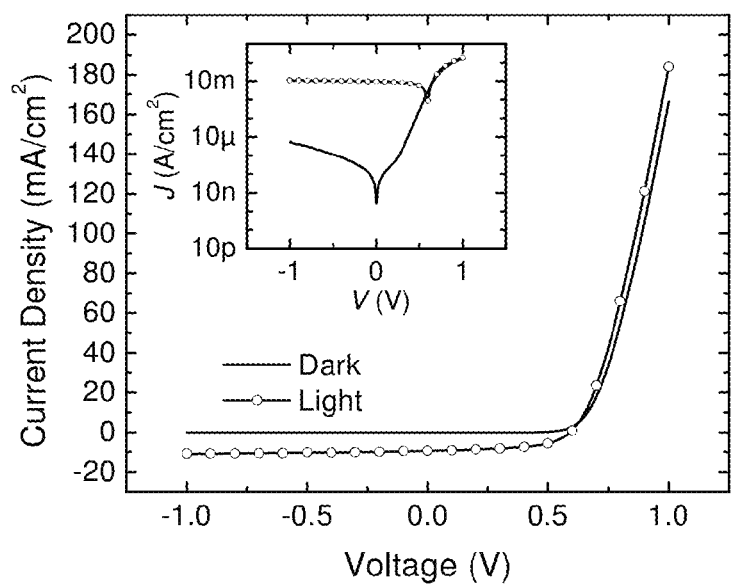
FIG. 32 shows J-V characteristics of a solar cell in dark and under AM 1.5 100 mW/cm$^2$ illumination, according to an exemplary embodiment of the invention.

FIG. 32 shows J-V characteristics of a solar cell in dark and under AM 1.5 100 mW/$cm^2$ illumination, according to an exemplary embodiment of the invention, and device performance is summarized in Table 21.

TABLE 21

Photovoltaic parameters of the inverted solar cells averaged over 5 devices

| Sample | $V_{OC}$ (V) | $J_{SC}$ (mA/$cm^2$) | FF | PCE (%) |
|---|---|---|---|---|
| YHZ-I-150A | 0.590 ± 0.003 | 9.53 ± 0.42 | 0.580 ± 0.008 | 3.26 ± 0.16 |

Example a6

Figure 33:
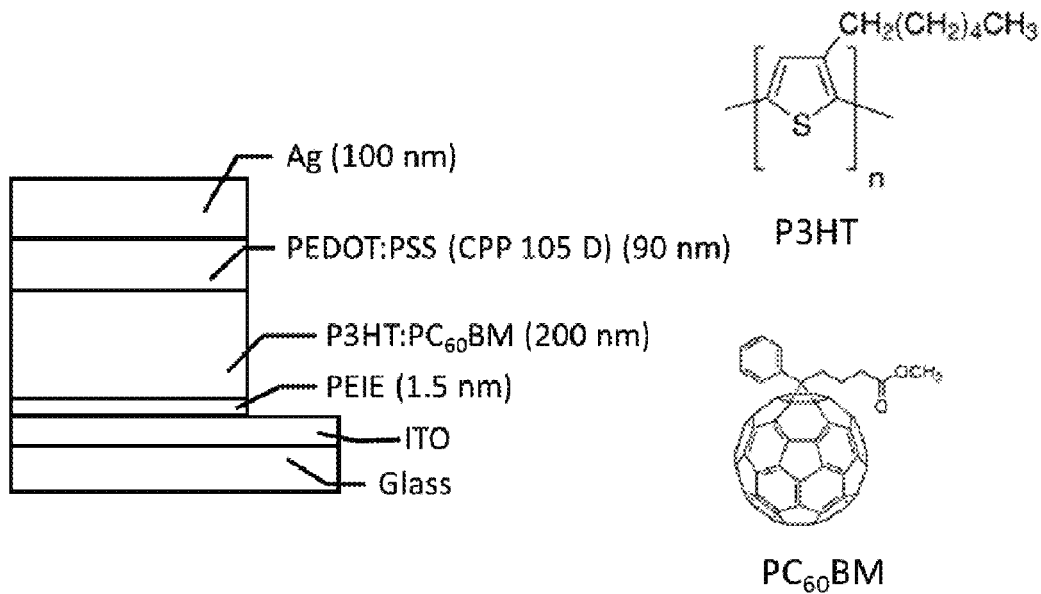
FIG. 33 shows a device structure of an inverted solar cell and chemical structure of P3HT and $PC_{60}BM$, according to an exemplary embodiment of the invention.

Inverted Solar Cells with ITO/PEIE (1.5 nm) Bottom Electrode, 200 nm P3HT:PC$_{60}$BM, PEDOT:PSS/Ag Top Electrode FIG. 33 shows a device structure of an inverted solar cell and chemical structure of P3HT and PC$_{60}$BM, according to an exemplary embodiment of the invention.

ITO-coated glass (Colorado Concept Coatings LLC) with a sheet resistivity of ~15 Ω/sq. was used as substrate. The ITO substrates were patterned with kapton tape and etched by acid vapor (1:3 by volume, HNO$_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths.

Polyethylenimine, 80% ethoxylated (PEIE) ($M_w$=70,000 g/mol) was dissolved in H$_2$O with a concentration of 35-40 wt. % as received from Aldrich. Then, it was further diluted into methoxyethanol to a concentration of 0.05 wt. %. The diluted solution was spin coated onto cleaned ITO substrates at 5000 rpm for 1 min and an acceleration of 1000 rpm/s and annealed at 120° C. for 10 min on hotplate in ambient air. The thickness of PEIE was 1.5 nm, determined by spectroscopic ellipsometry (J. A. Woollam Co.).

Then, the substrates were transferred into a N$_2$-filled glove box. The active layer of poly(3-hexylthiophene) (P3HT, 4002-E, B119-90, Rieke Metals, FIG. 33): [6,6]-phenyl C$_{61}$ butyric acid methyl ester (PC$_{60}$BM, Nano-C, FIG. 33) (1:0.7, weight ratio) was filtered through 0.2-μm-pore PTFE filters and spin-coated on each substrate from 34 mg/ml chlorobenzene solution at a speed of 1000 rpm and an acceleration of 10000 rpm/s and annealed at 160° C. for 10 min on hot plate in the glove box. The thickness of the active layer was 200 nm, measured using a profilometer (Dektak 6M Stylus, Veeco, Plainview, N.Y.).

Samples were then transferred out of the glove box and a layer of poly(3,4-ethylenedioxythiophene):poly(styrenesulfonate) (CLEVIOS™ F CPP 105 DM, HC Stack Inc., MA, 90 nm) was spin coated on top of the active layer at a speed of 5000 rpm and an acceleration of 1000 rpm/s. Samples were annealed at 110° C. for 10 min on hot plate in a N$_2$-filled glove box to dry the PEDOT:PSS layer.

Samples were then loaded into a vacuum thermal evaporation system (EvoVac, Angstrom Engineering Inc.), and a 100 nm of Ag was deposited through a shadow mask at a base pressure of 2×10$^{-7}$ Torr. The effective area of the active layer was 10 mm$^2$. The completed devices were transferred to another nitrogen-filled glove box for electrical measurements in a sealed container.

Current density-voltage (J-V) characteristics were measured inside the N$_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm$^2$ was used as the light source.

Figure 34:
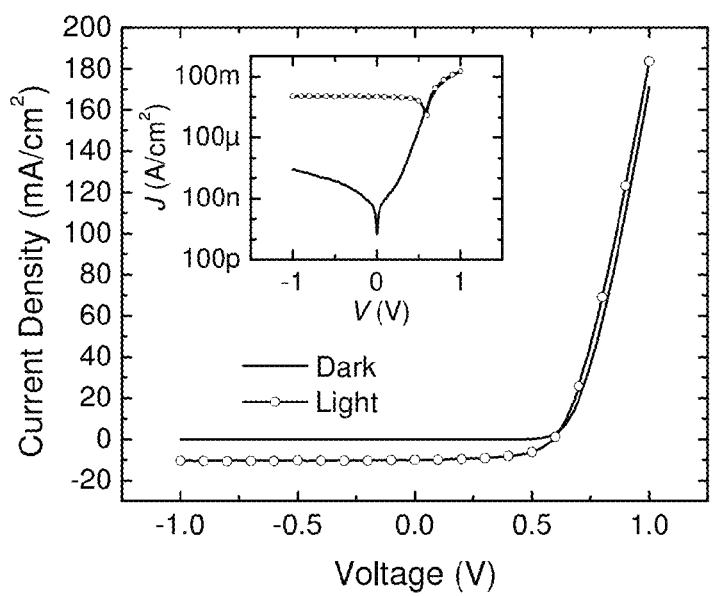
FIG. 34 shows J-V characteristics of a solar cell in dark and under AM 1.5 100 mW/cm$^2$ illumination, according to an exemplary embodiment of the invention.

FIG. 34 shows J-V characteristics of a solar cell in dark and under AM 1.5 100 mW/cm$^2$ illumination, according to an exemplary embodiment of the invention, and device performance is summarized in Table 22.

TABLE 22

Photovoltaic parameters of the inverted solar cells averaged over 5 devices

| Sample | $V_{OC}$ (V) | $J_{SC}$ (mA/cm$^2$) | FF | PCE (%) |
|---|---|---|---|---|
| YHZ-I-150C | 0.587 ± 0.003 | 10.21 ± 0.25 | 0.568 ± 0.013 | 3.40 ± 0.10 |

Example a7

Figure 35:
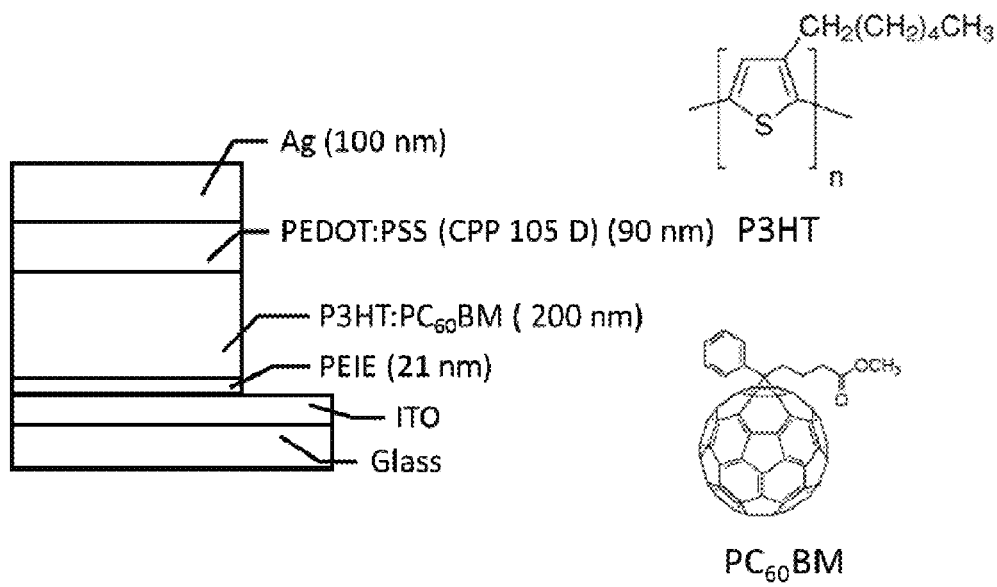
FIG. 35 shows a device structure of an inverted solar cell and chemical structure of P3HT and PC$_{60}$BM, according to an exemplary embodiment of the invention.

Inverted Solar Cells with ITO/PEIE (21 nm) Bottom Electrode, 200 nm P3HT:PC$_{60}$BM, PEDOT:PSS/Ag Top Electrode FIG. 35 shows a device structure of an inverted solar cell and chemical structure of P3HT and PC$_{60}$BM, according to an exemplary embodiment of the invention.

ITO-coated glass (Colorado Concept Coatings LLC) with a sheet resistivity of ~15 Ω/sq. was used as substrate. The ITO substrates were patterned with kapton tape and etched by acid vapor (1:3 by volume, HNO$_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths.

Polyethylenimine, 80% ethoxylated (PEIE) ($M_w$=70,000 g/mol) was dissolved in H$_2$O with a concentration of 35-40 wt. % as received from Aldrich. Then, it was further diluted into methoxyethanol to a concentration of 1 wt. %. The diluted solution was spin coated onto cleaned ITO substrates at 5000 rpm for 1 min and an acceleration of 1000 rpm/s and annealed at 120° C. for 10 min on hotplate in ambient air. The thickness of PEIE was 21 nm, determined by spectroscopic ellipsometry (J. A. Woollam Co.).

Then, the substrates were transferred into a N$_2$-filled glove box. The active layer of poly(3-hexylthiophene) (P3HT, 4002-E, B119-90, Rieke Metals, FIG. 35): [6,6]-phenyl C$_{61}$ butyric acid methyl ester (PC$_{60}$BM, Nano-C, FIG. 35) (1:0.7, weight ratio) was filtered through 0.2-μm-pore PTFE filters and spin-coated on each substrate from 34 mg/ml chlorobenzene solution at a speed of 1000 rpm and an acceleration of 10000 rpm/s and annealed at 160° C. for 10 min on hot plate in the glove box. The thickness of the active layer was 200 nm, measured using a profilometer (Dektak 6M Stylus, Veeco, Plainview, N.Y.).

Samples were then transferred out of the glove box and a layer of poly(3,4-ethylenedioxythiophene):poly(styrenesulfonate) (CLEVIOS™ F CPP 105 DM, HC Stack Inc., MA, 90 nm) was spin coated on top of the active layer at a speed of 5000 rpm and an acceleration of 1000 rpm/s. Samples were annealed at 110° C. for 10 min on hot plate in a N$_2$-filled glove box to dry the PEDOT:PSS layer.

Samples were then loaded into a vacuum thermal evaporation system (EvoVac, Angstrom Engineering Inc.), and a 100 nm of Ag was deposited through a shadow mask at a base pressure of 2×10$^{-7}$ Torr. The effective area of the active layer was 10 mm$^2$. The completed devices were transferred to another nitrogen-filled glove box for electrical measurements in a sealed container.

Current density-voltage (J-V) characteristics were measured inside the N$_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm² was used as the light source.

Figure 36:
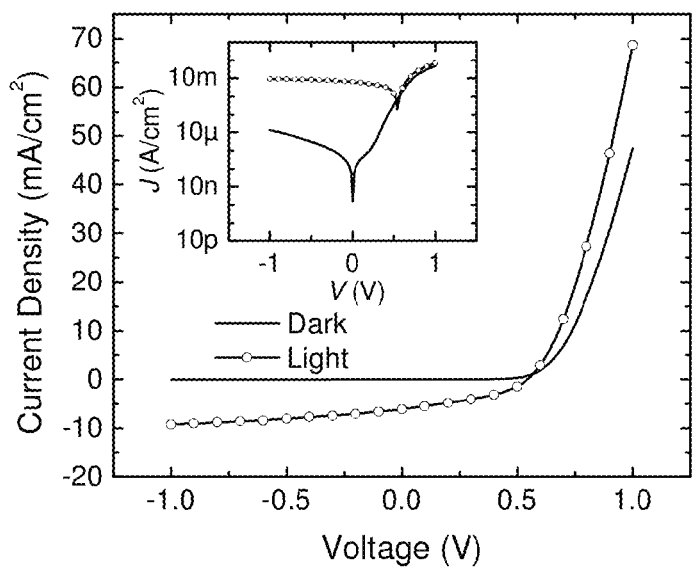
FIG. 36 shows J-V characteristics of a solar cell in dark and under AM 1.5 100 mW/cm$^2$ illumination, according to an exemplary embodiment of the invention.

FIG. 36 shows J-V characteristics of a solar cell in dark and under AM 1.5 100 mW/cm² illumination, according to an exemplary embodiment of the invention, and device performance is summarized in Table 23.

TABLE 23

Photovoltaic parameters of the inverted solar cells averaged over 5 devices

| Sample | $V_{OC}$ (V) | $J_{SC}$ (mA/cm²) | FF | PCE (%) |
|---|---|---|---|---|
| YHZ-II-20C | 0.546 ± 0.005 | 6.13 ± 0.54 | 0.393 ± 0.017 | 1.32 ± 0.17 |

Example a8

Figure 37:
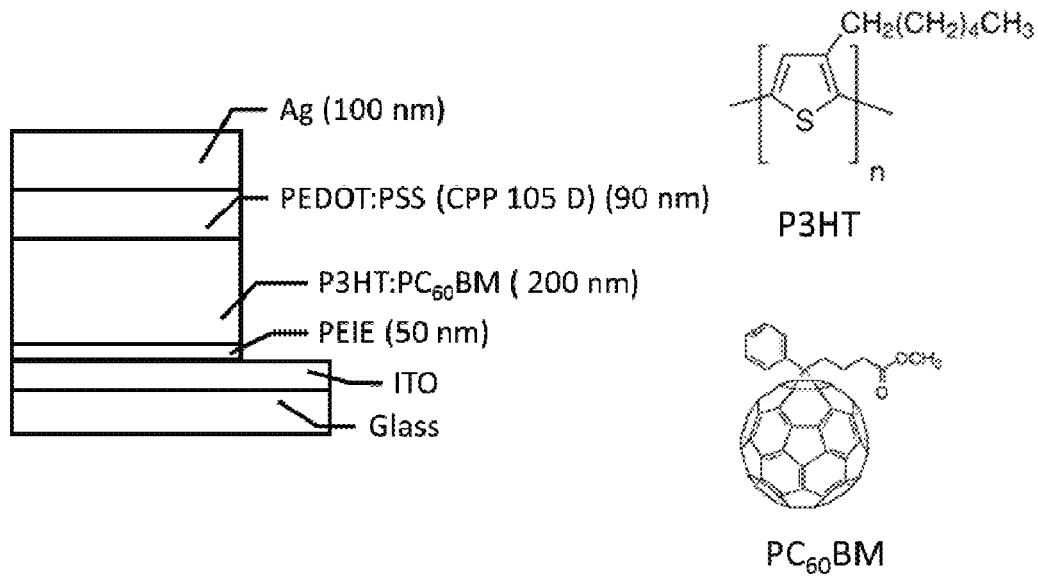
FIG. 37 shows a device structure of an inverted solar cell and chemical structure of P3HT and PC$_{60}$BM, according to an exemplary embodiment of the invention.

Inverted Solar Cells with ITO/PEIE (50 nm) Bottom Electrode, 200 nm 3HT:PC$_{60}$BM, PEDOT:PSS/Ag Top Electrode FIG. 37 shows a device structure of an inverted solar cell and chemical structure of P3HT and PC$_{60}$BM, according to an exemplary embodiment of the invention.

ITO-coated glass (Colorado Concept Coatings LLC) with a sheet resistivity of ~15 Ω/sq. was used as substrate. The ITO substrates were patterned with kapton tape and etched by acid vapor (1:3 by volume, HNO$_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths.

Polyethylenimine, 80% ethoxylated (PEIE) (M$_w$=70,000 g/mol) was dissolved in H$_2$O with a concentration of 35-40 wt. % as received from Aldrich. Then, it was further diluted into methoxyethanol to a concentration of 2 wt. %. The diluted solution was spin coated onto cleaned ITO substrates at 5000 rpm for 1 min and an acceleration of 1000 rpm/s and annealed at 120° C. for 10 min on hotplate in ambient air. The thickness of PEIE was 50 nm, determined by spectroscopic ellipsometry (J. A. Woollam Co.).

Then, the substrates were transferred into a N$_2$-filled glove box. The active layer of poly(3-hexylthiophene) (P3HT, 4002-E, BI19-90, Rieke Metals, FIG. 37): [6,6]-phenyl C$_{61}$ butyric acid methyl ester (PC$_{60}$BM, Nano-C, FIG. 37) (1:0.7, weight ratio) was filtered through 0.2-µm-pore PTFE filters and spin-coated on each substrate from 34 mg/ml chlorobenzene solution at a speed of 1000 rpm and an acceleration of 10000 rpm/s and annealed at 160° C. for 10 min on hot plate in the glove box. The thickness of the active layer was 200 nm, measured using a profilometer (Dektak 6M Stylus, Veeco, Plainview, N.Y.).

Samples were then transferred out of the glove box and a layer of poly(3,4-ethylenedioxythiophene):poly(styrenesulfonate) (CLEVIOS™ F CPP 105 DM, HC Stack Inc., MA, 90 nm) was spin coated on top of the active layer at a speed of 5000 rpm and an acceleration of 1000 rpm/s. Samples were annealed at 110° C. for 10 min on hot plate in a N$_2$-filled glove box to dry the PEDOT:PSS layer.

Samples were then loaded into a vacuum thermal evaporation system (EvoVac, Angstrom Engineering Inc.), and a 100 nm of Ag was deposited through a shadow mask at a base pressure of 2×10$^{-7}$ Torr. The effective area of the active layer was 10 mm². The completed devices were transferred to another nitrogen-filled glove box for electrical measurements in a sealed container.

Current density-voltage (J-V) characteristics were measured inside the N$_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm² was used as the light source.

Figure 38:
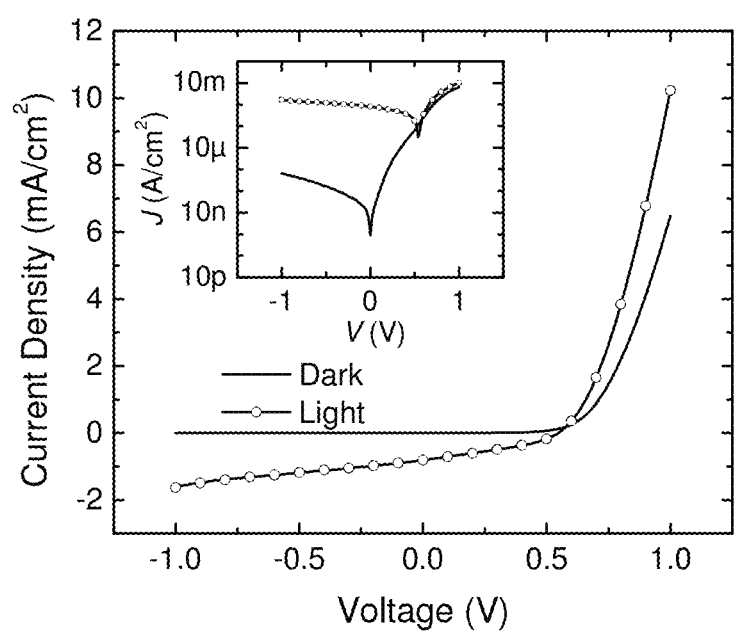
FIG. 38 shows J-V characteristics of a solar cell under AM 1.5 100 mW/cm$^2$ illumination, according to an exemplary embodiment of the invention.

FIG. 38 shows J-V characteristics of a solar cell under AM 1.5 100 mW/cm² illumination, according to an exemplary embodiment of the invention, and device performance is summarized in Table 24.

TABLE 24

Photovoltaic parameters of the inverted solar cells averaged over 5 devices

| Sample | $V_{OC}$ (V) | $J_{SC}$ (mA/cm²) | FF | PCE (%) |
|---|---|---|---|---|
| YHZ-II-20D | 0.544 ± 0.006 | 0.73 ± 0.17 | 0.358 ± 0.016 | 0.14 ± 0.03 |

Example a9

Figure 39:
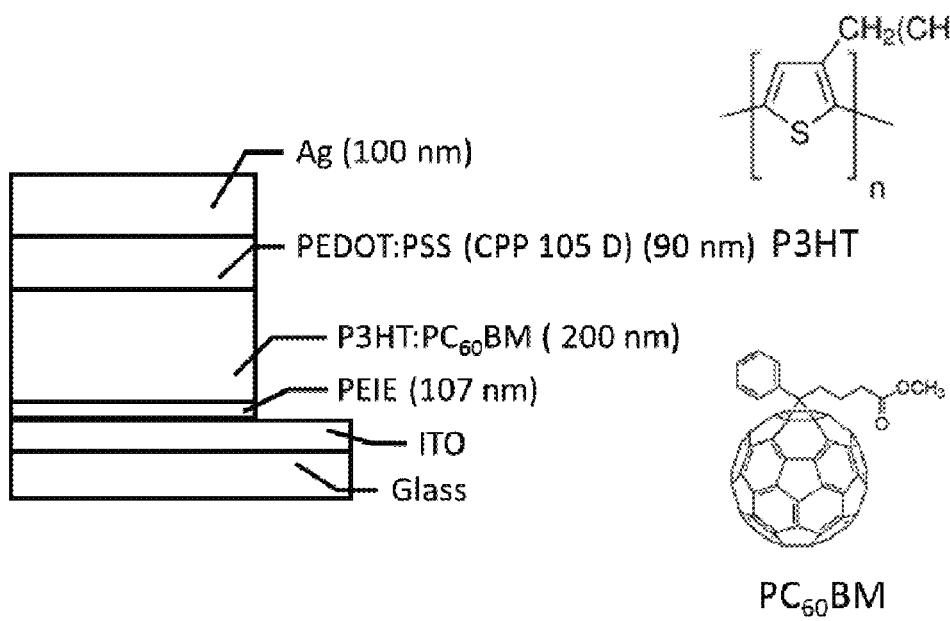
FIG. 39 shows a device structure of an inverted solar cell and chemical structure of P3HT and PC$_{60}$BM, according to an exemplary embodiment of the invention.

Inverted Solar Cells with ITO/PEIE (107 nm) Bottom Electrode, 200 nm P3HT:PC$_{60}$BM, PEDOT:PSS/Ag Top Electrode FIG. 39 shows a device structure of an inverted solar cell and chemical structure of P3HT and PC$_{60}$BM, according to an exemplary embodiment of the invention.

ITO-coated glass (Colorado Concept Coatings LLC) with a sheet resistivity of ~15 Ω/sq. was used as substrate. The ITO substrates were patterned with kapton tape and etched by acid vapor (1:3 by volume, HNO$_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths.

Polyethylenimine, 80% ethoxylated (PEIE) (M$_w$=70,000 g/mol) was dissolved in H$_2$O with a concentration of 35-40 wt. % as received from Aldrich. Then, it was further diluted into methoxyethanol to a concentration of 4 wt. %. The diluted solution was spin coated onto cleaned ITO substrates at 5000 rpm for 1 min and an acceleration of 1000 rpm/s and annealed at 120° C. for 10 min on hotplate in ambient air. The thickness of PEIE was 107 nm, determined by spectroscopic ellipsometry (J. A. Woollam Co.).

Then, the substrates were transferred into a N$_2$-filled glove box. The active layer of poly(3-hexylthiophene) (P3HT, 4002-E, BI19-90, Rieke Metals, FIG. 39): [6,6]-phenyl C$_{61}$ butyric acid methyl ester (PC$_{60}$BM, Nano-C, FIG. 39) (1:0.7, weight ratio) was filtered through 0.2-µm-pore PTFE filters and spin-coated on each substrate from 34 mg/ml chlorobenzene solution at a speed of 1000 rpm and an acceleration of 10000 rpm/s and annealed at 160° C. for 10 min on hot plate in the glove box. The thickness of the active layer was 200 nm, measured using a profilometer (Dektak 6M Stylus, Veeco, Plainview, N.Y.).

Samples were then transferred out of the glove box and a layer of poly(3,4-ethylenedioxythiophene):poly(styrenesulfonate) (CLEVIOS™ F CPP 105 DM, HC Stack Inc., MA, 90 nm) was spin coated on top of the active layer at a speed of 5000 rpm and an acceleration of 1000 rpm/s. Samples were annealed at 110° C. for 10 min on hot plate in a N$_2$-filled glove box to dry the PEDOT:PSS layer.

Samples were then loaded into a vacuum thermal evaporation system (EvoVac, Angstrom Engineering Inc.), and a 100 nm of Ag was deposited through a shadow mask at a base pressure of 2×10$^{-7}$ Torr. The effective area of the active layer was 10 mm$^2$. The completed devices were transferred to another nitrogen-filled glove box for electrical measurements in a sealed container.

Current density-voltage (J-V) characteristics were measured inside the N$_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm$^2$ was used as the light source.

Figure 40:
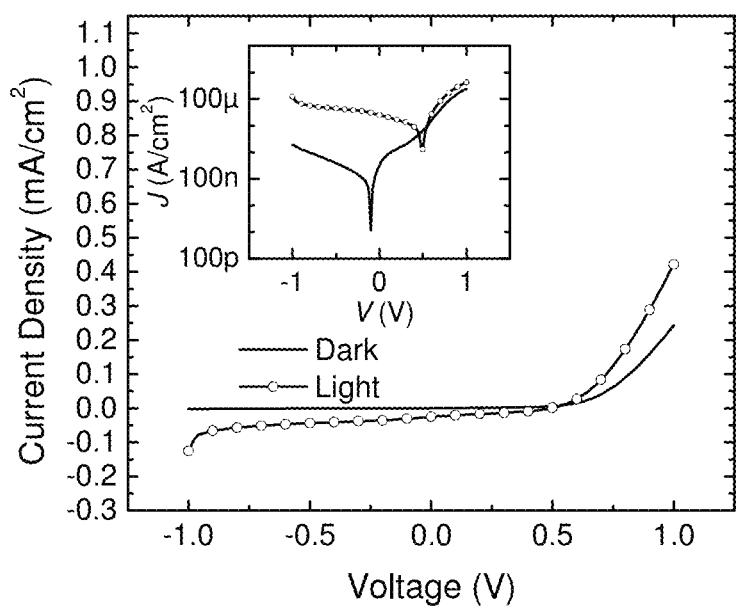
FIG. 40 shows J-V characteristics of a solar cell in dark and under AM 1.5 100 mW/cm$^2$ illumination, according to an exemplary embodiment of the invention.

FIG. 40 shows J-V characteristics of a solar cell in dark and under AM 1.5 100 mW/cm$^2$ illumination, according to an exemplary embodiment of the invention, and device performance is summarized in Table 25.

TABLE 25

Photovoltaic parameters of the inverted solar cells averaged over 5 devices

| Sample | $V_{OC}$ (V) | $J_{SC}$ (mA/cm$^2$) | FF | PCE (%) |
| --- | --- | --- | --- | --- |
| YHZ-II-20E | 0.484 ± 0.041 | 0.03 ± 0.02 | 0.314 ± 0.006 | 0.005 ± 0.004 |

Example a10

Figure 41:
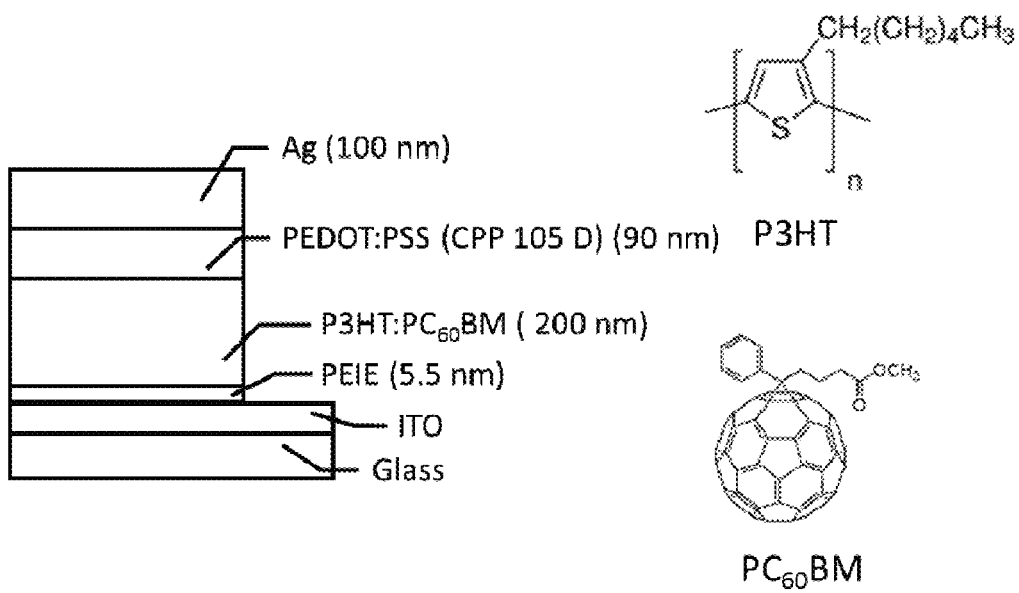
FIG. 41 shows a device structure of an inverted solar cell and chemical structure of P3HT and PC$_{60}$BM, according to an exemplary embodiment of the invention.

Inverted Solar Cells with ITO/PEIE (5.5 nm by Dipping into 0.1 wt % Methoxyethanol Solution for 30 s) Bottom Electrode, 200 nm P3HT:PC$_{60}$BM, PEDOT:PSS/Ag Top Electrode FIG. 41 shows a device structure of an inverted solar cell and chemical structure of P3HT and PC$_{60}$BM, according to an exemplary embodiment of the invention.

ITO-coated glass (Colorado Concept Coatings LLC) with a sheet resistivity of ~15 Ω/sq. was used as the substrates for the solar cells. The ITO substrates were patterned with kapton tape and etched by acid vapor (1:3 by volume, HNO$_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths.

Polyethylenimine, 80% ethoxylated (PEIE) (M$_w$=70,000 g/mol) was dissolved in H$_2$O with a concentration of 35-40 wt. % as received from Aldrich. Then, it was further diluted into methoxyethanol to a concentration of 0.1 wt. %. ITO substrates were then dipped into the PEIE solution for 30 sec and annealed at 120° C. for 10 min on hotplate in ambient air. The thickness of PEIE was 5.5 nm, determined by spectroscopic ellipsometry (J. A. Woollam Co.).

Then, the substrates were transferred into a N$_2$-filled glove box. The active layer of poly(3-hexylthiophene) (P3HT, 4002-E, B119-90, Rieke Metals, FIG. 41): [6,6]-phenyl C$_{61}$ butyric acid methyl ester (PC$_{60}$BM, Nano-C, FIG. 41) (1:0.7, weight ratio) was filtered through 0.2-µm-pore PTFE filters and spin-coated on each substrate from 34 mg/ml chlorobenzene solution at a speed of 1000 rpm and an acceleration of 10000 rpm/s and annealed at 160° C. for 10 min on hot plate in the glove box. The thickness of the active layer was 200 nm, measured using a profilometer (Dektak 6M Stylus, Veeco, Plainview, N.Y.).

Samples were then transferred out of the glove box and a layer of poly(3,4-ethylenedioxythiophene):poly(styrenesulfonate) (CLEVIOS™ F CPP 105 DM, HC Stack Inc., MA, 90 nm) was spin coated on top of the active layer at a speed of 5000 rpm and an acceleration of 1000 rpm/s. Samples were annealed at 110° C. for 10 min on hot plate in a N$_2$-filled glove box to dry the PEDOT:PSS layer.

Samples were then loaded into a vacuum thermal evaporation system (EvoVac, Angstrom Engineering Inc.), and a 100 nm of Ag was deposited through a shadow mask at a base pressure of 2×10$^{-7}$ Torr. The effective area of the active layer was 10 mm$^2$. The completed devices were transferred to another nitrogen-filled glove box for electrical measurements in a sealed container.

Current density-voltage (J-V) characteristics were measured inside the N$_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm$^2$ was used as the light source.

Figure 42:
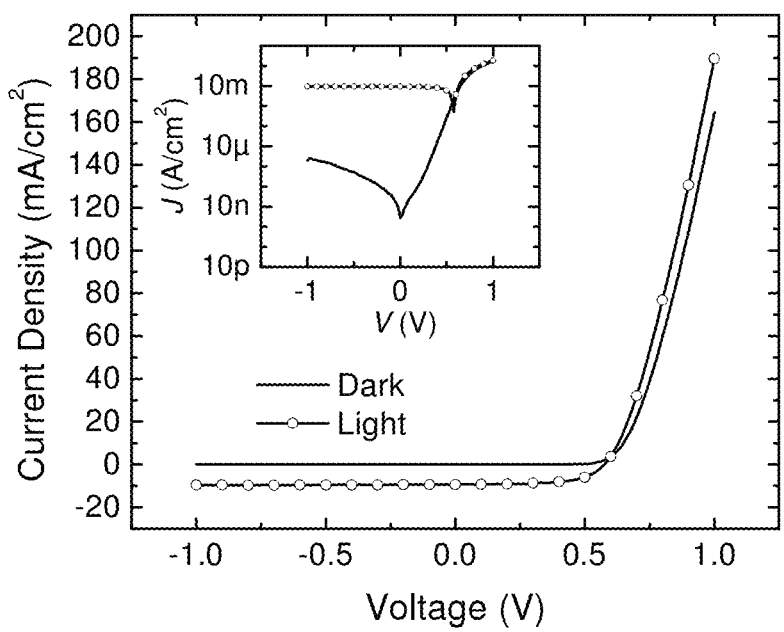
FIG. 42 shows J-V characteristics of a solar cell in dark and under AM 1.5 100 mW/cm$^2$ illumination, according to an exemplary embodiment of the invention.

FIG. 42 shows J-V characteristics of a solar cell in dark and under AM 1.5 100 mW/cm$^2$ illumination, according to an exemplary embodiment of the invention, and device performance is summarized in Table 26.

TABLE 26

Photovoltaic parameters of the inverted solar cells averaged over 4 devices

| Sample | $V_{OC}$ (V) | $J_{SC}$ (mA/cm$^2$) | FF | PCE (%) |
| --- | --- | --- | --- | --- |
| YHZ-I-156_C | 0.574 ± 0.001 | 9.46 ± 0.34 | 0.608 ± 0.006 | 3.31 ± 0.10 |

Example a11

Figure 43:
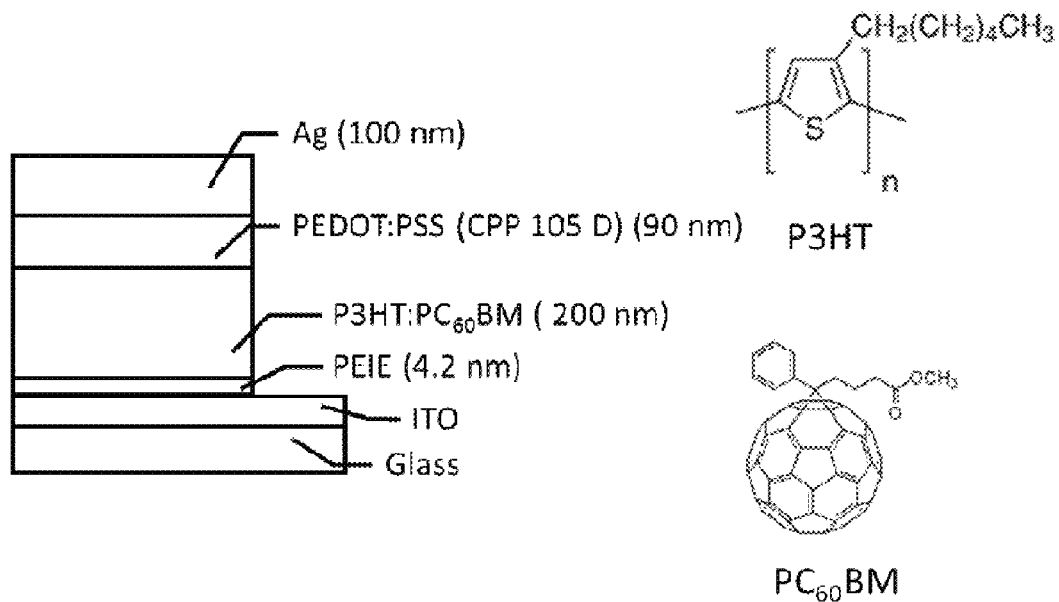
FIG. 43 shows a device structure of an inverted solar cell and chemical structure of P3HT and PC$_{60}$BM, according to an exemplary embodiment of the invention.

Inverted Solar Cells with ITO/PEIE (4.2 nm by Dipping into 0.1 wt % Methoxyethanol Solution for 5 min) Bottom Electrode, 200 nm P3HT:PC$_{60}$BM, PEDOT:PSS/Ag Top Electrode FIG. 43 shows a device structure of an inverted solar cell and chemical structure of P3HT and PC$_{60}$BM, according to an exemplary embodiment of the invention.

ITO-coated glass (Colorado Concept Coatings LLC) with a sheet resistivity of ~15 Ω/sq. was used as the substrates for the solar cells. The ITO substrates were patterned with kapton tape and etched by acid vapor (1:3 by volume, HNO$_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths.

Polyethylenimine, 80% ethoxylated (PEIE) (M$_w$=70,000 g/mol) was dissolved in H$_2$O with a concentration of 35-40 wt. % as received from Aldrich. Then, it was further diluted into methoxyethanol to a concentration of 0.1 wt. %. ITO substrates were then dipped into the PEIE solution for 5 min and annealed at 120° C. for 10 min on hotplate in ambient air. The thickness of PEIE was 4.2 nm, determined by spectroscopic ellipsometry (J. A. Woollam Co.).

Then, the substrates were transferred into a N$_2$-filled glove box. The active layer of poly(3-hexylthiophene) (P3HT, 4002-E, B119-90, Rieke Metals, FIG. 43): [6,6]-phenyl $C_{61}$ butyric acid methyl ester ($PC_{60}BM$, Nano-C, FIG. 43) (1:0.7, weight ratio) was filtered through 0.2-μm-pore PTFE filters and spin-coated on each substrate from 34 mg/ml chlorobenzene solution at a speed of 1000 rpm and an acceleration of 10000 rpm/s and annealed at 160° C. for 10 min on hot plate in the glove box. The thickness of the active layer was 200 nm, measured using a profilometer (Dektak 6M Stylus, Veeco, Plainview, N.Y.).

Samples were then transferred out of the glove box and a layer of poly(3,4-ethylenedioxythiophene):poly(styrenesulfonate) (CLEVIOS™ F CPP 105 DM, HC Stack Inc., MA, 90 nm) was spin coated on top of the active layer at a speed of 5000 rpm and an acceleration of 1000 rpm/s. Samples were annealed at 110° C. for 10 min on hot plate in a $N_2$-filled glove box to dry the PEDOT:PSS layer.

Samples were then loaded into a vacuum thermal evaporation system (EvoVac, Angstrom Engineering Inc.), and a 100 nm of Ag was deposited through a shadow mask at a base pressure of $2\times10^{-7}$ Torr. The effective area of the active layer was 10 $mm^2$. The completed devices were transferred to another nitrogen-filled glove box for electrical measurements in a sealed container.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/$cm^2$ was used as the light source.

Figure 44:
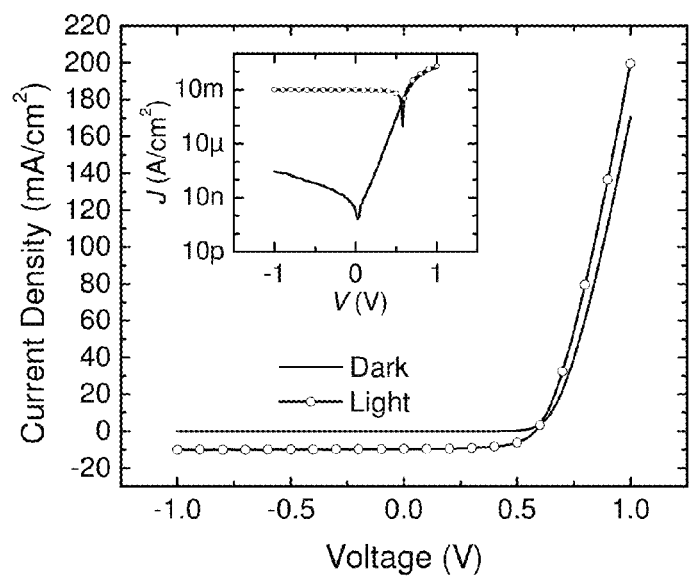
FIG. 44 shows J-V characteristics of a solar cell under AM 1.5 100 mW/cm$^2$ illumination, according to an exemplary embodiment of the invention.

FIG. 44 shows J-V characteristics of a solar cell under AM 1.5 100 mW/$cm^2$ illumination, according to an exemplary embodiment of the invention, and device performance is summarized in Table 27.

TABLE 27

Photovoltaic parameters of the inverted solar cells averaged over 4 devices

| Sample | $V_{OC}$ (V) | $J_{SC}$ (mA/$cm^2$) | FF | PCE (%) |
|---|---|---|---|---|
| YHZ-I-156_D | 0.577 ± 0.001 | 9.76 ± 0.09 | 0.614 ± 0.007 | 3.46 ± 0.03 |

Example a12

Figure 45:
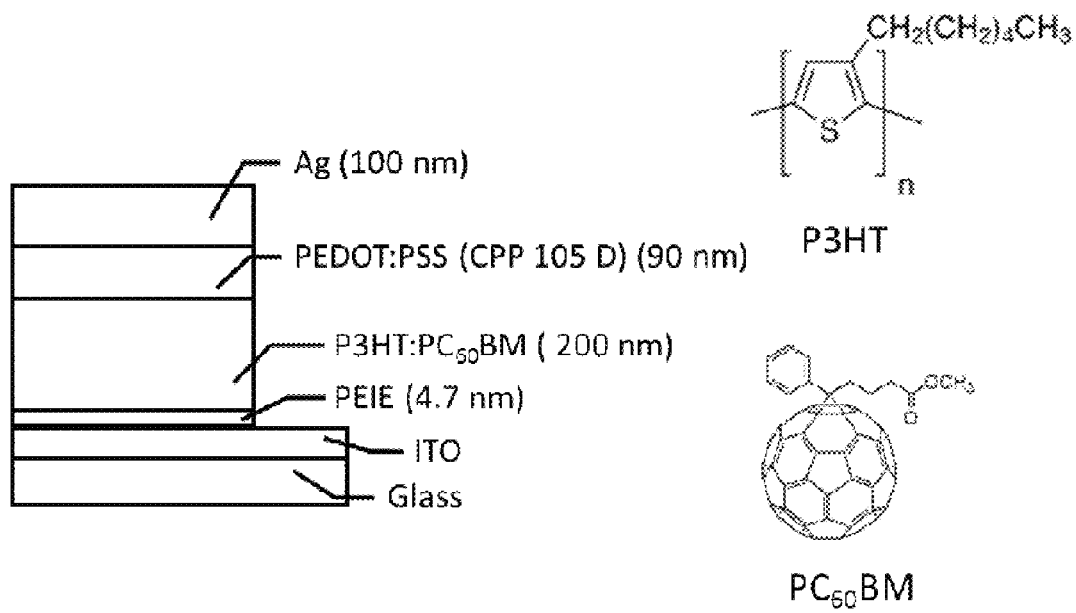
FIG. 45 shows a device structure of an inverted solar cell and chemical structure of P3HT and PC$_{60}$BM, according to an exemplary embodiment of the invention.

Inverted Solar Cells with ITO/PEIE (4.7 nm by Dipping into 0.1 wt % Methoxyethanol Solution for 30 min) Bottom Electrode, 200 nm P3HT:$PC_{60}BM$, PEDOT:PSS/Ag Top Electrode FIG. 45 shows a device structure of an inverted solar cell and chemical structure of P3HT and $PC_{60}BM$, according to an exemplary embodiment of the invention.

ITO-coated glass (Colorado Concept Coatings LLC) with a sheet resistivity of ~15 Ω/sq. was used as the substrates for the solar cells. The ITO substrates were patterned with kapton tape and etched by acid vapor (1:3 by volume, $HNO_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths.

Polyethylenimine, 80% ethoxylated (PEIE) ($M_w$=70,000 g/mol) was dissolved in $H_2O$ with a concentration of 35-40 wt. % as received from Aldrich. Then, it was further diluted into methoxyethanol to a concentration of 0.1 wt. %. ITO substrates were then dipped into the PETE solution for 30 min and annealed at 120° C. for 10 min on hotplate in ambient air. The thickness of PEIE was 4.7 nm, determined by spectroscopic ellipsometry (J. A. Woollam Co.).

Then, the substrates were transferred into a $N_2$-filled glove box. The active layer of poly(3-hexylthiophene) (P3HT, 4002-E, BI19-90, Rieke Metals, FIG. 45): [6,6]-phenyl $C_{61}$ butyric acid methyl ester ($PC_{60}BM$, Nano-C, FIG. 45) (1:0.7, weight ratio) was filtered through 0.2-μm-pore PTFE filters and spin-coated on each substrate from 34 mg/ml chlorobenzene solution at a speed of 1000 rpm and an acceleration of 10000 rpm/s and annealed at 160° C. for 10 min on hot plate in the glove box. The thickness of the active layer was 200 nm, measured using a profilometer (Dektak 6M Stylus, Veeco, Plainview, N.Y.).

Samples were then transferred out of the glove box and a layer of poly(3,4-ethylenedioxythiophene):poly(styrenesulfonate) (CLEVIOS™ F CPP 105 DM, HC Stack Inc., MA, 90 nm) was spin coated on top of the active layer at a speed of 5000 rpm and an acceleration of 1000 rpm/s. Samples were annealed at 110° C. for 10 min on hot plate in a $N_2$-filled glove box to dry the PEDOT:PSS layer.

Samples were then loaded into a vacuum thermal evaporation system (EvoVac, Angstrom Engineering Inc.), and a 100 nm of Ag was deposited through a shadow mask at a base pressure of $2\times10^{-7}$ Torr. The effective area of the active layer was 10 $mm^2$. The completed devices were transferred to another nitrogen-filled glove box for electrical measurements in a sealed container.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/$cm^2$ was used as the light source.

Figure 46:
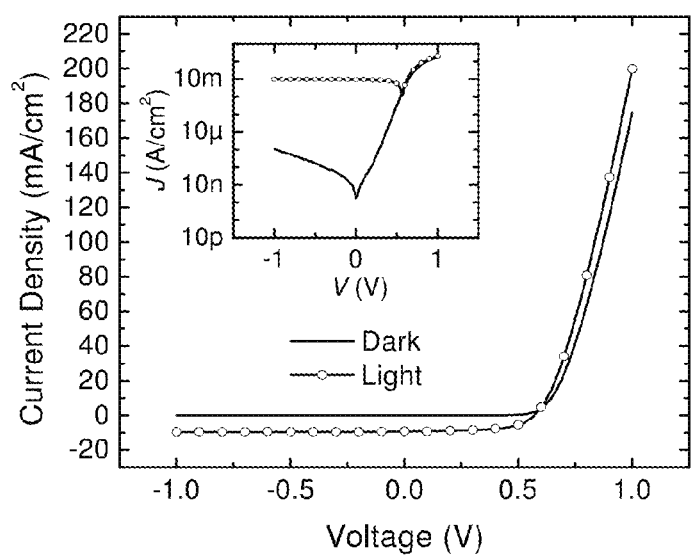
FIG. 46 shows J-V characteristics of a solar cell under AM 1.5 100 mW/cm$^2$ illumination, according to an exemplary embodiment of the invention.

FIG. 46 shows J-V characteristics of a solar cell under AM 1.5 100 mW/$cm^2$ illumination, according to an exemplary embodiment of the invention, and device performance is summarized in Table 28.

TABLE 28

Photovoltaic parameters of the inverted solar cells averaged over 4 devices

| Sample | $V_{OC}$ (V) | $J_{SC}$ (mA/$cm^2$) | FF | PCE (%) |
|---|---|---|---|---|
| YHZ-I-156_G | 0.570 ± 0.001 | 9.25 ± 0.30 | 0.589 ± 0.007 | 3.10 ± 0.08 |

Example a13

Figure 47:
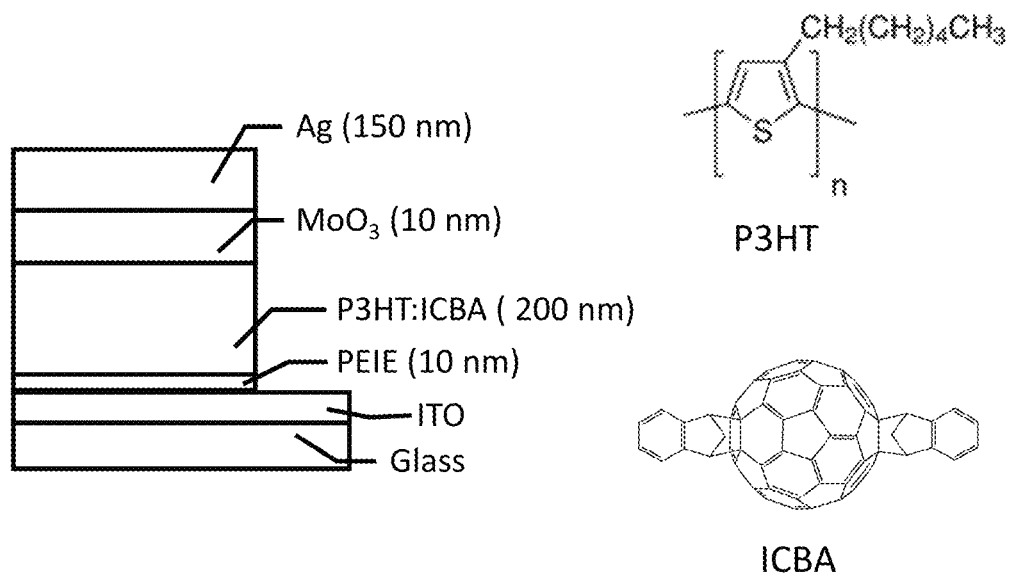
FIG. 47 shows a device structure of an inverted solar cell and chemical structure of P3HT and ICBA, according to an exemplary embodiment of the invention.

Inverted Solar Cells with ITO/PEIE (10 nm) Bottom Electrode, 200 nm P3HT:ICBA, $MoO_3$/Ag Top Electrode FIG. 47 shows a device structure of an inverted solar cell and chemical structure of P3HT and ICBA, according to an exemplary embodiment of the invention.

ITO-coated glass (Colorado Concept Coatings LLC) with a sheet resistivity of ~15 Ω/sq. was used as substrate. The ITO substrates were patterned with kapton tape and etched by acid vapor (1:3 by volume, $HNO_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths.

Polyethylenimine, 80% ethoxylated (PEIE) ($M_w$=70,000 g/mol) was dissolved in $H_2O$ with a concentration of 35-40 wt. % as received from Aldrich. Then, it was further diluted into methoxyethanol to a concentration of 0.5 wt. %. The diluted solution was spin coated onto cleaned ITO substrates at 5000 rpm for 1 min and an acceleration of 1000 rpm/s and annealed at 120° C. for 10 min on hotplate in ambient air. The thickness of PEIE was 10 nm, determined by spectroscopic ellipsometry (J. A. Woollam Co.).

Then, the substrates were transferred into a $N_2$-filled glove box. The active layer of poly(3-hexylthiophene) (P3HT, 4002-E, BI19-90, Rieke Metals, FIG. 47): Indene-C60 Bis-Adduct (ICBA, Lumtec, FIG. 47) (1:1, weight ratio) was filtered through 0.2-μm-pore PTFE filters and spin-coated on each substrate from 40 mg/ml chlorobenzene solution at a speed of 700 rpm and an acceleration of 10000 rpm/s and annealed at 160° C. for 10 min on hot plate in the glove box. The thickness of the active layer is 190 nm, measured by spectroscopic ellipsometry (J. A. Woollam Co.).

Samples were then loaded into a vacuum thermal evaporation system (SPECTROS, Kurt J. Lesker) connected to the glove box, and 10 nm of $MoO_3$ nd 150 nm of Ag was deposited through a shadow mask at a base pressure of $2\times10^{-7}$ Torr. The effective area of the active layer was 10 $mm^2$. The completed devices were transferred to another nitrogen-filled glove box for electrical measurements in a sealed container.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/$cm^2$ was used as the light source.

Figure 48:
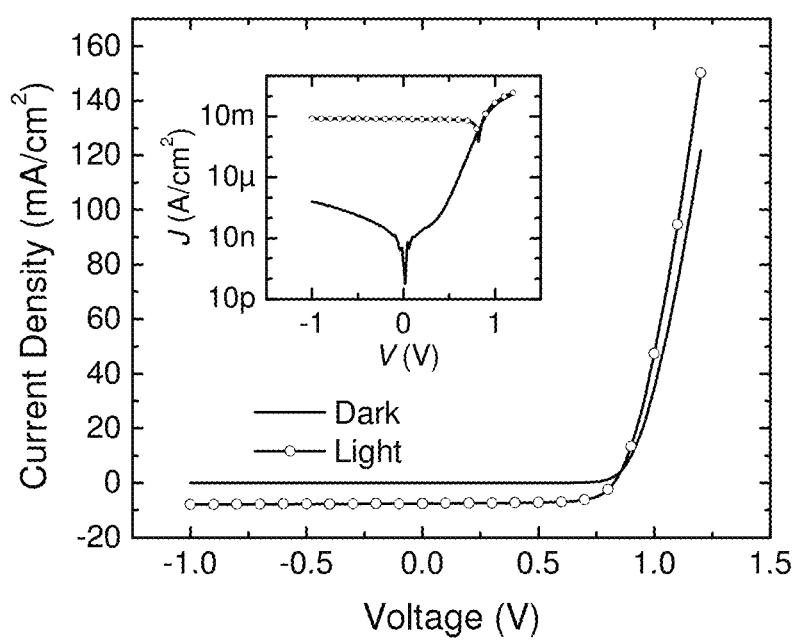
FIG. 48 shows J-V characteristics of a solar cell under AM 1.5 100 mW/cm$^2$ illumination, according to an exemplary embodiment of the invention.

FIG. 48 shows J-V characteristics of a solar cell under AM 1.5 100 mW/$cm^2$ illumination, according to an exemplary embodiment of the invention, and device performance is summarized in Table 29.

TABLE 29

Photovoltaic parameters of the inverted solar cells averaged over 5 devices

| Sample | $V_{OC}$ (V) | $J_{SC}$ (mA/$cm^2$) | FF | PCE (%) |
|---|---|---|---|---|
| YHZ-II-26II_F | 0.825 ± 0.001 | 7.84 ± 0.41 | 0.701 ± 0.011 | 4.54 ± 0.20 |

Example a14

Figure 49:
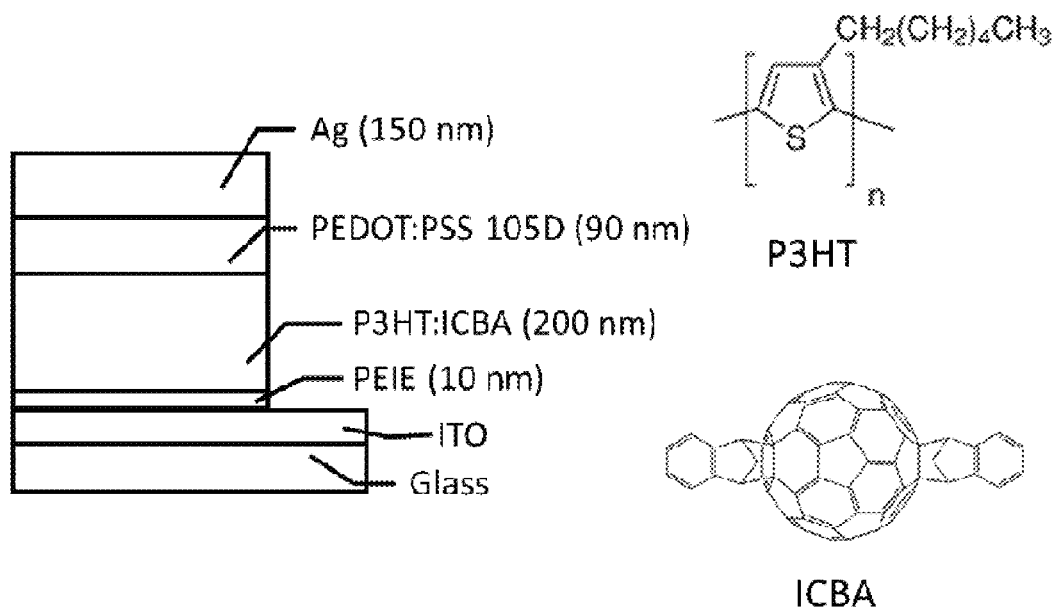
FIG. 49 shows a device structure of an inverted solar cell and chemical structure of P3HT and ICBA, according to an exemplary embodiment of the invention.

Inverted Solar Cells with ITO/PEIE (10 nm) Bottom Electrode, 200 nm P3HT:ICBA, PEDOT:PSS 105D/Ag Top Electrode FIG. 49 shows a device structure of an inverted solar cell and chemical structure of P3HT and ICBA, according to an exemplary embodiment of the invention.

ITO-coated glass (Colorado Concept Coatings LLC) with a sheet resistivity of ~15 Ω/sq. was used as substrate. The ITO substrates were patterned with kapton tape and etched by acid vapor (1:3 by volume, $HNO_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths.

Polyethylenimine, 80% ethoxylated (PEIE) ($M_w$=70,000 g/mol) was dissolved in $H_2O$ with a concentration of 35-40 wt. % as received from Aldrich. Then, it was further diluted into methoxyethanol to a concentration of 0.5 wt. %. The diluted solution was spin coated onto cleaned ITO substrates at 5000 rpm for 1 min and an acceleration of 1000 rpm/s and annealed at 120° C. for 10 min on hotplate in ambient air. The thickness of PETE was 10 nm, determined by spectroscopic ellipsometry (J. A. Woollam Co.).

Then, the substrates were transferred into a $N_2$-filled glove box. The active layer of poly(3-hexylthiophene) (P3HT, 4002-E, BI19-90, Rieke Metals, FIG. 49): Indene-C60 Bis-Adduct (ICBA, Lumtec, FIG. 49) (1:1, weight ratio) was filtered through 0.2-μm-pore PTFE filters and spin-coated on each substrate from 40 mg/ml chlorobenzene solution at a speed of 700 rpm and an acceleration of 10000 rpm/s and annealed at 160° C. for 10 min on hot plate in the glove box. The thickness of the active layer is 190 nm, measured by spectroscopic ellipsometry (J. A. Woollam Co.).

Samples were then transferred out of the glove box and a layer of poly(3,4-ethylenedioxythiophene):poly(styrenesulfonate) (CLEVIOS™ F CPP 105 DM, HC Stack Inc., MA, 90 nm) was spin coated on top of the active layer at a speed of 5000 rpm and an acceleration of 1000 rpm/s. Samples were annealed at 110° C. for 10 min on hot plate in a $N_2$-filled glove box to dry the PEDOT:PSS layer.

Samples were then loaded into a vacuum thermal evaporation system (SPECTROS, Kurt J. Lesker), and 150 nm of Ag was deposited through a shadow mask at a base pressure of $2\times10^{-7}$ Torr. The effective area of the active layer was 10 $mm^2$. The completed devices were transferred to another nitrogen-filled glove box for electrical measurements in a sealed container.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/$cm^2$ was used as the light source.

Figure 50:
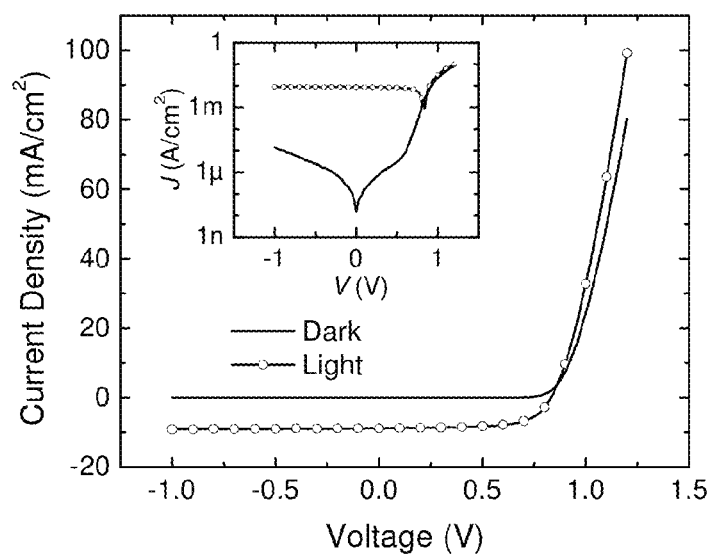
FIG. 50 shows J-V characteristics of a solar cell in dark and under AM 1.5 100 mW/cm$^2$ illumination, according to an exemplary embodiment of the invention.

FIG. 50 shows J-V characteristics of a solar cell in dark and under AM 1.5 100 mW/$cm^2$ illumination, according to an exemplary embodiment of the invention, and device performance is summarized in Table 30.

TABLE 30

Photovoltaic parameters of the inverted solar cells averaged over 5 devices

| Sample | $V_{OC}$ (V) | $J_{SC}$ (mA/$cm^2$) | FF | PCE (%) |
|---|---|---|---|---|
| YHZ-II-26II_G | 0.827 ± 0.005 | 8.29 ± 0.36 | 0.676 ± 0.010 | 4.64 ± 0.19 |

Example a15

Figure 51:
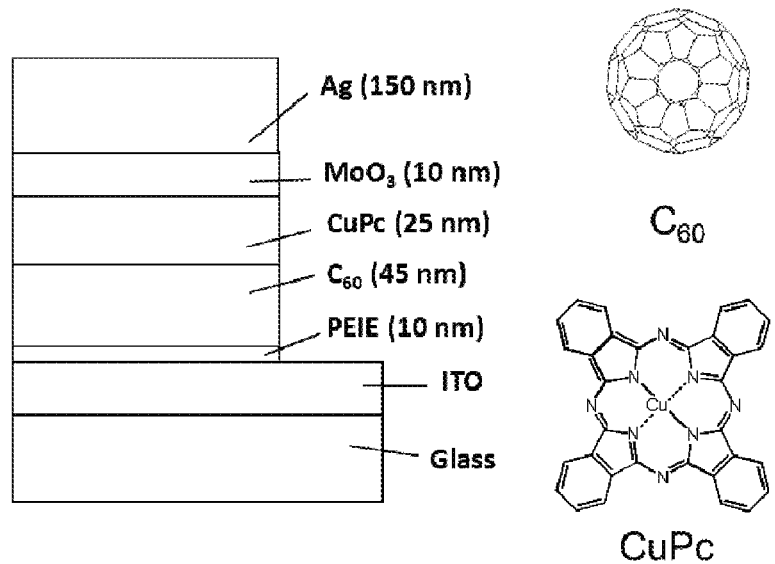
FIG. 51 shows a device structure of an inverted solar cell and chemical structure of CuPc and C$_{60}$, according to an exemplary embodiment of the invention.

Inverted Solar Cells with ITO/PEIE (10 nm) Bottom Electrode, $C_{60}$ (45 nm)/CuPc (25 nm), $MoO_3$/Ag Top Electrode FIG. 51 shows a device structure of an inverted solar cell and chemical structure of CuPc and $C_{60}$, according to an exemplary embodiment of the invention.

ITO-coated glass (Colorado Concept Coatings LLC) with a sheet resistivity of ~15 Ω/sq. was used as the substrates for the solar cells. The ITO substrates were patterned with kapton tape and etched by acid vapor (1:3 by volume, $HNO_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Each ultrasonic bath lasted 20 min. Nitrogen was used to dry the substrates after each of the last three baths.

Polyethylenimine, 80% ethoxylated (PEIE) ($M_w$=70,000 g/mol) was dissolved in $H_2O$ with a concentration of 35-40 wt. % as received from Aldrich. Then, it was further diluted into methoxyethanol to a concentration of 0.5 wt. %. The diluted solution was spin coated onto cleaned ITO substrates at 5000 rpm for 1 min and an acceleration of 1000 rpm/s and annealed at 120° C. for 10 min on hotplate in ambient air. The thickness of PEIE was 10 nm, determined by spectroscopic ellipsometry (J. A. Woollam Co.).

Samples were then loaded into a vacuum thermal evaporation system (SPECTROS, Kurt J. Lesker). 45 nm of $C_{60}$ followed by 25 nm of CuPc, 10 nm of $MoO_3$ and 150 nm of Ag were sequentially deposited at a base pressure of $2 \times 10^{-7}$ Torr in sequence (FIG. 51). The effective area of the active layer was 10 $mm^2$. The completed devices were transferred to another nitrogen-filled glove box for electrical measurements in a sealed container.

Current density-voltage (J-V) characteristics were measured inside the $N_2$-filled glove box by using a source meter (2400, Keithley Instruments, Cleveland, Ohio) and a calibrated photodiode integrated with a LabVIEW program.

Figure 52:
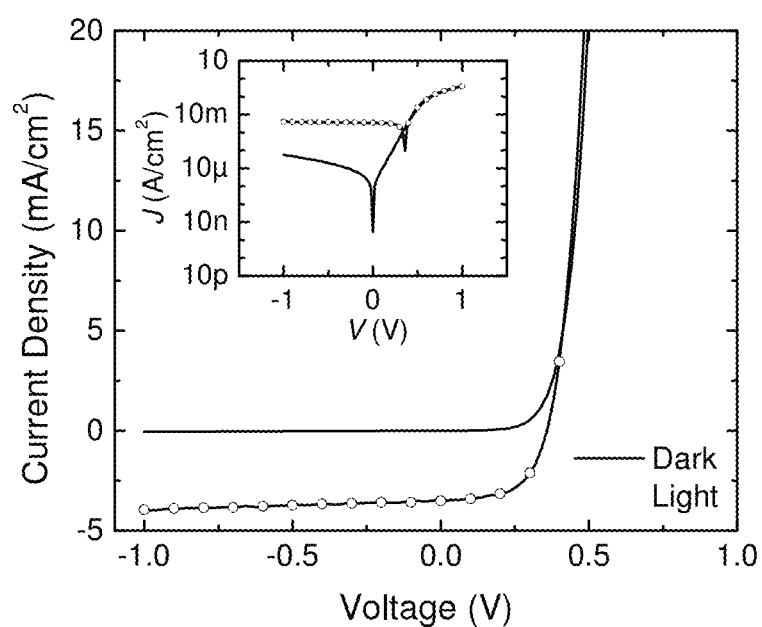
FIG. 52 shows J-V characteristics of a solar cell in dark and under AM 1.5 100 mW/cm$^2$ illumination, according to an exemplary embodiment of the invention.

FIG. 52 shows J-V characteristics of a solar cell in dark and under AM 1.5 100 mW/$cm^2$ illumination, according to an exemplary embodiment of the invention, and device performance is summarized in Table 31.

TABLE 31

Photovoltaic parameters of the inverted solar cells averaged over 10 devices

| Sample | $V_{OC}$ (V) | $J_{SC}$ (mA/$cm^2$) | FF | PCE (%) |
|---|---|---|---|---|
| YHZ-II-30_A&B | 0.357 ± 0.004 | 3.52 ± 0.06 | 0.578 ± 0.005 | 0.73 ± 0.01 |

Example a16

Figure 53:
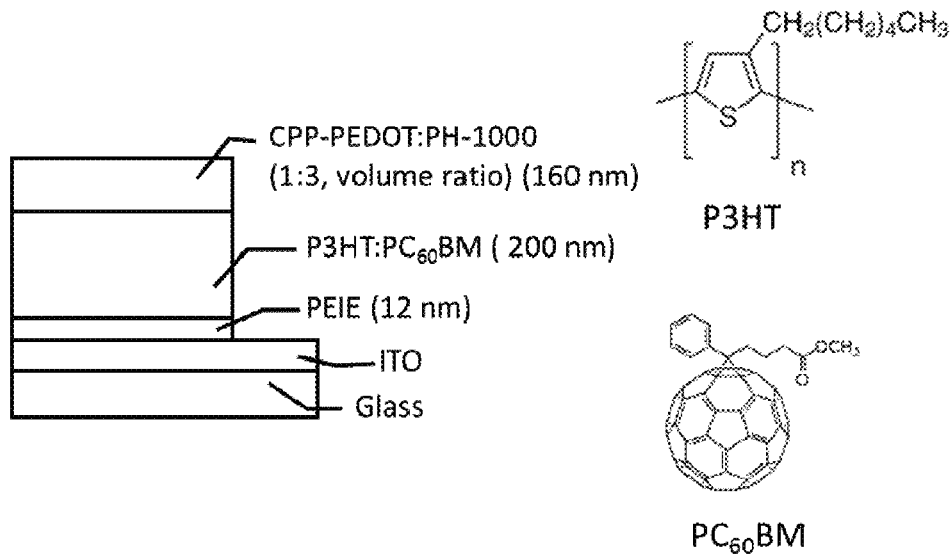
FIG. 53 shows a device structure of semitransparent solar cells and chemical structure of P3HT and PC$_{60}$BM, according to an exemplary embodiment of the invention.

Semitransparent Inverted Solar Cells with ITO/PEIE (12 nm) Bottom Electrode, 200 nm P3HT:$PC_{60}BM$, CPP-PEDOT:PH-1000 Blend Top Electrode FIG. 53 shows a device structure of semitransparent solar cells and chemical structure of P3HT and $PC_{60}BM$, according to an exemplary embodiment of the invention.

ITO-coated glass (Colorado Concept Coatings LLC) with a sheet resistivity of ~15 Ω/sq. was used as substrate. The ITO substrates were patterned with kapton tape and etched by acid vapor (1:3 by volume, $HNO_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths.

Polyethylenimine, 80% ethoxylated (PEIE) ($M_w$=70,000 g/mol) was dissolved in $H_2O$ with a concentration of 35-40 wt. % when received from Aldrich. Then, it was diluted into methoxyethanol to a concentration of 0.5 wt. %. Then, the diluted solution was spin coated onto cleaned ITO substrates at a speed of 5000 rpm for 1 min and at an acceleration of 1000 rpm/s and annealed at 100° C. for 10 min on hot plate in ambient air. The thickness of PEIE was 12 nm determined by spectroscopic ellipsometry (J. A. Woollam Co.).

Then the substrates were transferred into a $N_2$-filled glove box. The active layer of poly(3-hexylthiophene) (P3HT, 4002-E, BJ19-79, Rieke Metals, FIG. 53): [6,6]-phenyl $C_{61}$ butyric acid methyl ester ($PC_{60}BM$, Nano-C, FIG. 53) (1:0.7, weight ratio) was filtered through 0.2-μm-pore PTFE filters and spin-coated, on each substrate, from a 34 mg/ml chlorobenzene solution at a speed of 700 rpm, and at acceleration of 10000 rpm/s, and annealed at 160° C. for 10 min on hot plate in the glove box. The thickness of the active layer was 200 nm, measured using a profilometer (Dektak 6M Stylus, Veeco, Plainview, N.Y.).

A blend of two Poly(3,4-ethylenedioxythiophene):poly (styrenesulfonate) (PEDOT:PSS) formulations of PH1000 (CLEVIOS™ PH 1000, HC Stack Inc., MA):CPP-PEDOT (CLEVIOS™ F CPP 105 DM, HC Stack Inc., MA) (3:1) was used as the top electrode by coating at a speed of 1000 rpm for 30 s in air. Then samples were transferred into a glove box, where top electrode was patterned with polydimethylsiloxane (PDMS) and annealed at 105° C. for 10 min. The effective device area was 24 $mm^2$. To improve the electrical contacts, silver paint was put outside the active area and onto the PEDOT:PSS blend prior to the electrical measurements.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/$cm^2$ was used as the light source.

Figure 54:
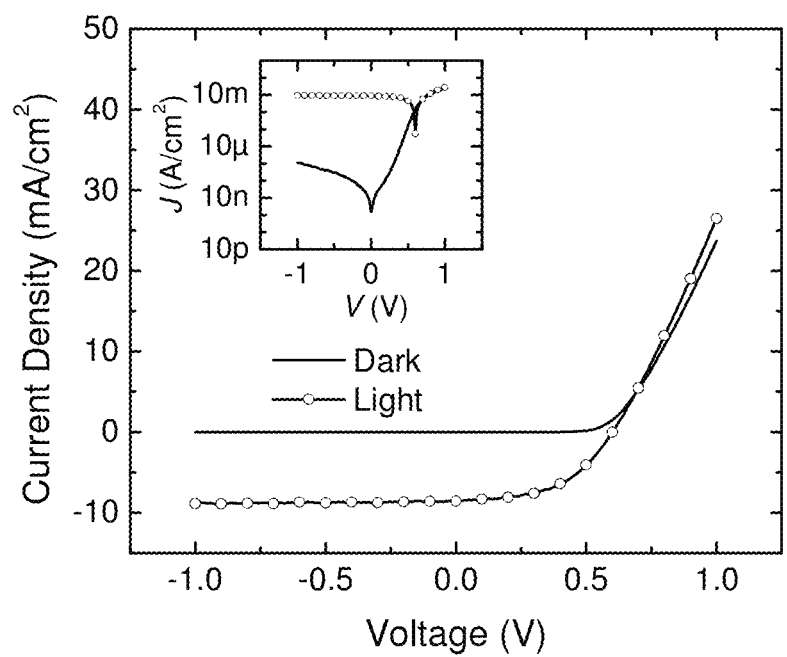
FIG. 54 shows J-V characteristics of a solar cell under AM 1.5 100 mW/cm$^2$ illumination, according to an exemplary embodiment of the invention.

FIG. 54 shows J-V characteristics of a solar cell under AM 1.5 100 mW/$cm^2$ illumination, according to an exemplary embodiment of the invention, and device performance is summarized in Table 32.

TABLE 32

Photovoltaic performance of a semitransparent solar cell

| Sample | $V_{OC}$ (V) | $J_{SC}$ (mA/$cm^2$) | FF | PCE (%) |
|---|---|---|---|---|
| YHZ-I-154I#2 | 0.60 | 8.56 | 0.50 | 2.58 |

Example a17

Figure 55:
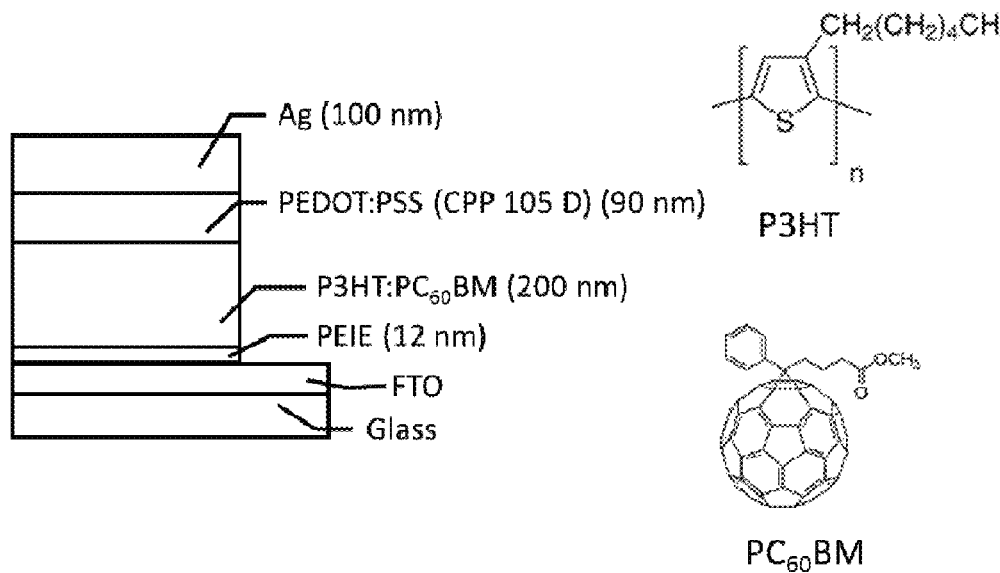
FIG. 55 shows a device structure of a solar cell and chemical structure of P3HT and PC$_{60}$BM, according to an exemplary embodiment of the invention.

Inverted Solar Cells with FTO/PEIE (12 nm) Bottom Electrode, 200 nm P3HT:$PC_{60}BM$, PEDOT:PSS/Ag Top Electrode. PEIE (12 nm) Prepared on FTO by Spin Coating FIG. 55 shows a device structure of a solar cell and chemical structure of P3HT and $PC_{60}BM$, according to an exemplary embodiment of the invention.

Fluorine-doped tin oxide (FTO) (TEC-15) from Hartford Glass Co. Inc with a sheet resistance of 15 Ω/sq was used as substrate. The substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths. A 300-nm-thick layer of $SiO_x$ was deposited on the cleaned FTO by e-beam deposition (AXXIS, Kurt J. Lesker) to pattern the anode. Next, the substrates were ultrasonicated in isopropanol for 10 minutes and blown dry with nitrogen.

Polyethylenimine, 80% ethoxylated (PEIE) ($M_w$=70,000 g/mol) was dissolved in $H_2O$ with a concentration of 35-40 wt. % when received from Aldrich and then diluted into methoxyethanol to a concentration of 0.5 wt. %. The diluted solution was spin coated onto cleaned FTO substrates at a speed of 5000 rpm for 1 min and an acceleration of 1000 rpm/s and annealed at 120° C. for 10 min on hot plate in ambient air. The thickness of PETE was 12 nm, determined by spectroscopic ellipsometry (J. A. Woollam Co.).

Then, the substrates were transferred into a $N_2$-filled glove box. The active layer of poly(3-hexylthiophene) (P3HT, 4002-E, BJ19-79, Rieke Metals, FIG. 55): [6,6]-phenyl $C_{61}$ butyric acid methyl ester ($PC_{60}BM$, Nano-C, FIG. 55) (1:0.7, weight ratio) was filtered through 0.2-μm-pore PTFE filters and spin-coated on each substrate from 34 mg/ml chlorobenzene solution at a speed of 700 rpm and an acceleration of 10000 rpm/s and annealed at 160° C. for 10 min on hot plate in the glove box. The thickness of the active layer is 200 nm, measured using a profilometer (Dektak 6M Stylus, Veeco, Plainview, N.Y.).

Samples were transferred out of the glove box and a layer of poly(3,4-ethylenedioxythiophene):poly(styrenesulfonate) (CLEVIOS™ F CPP 105 DM, HC Stack Inc., MA, 90 nm) was spin coated on top of the active layer at a speed of 5000 rpm and at an acceleration of 1000 rpm/s. The samples were then annealed at 110° C. for 10 min on hot plate in a $N_2$-filled glove box to dry PEDOT:PSS layer.

The samples were then loaded into a vacuum thermal evaporation system (EvoVac, Angstrom Engineering Inc.), and a 100 nm of Ag was deposited through a shadow mask at a base pressure of $2\times10^{-7}$ Torr. The effective area of the active layer was 10 $mm^2$. The completed devices were transferred to another nitrogen-filled glove box for electrical measurements in a sealed container.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/$cm^2$ was used as the light source.

Figure 56:
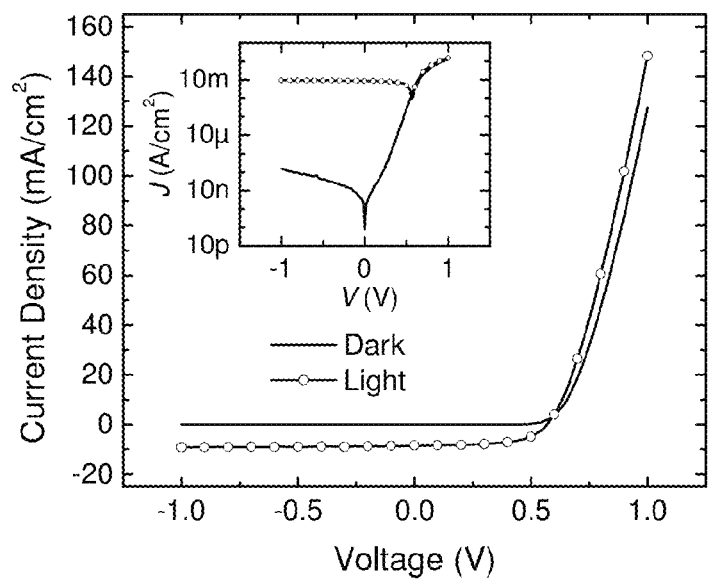
FIG. 56 shows J-V characteristics of a solar cell in dark and under AM 1.5 100 mW/cm$^2$ illumination, according to an exemplary embodiment of the invention.

FIG. 56 shows J-V characteristics of a solar cell in dark and under AM 1.5 100 mW/$cm^2$ illumination, according to an exemplary embodiment of the invention, and device performance is summarized in Table 33.

TABLE 33

Photovoltaic parameters of the inverted solar cells averaged over 4 devices

| Sample | $V_{OC}$ (V) | $J_{SC}$ (mA/$cm^2$) | FF | PCE (%) |
|---|---|---|---|---|
| YHZ-I-156II_D | 0.563 ± 0.003 | 8.62 ± 0.20 | 0.582 ± 0.014 | 2.84 ± 0.07 |

Example a18

Figure 57:
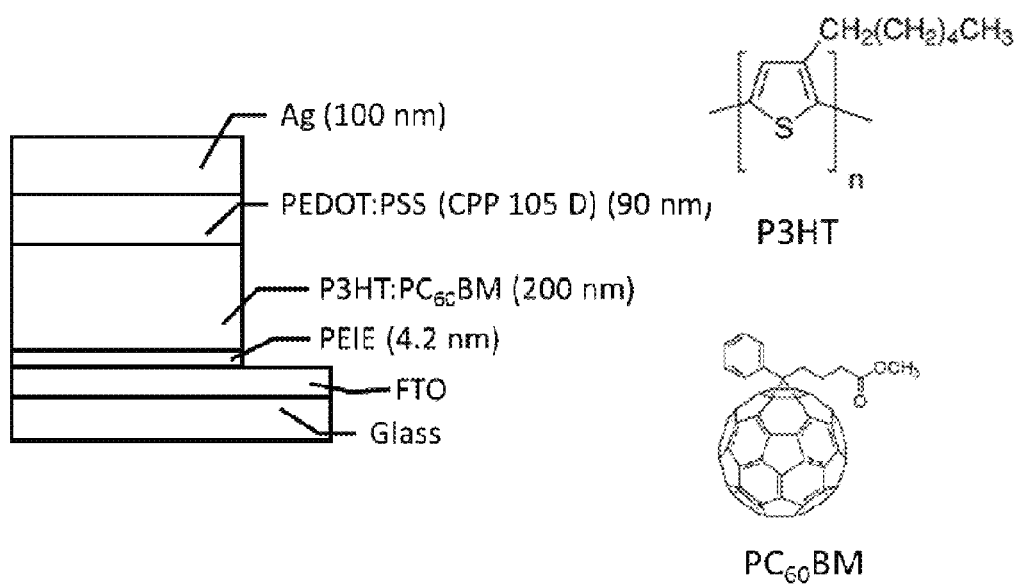
FIG. 57 shows a device structure of a solar cell and chemical structure of P3HT and PC$_{60}$BM, according to an exemplary embodiment of the invention.

Inverted Solar Cells with FTO/PEIE (4.2 nm by Dipping into 0.1 wt % Methoxyethanol Solution) Bottom Electrode, 200 nm P3HT:$PC_{60}BM$, PEDOT:PSS/Ag Top Electrode FIG. 57 shows a device structure of a solar cell and chemical structure of P3HT and $PC_{60}BM$, according to an exemplary embodiment of the invention.

Fluorine-doped tin oxide (FTO) (TEC-15) from Hartford Glass Co. Inc with a sheet resistance of 15 Ω/sq was used as substrate. The substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths. A 300-nm-thick layer of SiO, was deposited on the cleaned FTO by e-beam deposition (AXXIS, Kurt J. Lesker) to pattern the anode. Next, the substrates were ultrasonicated in isopropanol for 10 minutes and blown dry with nitrogen.

Polyethylenimine, 80% ethoxylated (PEIE) ($M_w$=70,000 g/mol) was dissolved in $H_2O$ with a concentration of 35-40 wt. % as received from Aldrich and diluted into methoxyethanol to a concentration of 0.1 wt. %. The FTO substrates were dipped into the PEIE solution for 5 min and annealed at 120° C. for 10 min on hot plate in ambient air. The thickness of PEIE was 4.2 nm, determined by spectroscopic ellipsometry (J. A. Woollam Co.).

Then the substrates were transferred into a $N_2$-filled glove box. The active layer of poly(3-hexylthiophene) (P3HT, 4002-E, BJ19-79, Rieke Metals, FIG. 57): [6,6]-phenyl $C_{61}$ butyric acid methyl ester ($PC_{60}BM$, Nano-C, FIG. 57) (1:0.7, weight ratio) was filtered through 0.2-μm-pore PTFE filters and spin-coated on each substrate from 34 mg/ml chlorobenzene solution at a speed of 700 rpm, and at an acceleration of 10000 rpm/s, and then annealed at 160° C. for 10 min on hot plate in the glove box. The thickness of the active layer was 200 nm, measured using a profilometer (Dektak 6M Stylus, Veeco, Plainview, N.Y.).

The samples were transferred out of the glove box and a layer of poly(3,4-ethylenedioxythiophene):poly(styrenesulfonate) (CLEVIOS™ F CPP 105 DM, HC Stack Inc., MA, 90 nm) was spin coated on top of the active layer at a speed of 5000 rpm and an acceleration of 1000 rpm/s. Samples were annealed at 110° C. for 10 min on hot plate in a $N_2$-filled glove box to dry PEDOT:PSS layer.

Samples were then loaded into a vacuum thermal evaporation system (EvoVac, Angstrom Engineering Inc.), and a 100 nm of Ag was deposited through a shadow mask at a base pressure of $2\times10^{-7}$ Torr. The effective area of the active layer was 10 $mm^2$. The completed devices were transferred, in a sealed container, to another nitrogen-filled glove box for electrical measurements.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/$cm^2$ was used as the light source.

Figure 58:
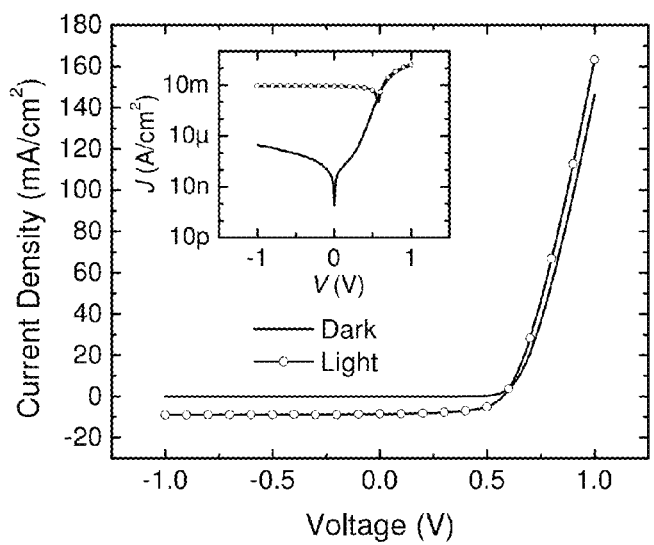
FIG. 58 shows J-V characteristics of a solar cell under AM 1.5 100 mW/cm$^2$ illumination, according to an exemplary embodiment of the invention.

FIG. 58 shows J-V characteristics of a solar cell under AM 1.5 100 mW/$cm^2$ illumination, according to an exemplary embodiment of the invention, and device performance is summarized in Table 34.

TABLE 34

Photovoltaic parameters of the inverted solar cells averaged over 4 devices

| Sample | $V_{OC}$ (V) | $J_{SC}$ (mA/$cm^2$) | FF | PCE (%) |
|---|---|---|---|---|
| YHZ-I-156II_E | 0.573 ± 0.002 | 8.36 ± 0.26 | 0.595 ± 0.008 | 2.85 ± 0.08 |

Example a19

Figure 59:
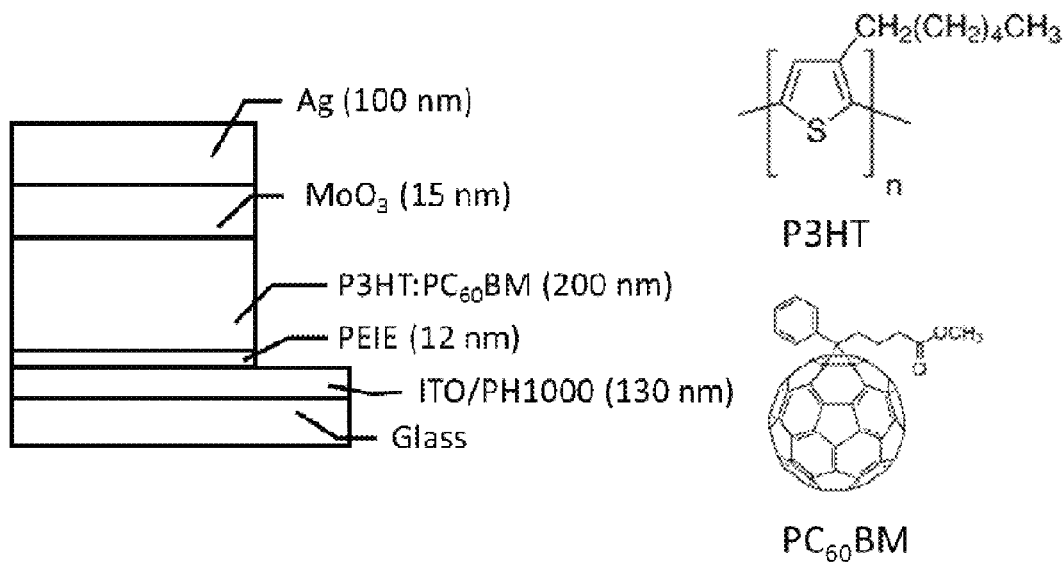
FIG. 59 shows a device structure of a solar cell and chemical structure of P3HT and PC$_{60}$BM, according to an exemplary embodiment of the invention.

Inverted Solar Cells with ITO/PH1000/PEIE (12 nm) Bottom Electrode, 200 nm P3HT:PC$_{60}$BM, MoO$_3$/Ag Top Electrode FIG. 59 shows a device structure of a solar cell and chemical structure of P3HT and PC$_{60}$BM, according to an exemplary embodiment of the invention.

Indium tin oxide (ITO)-coated glass (Colorado Concept Coatings LLC) with a sheet resistivity of ~15 Ω/sq were used as substrate. The substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths. Substrates were treated by an O$_2$ plasma for 3 min to make the surface hydrophilic.

High conductivity PEDOT:PSS PH1000 (CLEVIOS™ PH 1000, HC Stack Inc., MA) with 5% DMSO was spin coated onto the ITO glass substrates at a speed of 1000 rpm for 30 s and at an acceleration of 1000 rpm/s, and then annealed at 140° C. for 10 min on a hot plate in air. These resulted in PH1000 films with a thickness of 130 nm, measured using a profilometer (Dektak 6M Stylus, Veeco, Plainview, N.Y.). A 300-nm-thick layer of SiO$_x$ was deposited on the ITO glass/PH1000 by e-beam deposition (AXXIS, Kurt J. Lesker) to pattern the electrode.

Polyethylenimine, 80% ethoxylated (PEIE) (M$_w$=70,000 g/mol) was dissolved in H$_2$O with a concentration of 35-40 wt. % when received from Aldrich and then further diluted into methoxyethanol to a concentration of 0.5 wt. %. Then, the solution was spin-coated onto the ITO glass/PH1000 substrate at a speed of 5000 rpm for 1 min and at an acceleration of 1000 rpm/s, and then annealed at 120° C. for 10 min on hot plate in ambient air. The thickness of PEIE was 12 nm, determined by spectroscopic ellipsometry (J. A. Woollam Co.).

Then, the substrates were transferred into a N$_2$-filled glove box. The active layer of poly(3-hexylthiophene) (P3HT, 4002-E, BJ19-79, Rieke Metals, FIG. 59): [6,6]-phenyl C$_{61}$ butyric acid methyl ester (PC$_{60}$BM, Nano-C, FIG. 59) (1:0.7, weight ratio) was filtered through 0.2-µm-pore PTFE filters and spin-coated on each substrate from a 34 mg/ml chlorobenzene solution at a speed of 700 rpm and at an acceleration of 10000 rpm/s, and then annealed at 160° C. for 10 min on hot plate in the glove box. The thickness of the active layer was 200 nm, measured using a profilometer (Dektak 6M Stylus, Veeco, Plainview, N.Y.).

Samples were then loaded into a vacuum thermal evaporation system (EvoVac, Angstrom Engineering Inc.), and a 10 nm MoO$_3$ followed by a 100 nm of Ag was deposited through a shadow mask at a base pressure of 2×10$^{-7}$ Torr. The effective area of the active layer was 10 mm$^2$. The completed devices were transferred, in a sealed container, to another nitrogen-filled glove box for electrical measurements.

Figure 60:
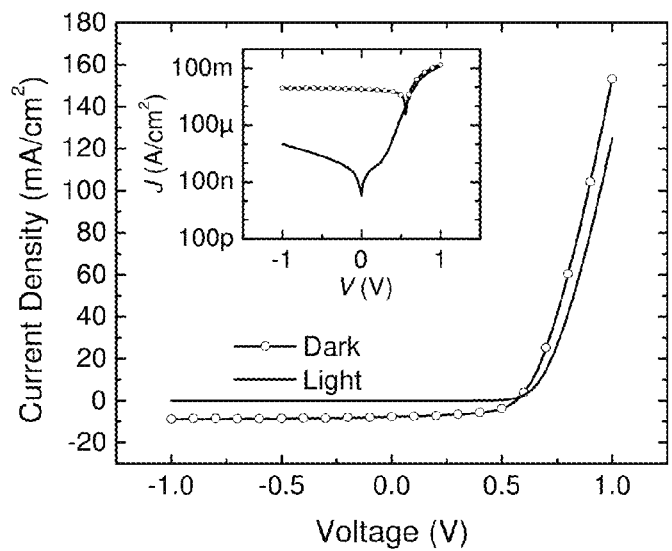
FIG. 60 shows J-V characteristics of a solar cell in dark and under AM 1.5 100 mW/cm$^2$ illumination, according to an exemplary embodiment of the invention.

Current density-voltage (J-V) characteristics were measured inside the N$_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm$^2$ was used as the light source. FIG. 60 shows J-V characteristics of a solar cell in dark and under AM 1.5 100 mW/cm$^2$ illumination, according to an exemplary embodiment of the invention, and device performance is summarized in Table 35.

TABLE 35

| Photovoltaic parameters of the inverted solar cells averaged over 4 devices | | | | |
|---|---|---|---|---|
| Sample | $V_{OC}$ (V) | $J_{SC}$ (mA/cm$^2$) | FF | PCE (%) |
| YHZ-I-156BB with PEIE | 0.563 ± 0.002 | 7.79 ± 0.13 | 0.546 ± 0.008 | 2.46 ± 0.08 |

Example a20

Figure 61:
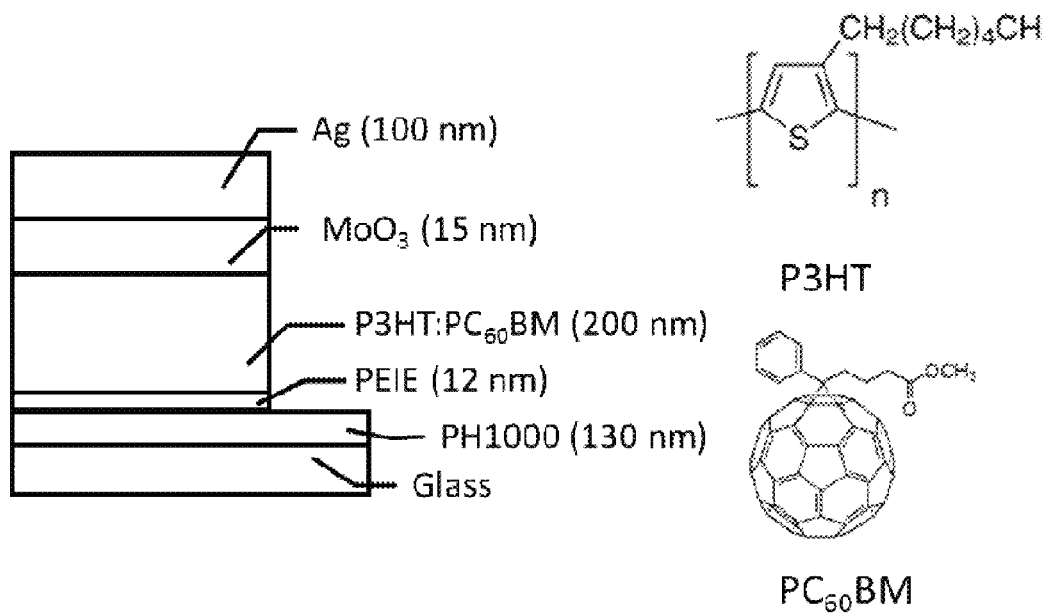
FIG. 61 shows a device structure of a solar cell and chemical structure of P3HT and PC$_{60}$BM, according to an exemplary embodiment of the invention.

Inverted Solar Cells with Glass/PH1000/PEIE (12 nm) Bottom Electrode, 200 nm P3HT:PC$_{60}$BM, MoO$_3$/Ag Top Electrode FIG. 61 shows a device structure of a solar cell and chemical structure of P3HT and PC$_{60}$BM, according to an exemplary embodiment of the invention.

Microscope glass substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths. Substrates were treated with an O$_2$ plasma for 3 min to tune make the surface hydrophilic.

High conductivity PEDOT:PSS PH1000 (CLEVIOS™ PH 1000, HC Stack Inc., MA) with 5% DMSO was spin coated onto ITO glass substrates at a speed of 1000 rpm for 30 s and at an acceleration of 1000 rpm/s; and then annealed at 140° C. for 10 min on a hot plate in air. Its thickness was 130 nm, measured using a profilometer (Dektak 6M Stylus, Veeco, Plainview, N.Y.). A 300-nm-thick layer of SiO$_x$ was deposited on the ITO glass/PH1000 by e-beam deposition (AXXIS, Kurt J. Lesker) to pattern the electrode.

Polyethylenimine, 80% ethoxylated (PEIE) (M$_w$=70,000 g/mol) was dissolved in H$_2$O with a concentration of 35-40 wt. % when received from Aldrich and then further diluted into methoxyethanol to a concentration of 0.5 wt. %. Then, the solution was spin coated onto glass/PH1000 at a speed of 5000 rpm for 1 min and at an acceleration of 1000 rpm/s; and then annealed at 120° C. for 10 min on hot plate in ambient air. The thickness of PETE was 12 nm, determined by spectroscopic ellipsometry (J. A. Woollam Co.).

Then, the substrates were transferred into a N$_2$-filled glove box. The active layer of poly(3-hexylthiophene) (P3HT, 4002-E, BJ19-79, Rieke Metals, FIG. 61): [6,6]-phenyl C$_{61}$ butyric acid methyl ester (PC$_{60}$BM, Nano-C, FIG. 61) (1:0.7, weight ratio) was filtered through 0.2-µm-pore PTFE filters and spin-coated on each substrate from a 34 mg/ml chlorobenzene solution at a speed of 700 rpm and at an acceleration of 10000 rpm/s; and then, annealed at 160° C. for 10 min on hot plate in the glove box. The thickness of the active layer was 200 nm, measured using a profilometer (Dektak 6M Stylus, Veeco, Plainview, N.Y.).

The samples were then loaded into a vacuum thermal evaporation system (EvoVac, Angstrom Engineering Inc.) where 10 nm of MoO$_3$ followed by 100 nm of Ag were deposited through a shadow mask at a base pressure of 2×10$^{-7}$ Torr. The effective area of the active layer was 10 mm$^2$. The completed devices were transferred, in a sealed container, to another nitrogen-filled glove box for electrical measurements.

Current density-voltage (J-V) characteristics were measured inside the N$_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm² was used as the light source.

Figure 62:
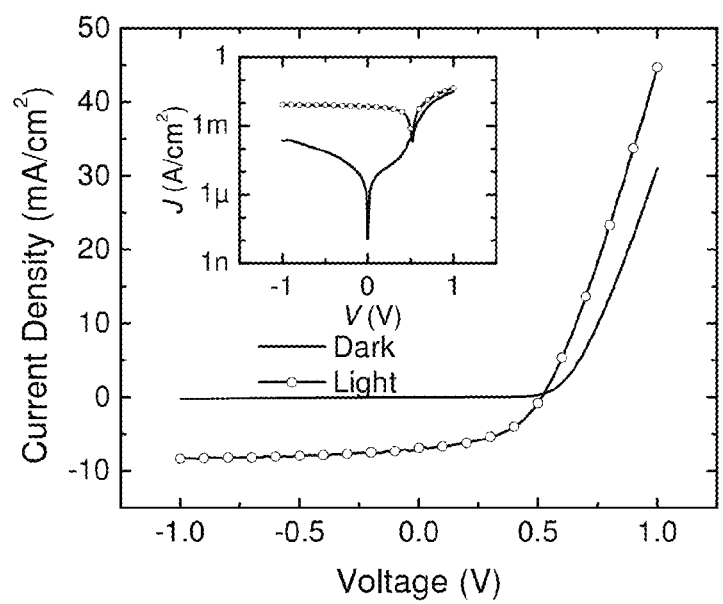
FIG. 62 shows J-V characteristics of a solar cell under AM 1.5 100 mW/cm$^2$ illumination, according to an exemplary embodiment of the invention.

FIG. 62 shows J-V characteristics of a solar cell under AM 1.5 100 mW/cm² illumination, according to an exemplary embodiment of the invention, and device performance is summarized in Table 36.

TABLE 36

Photovoltaic parameters of the inverted solar cells averaged over 5 devices

| Sample | $V_{OC}$ (V) | $J_{SC}$ (mA/cm²) | FF | PCE (%) |
|---|---|---|---|---|
| YHZ-I-156EE with PEIE | 0.510 ± 0.011 | 7.10 ± 0.33 | 0.473 ± 0.011 | 1.77 ± 0.08 |

Example a21

Figure 63:
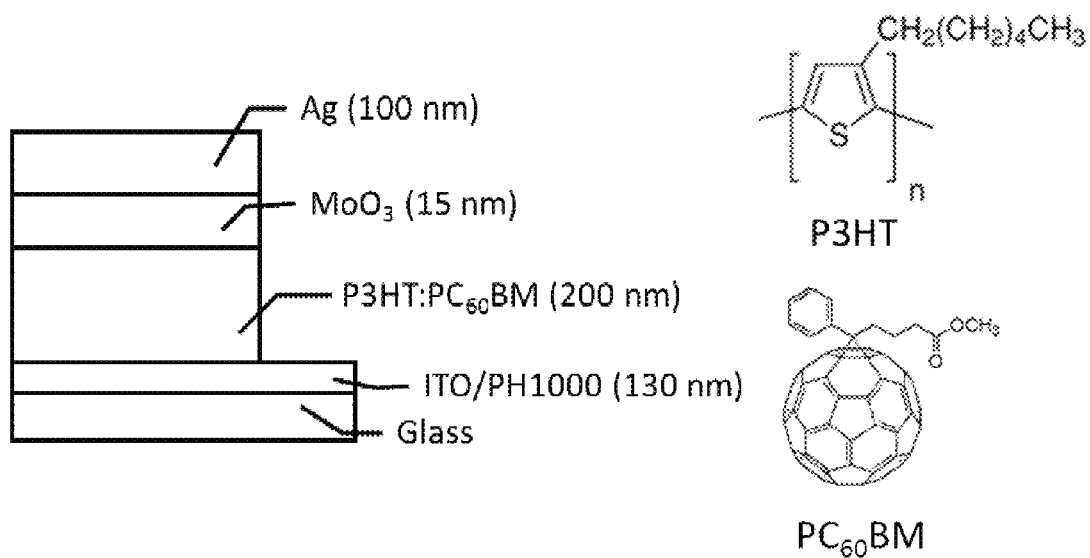
FIG. 63 shows a device structure and chemical structure of P3HT and PC$_{60}$BM, according to an exemplary embodiment of the invention.

Devices with ITO/PH1000 Bottom Electrode (without PEIE Modification), 200 nm P3HT:PC$_{60}$BM, MoO$_3$/Ag Top Electrode FIG. 63 shows a device structure and chemical structure of P3HT and PC$_{60}$BM, according to an exemplary embodiment of the invention.

Indium tin oxide (ITO)-coated glass (Colorado Concept Coatings LLC) with a sheet resistivity of ~15 Ω/sq was used as the substrate. The substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths. Substrates were treated by O$_2$ for 3 min to tune the surface becoming hydrophilic.

High conductivity PEDOT:PSS PH1000 (CLEVIOS™ PH 1000, HC Stack Inc., MA) with 5% DMSO was spin coated onto ITO glass substrates at a speed of 1000 rpm for 30 s and at an acceleration of 1000 rpm/s; and then annealed at 140° C. for 10 min on a hot plate in air. Its thickness was 130 nm, measured using a profilometer (Dektak 6M Stylus, Veeco, Plainview, N.Y.). A 300-nm-thick layer of SiO$_x$ was deposited on the ITO glass/PH1000 by e-beam deposition (AXXIS, Kurt J. Lesker) to pattern the electrode.

Then, the substrates were transferred into a N$_2$-filled glove box. The active layer of poly(3-hexylthiophene) (P3HT, 4002-E, BJ19-79, Rieke Metals, FIG. 63): [6,6]-phenyl C$_{61}$ butyric acid methyl ester (PC$_{60}$BM, Nano-C, FIG. 63) (1:0.7, weight ratio) was filtered through 0.2-μm-pore PTFE filters and spin-coated on each substrate from a 34 mg/ml chlorobenzene solution at a speed of 700 rpm and at an acceleration of 10000 rpm/s, and then annealed at 160° C. for 10 min on hot plate in the glove box. The thickness of the active layer was 200 nm, measured using a profilometer (Dektak 6M Stylus, Veeco, Plainview, N.Y.).

Samples were then loaded into a vacuum thermal evaporation system (EvoVac, Angstrom Engineering Inc.) where 10 nm of MoO$_3$ followed by 100 nm of Ag were deposited through a shadow mask at a base pressure of 2×10⁻⁷ Torr. The effective area of the active layer was 10 mm². The completed devices were transferred, in a sealed container, to another nitrogen-filled glove box for electrical measurements.

Current density-voltage (J-V) characteristics were measured inside the N$_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm² was used as the light source.

Figure 64:
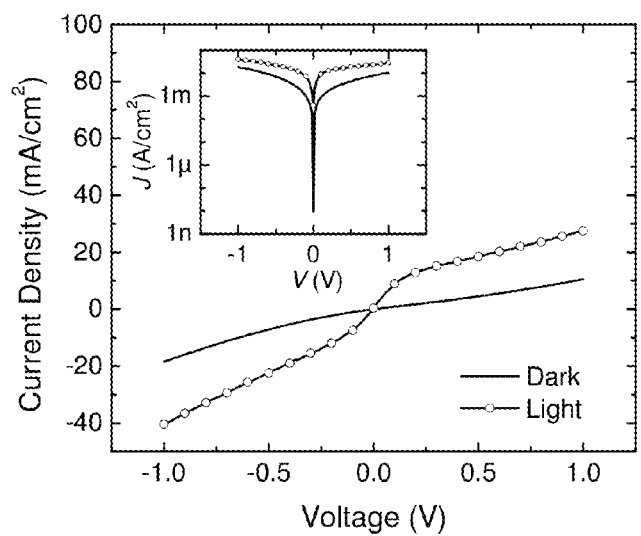
FIG. 64 shows J-V characteristics of a device under AM 1.5 100 mW/cm$^2$ illumination, according to an exemplary embodiment of the invention.

FIG. 64 shows J-V characteristics of the devices under AM 1.5 100 mW/cm² illumination, according to an exemplary embodiment of the invention.

Example a22

Figure 65:
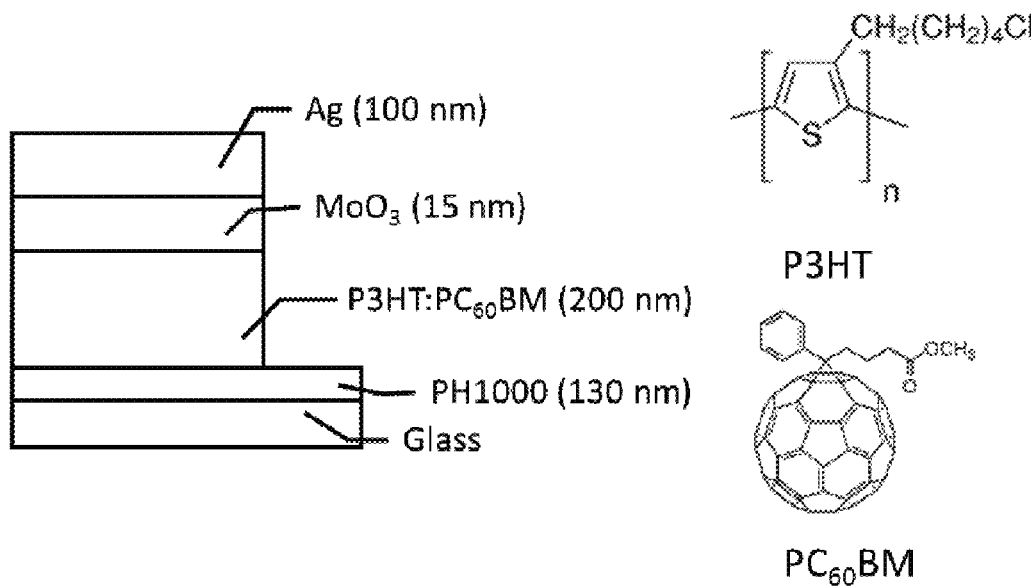
FIG. 65 shows a device structure and chemical structure of P3HT and PC$_{60}$BM, according to an exemplary embodiment of the invention.

Devices with Glass/PH1000 Bottom Electrode (without PEIE Modification), 200 nm P3HT:PC$_{60}$BM, MoO$_3$/Ag Top Electrode FIG. 65 shows a device structure and chemical structure of P3HT and PC$_{60}$BM, according to an exemplary embodiment of the invention.

Microscope glass substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths. Substrates were treated with an O$_2$ plasma for 3 min to tune make the surface hydrophilic.

High conductivity PEDOT:PSS PH1000 (CLEVIOS™ PH 1000, HC Stack Inc., MA) with 5% DMSO was spin coated onto ITO glass substrates at a speed of 1000 rpm for 30 s and at an acceleration of 1000 rpm/s; and then annealed at 140° C. for 10 min on a hot plate in air. Its thickness was 130 nm, measured using a profilometer (Dektak 6M Stylus, Veeco, Plainview, N.Y.). A 300-nm-thick layer of SiO$_x$ was deposited on the ITO glass/PH1000 by e-beam deposition (AXXIS, Kurt J. Lesker) to pattern the electrode.

Then, the substrates were transferred into a N$_2$-filled glove box. The active layer of poly(3-hexylthiophene) (P3HT, 4002-E, BJ19-79, Rieke Metals, FIG. 65): [6,6]-phenyl C$_{61}$ butyric acid methyl ester (PC$_{60}$BM, Nano-C, FIG. 65) (1:0.7, weight ratio) was filtered through 0.2-μm-pore PTFE filters and spin-coated on each substrate from a 34 mg/ml chlorobenzene solution at a speed of 700 rpm and at an acceleration of 10000 rpm/s; and then, annealed at 160° C. for 10 min on hot plate in the glove box. The thickness of the active layer was 200 nm, measured using a profilometer (Dektak 6M Stylus, Veeco, Plainview, N.Y.).

The samples were then loaded into a vacuum thermal evaporation system (EvoVac, Angstrom Engineering Inc.) where 10 nm of MoO$_3$ followed by 100 nm of Ag were deposited through a shadow mask at a base pressure of 2×10⁻⁷ Torr. The effective area of the active layer was 10 mm². The completed devices were transferred, in a sealed container, to another nitrogen-filled glove box for electrical measurements.

Current density-voltage (J-V) characteristics were measured inside the N$_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm² was used as the light source.

Figure 66:
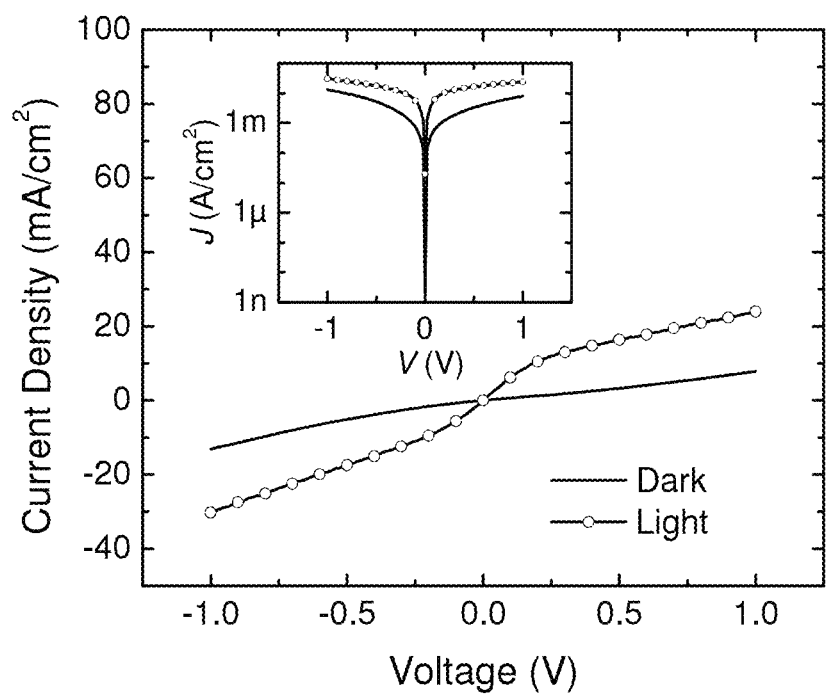
FIG. 66 shows J-V characteristics of a device under AM 1.5 100 mW/cm$^2$ illumination, according to an exemplary embodiment of the invention.

FIG. 66 shows J-V characteristics of the devices under AM 1.5 100 mW/cm² illumination, according to an exemplary embodiment of the invention.

Example a23

Fully Polymeric Semitransparent Inverted Solar Cells with Glass/PH1000/PEIE (12 nm) Bottom Electrode, 200 nm P3HT:PC$_{60}$BM, CPP-PEDOT:PH1000 Top Electrode

Figure 67:
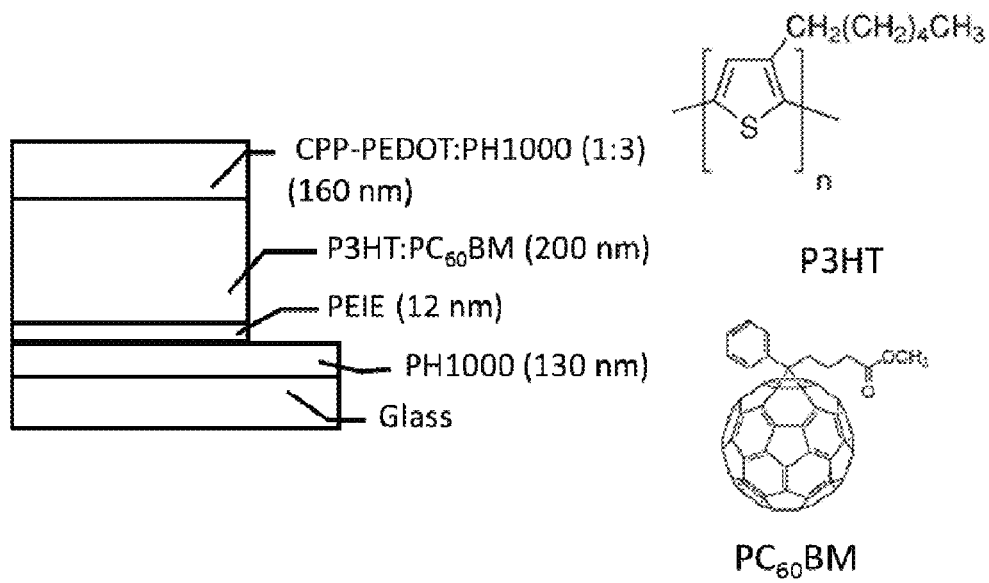
FIG. 67 shows a device structure and chemical structure of P3HT and PC$_{60}$BM, according to an exemplary embodiment of the invention.

FIG. 67 shows a device structure and chemical structure of P3HT and PC$_{60}$BM, according to an exemplary embodiment of the invention.

Microscope glass substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths. Substrates were treated with an O$_2$ plasma for 3 min to make the surface hydrophilic.

High conductivity PEDOT:PSS PH1000 (CLEVIOS™ PH 1000, HC Stack Inc., MA) with 5% DMSO was spin coated onto the glass substrates at a speed of 1000 rpm for 30 s and at an acceleration of 1000 rpm/s; and then, annealed at 140° C. for 10 min on a hot plate in air. Its thickness was 130 nm, measured using a profilometer (Dektak 6M Stylus, Veeco, Plainview, N.Y.). A 300-nm-thick layer of SiO$_x$ was deposited on the ITO glass/PH1000 by e-beam deposition (AXXIS, Kurt J. Lesker) to pattern the electrode.

Polyethylenimine, 80% ethoxylated (PEIE) (M$_w$=70,000 g/mol) was dissolved in H$_2$O with a concentration of 35-40 wt. % when received from Aldrich, and then further diluted into methoxyethanol to a concentration of 0.5 wt. %. Then, the solution was spin coated onto glass/PH1000 at a speed of 5000 rpm for 1 min and at an acceleration of 1000 rpm/s; and then, annealed at 120° C. for 10 min on a hot plate in ambient air. The thickness of PETE was 12 nm, determined by spectroscopic ellipsometry (J. A. Woollam Co.).

Then, the substrates were transferred into a N$_2$-filled glove box. The active layer of poly(3-hexylthiophene) (P3HT, 4002-E, BJ19-79, Rieke Metals, FIG. 67): [6,6]-phenyl C$_{61}$ butyric acid methyl ester (PC$_{60}$BM, Nano-C, FIG. 67) (1:0.7, weight ratio) was filtered through 0.2-µm-pore PTFE filters and spin-coated on each substrate from a 34 mg/ml chlorobenzene solution at a speed of 700 rpm and at an acceleration of 10000 rpm/s; and then, annealed at 160° C. for 10 min on hot plate in the glove box. The thickness of the active layer is 200 nm, measured using a profilometer (Dektak 6M Stylus, Veeco, Plainview, N.Y.).

A blend of two Poly(3,4-ethylenedioxythiophene):poly(styrenesulfonate) (PEDOT:PSS) formulations of PH1000:CPP-PEDOT (CLEVIOS™ F CPP 105 DM, HC Stack Inc., MA) (3:1, by volume) was used as the top electrode. A 160 nm thick PEDOT:PSS blend layer was then deposited on top of the active layer by spin coating at a speed of 1000 rpm for 30 in air. Then samples were transferred into a glove box, where top electrode was patterned by polydimethylsiloxane (PDMS) and annealed at 110° C. for 10 min. The effective area of the device was 3.7 mm$^2$.

Current density-voltage (J-V) characteristics were measured inside the N$_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm$^2$ was used as the light source.

Figure 68:
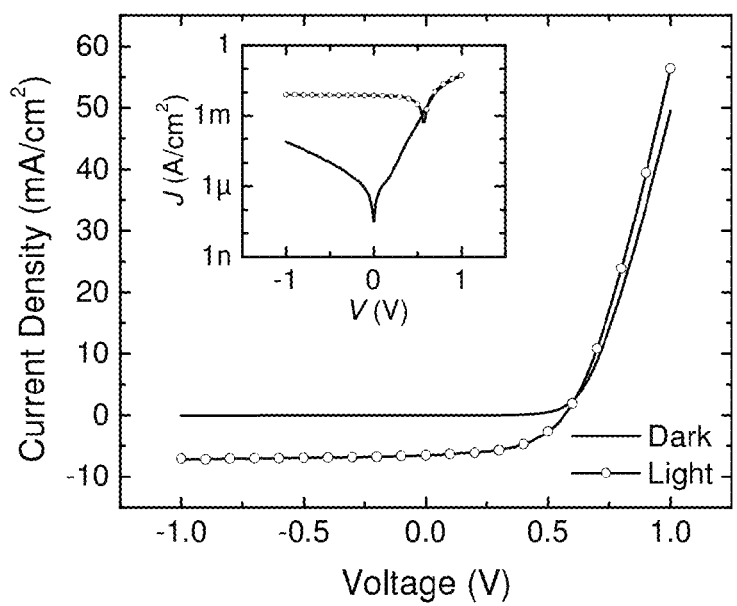
FIG. 68 shows J-V characteristics of a solar cell in dark and under AM 1.5 100 mW/cm$^2$ illumination, according to an exemplary embodiment of the invention.

FIG. 68 shows J-V characteristics of a solar cell in dark and under AM 1.5 100 mW/cm$^2$ illumination, according to an exemplary embodiment of the invention, and device performance is summarized in Table 37.

TABLE 37

| | Photovoltaic parameters of the inverted solar cells averaged over 4 devices | | | |
|---|---|---|---|---|
| Sample | V$_{OC}$ (V) | J$_{SC}$ (mA/cm$^2$) | FF | PCE (%) |
| YHZ-II-23A | 0.568 ± 0.002 | 6.87 ± 0.54 | 0.511 ± 0.003 | 2.00 ± 0.15 |

Example a24

Fully Polymeric Devices with Glass/PH1000 Bottom Electrode (without PEIE Modification), 200 nm P3HT:PC$_{60}$BM, CPP-PEDOT:PH1000 Top Electrode

Figure 69:
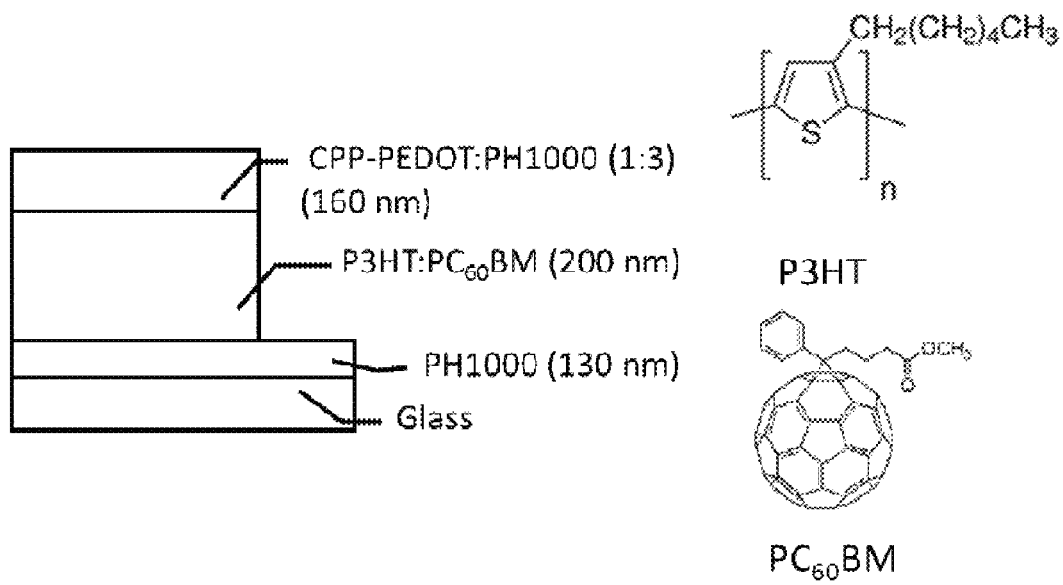
FIG. 69 shows a device structure and chemical structure of P3HT and PC$_{60}$BM, according to an exemplary embodiment of the invention.

FIG. 69 shows a device structure and chemical structure of P3HT and PC$_{60}$BM, according to an exemplary embodiment of the invention.

Microscope glass substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths. Substrates were treated with O$_2$ plasma for 3 min to make the surface hydrophilic.

High conductivity PEDOT:PSS PH1000 (CLEVIOS™ PH 1000, HC Stack Inc., MA) with 5% DMSO was spin coated onto the glass substrates at a speed of 1000 rpm for 30 s and at an acceleration of 1000 rpm/s; and then, annealed at 140° C. for 10 min on a hot plate in air. Its thickness was 130 nm, measured using a profilometer (Dektak 6M Stylus, Veeco, Plainview, N.Y.). A 300-nm-thick layer of SiO$_x$ was deposited on the ITO glass/PH1000 by e-beam deposition (AXXIS, Kurt J. Lesker) to pattern the electrode.

Then, the substrates were transferred into a N$_2$-filled glove box. The active layer of poly(3-hexylthiophene) (P3HT, 4002-E, BJ19-79, Rieke Metals, FIG. 69): [6,6]-phenyl C$_{61}$ butyric acid methyl ester (PC$_{60}$BM, Nano-C, FIG. 69) (1:0.7, weight ratio) was filtered through 0.2-µm-pore PTFE filters and spin-coated on each substrate from a 34 mg/ml chlorobenzene solution at a speed of 700 rpm and at an acceleration of 10000 rpm/s; and then, annealed at 160° C. for 10 min on hot plate in the glove box. The thickness of the active layer is 200 nm, measured using a profilometer (Dektak 6M Stylus, Veeco, Plainview, N.Y.).

A blend of two Poly(3,4-ethylenedioxythiophene):poly(styrenesulfonate) (PEDOT:PSS) formulations of PH1000:CPP-PEDOT (CLEVIOS™ F CPP 105 DM, HC Stack Inc., MA) (3:1, by volume) was used as the top electrode. A 160 nm thick PEDOT:PSS blend layer was then deposited on top of the active layer by spin coating at a speed of 1000 rpm for 30 in air. Then samples were transferred into a glove box, where top electrode was patterned by polydimethylsiloxane (PDMS) and annealed at 110° C. for 10 min. The effective area of the device was 3.7 mm$^2$.

Current density-voltage (J-V) characteristics were measured inside the N$_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm$^2$ was used as the light source.

Figure 70:
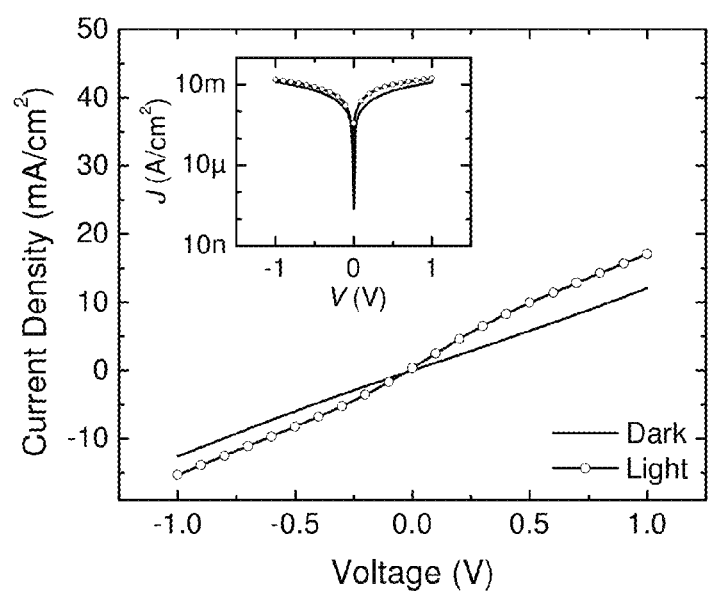
FIG. 70 shows J-V characteristics of a device in dark and under AM 1.5 100 mW/cm$^2$ illumination, according to an exemplary embodiment of the invention.

FIG. 70 shows J-V characteristics of a device in dark and under AM 1.5 100 mW/cm$^2$ illumination, according to an exemplary embodiment of the invention.

Example a25

Figure 71:
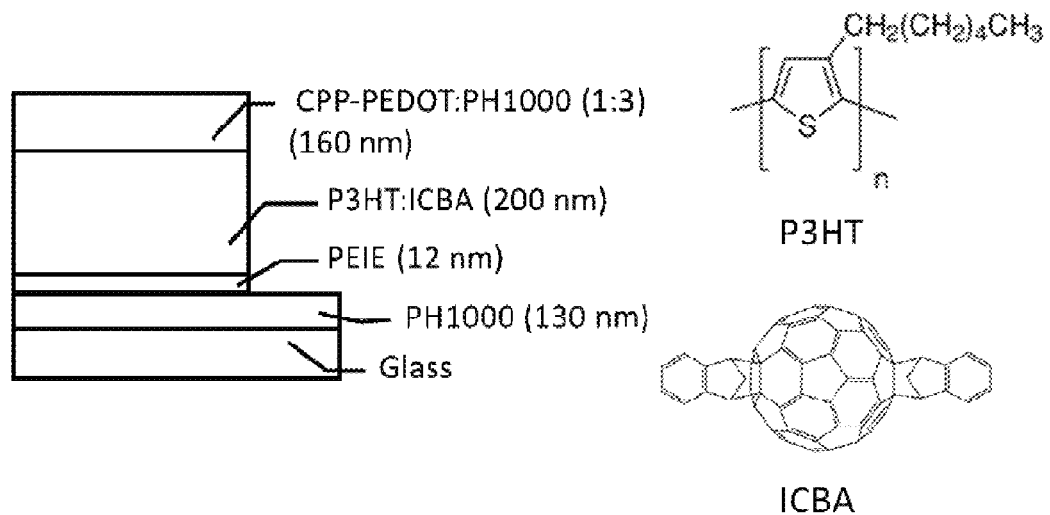
FIG. 71 shows a device structure and chemical structure of P3HT and ICBA, according to an exemplary embodiment of the invention.

Fully Polymeric Semitransparent Inverted Solar Cells with Glass/PH1000/PEIE (12 nm) Bottom Electrode, 200 nm P3HT:ICBA, CPP-PEDOT:PH1000 Top Electrode FIG. 71 shows a device structure and chemical structure of P3HT and ICBA, according to an exemplary embodiment of the invention.

Microscope glass substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths. Substrates were treated with an $O_2$ plasma for 3 min to make the surface hydrophilic.

High conductivity PEDOT:PSS PH1000 (CLEVIOS™ PH 1000, HC Stack Inc., MA) with 5% DMSO was spin coated onto the glass substrates at a speed of 1000 rpm for 30 s and at an acceleration of 1000 rpm/s; and then, annealed at 140° C. for 10 min on a hot plate in air. Its thickness was 130 nm, measured using a profilometer (Dektak 6M Stylus, Veeco, Plainview, N.Y.). A 300-nm-thick layer of $SiO_x$ was deposited on the ITO glass/PH1000 by e-beam deposition (AXXIS, Kurt J. Lesker) to pattern the electrode.

Polyethylenimine, 80% ethoxylated (PEIE) ($M_w$=70,000 g/mol) was dissolved in $H_2O$ with a concentration of 35-40 wt. % when received from Aldrich, and then further diluted into methoxyethanol to a concentration of 0.5 wt. %. Then, the solution was spin coated onto glass/PH1000 at a speed of 5000 rpm for 1 min and at an acceleration of 1000 rpm/s; and then, annealed at 120° C. for 10 min on a hot plate in ambient air. The thickness of PETE was 12 nm, determined by spectroscopic ellipsometry (J. A. Woollam Co.).

Then the substrates were transferred into a $N_2$-filled glove box. The active layer of poly(3-hexylthiophene) (P3HT, 4002-E, BJ19-79, Rieke Metals, FIG. 71): Indene-C60 Bis-Adduct (ICBA, Lumtec, FIG. 71) (1:1, weight ratio) was filtered through 0.2-µm-pore PTFE filters and spin-coated on each substrate from 40 mg/ml chlorobenzene solution at a speed of 700 rpm and at an acceleration of 10000 rpm/s; and then annealed at 160° C. for 10 min on a hot plate in the glove box. The thickness of the active layer was 200 nm, measured using a profilometer (Dektak 6M Stylus, Veeco, Plainview, N.Y.).

A blend of two Poly(3,4-ethylenedioxythiophene):poly(styrenesulfonate) (PEDOT:PSS) formulations of PH1000:CPP-PEDOT (CLEVIOS™ F CPP 105 DM, HC Stack Inc., MA) (3:1, by volume) was used as the top electrode. A 160 nm thick PEDOT:PSS blend layer was then deposited on top of the active layer by spin coating at a speed of 1000 rpm for 30 in air. Then samples were transferred into a glove box, where top electrode was patterned by polydimethylsiloxane (PDMS) and annealed at 110° C. for 10 min. The effective area of the device was 3.7 $mm^2$.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/$cm^2$ was used as the light source.

Figure 72:
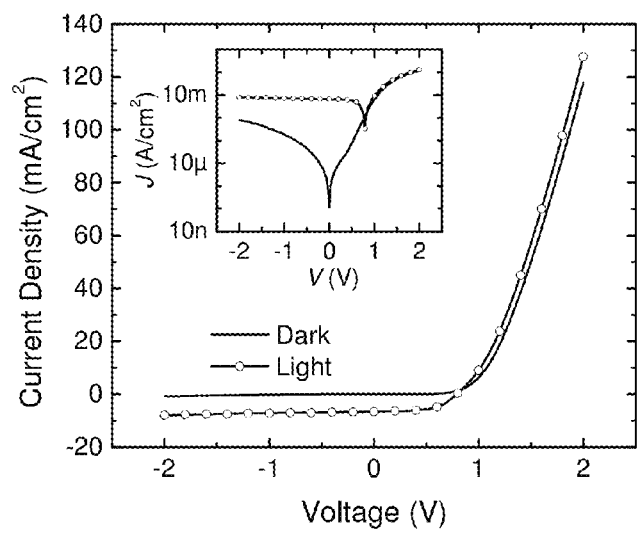
FIG. 72 shows J-V characteristics of a device in the dark and under AM 1.5 100 mW/cm$^2$ illumination, according to an exemplary embodiment of the invention.

FIG. 72 shows J-V characteristics of a device in the dark and under AM 1.5 100 mW/$cm^2$ illumination, according to an exemplary embodiment of the invention, and device performance is summarized in Table 38.

TABLE 38

Photovoltaic performance of a fully polymeric solar cell

| Sample | $V_{OC}$ (V) | $J_{SC}$ (mA/$cm^2$) | FF | PCE (%) |
|---|---|---|---|---|
| YHZ-II-23C | 0.790 | 6.60 | 0.564 | 2.95 |

Example a26

Figure 73:
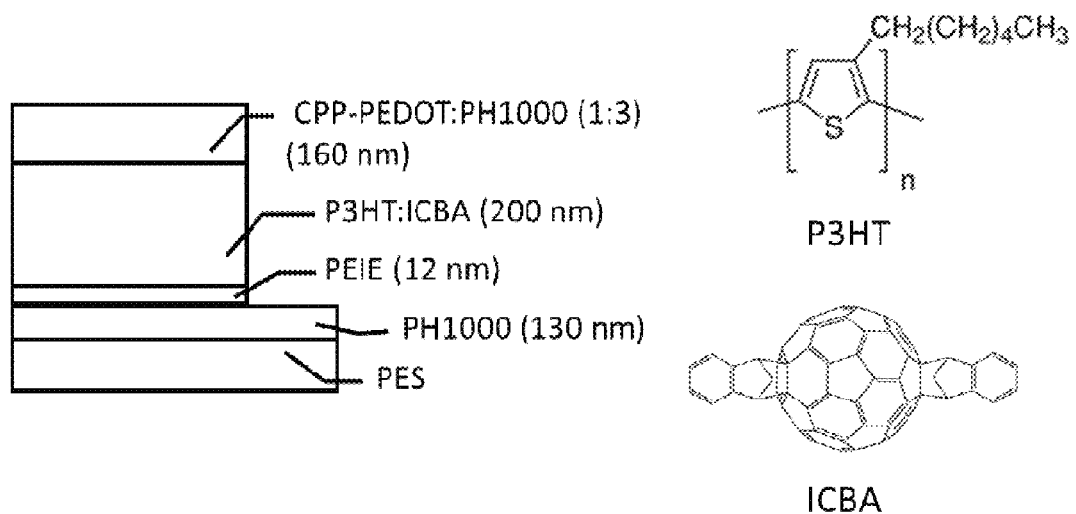
FIG. 73 shows a device structure and chemical structure of P3HT and ICBA, according to an exemplary embodiment of the invention.

Flexible Fully Polymeric Semitransparent Inverted Solar Cells with PES/PH1000/PEIE (12 nm) Bottom Electrode, 200 nm P3HT:ICBA, CPP-PEDOT:PH1000 Top Electrode FIG. 73 shows a device structure and chemical structure of P3HT and ICBA, according to an exemplary embodiment of the invention.

Polyethersulfone (PES) was used as the substrates for the flexible organic solar cells. For PH1000 patterning, a piece of polydimethylsiloxane (PDMS) was put down on half of the PES substrates as a shadow mask and then the PES substrates were treated with an $O_2$ plasma for 5 s.

High conductivity PEDOT:PSS PH1000 (CLEVIOS™ PH 1000, HC Stack Inc., MA) with 5% DMSO was spin coated on PES substrates at a speed of 1000 rpm for 30 s and an acceleration of 1000 rpm/s and annealed at 140° C. for 10 min on a hot plate in air. PH1000 only wet half of the PES substrates with plasma treatment. The thickness of PH1000 was 130 nm, measured using a profilometer (Dektak 6M Stylus, Veeco, Plainview, N.Y.).

Polyethylenimine, 80% ethoxylated (PEIE) (Mw=70,000) was dissolved in $H_2O$ with a concentration of 35-40 wt. % when received from Aldrich. It was diluted into methoxyethanol to the weight concentration of 0.5%. PEIE was spin coated onto the substrates at a speed of 5000 rpm for 1 min and an acceleration of 1000 rpm/s and annealed at 100° C. for 10 min on hot plate in ambient air. The thickness of PEIE was 12 nm, determined by spectroscopic ellipsometry (J. A. Woollam Co.).

Then the substrates were transferred into a $N_2$-filled glove box. The active layer of poly(3-hexylthiophene) (P3HT, 4002-E, BJ19-79, Rieke Metals, FIG. 73): Indene-C60 Bis-Adduct (ICBA, Lumtec, FIG. 73) (1:1, weight ratio) was filtered through 0.2-µm-pore PTFE filters and spin-coated on each substrate from 40 mg/ml chlorobenzene solution at a speed of 700 rpm and an acceleration of 10000 rpm/s and annealed at 160° C. for 10 min on hot plate in the glove box. For some some samples, active layer of poly(3-hexylthiophene) (P3HT, 4002-E, BJ19-79, Rieke Metals): [6,6]-phenyl $C_{61}$ butyric acid methyl ester ($PC_{60}BM$, Nano-C) (1:0.7, weight ratio) was spin-coated on each substrate from 34 mg/ml chlorobenzene solution at a speed of 700 rpm and an acceleration of 10000 rpm/s and annealed at 160° C. for 10 min on hot plate in the glove box. The thicknesses of the active layer were 200 nm, measured using a profilometer.

A blend of two Poly(3,4-ethylenedioxythiophene):poly(styrenesulfonate) (PEDOT:PSS) formulations of PH1000:CPP-PEDOT (CLEVIOS™ F CPP 105 DM, HC Stack Inc., MA) (3:1, by volume) was used as the top electrode, prepared by spin coating at a speed of 1000 rpm for 30 s in air. Then samples were transferred into a glove box, where top electrode was patterned by polydimethylsiloxane (PDMS) and annealed at 110° C. for 10 min. The thickness of the blend PEDOT:PSS was 160 nm. The effective area of the device was 4-7 $mm^2$.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm$^2$ was used as the light source.

Figure 74:
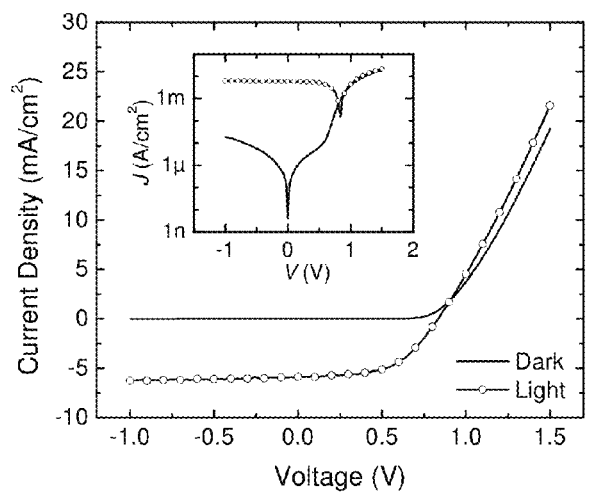
FIG. 74 shows J-V characteristics of a solar cell in dark and under AM 1.5 100 mW/cm$^2$ illumination, according to an exemplary embodiment of the invention.

FIG. 74 shows J-V characteristics of a solar cell in dark and under AM 1.5 100 mW/cm$^2$ illumination, according to an exemplary embodiment of the invention, and performance summarized in Table 39.

Figure 75:
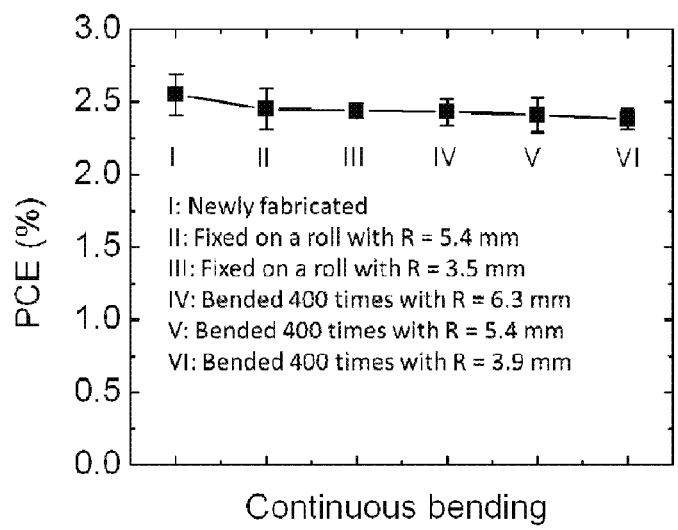
FIG. 75 shows a photovoltaic performance of a device after continuous bending, according to an exemplary embodiment of the invention.

FIG. 75 shows a photovoltaic performance of a device after continuous bending, according to an exemplary embodiment of the invention.

TABLE 39

Photovoltaic parameters of the flexible fully polymeric solar cells, averaged over 3 devices

| Sample | $V_{OC}$ (V) | $J_{SC}$ (mA/cm$^2$) | FF | PCE (%) |
|---|---|---|---|---|
| YHZ-II-34A | 0.834 ± 0.001 | 5.63 ± 0.20 | 0.544 ± 0.024 | 2.55 ± 0.14 |

Example a27

Figure 76:
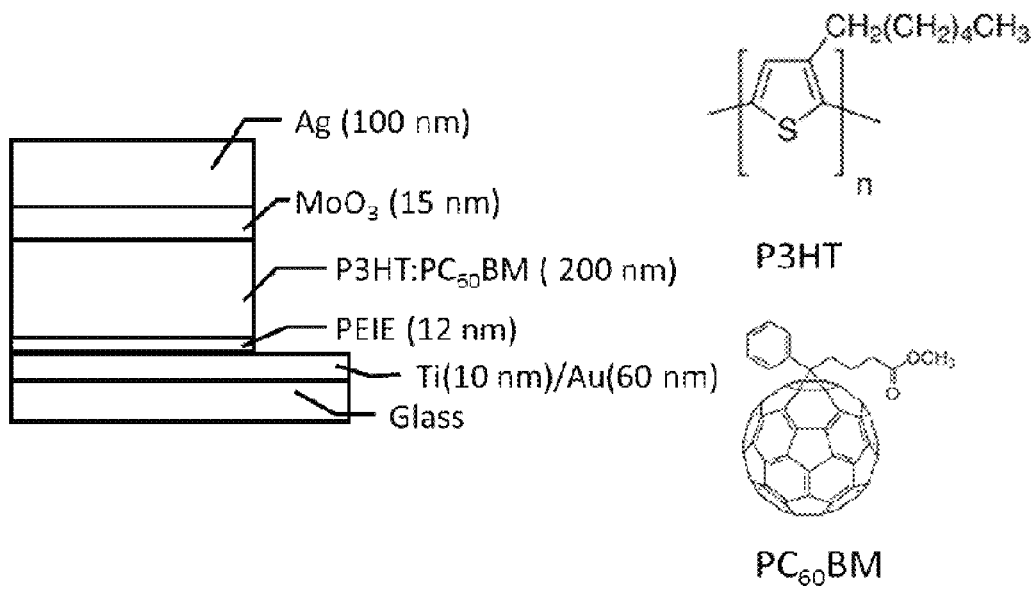
FIG. 76 shows a device structure and chemical structure of P3HT and PC$_{60}$BM, according to an exemplary embodiment of the invention.

Diodes with Ti/Au/PEIE (12 nm) Bottom Electrode, 200 nm P3HT:PC$_{60}$BM, MoO$_3$/Ag Top Electrode FIG. 76 shows a device structure and chemical structure of P3HT and PC$_{60}$BM, according to an exemplary embodiment of the invention.

Microscope glasses substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths.

A Ti (10 nm)/Au (60 nm) electrode was deposited onto the glass substrates through a shadow mask by e-beam deposition (AXXIS, Kurt J. Lesker).

Polyethylenimine, 80% ethoxylated (PEIE) ($M_w$=70,000 g/mol) was dissolved in $H_2O$ with a concentration of 35-40 wt. % as received from Aldrich and then further diluted into methoxyethanol to a concentration of 0.5 wt. %. Then, the solution was spin coated onto the glass/Ti/Au at a speed of 5000 rpm for 1 min and at an acceleration of 1000 rpm/s; and then annealed at 120° C. for 10 min on hot plate in ambient air. The thickness of PETE was 12 nm, determined by spectroscopic ellipsometry (J. A. Woollam Co.).

Then, the substrates were transferred into a $N_2$-filled glove box. The active layer of P3HT (Rieke Metals, 4002-E, FIG. 76): PCBM (Nano-C, BJ091013, FIG. 76) (1:0.7, weight ratio) was spin-coated on each substrate from a 34 mg/ml chlorobenzene solution and annealed at 160° C. for 10 min on hot plate in the glove box. The thickness of the active layer was measured to be 200 nm.

Samples were transferred to a vacuum thermal evaporation system (EvoVac) and 15 nm of $MoO_3$ followed by 100 nm of Ag were deposited through a shadow mask at a base pressure of 2×10$^{-7}$ Torr. The effective area of the active layer was 10 mm$^2$.

Figure 77:
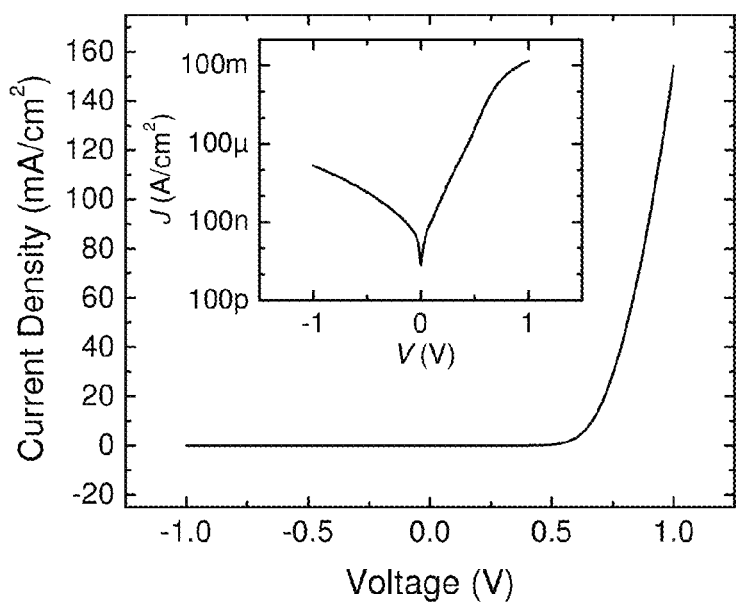
FIG. 77 shows J-V characteristics of a device in dark, according to an exemplary embodiment of the invention.

FIG. 77 shows J-V characteristics of a device in dark, according to an exemplary embodiment of the invention. Current density-voltage (J-V) characteristics in the dark were measured inside the $N_2$-filled glove box by using a source meter (2400, Keithley Instruments, Cleveland, Ohio) controlled by a LabVIEW program.

Example a28

Figure 78:
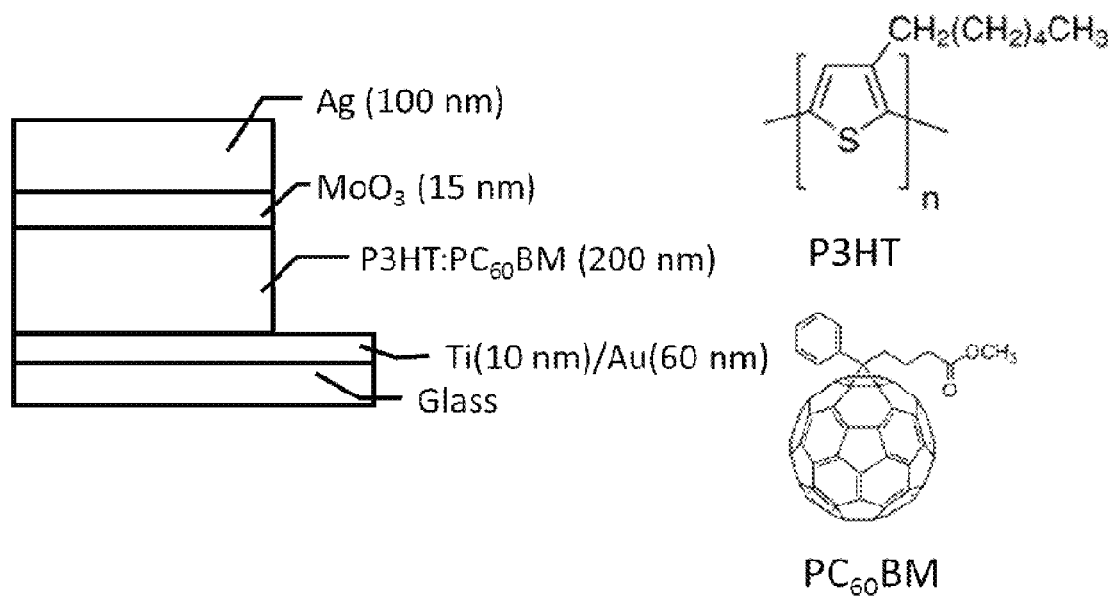
FIG. 78 shows a device structure and chemical structure of P3HT and $PC_{60}BM$, according to an exemplary embodiment of the invention.

Devices with Ti/Au Bottom Electrode (without PEIE Modification), 200 nm P3HT:PC$_{60}$BM, MoO$_3$/Ag Top Electrode FIG. 78 shows a device structure and chemical structure of P3HT and PC$_{60}$BM, according to an exemplary embodiment of the invention.

Microscope glasses substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths.

A Ti (10 nm)/Au (60 nm) electrode was deposited onto the glass substrates through a shadow mask by e-beam deposition (AXXIS, Kurt J. Lesker).

Then, the substrates were transferred into a $N_2$-filled glove box. The active layer of P3HT (Rieke Metals, 4002-E, FIG. 78): PCBM (Nano-C, BJ091013, FIG. 78) (1:0.7, weight ratio) was spin-coated on each substrate from a 34 mg/ml chlorobenzene solution and annealed at 160° C. for 10 min on hot plate in the glove box. The thickness of the active layer was measured to be 200 nm.

Samples were transferred to a vacuum thermal evaporation system (EvoVac) and 15 nm of $MoO_3$ followed by 100 nm of Ag were deposited through a shadow mask at a base pressure of 2×10$^{-7}$ Torr. The effective area of the active layer was 10 mm$^2$.

Figure 79:
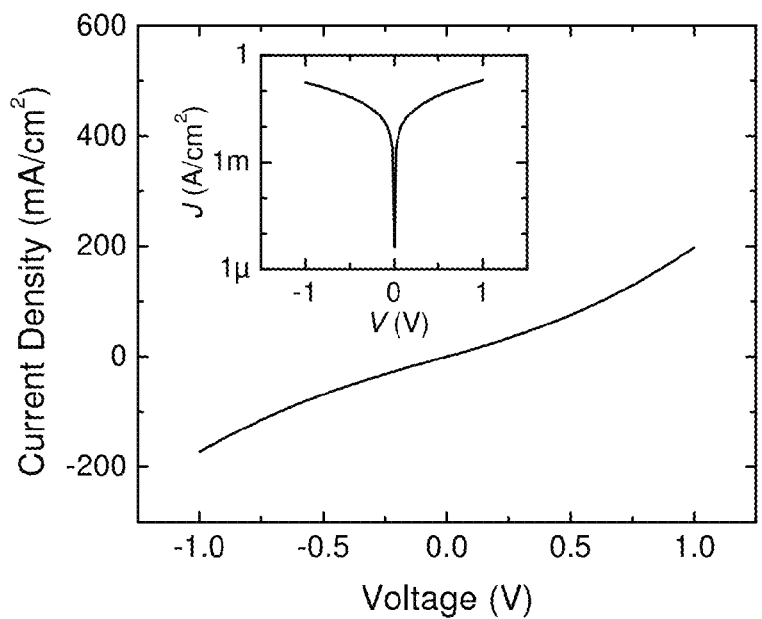
FIG. 79 shows J-V characteristics of a device in the dark, according to an exemplary embodiment of the invention.

FIG. 79 shows density-voltage J-V characteristics of a device in the dark, according to an exemplary embodiment of the invention. The J-V characteristics in the dark were measured inside the $N_2$-filled glove box by using a source meter (2400, Keithley Instruments, Cleveland, Ohio) controlled by a LabVIEW program.

Example a29

Figure 80:
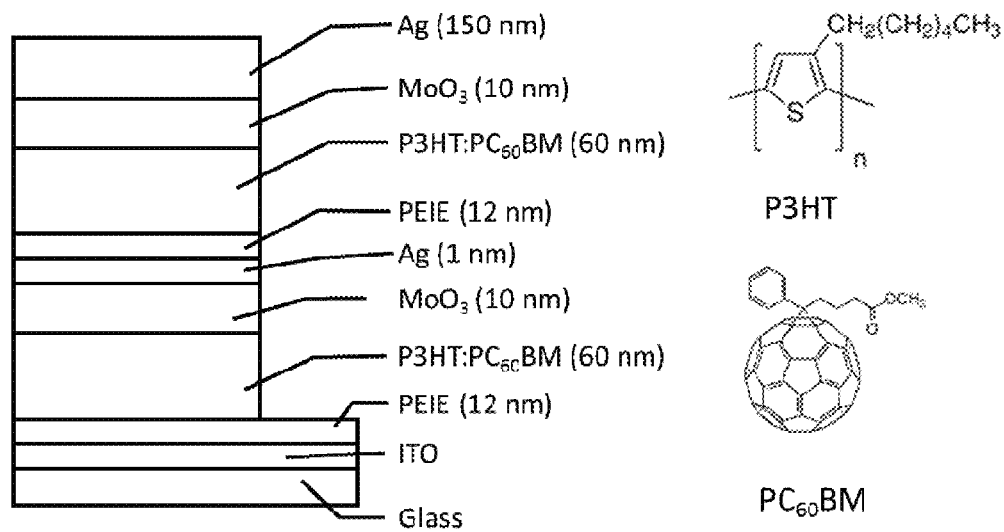
FIG. 80 shows a structure of tandem solar cells and chemical structure of P3HT and $PC_{60}BM$, according to an exemplary embodiment of the invention.

Inverted Tandem Solar Cells with ITO/PEIE (12 nm) Bottom Electrode and MoO$_3$/Ag/PEIE (12 nm) Recombination Layer FIG. 80 shows a structure of tandem solar cells and chemical structure of P3HT and PC$_{60}$BM, according to an exemplary embodiment of the invention.

ITO-coated glass (Colorado Concept Coatings LLC) with a sheet resistivity of ~15 Ω/sq. was used as substrate. The substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths. A 300-nm-thick layer of SiO$_x$ was deposited on the ITO substrate by e-beam deposition (AXXIS, Kurt J. Lesker) to pattern the anode. Next, the substrates were ultrasonicated in isopropanol for 10 minutes, blown dry with nitrogen.

Polyethylenimine, 80% ethoxylated (PEIE) ($M_w$=70,000 g/mol) was dissolved in $H_2O$ with a concentration of 35-40 wt. % as received from Aldrich and then further diluted into methoxyethanol to a concentration of 0.5 wt. %. Then, the solution was spin coated onto ITO glass at a speed of 5000 rpm for 1 min and an acceleration of 1000 rpm/s and annealed at 120° C. for 10 min on hot plate in ambient air. The thickness of PETE was 12 nm, determined by spectroscopic ellipsometry (J. A. Woollam Co.).

Then, the substrates were transferred into a $N_2$-filled glove box. The active layer of P3HT (Rieke Metals, 4002-E, FIG. 80): PCBM (Nano-C, FIG. 80) (1:0.7, weight ratio) was spin-coated on each substrate from a 17 mg/ml chlorobenzene solution at a speed of 1000 rpm and at an acceleration of 10000 rpm/s; and then annealed at 160° C. for 10 min on hot plate inside the glove box. The thickness of the active layer was 60 nm measured by spectroscopic ellipsometry.

The substrates were then loaded into a vacuum thermal evaporation system (SPECTROS, Kurt J. Lesker) connected to the glove box, and 10 nm $MoO_3$ followed by 1 nm Ag was deposited at a rate of 1-3 Å/s and a base pressure of $2\times10^{-7}$ Torr. Then, another layer of PETE film was deposited onto the samples by spin coating from a 0.5 wt % methoxymethanol solution at a speed of 5000 rpm for 1 min and at an acceleration of 1000 rpm/s; and then annealed at 120° C. for 10 min on hot plate in the glove box. Another layer of P3HT:PCBM was deposited on top of the second PETE layer using the same condition used for the first layer.

Samples were then loaded into the vacuum thermal evaporation system (SPECTROS, Kurt J. Lesker) where 10 nm of $MoO_3$ followed by 150 nm of Ag were deposited at a rate of 1-3 Å/s through a shadow mask at a base pressure of $2\times10^{-7}$ Torr to finish the device fabrication. The effective area of the active layer was 10 $mm^2$. The completed devices were transferred, in a sealed container, to another nitrogen-filled glove box for electrical measurements.

Current density-voltage (J-V) characteristics were measured inside the $N_2$-filled glove box by using a source meter (2400, Keithley Instruments, Cleveland, Ohio) controlled by a LabVIEW program.

Figure 81:
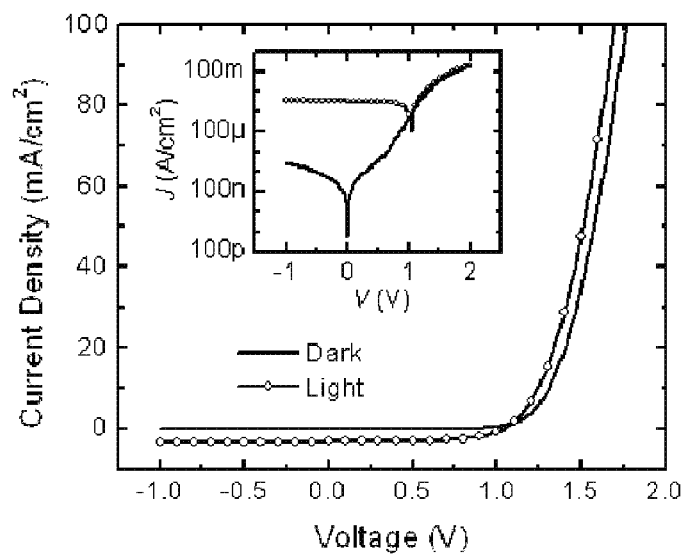
FIG. 81 shows J-V characteristics of a device in the dark and under AM 1.5 100 mW/cm$^2$ illumination, according to an exemplary embodiment of the invention.

FIG. 81 shows J-V characteristics of a device in the dark and under AM 1.5 100 mW/$cm^2$ illumination, according to an exemplary embodiment of the invention, and device performance is summarized in Table 40.

To test the solar cell properties under illumination, an Oriel lamp with an air mass 1.5 filter and an intensity of 100 mW/$cm^2$ was used as the light source.

TABLE 40

Photovoltaic parameters of tandem solar cells, averaged over 3 devices

| Device | $V_{OC}$ (mV) | $J_{SC}$ (mA/$cm^2$) | FF | PCE (%) |
|---|---|---|---|---|
| JWS-II-107B | 1042 ± 6 | 3.15 ± 0.03 | 0.62 ± 0.01 | 2.04 ± 0.02 |

4.4.2 Examples a30-a32

Use of PEIE Modified Electrodes in OLEDs

Example a30

Figure 82:
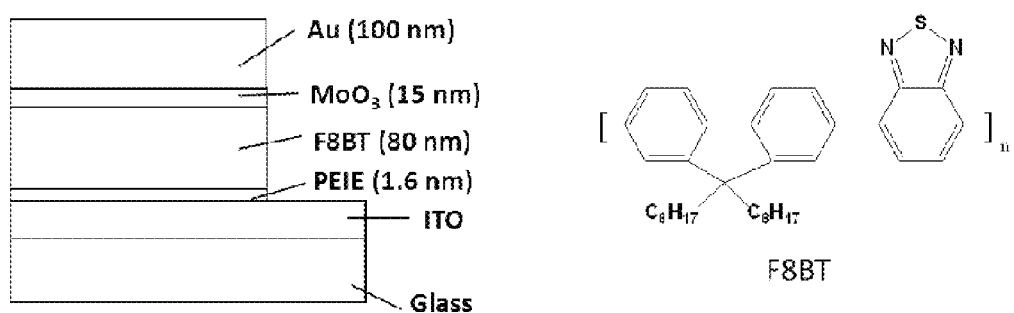
FIG. 82 shows a structure of an inverted OLED and chemical structure of F8BT, according to an exemplary embodiment of the invention.

Inverted Organic Light-Emitting Diodes with a ITO/PEIE (1.6 nm) Electron-Injection Electrode FIG. 82 shows a structure of an inverted OLED and chemical structure of F8BT, according to an exemplary embodiment of the invention.

ITO-coated glass (Colorado Concept Coatings LLC) with a sheet resistivity of ~15 Ω/sq. was used as substrate. The ITO substrates were patterned with kapton tape and etched by acid vapor (1:3 by volume, $HNO_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Each ultrasonic bath lasted 20 min. Nitrogen was used to dry the substrates after each of the last three baths.

Polyethylenimine, 80% ethoxylated (PEIE) ($M_w$=70,000 g/mol), was dissolved in $H_2O$ with a concentration of 35-40 wt. % when received from Aldrich and then further diluted into methoxyethanol to a concentration of 0.05 wt. %. Then, the solution was spin coated onto cleaned ITO substrates at a speed of 5000 rpm for 1 min and an acceleration of 1000 rpm/s and annealed at 120° C. for 10 min on hot plate in ambient air. The thickness of PEIE was 1.6 nm, determined by spectroscopic ellipsometry (J. A. Woollam Co.).

Poly[9,9-dioctylfluorenyl-2,7-diyl)-co-1,4-benzo-2{2,1'-3}-thiadiazole)] (F8BT, ADS133YE, American Dye Source, Inc., FIG. 82) was spin-coated on samples as the emissive layer from a 15 mg/ml chlorobenzene solution at a speed of 1000 rpm and at an acceleration of 10000 rpm/s. Its thickness was 80 nm measured by spectroscopic ellipsometry.

Samples were then loaded into a vacuum thermal evaporation system (EvoVac, Angstrom Engineering Inc.), a 15 nm of $MoO_3$ followed by a 100 nm of Ag was deposited through a shadow mask at a base pressure of $2\times10^{-7}$ Torr. The effective area of the active layer was 10 $mm^2$. The completed devices were transferred, in a sealed container, to another nitrogen-filled glove box for electrical measurements.

Current density-voltage (J-V) and luminance-voltage (L-V) characteristics were measured inside the $N_2$-filled glove box by using a source meter (2400, Keithley Instruments, Cleveland, Ohio) and a calibrated photodiode integrated with a LabVIEW program.

Figure 83:
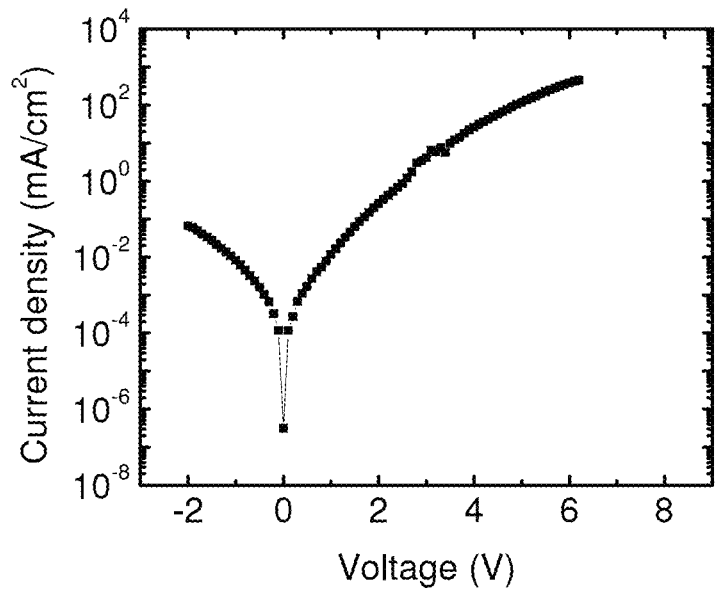
FIG. 83 shows J-V characteristics of an inverted OLED, according to an exemplary embodiment of the invention.

FIG. 83 shows J-V characteristics of an inverted OLED, according to an exemplary embodiment of the invention.

Figure 84:
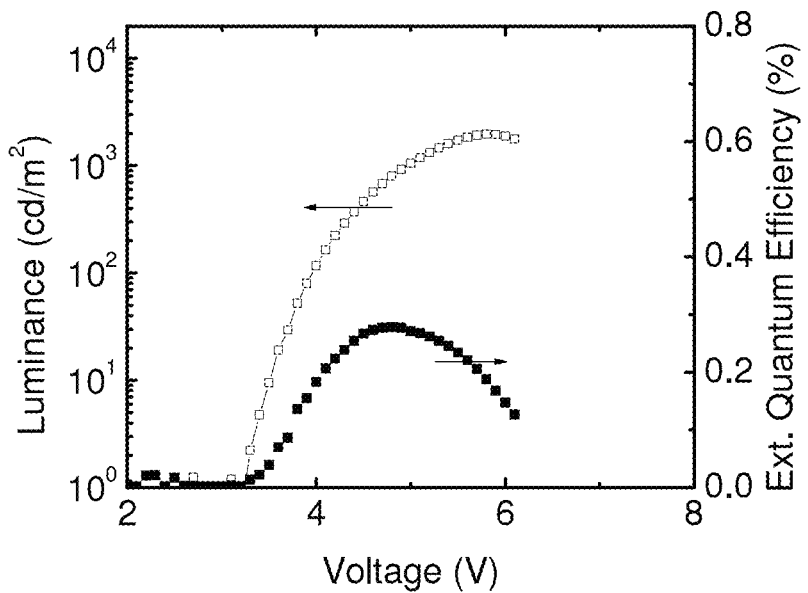
FIG. 84 shows L-EQE-V characteristics of an inverted OLED, according to an exemplary embodiment of the invention.

FIG. 84 shows L-EQE-V characteristics of an inverted OLED, according to an exemplary embodiment of the invention.

Example a31

Figure 85:
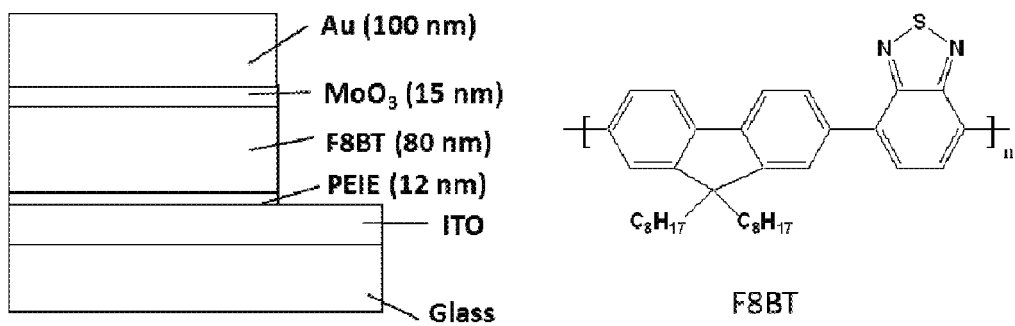
FIG. 85 shows a structure of an inverted OLED and chemical structure of F8BT, according to an exemplary embodiment of the invention.

Inverted Organic Light-Emitting Diodes with a ITO/PEIE (12 nm) Electron-Injection Electrode FIG. 85 shows a structure of an inverted OLED and chemical structure of F8BT, according to an exemplary embodiment of the invention.

ITO-coated glass (Colorado Concept Coatings LLC) with a sheet resistivity of ~15 Ω/sq. was used as substrate. The ITO substrates were patterned with kapton tape and etched by acid vapor (1:3 by volume, $HNO_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Each ultrasonic bath lasted 20 min. Nitrogen was used to dry the substrates after each of the last three baths.

Polyethylenimine, 80% ethoxylated (PEIE) ($M_w$=70,000 g/mol), was dissolved in $H_2O$ with a concentration of 35-40 wt. % when received from Aldrich and then further diluted into methoxyethanol to a concentration of 0.5 wt. %. Then, the solution was spin coated onto cleaned ITO substrates at a speed of 5000 rpm for 1 min and an acceleration of 1000 rpm/s and annealed at 120° C. for 10 min on hot plate in ambient air. The thickness of PEIE was 12 nm, determined by spectroscopic ellipsometry (J. A. Woollam Co.).

Poly[9,9-dioctylfluorenyl-2,7-diyl)-co-1,4-benzo-2{2,1'-3}-thiadiazole)] (F8BT, ADS133YE, American Dye Source, Inc., FIG. 85) was spin-coated on samples as the emissive layer from a 15 mg/ml chlorobenzene solution at a speed of 1000 rpm and at an acceleration of 10000 rpm/s. Its thickness was 80 nm measured by spectroscopic ellipsometry.

Samples were then loaded into a vacuum thermal evaporation system (EvoVac, Angstrom Engineering Inc.), a 15 nm of $MoO_3$ followed by a 100 nm of Ag was deposited through a shadow mask at a base pressure of $2 \times 10^{-7}$ Torr. The effective area of the active layer was 10 $mm^2$. The completed devices were transferred, in a sealed container, to another nitrogen-filled glove box for electrical measurements.

Current density-voltage (J-V) and luminance-voltage (L-V) characteristics were measured inside the $N_2$-filled glove box by using a source meter (2400, Keithley Instruments, Cleveland, Ohio) and a calibrated photodiode integrated with a LabVIEW program.

Figure 86:
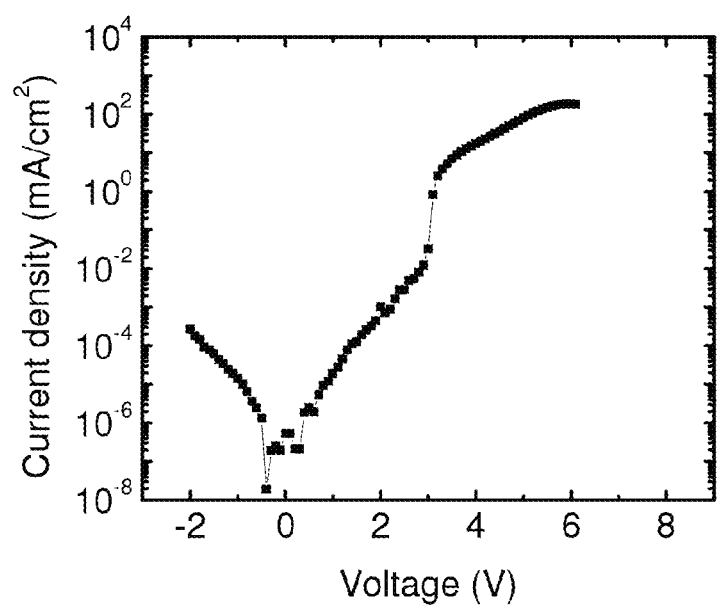
FIG. 86 shows J-V characteristics of an inverted OLED, according to an exemplary embodiment of the invention.

FIG. 86 shows J-V characteristics of an inverted OLED, according to an exemplary embodiment of the invention.

Figure 87:
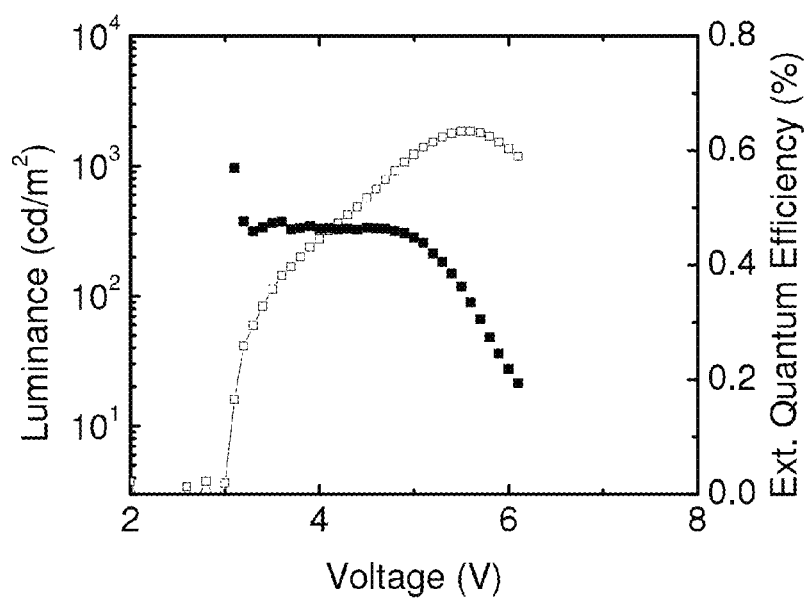
FIG. 87 shows L-EQE-V characteristics of an inverted OLED, according to an exemplary embodiment of the invention.

FIG. 87 shows L-EQE-V characteristics of an inverted OLED, according to an exemplary embodiment of the invention.

Example a32

Figure 88:
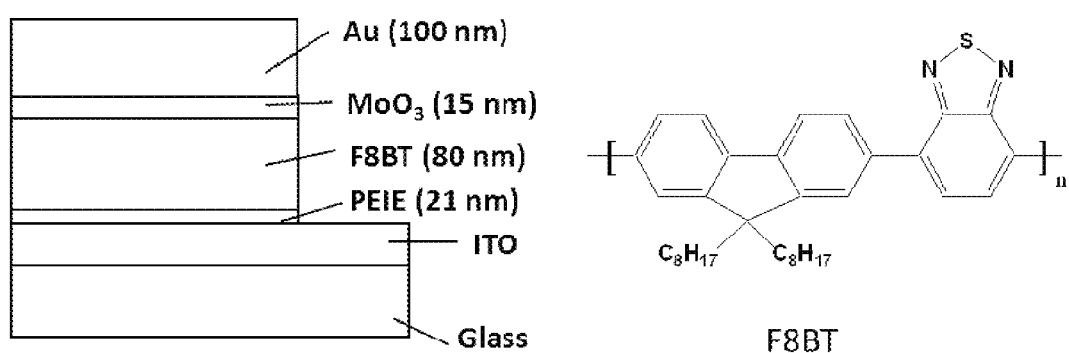
FIG. 88 shows a structure of an inverted OLED and chemical structure of F8BT, according to an exemplary embodiment of the invention.

Inverted Organic Light-Emitting Diodes with a ITO/PEIE (21 nm) Electron-Injection Electrode FIG. 88 shows a structure of an inverted OLED and chemical structure of F8BT, according to an exemplary embodiment of the invention.

ITO-coated glass (Colorado Concept Coatings LLC) with a sheet resistivity of ~15 $\Omega$/sq. was used as substrate. The ITO substrates were patterned with kapton tape and etched by acid vapor (1:3 by volume, $HNO_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Each ultrasonic bath lasted 20 min. Nitrogen was used to dry the substrates after each of the last three baths.

Polyethylenimine, 80% ethoxylated (PEIE) ($M_w$=70,000 g/mol), was dissolved in $H_2O$ with a concentration of 35-40 wt. % when received from Aldrich and then further diluted into methoxyethanol to a concentration of 1 wt. %. Then, the solution was spin coated onto cleaned ITO substrates at a speed of 5000 rpm for 1 min and an acceleration of 1000 rpm/s and annealed at 120° C. for 10 min on hot plate in ambient air. The thickness of PETE was 21 nm, determined by spectroscopic ellipsometry (J. A. Woollam Co.).

Poly[9,9-dioctylfluorenyl-2,7-diyl)-co-1,4-benzo-2{2,1-3}-thiadiazole)] (F8BT, ADS133YE, American Dye Source, Inc., FIG. 88) was spin-coated on samples as the emissive layer from a 15 mg/ml chlorobenzene solution at a speed of 1000 rpm and at an acceleration of 10000 rpm/s. Its thickness was 80 nm measured by spectroscopic ellipsometry.

Samples were then loaded into a vacuum thermal evaporation system (EvoVac, Angstrom Engineering Inc.), a 15 nm of $MoO_3$ followed by a 100 nm of Ag was deposited through a shadow mask at a base pressure of $2 \times 10^{-7}$ Torr. The effective area of the active layer was 10 $mm^2$. The completed devices were transferred, in a sealed container, to another nitrogen-filled glove box for electrical measurements.

Current density-voltage (J-V) and luminance-voltage (L-V) characteristics were measured inside the $N_2$-filled glove box by using a source meter (2400, Keithley Instruments, Cleveland, Ohio) and a calibrated photodiode integrated with a LabVIEW program.

Figure 89:
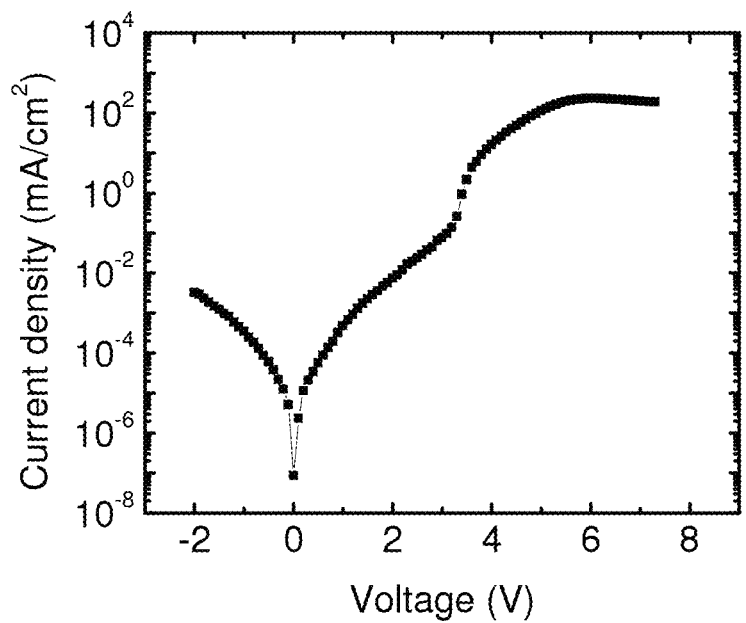
FIG. 89 shows J-V characteristics of an inverted OLED, according to an exemplary embodiment of the invention.

FIG. 89 shows J-V characteristics of an inverted OLED, according to an exemplary embodiment of the invention.

Figure 90:
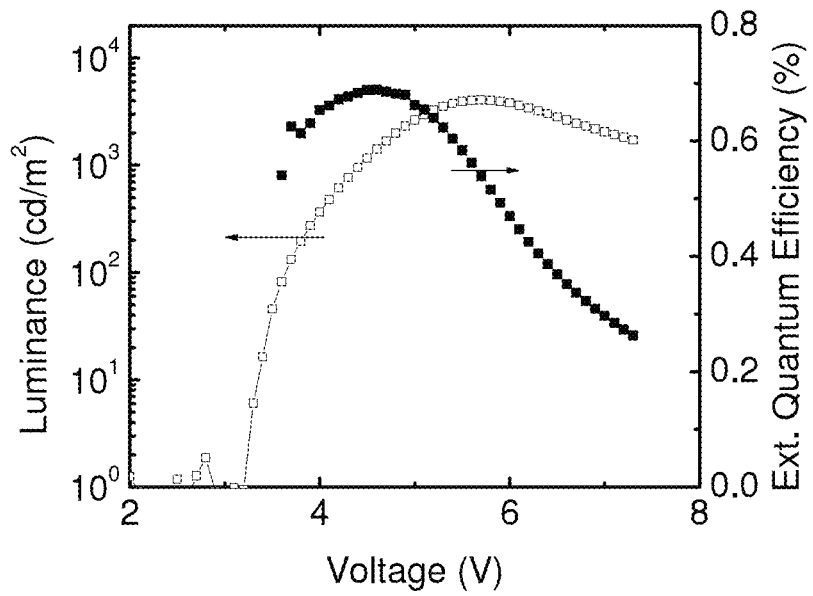
FIG. 90 shows L-EQE-V characteristics of an inverted OLED, according to an exemplary embodiment of the invention.

FIG. 90 shows L-EQE-V characteristics of an inverted OLED, according to an exemplary embodiment of the invention.

Examples a33-a36

Use of PEIE Modified Electrodes in OFETs

Example a33

Figure 91:
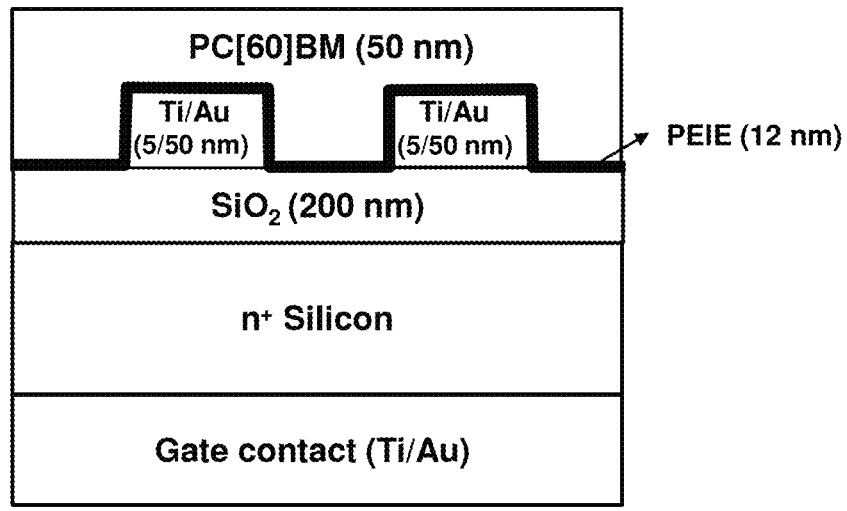
FIG. 91 shows a structure of an OFET device, according to an exemplary embodiment of the invention.

N-Channel $PC_{60}BM$ Thin-Film Transistors Au/PEIE (12 nm) as the Source and Drain Electrodes FIG. 91 shows a structure of an OFET device, according to an exemplary embodiment of the invention.

Bottom-contact bottom-gate OFETs were fabricated on heavily doped n-type silicon substrate (resistivity <0.005 $\Omega$cm, with a wafer thickness of 525 μm from Silicon Quest Int., which also serves as gate electrode) with a 200 nm thick thermally grown $SiO_2$ which served as the gate dielectric. Using an e-beam deposition system (AXXIS, Kurt J. Lesker), a Ti/Au (10 nm/100 nm) metallization on the backside of the substrate was done to enhance the gate electrical contact. Then, Ti/Au (5/50 nm) bottom source and drain electrodes were deposited by e-beam deposition (AXXIS, Kurt J. Lesker) and patterned by photolithography and lift-off.

Polyethylenimine, 80% ethoxylated (PEIE) ($M_w$=70,000 g/mol) was dissolved in $H_2O$ with a concentration of 35-40 wt. % when received from Aldrich and then further diluted into methoxyethanol to a concentration of 0.5 wt. %. Then, the solution was spin coated onto substrates at a speed of 5000 rpm for 1 min and an acceleration of 1000 rpm/s and annealed at 120° C. for 10 min on hot plate in ambient air. The thickness of PETE was 12 nm, determined by spectroscopic ellipsometry (J. A. Woollam Co.).

Then samples were loaded in a $N_2$-filled glove box. A layer of [6,6]-phenyl $C_{61}$ butyric acid methyl ester ($PC_{60}BM$, Nano-C) was deposited onto the substrates by spin coating from a 10 mg/ml chlorobenzene solution at a speed of 1000 rpm and at an acceleration of 10000 rpm/s; and then, annealed at 90° C. for 5 min. Its thickness was measured to be 50 nm using a profilometer (Dektak 6M Stylus, Veeco, Plainview, N.Y.). Device structure is shown in FIG. 91.

Current-voltage (I-V) characteristics of the transistors were measured in a $N_2$-filled glove box ($O_2$, $H_2O$<0.1 ppm) in the dark using an Agilent E5272A source/monitor unit and an Agilent 4284A LCR meter.

Figure 92:
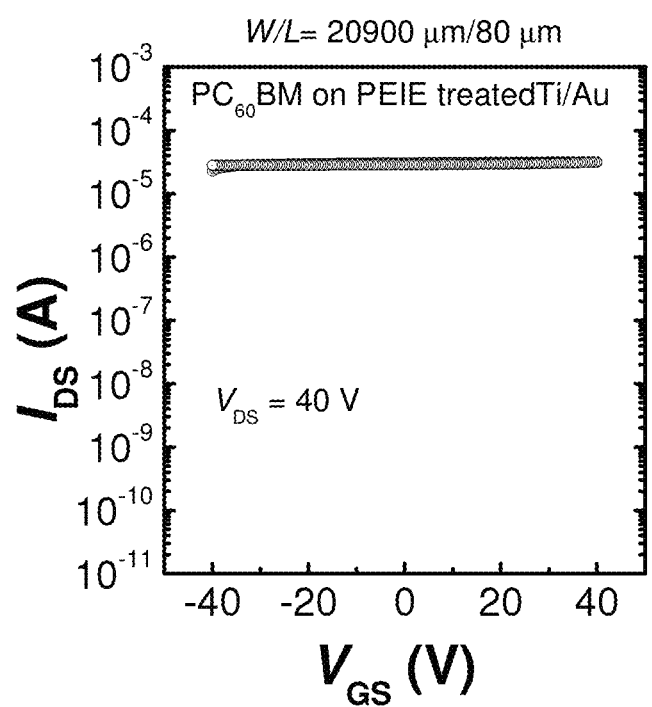
FIG. 92 shows transfer characteristics of an OFET device, according to an exemplary embodiment of the invention.

FIG. 92 shows transfer characteristics of an OFET device, according to an exemplary embodiment of the invention.

Figure 93:
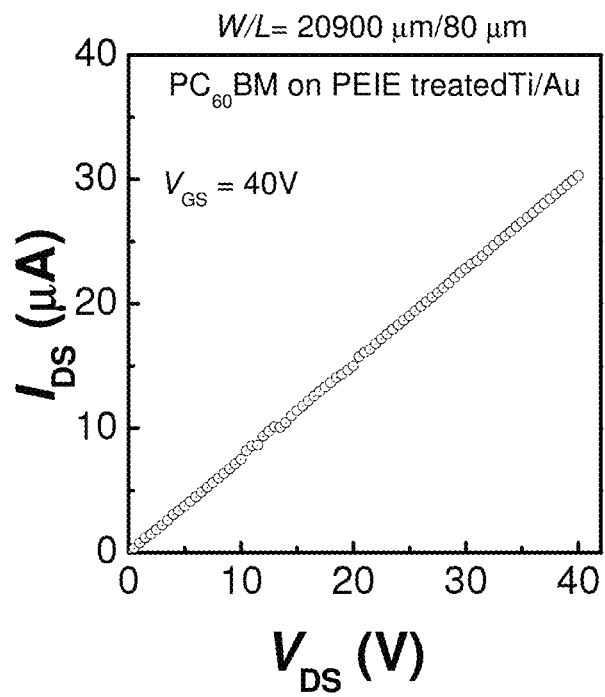
FIG. 93 shows output characteristics of an OFET device, according to an exemplary embodiment of the invention.

FIG. 93 shows output characteristics of an OFET device, according to an exemplary embodiment of the invention.

Example a34

Figure 94:
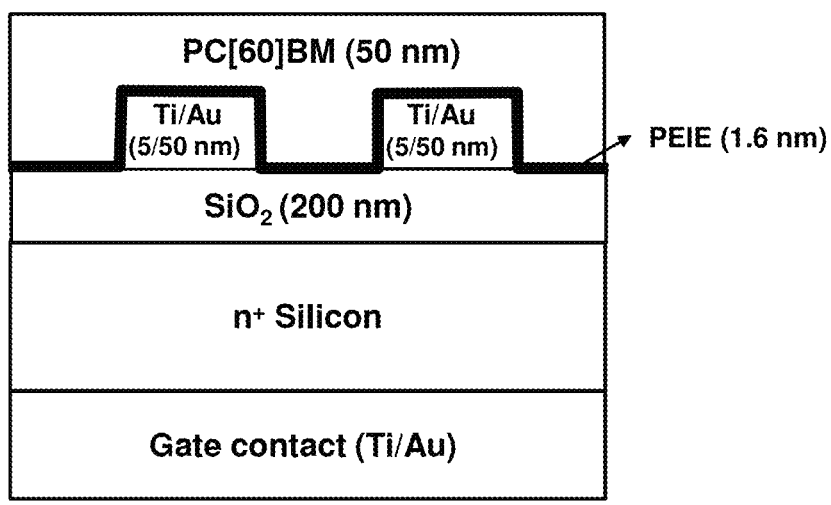
FIG. 94 shows a structure of an OFET device, according to an exemplary embodiment of the invention.

N-Channel $PC_{60}BM$ Thin-Film Transistors Au/PEIE (1.6 nm) as the Source and Drain Electrodes FIG. 94 shows a structure of an OFET device, according to an exemplary embodiment of the invention.

Bottom-contact bottom-gate OFETs were fabricated on heavily doped n-type silicon substrate (resistivity <0.005 $\Omega$cm, with a wafer thickness of 525 μm from Silicon Quest Int., which also serves as gate electrode) with a 200 nm thick thermally grown $SiO_2$ which served as the gate dielectric. Using an e-beam deposition system (AXXIS, Kurt J. Lesker), a Ti/Au (10 nm/100 nm) metallization on the backside of the substrate was done to enhance the gate electrical contact. Then, Ti/Au (5/50 nm) bottom source and drain electrodes were deposited by e-beam deposition (AXXIS, Kurt J. Lesker) and patterned by photolithography and lift-off.

Polyethylenimine, 80% ethoxylated (PEIE) ($M_w$=70,000 g/mol) was dissolved in $H_2O$ with a concentration of 35-40 wt. % when received from Aldrich and then further diluted into methoxyethanol to a concentration of 0.05 wt. %. Then, the solution was spin coated onto substrates at a speed of 5000 rpm for 1 min and an acceleration of 1000 rpm/s and annealed at 120° C. for 10 min on hot plate in ambient air. The thickness of PETE was 1.6 nm, determined by spectroscopic ellipsometry (J. A. Woollam Co.).

Then samples were loaded in a $N_2$-filled glove box. A layer of [6,6]-phenyl $C_{61}$ butyric acid methyl ester ($PC_{60}BM$, Nano-C) was deposited onto the substrates by spin coating from a 10 mg/ml chlorobenzene solution at a speed of 1000 rpm and at an acceleration of 10000 rpm/s; and then, annealed at 90° C. for 5 min. Its thickness was measured to be 50 nm using a profilometer (Dektak 6M Stylus, Veeco, Plainview, N.Y.). Device structure is shown in FIG. 94.

Current-voltage (I-V) characteristics of the transistors were measured in a $N_2$-filled glove box ($O_2$, $H_2O$<0.1 ppm) in the dark using an Agilent E5272A source/monitor unit and an Agilent 4284A LCR meter.

Figure 95:
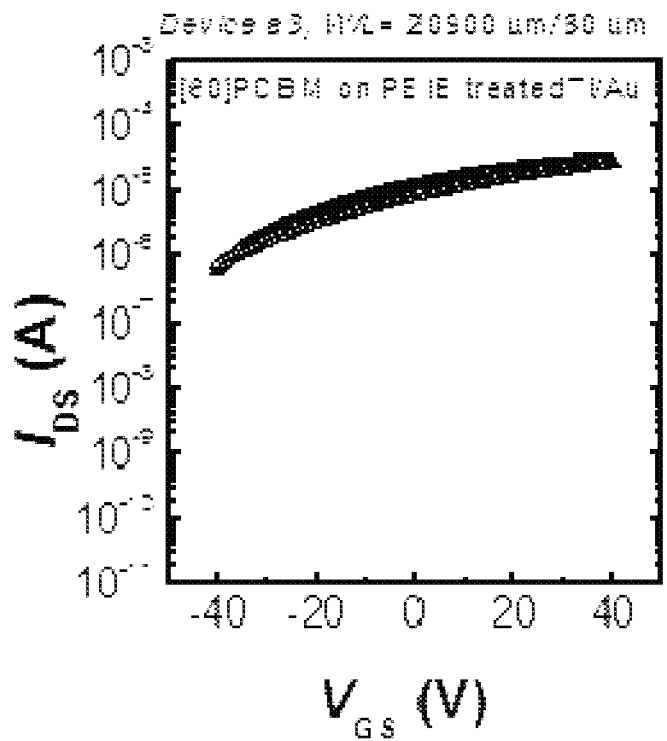
FIG. 95 shows transfer characteristics of an OFET device, according to an exemplary embodiment of the invention.

FIG. 95 shows transfer characteristics of an OFET device, according to an exemplary embodiment of the invention.

Figure 96:
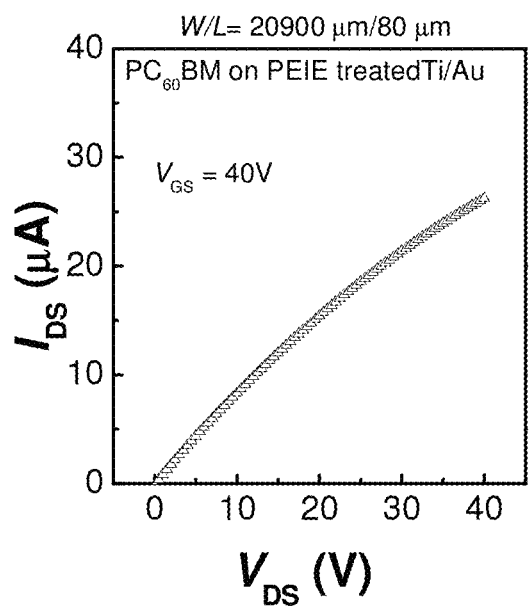
FIG. 96 shows output characteristics of an OFET device, according to an exemplary embodiment of the invention.

FIG. 96 shows output characteristics of an OFET device, according to an exemplary embodiment of the invention.

Example a35

Figure 97:
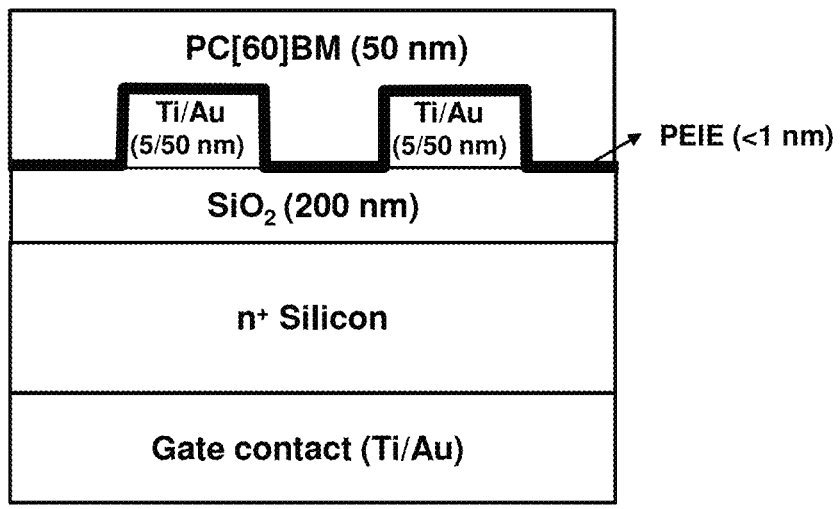
FIG. 97 shows a structure of an OFET device, according to an exemplary embodiment of the invention.

N-Channel $PC_{60}BM$ Thin-Film Transistors Au/PEIE (<1 nm) as the Source and Drain Electrodes FIG. 97 shows a structure of an OFET device, according to an exemplary embodiment of the invention.

Bottom-contact bottom-gate OFETs were fabricated on heavily doped n-type silicon substrate (resistivity <0.005 Ωcm, with a wafer thickness of 525 μm from Silicon Quest Int., which also serves as gate electrode) with a 200 nm thick thermally grown $SiO_2$ which served as the gate dielectric. Using an e-beam deposition system (AXXIS, Kurt J. Lesker), a Ti/Au (10 nm/100 nm) metallization on the backside of the substrate was done to enhance the gate electrical contact. Then, Ti/Au (5/50 nm) bottom source and drain electrodes were deposited by e-beam deposition (AXXIS, Kurt J. Lesker) and patterned by photolithography and lift-off.

Polyethylenimine, 80% ethoxylated (PEIE) ($M_w$=70,000 g/mol) was dissolved in $H_2O$ with a concentration of 35-40 wt. % when received from Aldrich and then further diluted into methoxyethanol to a concentration of 0.005 wt. %. Then, the solution was spin coated onto substrates at a speed of 5000 rpm for 1 min and an acceleration of 1000 rpm/s and annealed at 120° C. for 10 min on hot plate in ambient air. The thickness of PETE was less than 1 nm, determined by spectroscopic ellipsometry (J. A. Woollam Co.).

Then samples were loaded in a $N_2$-filled glove box. A layer of [6,6]-phenyl $C_{61}$ butyric acid methyl ester ($PC_{60}BM$, Nano-C) was deposited onto the substrates by spin coating from a 10 mg/ml chlorobenzene solution at a speed of 1000 rpm and at an acceleration of 10000 rpm/s; and then, annealed at 90° C. for 5 min. Its thickness was measured to be 50 nm using a profilometer (Dektak 6M Stylus, Veeco, Plainview, N.Y.). Device structure is shown in FIG. 97.

Current-voltage (I-V) characteristics of the transistors were measured in a $N_2$-filled glove box ($O_2$, $H_2O$<0.1 ppm) in the dark using an Agilent E5272A source/monitor unit and an Agilent 4284A LCR meter.

Figure 98:
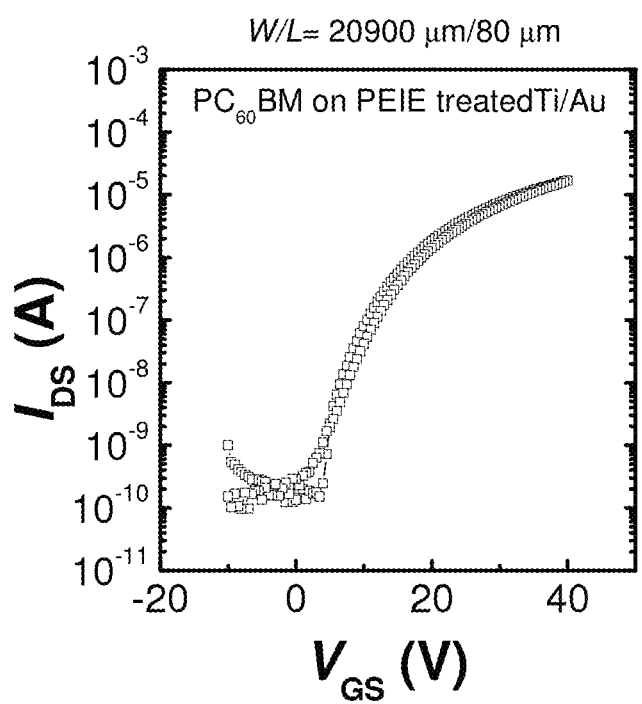
FIG. 98 shows transfer characteristics of an OFET device, according to an exemplary embodiment of the invention.

FIG. 98 shows transfer characteristics of an OFET device, according to an exemplary embodiment of the invention.

Figure 99:
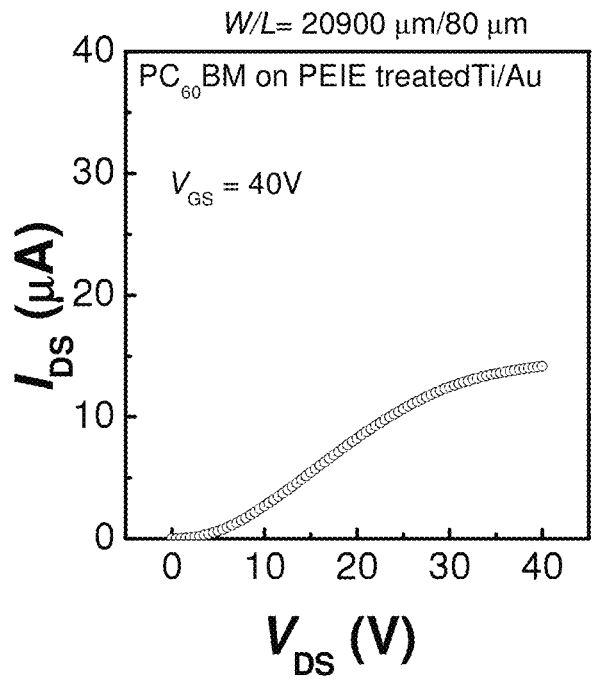
FIG. 99 shows output characteristics of an OFET device, according to an exemplary embodiment of the invention.

FIG. 99 shows output characteristics of an OFET device, according to an exemplary embodiment of the invention.

Example a36

N-Channel $PC_{60}BM$ Thin-Film Transistors Au as the Source and Drain Electrodes (without PEIE Modification)

Figure 100:
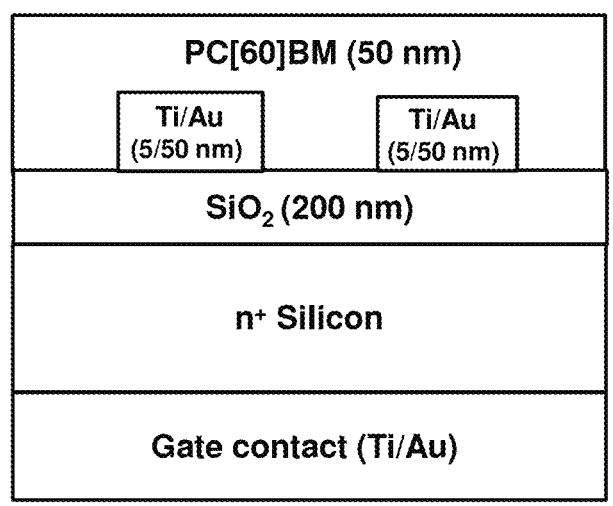
FIG. 100 shows a structure of an OFET device, according to an exemplary embodiment of the invention.

FIG. 100 shows a structure of an OFET device, according to an exemplary embodiment of the invention.

Bottom-contact bottom-gate OFETs were fabricated on heavily doped n-type silicon substrate (resistivity <0.005 Ωcm, with a wafer thickness of 525 μm from Silicon Quest Int., which also serves as gate electrode) with a 200 nm thick thermally grown $SiO_2$ which served as the gate dielectric. Using an e-beam deposition system (AXXIS, Kurt J. Lesker), a Ti/Au (10 nm/100 nm) metallization on the backside of the substrate was done to enhance the gate electrical contact. Then, Ti/Au (5/50 nm) bottom source and drain electrodes were deposited by e-beam deposition (AXXIS, Kurt J. Lesker) and patterned by photolithography and lift-off.

Then samples were loaded in a $N_2$-filled glove box. A layer of [6,6]-phenyl $C_{61}$ butyric acid methyl ester ($PC_{60}BM$, Nano-C) was deposited onto the substrates by spin coating from a 10 mg/ml chlorobenzene solution at a speed of 1000 rpm and at an acceleration of 10000 rpm/s; and then, annealed at 90° C. for 5 min. Its thickness was measured to be 50 nm using a profilometer (Dektak 6M Stylus, Veeco, Plainview, N.Y.). Device structure is shown in FIG. 100.

Current-voltage (I-V) characteristics of the transistors were measured in a $N_2$-filled glove box ($O_2$, $H_2O$<0.1 ppm) in the dark using an Agilent E5272A source/monitor unit and an Agilent 4284A LCR meter.

Figure 101:
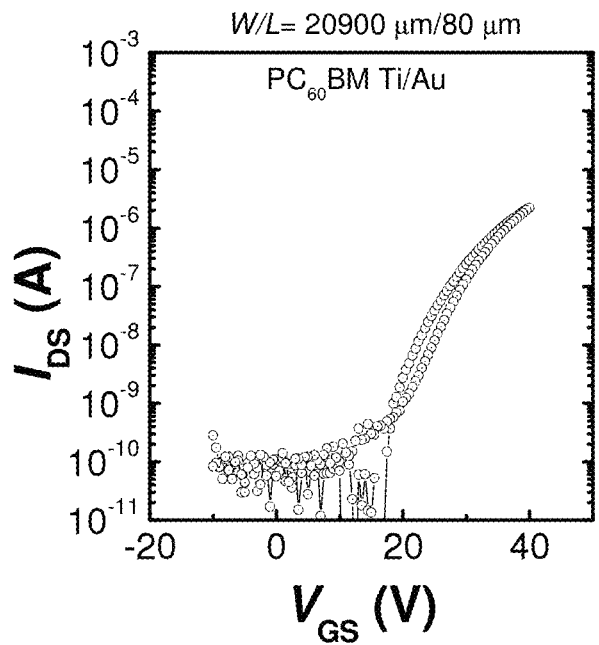
FIG. 101 shows transfer characteristics of an OFET device, according to an exemplary embodiment of the invention.

FIG. 101 shows transfer characteristics of an OFET device, according to an exemplary embodiment of the invention.

Figure 102:
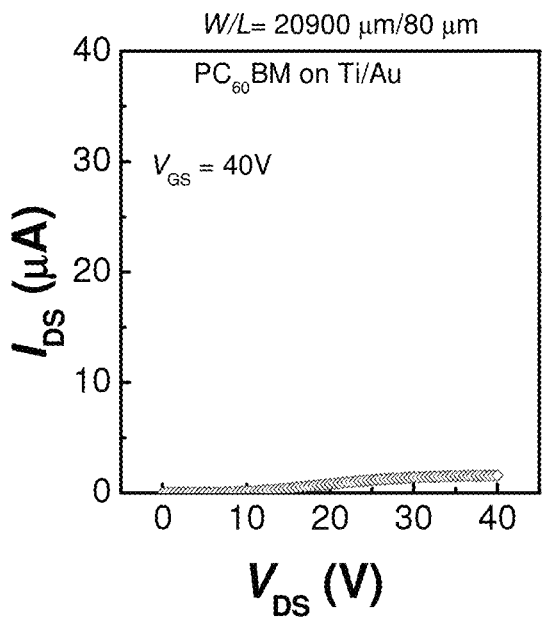
FIG. 102 shows output characteristics of an OFET device, according to an exemplary embodiment of the invention.

FIG. 102 shows output characteristics of an OFET device, according to an exemplary embodiment of the invention.

Example a37

Electron-Only Devices with ITO/PEIE/CuPc/Mg/Ag

Figure 103:
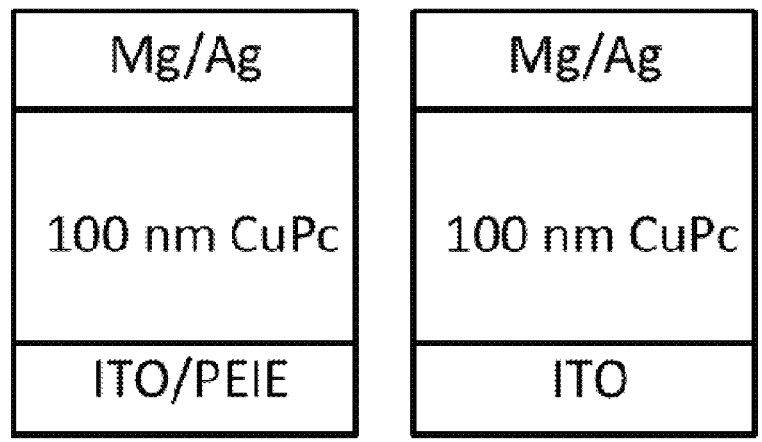
FIG. 103 shows a scheme of electron-only devices, according to an exemplary embodiment of the invention.

FIG. 103 shows a scheme of electron-only devices, according to an exemplary embodiment of the invention.

ITO-coated glass (Colorado Concept Coatings LLC) with a sheet resistivity of ~15 Ω/sq. was used as substrate. The ITO substrates were cleaned in an ultrasonic bath of detergent water, rinsed with deionized water, and then cleaned in sequential ultrasonic baths of deionized water, acetone, and methanol. Each ultrasonic bath lasted 20 min. Nitrogen was used to dry the substrates after each of the last three baths.

Polyethylenimine, 80% ethoxylated (PEIE) ($M_w$=70,000 g/mol), was dissolved in $H_2O$ with a concentration of 35-40 wt. % when received from Aldrich and then further diluted into methoxyethanol to a concentration of 0.5 wt. %. Then, the solution was spin coated onto cleaned ITO substrates at a speed of 5000 rpm for 1 min and an acceleration of 1000 rpm/s and annealed at 120° C. for 10 min on hot plate in nitrogen.

Samples were then loaded into a vacuum thermal evaporation system and a 100 nm thick Copper phthalocyanine (CuPc, 546682, Sigma-Aldrich) followed by a 100 nm of Mg/Ag was deposited through a shadow mask at a base pressure of $5 \times 10^{-7}$ Torr was deposited. The effective area of the active layer was 0.11 mm². The completed devices were transferred, to a nitrogen-filled glove box for electrical measurements. Current density-voltage (J-V) characteristics were measured inside the $N_2$-filled glove box by using a HP semiconductor parameter analyzer 4155A.

Figure 104:
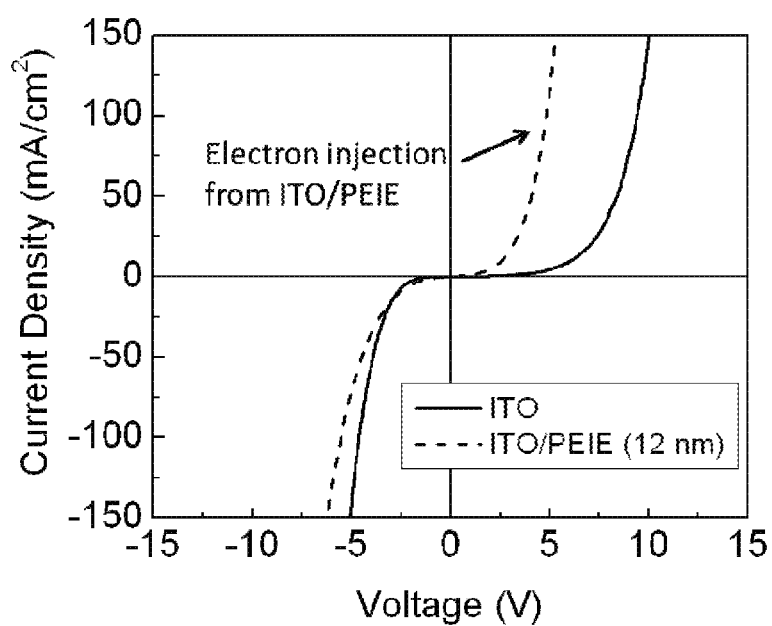
FIG. 104 shows a current density-voltage characteristics of electron-only device with ITO and ITO/PEIE electrode, according to an exemplary embodiment of the invention.

FIG. 104 shows current density-voltage characteristics of electron only device with ITO and ITO/PEIE electrode, according to an exemplary embodiment of the invention. The electron-only devices (as illustrated in FIG. 103) clearly show the improved electron injection from ITO/PEIE compared to the control device without PEIE layer.

Examples b1-b11

Use of PEI Modified Electrodes in OPVs

Example b1

Figure 105:
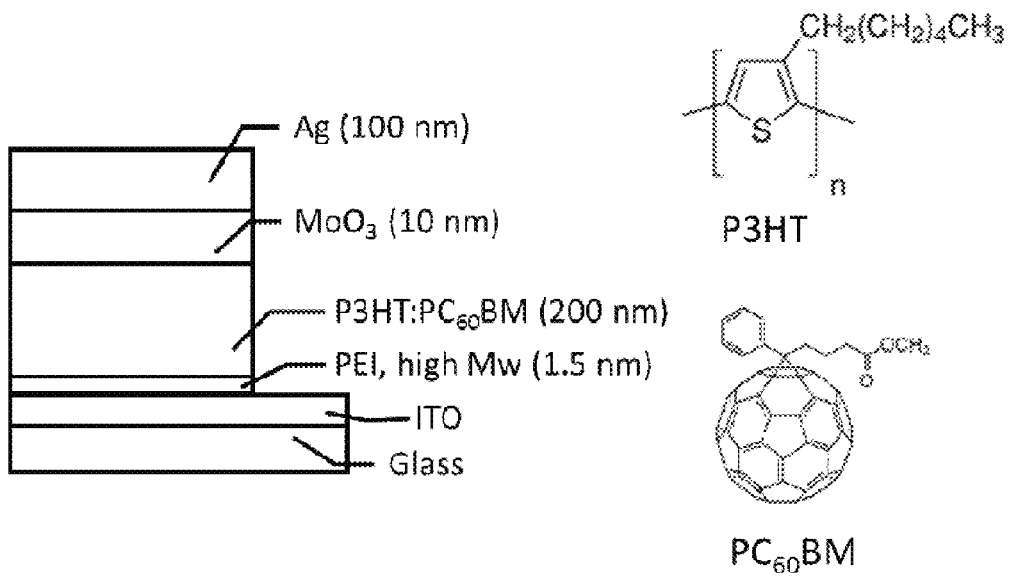
FIG. 105 shows a device structure of an inverted solar cell and chemical structure of P3HT and $PC_{60}BM$, according to an exemplary embodiment of the invention.

Inverted Solar Cells with ITO/PEI (1.5 nm; 750,000 g/mol) Bottom Electrode, 200 nm P3HT:PC$_{60}$BM, MoO$_3$/Ag Top Electrode FIG. 105 shows a device structure of an inverted solar cell and chemical structure of P3HT and PC$_{60}$BM, according to an exemplary embodiment of the invention.

ITO-coated glass (Colorado Concept Coatings LLC) with a sheet resistivity of 15 Ω/sq. was used as the substrate for the solar cells. The ITO substrates were patterned with kapton tape and etched by acid vapor (1:3 by volume, HNO$_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths.

Polyethylenimine (PEI, branched) solution ($M_w$=750,000 g/mol), which was dissolved in H$_2$O with a concentration of 50 wt. % when received from Aldrich, was diluted into methoxyethanol to the weight concentration of 0.05%. Then the solution was spin coated onto cleaned ITO substrates at a speed of 5000 rpm for 1 min and an acceleration of 1000 rpm/s and annealed at 100° C. for 10 min on hot plate in ambient air. The thickness of PEI was 1.5 nm determined by spectroscopic ellipsometry (J. A. Woollam Co.).

Then the substrates were transferred into a N$_2$-filled glove box. The active layer of poly(3-hexylthiophene) (P3HT, 4002-E, BJ19-79, Rieke Metals, FIG. 105): [6,6]-phenyl C$_{61}$ butyric acid methyl ester (PC$_{60}$BM, Nano-C, FIG. 105) (1:0.7, weight ratio) was filtered through 0.2-μm-pore PTFE filters and spin-coated on each substrate from 34 mg/ml chlorobenzene solution at a speed of 700 rpm and an acceleration of 10000 rpm/s and annealed at 160° C. for 10 min on hot plate in the glove box. The thickness of the active layer is 200 nm, measured using a profilometer (Dektak 6M Stylus, Veeco, Plainview, N.Y.).

Samples were then loaded into a vacuum thermal evaporation system (EvoVac, Angstrom Engineering Inc.), and a 10 nm MoO$_3$ and a 100 nm of Ag was deposited through a shadow mask at a base pressure of $2 \times 10^{-7}$ Torr. The effective area of the active layer was 10 mm². The completed devices were transferred to another nitrogen-filled glove box for electrical measurements in a sealed container.

Current density-voltage (J-V) characteristics were measured inside the N$_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm² was used as the light source.

Figure 106:
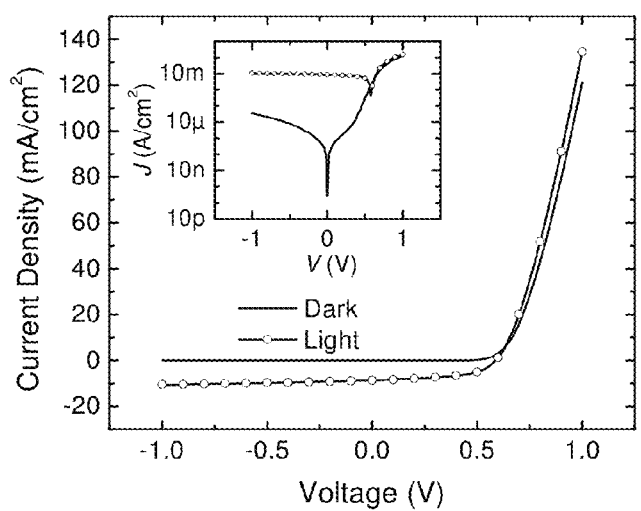
FIG. 106 shows J-V characteristics of a solar cell in the dark and under AM 1.5 100 mW/cm$^2$ illumination, according to an exemplary embodiment of the invention.

FIG. 106 shows J-V characteristics of a solar cell in the dark and under AM 1.5 100 mW/cm² illumination, according to an exemplary embodiment of the invention, and device performance is summarized in Table 41.

TABLE 41

Photovoltaic parameters of the inverted solar cells averaged over 5 devices

| Sample | $V_{OC}$ (V) | $J_{SC}$ (mA/cm²) | FF | PCE (%) |
|---|---|---|---|---|
| YHZ-II-17G | 0.585 ± 0.002 | 8.65 ± 0.08 | 0.552 ± 0.009 | 2.79 ± 0.06 |

Example b2

Figure 107:
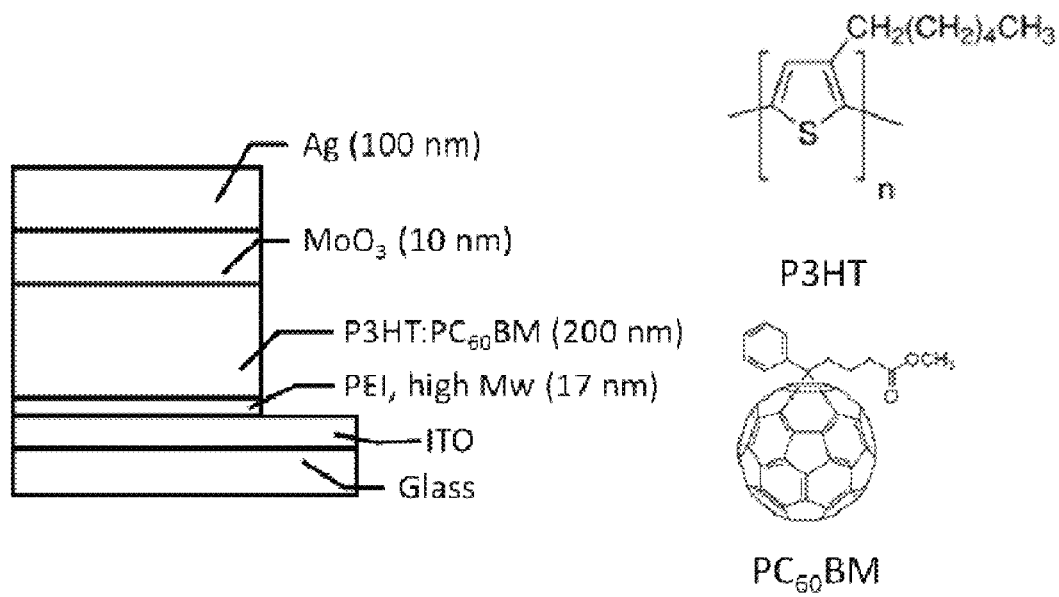
FIG. 107 shows a device structure of an inverted solar cell and chemical structure of P3HT and $PC_{60}BM$, according to an exemplary embodiment of the invention.

Inverted Solar Cells with ITO/PEI (17 nm; 750,000 g/mol) Bottom Electrode, 200 nm P3HT:PC$_{60}$BM, MoO$_3$/Ag Top Electrode FIG. 107 shows a device structure of an inverted solar cell and chemical structure of P3HT and PC$_{60}$BM, according to an exemplary embodiment of the invention.

ITO-coated glass (Colorado Concept Coatings LLC) with a sheet resistivity of 15 Ω/sq. was used as the substrate for the solar cells. The ITO substrates were patterned with kapton tape and etched by acid vapor (1:3 by volume, HNO$_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths.

Polyethylenimine (PEI, branched) solution ($M_w$=750,000 g/mol), which was dissolved in H$_2$O with a concentration of 50 wt. % when received from Aldrich, was diluted into methoxyethanol to the weight concentration of 0.5%. Then the solution was spin coated onto cleaned ITO substrates at a speed of 5000 rpm for 1 min and an acceleration of 1000 rpm/s and annealed at 100° C. for 10 min on hot plate in ambient air. The thickness of PEI was 17 nm determined by spectroscopic ellipsometry (J. A. Woollam Co.).

Then the substrates were transferred into a N$_2$-filled glove box. The active layer of poly(3-hexylthiophene) (P3HT, 4002-E, BJ19-79, Rieke Metals, FIG. 107): [6,6]-phenyl C$_{61}$ butyric acid methyl ester (PC$_{60}$BM, Nano-C, FIG. 107) (1:0.7, weight ratio) was filtered through 0.2-μm-pore PTFE filters and spin-coated on each substrate from 34 mg/ml chlorobenzene solution at a speed of 700 rpm and an acceleration of 10000 rpm/s and annealed at 160° C. for 10 min on hot plate in the glove box. The thickness of the active layer is 200 nm, measured using a profilometer (Dektak 6M Stylus, Veeco, Plainview, N.Y.).

Samples were then loaded into a vacuum thermal evaporation system (EvoVac, Angstrom Engineering Inc.), and a 10 nm MoO$_3$ and a 100 nm of Ag was deposited through a shadow mask at a base pressure of $2 \times 10^{-7}$ Torr. The effective area of the active layer was 10 mm². The completed devices were transferred to another nitrogen-filled glove box for electrical measurements in a sealed container.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm² was used as the light source.

Figure 108:
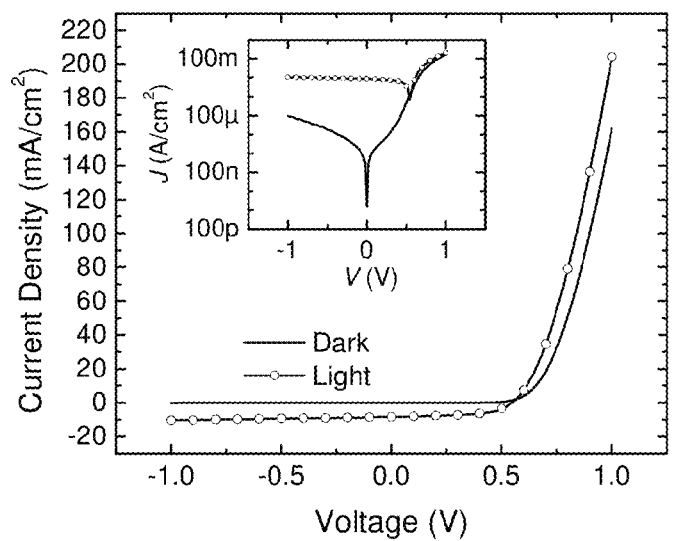
FIG. 108 shows J-V characteristics of a solar cell in dark and under AM 1.5 100 mW/cm$^2$ illumination, according to an exemplary embodiment of the invention.

FIG. 108 shows J-V characteristics of a solar cell in dark and under AM 1.5 100 mW/cm² illumination, according to an exemplary embodiment of the invention, and device performance is summarized in Table 42.

TABLE 42

Photovoltaic parameters of the inverted solar cells averaged over 5 devices

| Sample | $V_{OC}$ (V) | $J_{SC}$ (mA/cm²) | FF | PCE (%) |
|---|---|---|---|---|
| YHZ-II-17F | 0.553 ± 0.007 | 8.27 ± 0.32 | 0.562 ± 0.007 | 2.57 ± 0.10 |

Example b3

Figure 109:
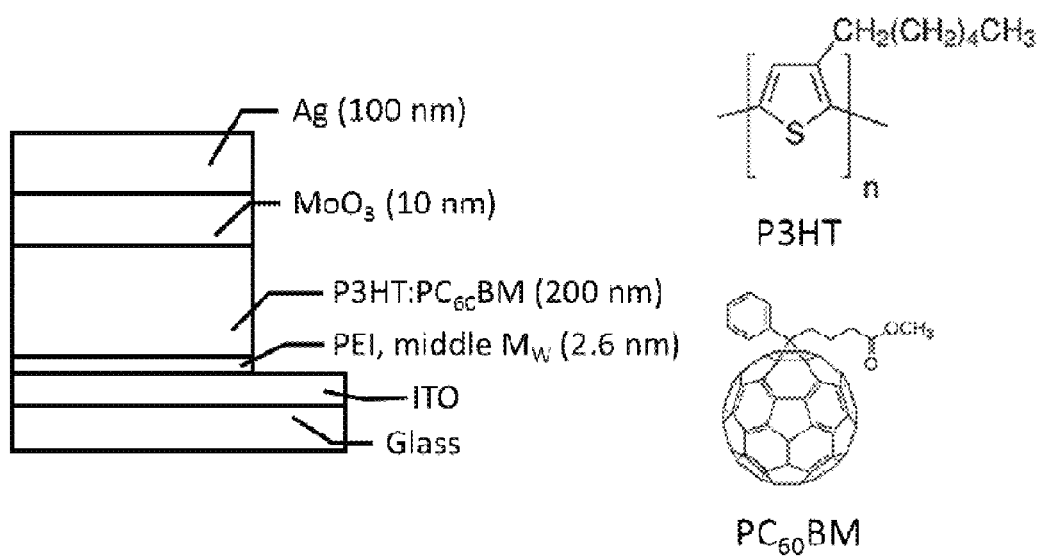
FIG. 109 shows a device structure of an inverted solar cell and chemical structure of P3HT and $PC_{60}BM$, according to an exemplary embodiment of the invention.

Inverted Solar Cells with ITO/PEI (2.6 nm; 25,000 g/mol) Bottom Electrode, 200 nm P3HT:PC$_{60}$BM, MoO$_3$/Ag Top Electrode FIG. 109 shows a device structure of an inverted solar cell and chemical structure of P3HT and PC$_{60}$BM, according to an exemplary embodiment of the invention.

ITO-coated glass (Colorado Concept Coatings LLC) with a sheet resistivity of 15 Ω/sq. was used as the substrate for the solar cells. The ITO substrates were patterned with kapton tape and etched by acid vapor (1:3 by volume, HNO$_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths.

Polyethylenimine (PEI, branched, $M_w$=25,000 g/mol, Aldrich) was diluted on methoxyethanol to a concentration of 0.1 wt. %. Then the solution was spin coated onto cleaned ITO substrates at a speed of 5000 rpm for 1 min and an acceleration of 1000 rpm/s and annealed at 100° C. for 10 min on hot plate in ambient air. The thickness of PEI was 2.6 nm, determined by spectroscopic ellipsometry (J. A. Woollam Co.).

Then the substrates were transferred into a $N_2$-filled glove box. The active layer of poly(3-hexylthiophene) (P3HT, 4002-E, BJ19-79, Rieke Metals, FIG. 109): [6,6]-phenyl $C_{61}$ butyric acid methyl ester (PC$_{60}$BM, Nano-C, FIG. 109) (1:0.7, weight ratio) was filtered through 0.2-μm-pore PTFE filters and spin-coated on each substrate from 34 mg/ml chlorobenzene solution at a speed of 700 rpm and an acceleration of 10000 rpm/s and annealed at 160° C. for 10 min on hot plate in the glove box. The thickness of the active layer is 200 nm, measured using a profilometer (Dektak 6M Stylus, Veeco, Plainview, N.Y.).

Samples were then loaded into a vacuum thermal evaporation system (EvoVac, Angstrom Engineering Inc.), and a 10 nm MoO$_3$ and a 100 nm of Ag was deposited through a shadow mask at a base pressure of 2×10$^{-7}$ Torr. The effective area of the active layer was 10 mm². The completed devices were transferred to another nitrogen-filled glove box for electrical measurements in a sealed container.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm² was used as the light source.

Figure 110:
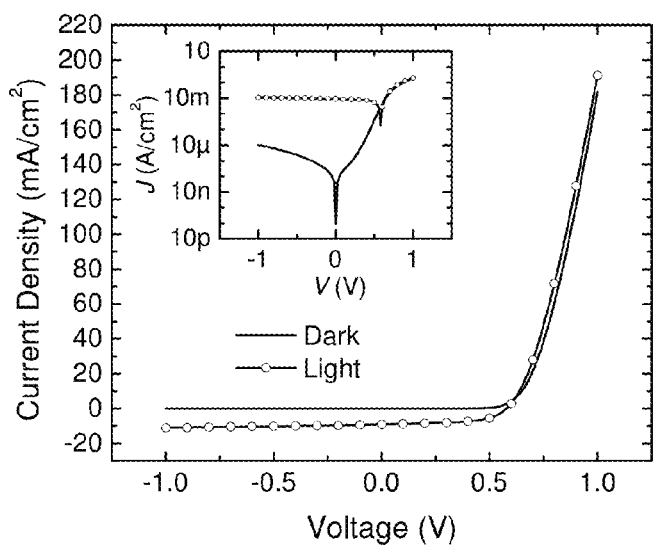
FIG. 110 shows J-V characteristics of a solar cell in dark and under AM 1.5 100 mW/cm$^2$ illumination, according to an exemplary embodiment of the invention.

FIG. 110 shows J-V characteristics of a solar cell in dark and under AM 1.5 100 mW/cm² illumination, according to an exemplary embodiment of the invention, and device performance is summarized in Table 43.

TABLE 43

Photovoltaic parameters of the inverted solar cells averaged over 5 devices

| Sample | $V_{OC}$ (V) | $J_{SC}$ (mA/cm²) | FF | PCE (%) |
|---|---|---|---|---|
| YHZ-II-17E | 0.580 ± 0.002 | 9.06 ± 0.15 | 0.572 ± 0.004 | 3.01 ± 0.06 |

Example b4

Figure 111:
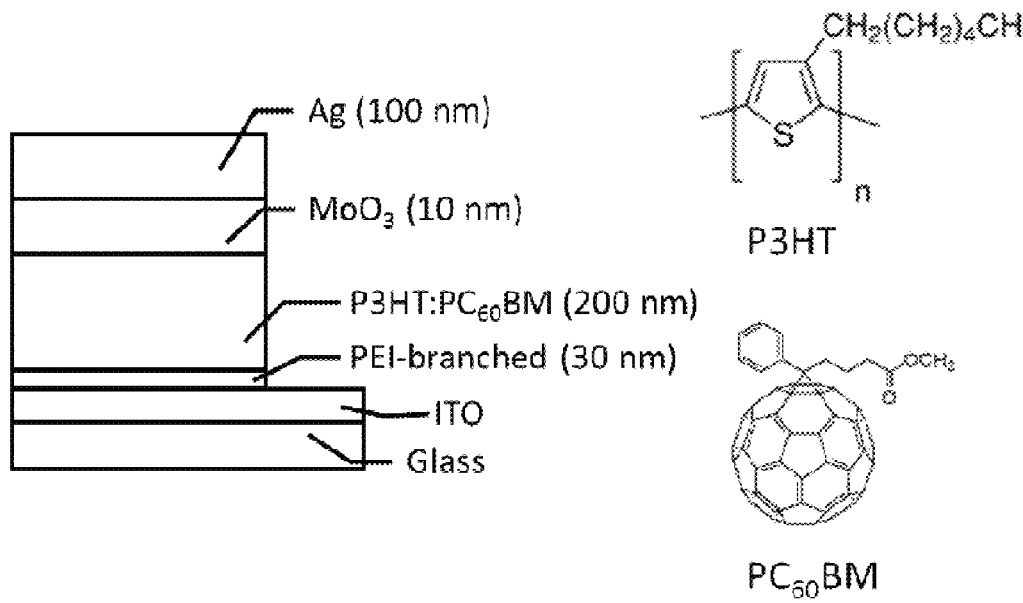
FIG. 111 shows a device structure of an inverted solar cell and chemical structure of P3HT and $PC_{60}BM$, according to an exemplary embodiment of the invention.

Inverted Solar Cells with ITO/PEI (30 nm; 25,000 g/mol) Bottom Electrode, 200 nm P3HT:PC$_{60}$BM, MoO$_3$/Ag Top Electrode FIG. 111 shows a device structure of an inverted solar cell and chemical structure of P3HT and PC$_{60}$BM, according to an exemplary embodiment of the invention.

ITO-coated glass (Colorado Concept Coatings LLC) with a sheet resistivity of 15 Ω/sq. was used as the substrate for the solar cells. The ITO substrates were patterned with kapton tape and etched by acid vapor (1:3 by volume, HNO$_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths.

Polyethylenimine (PEI, branched, $M_w$=25,000 g/mol, Aldrich) was diluted on methoxyethanol to a concentration of 1 wt. %. Then the solution was spin coated onto cleaned ITO substrates at a speed of 5000 rpm for 1 min and an acceleration of 1000 rpm/s and annealed at 100° C. for 10 min on hot plate in ambient air. The thickness of PEI was 30 nm, determined by spectroscopic ellipsometry (J. A. Woollam Co.).

Then the substrates were transferred into a $N_2$-filled glove box. The active layer of poly(3-hexylthiophene) (P3HT, 4002-E, BJ19-79, Rieke Metals, FIG. 111): [6,6]-phenyl $C_{61}$ butyric acid methyl ester (PC$_{60}$BM, Nano-C, FIG. 111) (1:0.7, weight ratio) was filtered through 0.2-μm-pore PTFE filters and spin-coated on each substrate from 34 mg/ml chlorobenzene solution at a speed of 700 rpm and an acceleration of 10000 rpm/s and annealed at 160° C. for 10 min on hot plate in the glove box. The thickness of the active layer is 200 nm, measured using a profilometer (Dektak 6M Stylus, Veeco, Plainview, N.Y.).

Samples were then loaded into a vacuum thermal evaporation system (EvoVac, Angstrom Engineering Inc.), and a 10 nm-thick layer of MoO$_3$ and a 100 nm-thick layer of Ag were deposited through a shadow mask at a base pressure of 2×10$^{-7}$ Torr. The effective area of the active layer was 10 mm². The completed devices were transferred to another nitrogen-filled glove box for electrical measurements in a sealed container.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass (AM) 1.5 filter and an intensity of 100 mW/cm² was used as the light source.

Figure 112:
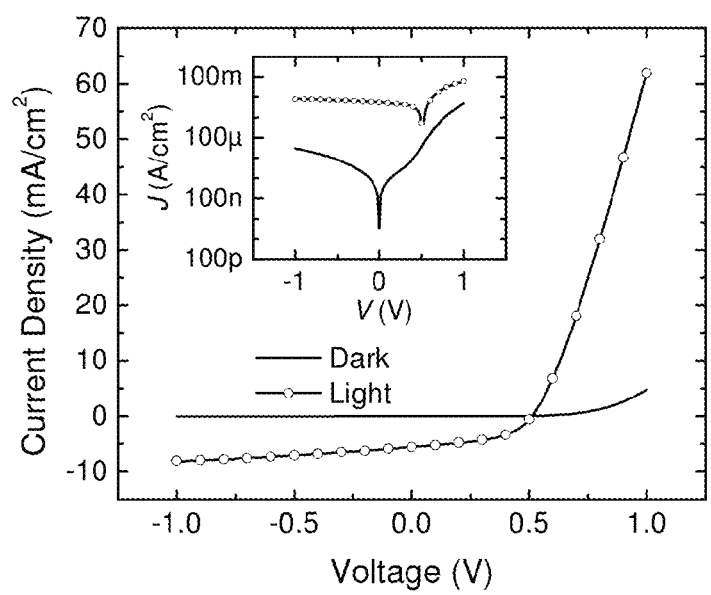
FIG. 112 shows J-V characteristics of a solar cell in the dark and under AM 1.5 100 mW/cm$^2$ illumination, according to an exemplary embodiment of the invention.

FIG. 112 shows J-V characteristics of a solar cell in the dark and under AM 1.5 100 mW/cm² illumination, according to an exemplary embodiment of the invention, and device performance is summarized in Table 44.

TABLE 44

Photovoltaic parameters of the inverted solar cells averaged over 5 devices

| Sample | $V_{OC}$ (V) | $J_{SC}$ (mA/cm²) | FF | PCE (%) |
|---|---|---|---|---|
| YHZ-II-17D | 0.513 ± 0.004 | 5.24 ± 0.52 | 0.491 ± 0.004 | 1.32 ± 0.13 |

Example b5

Figure 113:
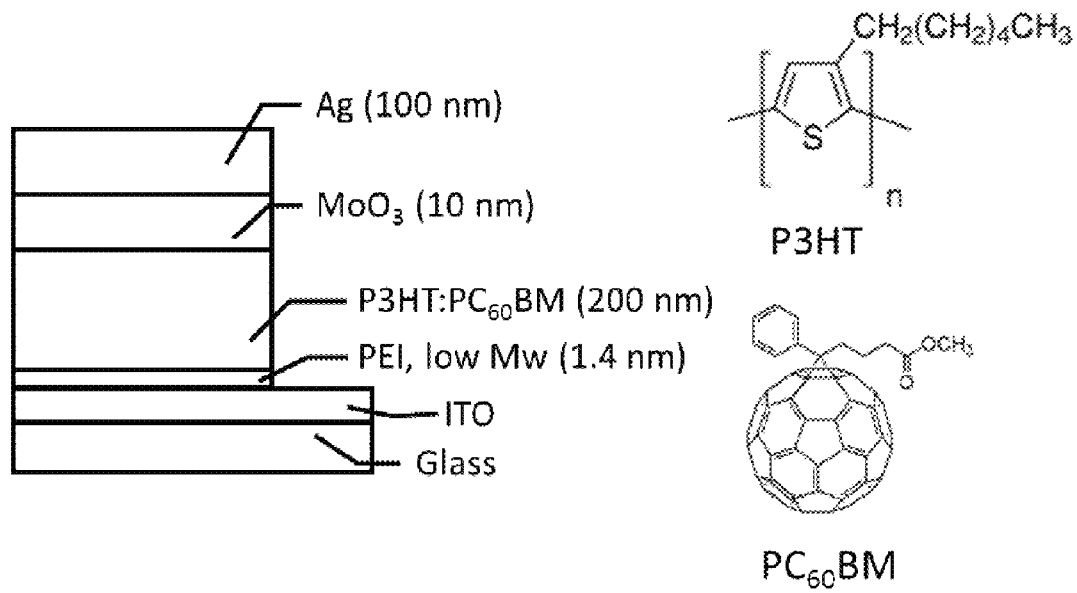
FIG. 113 shows a device structure of an inverted solar cell and chemical structure of P3HT and $PC_{60}BM$, according to an exemplary embodiment of the invention.

Inverted Solar Cells with ITO/PEI (1.4 nm; 2,000 g/mol) Bottom Electrode, 200 nm P3HT:PC$_{60}$BM, MoO$_3$/Ag Top Electrode FIG. 113 shows a device structure of an inverted solar cell and chemical structure of P3HT and PC$_{60}$BM, according to an exemplary embodiment of the invention.

ITO-coated glass (Colorado Concept Coatings LLC) with a sheet resistivity of 15 Ω/sq. was used as the substrate for the solar cells. The ITO substrates were patterned with kapton tape and etched by acid vapor (1:3 by volume, HNO$_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths.

Polyethylenimine (PEI, branched, M$_w$=2,000 g/mol, Aldrich), which was dissolved in H$_2$O with a concentration of 50 wt. % when received from Aldrich and then further diluted into methoxyethanol to a concentration of 0.05 wt. %. Then the solution was spin coated onto cleaned ITO substrates at a speed of 5000 rpm for 1 min and an acceleration of 1000 rpm/s and annealed at 100° C. for 10 min on hot plate in ambient air. The thickness of PEI was 1.4 nm determined, by spectroscopic ellipsometry (J. A. Woollam Co.).

Then the substrates were transferred into a N$_2$-filled glove box. The active layer of poly(3-hexylthiophene) (P3HT, 4002-E, BJ19-79, Rieke Metals, FIG. 113): [6,6]-phenyl C$_{61}$ butyric acid methyl ester (PC$_{60}$BM, Nano-C, FIG. 113) (1:0.7, weight ratio) was filtered through 0.2-μm-pore PTFE filters and spin-coated on each substrate from 34 mg/ml chlorobenzene solution at a speed of 700 rpm and an acceleration of 10000 rpm/s and annealed at 160° C. for 10 min on hot plate in the glove box. The thickness of the active layer is 200 nm, measured using a profilometer (Dektak 6M Stylus, Veeco, Plainview, N.Y.).

Samples were then loaded into a vacuum thermal evaporation system (EvoVac, Angstrom Engineering Inc.), and a 10 nm-thick layer of MoO$_3$ and a 100 nm-thick layer of Ag were deposited through a shadow mask at a base pressure of 2×10⁻⁷ Torr. The effective area of the active layer was 10 mm². The completed devices were transferred to another nitrogen-filled glove box for electrical measurements in a sealed container.

Current density-voltage (J-V) characteristics were measured inside the N$_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm² was used as the light source.

Figure 114:
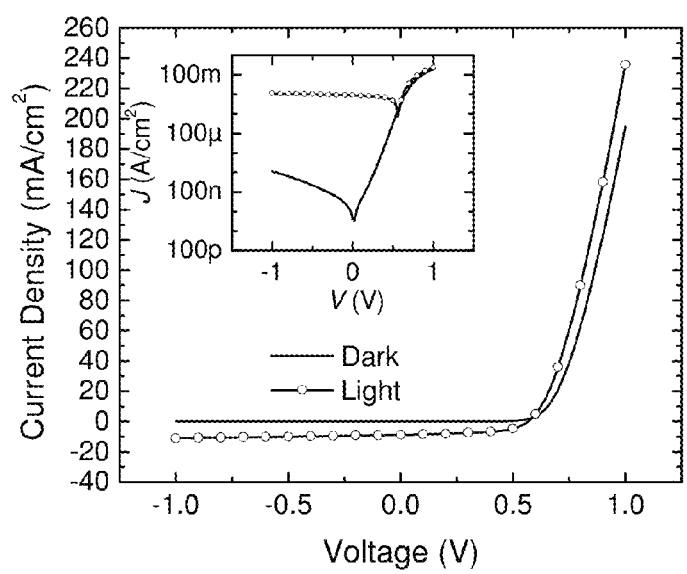
FIG. 114 shows J-V characteristics of a solar cell in dark and under AM 1.5 100 mW/cm$^2$ illumination, according to an exemplary embodiment of the invention.

FIG. 114 shows J-V characteristics of the solar cells in dark and under AM 1.5 100 mW/cm² illumination, according to an exemplary embodiment of the invention, and device performance is summarized in Table 45.

TABLE 45

Photovoltaic parameters of the inverted solar cells averaged over 3 devices

| Sample | $V_{OC}$ (V) | $J_{SC}$ (mA/cm²) | FF | PCE (%) |
|---|---|---|---|---|
| YHZ-II-17I | 0.566 ± 0.002 | 8.90 ± 0.20 | 0.542 ± 0.010 | 2.73 ± 0.01 |

Example b6

Figure 115:
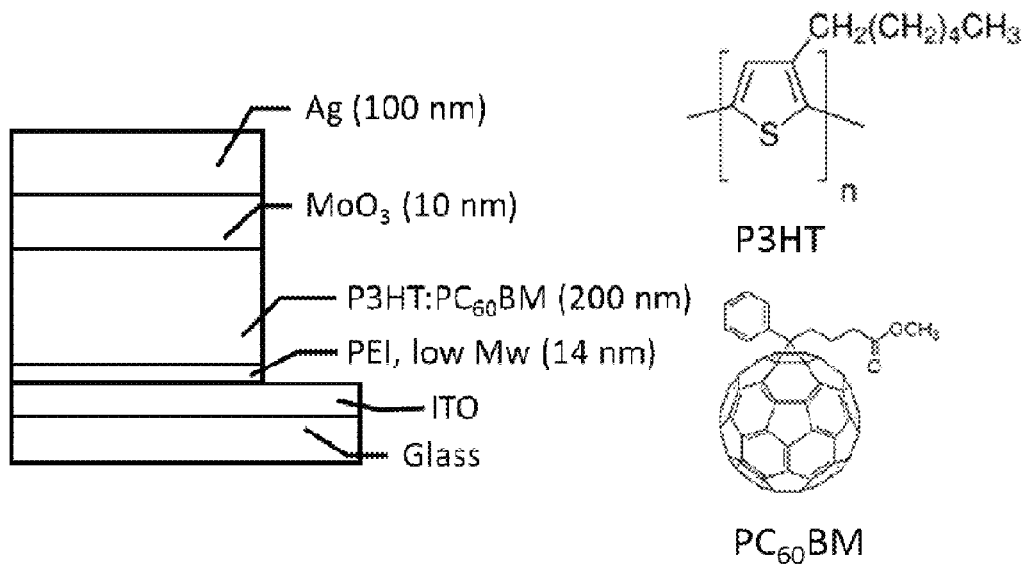
FIG. 115 shows a device structure of an inverted solar cell and chemical structure of P3HT and $PC_{60}BM$, according to an exemplary embodiment of the invention.

Inverted Solar Cells with ITO/PEI (14 nm; 2,000 g/mol) Bottom Electrode, 200 nm P3HT:PC$_{60}$BM, MoO$_3$/Ag Top Electrode FIG. 115 shows a device structure of an inverted solar cell and chemical structure of P3HT and PC$_{60}$BM, according to an exemplary embodiment of the invention.

ITO-coated glass (Colorado Concept Coatings LLC) with a sheet resistivity of 15 Ω/sq. was used as the substrate for the solar cells. The ITO substrates were patterned with kapton tape and etched by acid vapor (1:3 by volume, HNO$_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths.

Polyethylenimine (PEI, branched, M$_w$=2,000 g/mol, Aldrich), which was dissolved in H$_2$O with a concentration of 50 wt. % when received from Aldrich and then further diluted into methoxyethanol to a concentration of 0.5 wt. %. Then the solution was spin coated onto cleaned ITO substrates at a speed of 5000 rpm for 1 min and an acceleration of 1000 rpm/s and annealed at 100° C. for 10 min on hot plate in ambient air. The thickness of PEI was 14 nm determined, by spectroscopic ellipsometry (J. A. Woollam Co.).

Then the substrates were transferred into a N$_2$-filled glove box. The active layer of poly(3-hexylthiophene) (P3HT, 4002-E, BJ19-79, Rieke Metals, FIG. 115): [6,6]-phenyl C$_{61}$ butyric acid methyl ester (PC$_{60}$BM, Nano-C, FIG. 115) (1:0.7, weight ratio) was filtered through 0.2-μm-pore PTFE filters and spin-coated on each substrate from 34 mg/ml chlorobenzene solution at a speed of 700 rpm and an acceleration of 10000 rpm/s and annealed at 160° C. for 10 min on hot plate in the glove box. The thickness of the active layer is 200 nm, measured using a profilometer (Dektak 6M Stylus, Veeco, Plainview, N.Y.).

Samples were then loaded into a vacuum thermal evaporation system (EvoVac, Angstrom Engineering Inc.), and a 10 nm MoO$_3$ and a 100 nm of Ag was deposited through a shadow mask at a base pressure of 2×10⁻⁷ Torr. The effective area of the active layer was 10 mm². The completed devices were transferred to another nitrogen-filled glove box for electrical measurements in a sealed container.

Current density-voltage (J-V) characteristics were measured inside the N$_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm² was used as the light source.

Figure 116:
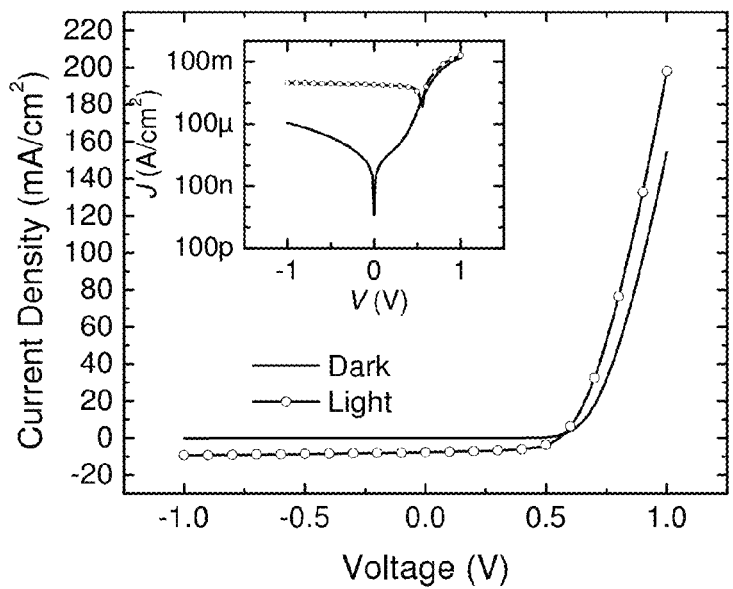
FIG. 116 shows J-V characteristics of a solar cell in the dark and under AM 1.5 100 mW/cm$^2$ illumination, according to an exemplary embodiment of the invention.

FIG. 116 shows J-V characteristics of solar cells in the dark and under AM 1.5 100 mW/cm² illumination, according to an exemplary embodiment of the invention, and device performance is summarized in Table 46.

TABLE 46

Photovoltaic parameters of the inverted solar cells averaged over 5 devices

| Sample | $V_{OC}$ (V) | $J_{SC}$ (mA/cm²) | FF | PCE (%) |
|---|---|---|---|---|
| YHZ-II-17H | 0.553 ± 0.003 | 7.95 ± 0.28 | 0.566 ± 0.008 | 2.49 ± 0.07 |

Example b7

Figure 117:
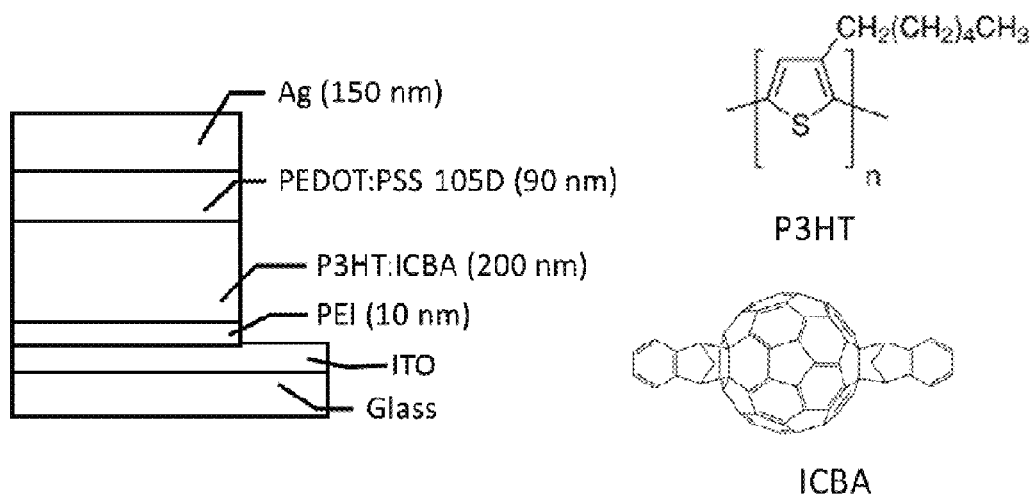
FIG. 117 shows a device structure of an inverted solar cell and chemical structure of P3HT and ICBA, according to an exemplary embodiment of the invention.

Inverted Solar Cells with ITO/PEI (10 nm; 25,000 g/mol) Bottom Electrode, 200 nm P3HT:ICBA, PEDOT:PSS105D/Ag Top Electrode FIG. 117 shows a device structure of an inverted solar cell and chemical structure of P3HT and ICBA, according to an exemplary embodiment of the invention.

ITO-coated glass (Colorado Concept Coatings LLC) with a sheet resistivity of 15 Ω/sq. was used as the substrate for the solar cells. The ITO substrates were patterned with kapton tape and etched by acid vapor (1:3 by volume, $HNO_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths.

Polyethylenimine (PEI, branched, $M_w$=25,000 g/mol, Aldrich) was diluted on methoxyethanol to a concentration of 0.4 wt. %. Then the solution was spin coated onto cleaned ITO substrates at a speed of 5000 rpm for 1 min and an acceleration of 1000 rpm/s and annealed at 100° C. for 10 min on hot plate in ambient air. The thickness of PEI was 10 nm, determined by spectroscopic ellipsometry (J. A. Woollam Co.).

Then the substrates were transferred into a $N_2$-filled glove box. The active layer of poly(3-hexylthiophene) (P3HT, 4002-E, BJ19-79, Rieke Metals, FIG. 117): Indene-C60 Bis-Adduct (ICBA, Lumtec, FIG. 117) (1:1, weight ratio) was filtered through 0.2-μm-pore PTFE filters and spin-coated on each substrate from 40 mg/ml chlorobenzene solution at a speed of 700 rpm and an acceleration of 10000 rpm/s and annealed at 160° C. for 10 min on hot plate in the glove box. The thickness of the active layer is 200 nm, measured using a profilometer (Dektak 6M Stylus, Veeco, Plainview, N.Y.).

Samples were then transferred out of the glove box and a layer of poly(3,4-ethylenedioxythiophene):poly(styrenesulfonate) (CLEVIOS™ F CPP 105 DM, HC Stack Inc., MA, 90 nm) was spin coated on top of the active layer at a speed of 5000 rpm and an acceleration of 1000 rpm/s. Samples were annealed at 110° C. for 10 min on hot plate in a $N_2$-filled glove box to dry PEDOT:PSS layer.

Samples were then loaded into a vacuum thermal evaporation system (SPECTROS, Kurt J. Lesker), and a 150 nm of Ag was deposited through a shadow mask at a base pressure of $2 \times 10^{-7}$ Torr. The effective area of the active layer was 10 mm². The completed devices were transferred, in a sealed container, to another nitrogen-filled glove box for electrical measurements.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm² was used as the light source.

Figure 118:
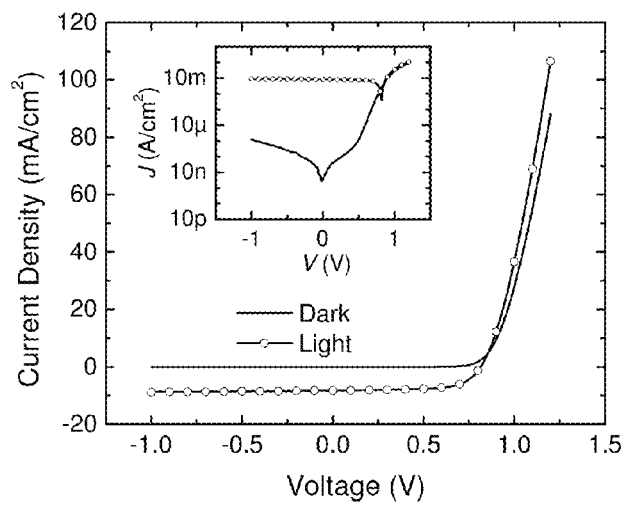
FIG. 118 shows J-V characteristics of a solar cell in dark and under AM 1.5 100 mW/cm$^2$ illumination, according to an exemplary embodiment of the invention.

FIG. 118 shows J-V characteristics of a solar cell in dark and under AM 1.5 100 mW/cm² illumination, according to an exemplary embodiment of the invention, and device performance is summarized in Table 47.

TABLE 47

Photovoltaic parameters of the inverted solar cells averaged over 5 devices

| Sample | $V_{OC}$ (V) | $J_{SC}$ (mA/cm²) | FF | PCE (%) |
|---|---|---|---|---|
| YHZ-II-26II_C | 0.815 ± 0.001 | 8.16 ± 0.16 | 0.667 ± 0.004 | 4.44 ± 0.07 |

Example b8

Figure 119:
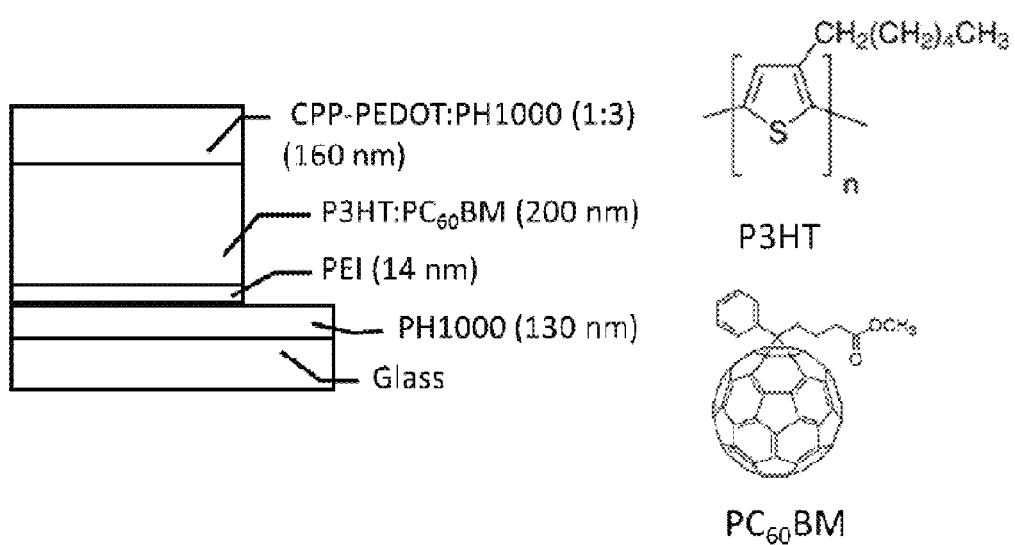

Semitransparent Inverted Solar Cells with PH1000/PEI (14 nm; 25,000 g/mol) Bottom Electrode, 200 nm P3HT:$PC_{60}BM$, CPP-PEDOT:PH1000 Top Electrode FIG. 119 shows a device structure of an inverted solar cell and chemical structure of P3HT and $PC_{60}BM$, according to an exemplary embodiment of the invention.

Microscope glass substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths. Substrates were treated by $O_2$ for 3 min to tune the surface becoming hydrophilic.

High conductivity PEDOT:PSS PH1000 (CLEVIOS™ PH 1000, HC Stack Inc., MA) with 5% DMSO was spin coated ITO glass substrates at a speed of 1000 rpm for 30 s and an acceleration of 1000 rpm/s and annealed at 140° C. for 10 min on a hot plate in air. Its thickness was 130 nm, measured using a profilometer (Dektak 6M Stylus, Veeco, Plainview, N.Y.). A 300-nm-thick layer of $SiO_x$ was deposited on parts of the ITO glass/PH1000 by e-beam deposition (AXXIS, Kurt J. Lesker) to pattern the electrode.

Polyethylenimine (PEI, branched, $M_w$=25,000 g/mol, Aldrich) was diluted on methoxyethanol to a concentration of 0.5 wt. %. Then the solution was spin coated onto cleaned ITO substrates at a speed of 5000 rpm for 1 min and an acceleration of 1000 rpm/s and annealed at 100° C. for 10 min on hot plate in ambient air. The thickness of PEI was 14 nm, determined by spectroscopic ellipsometry (J. A. Woollam Co.).

Then the substrates were transferred into a $N_2$-filled glove box. The active layer of poly(3-hexylthiophene) (P3HT, 4002-E, BJ19-79, Rieke Metals, FIG. 119): [6,6]-phenyl $C_{61}$ butyric acid methyl ester ($PC_{60}BM$, Nano-C, FIG. 119) (1:0.7, weight ratio) was filtered through 0.2-μm-pore PTFE filters and spin-coated on each substrate from 34 mg/ml chlorobenzene solution at a speed of 700 rpm and an acceleration of 10000 rpm/s and annealed at 160° C. for 10 min on hot plate in the glove box. The thickness of the active layer is 200 nm, measured using a profilometer (Dektak 6M Stylus, Veeco, Plainview, N.Y.).

A blend of two Poly(3,4-ethylenedioxythiophene):poly (styrenesulfonate) (PEDOT:PSS) formulations of PH1000:

CPP-PEDOT (CLEVIOS™ F CPP 105 DM, HC Stack Inc., MA) (3:1, by volume) was used as the top electrode, prepared by spin coating at a speed of 1000 rpm for 30 s in air. Then samples were transferred into a glove box, where top electrode was patterned by polydimethylsiloxane (PDMS) and annealed at 110° C. for 10 min. The thickness of the blend PEDOT:PSS was 160 nm. The effective area of the device was 3.3 mm².

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm² was used as the light source.

Figure 120:
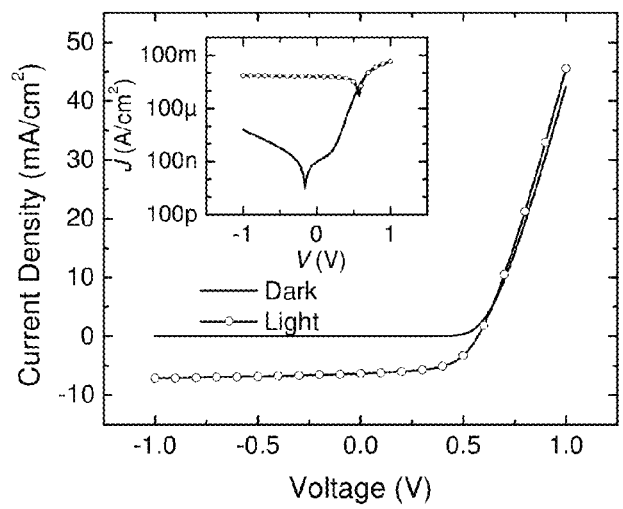

FIG. 120 shows J-V characteristics of a solar cell in dark and under AM 1.5 100 mW/cm² illumination, according to an exemplary embodiment of the invention, and device performance is summarized in Table 48.

TABLE 48

Photovoltaic parameters of the inverted solar cells averaged over 2 devices.

| Sample | $V_{OC}$ (V) | $J_{SC}$ (mA/cm²) | FF | PCE (%) |
|---|---|---|---|---|
| YHZ-II-23D | 0.570 ± 0.001 | 6.40 ± 0.10 | 0.567 ± 0.008 | 2.07 ± 0.05 |

Example b9

Figure 121:
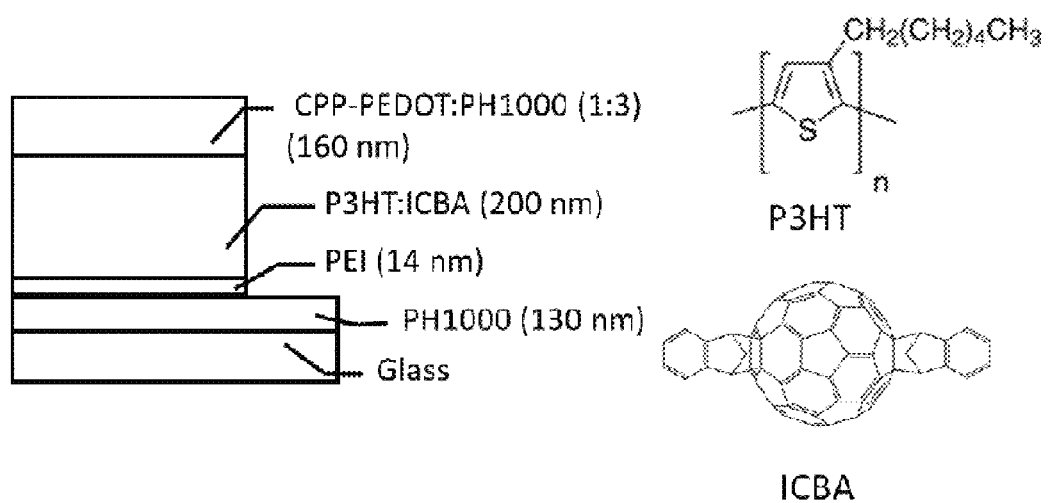

Fully Polymeric Semitransparent Inverted Solar Cells with PH1000/PEI (14 nm; 25,000 g/mol) Bottom Electrode, 200 nm P3HT:ICBA, CPP-PEDOT:PH1000 Top Electrode FIG. 121 shows a device structure of an inverted solar cell and chemical structure of P3HT and ICBA, according to an exemplary embodiment of the invention.

Microscope glass substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths. Substrates were treated by $O_2$ plasma for 3 min to make the surface hydrophilic.

High conductivity PEDOT:PSS PH1000 (CLEVIOS™ PH 1000, HC Stack Inc., MA) with 5% DMSO was spin coated onto ITO glass substrates at a speed of 1000 rpm for 30 s and at an acceleration of 1000 rpm/s; and then annealed at 140° C. for 10 min on a hot plate in air. Its thickness was 130 nm, measured using a profilometer (Dektak 6M Stylus, Veeco, Plainview, N.Y.). A 300-nm-thick layer of $SiO_x$ was deposited on the ITO glass/PH1000 by e-beam deposition (AXXIS, Kurt J. Lesker) to pattern the electrode.

Polyethylenimine (PEI branched, $M_w$=25,000 g/mol from Aldrich) was diluted into methoxyethanol to a concentration of 0.5 wt. %. Then the solution was spin coated onto glass/PH1000 at a speed of 5000 rpm for 1 min and at an acceleration of 1000 rpm/s; and then annealed at 100° C. for 10 min on a hot plate in ambient air. The thickness of PEI was 14 nm, determined by spectroscopic ellipsometry (J. A. Woollam Co.).

Then the substrates were transferred into a $N_2$-filled glove box. The active layer of poly(3-hexylthiophene) (P3HT, 4002-E, BJ19-79, Rieke Metals, FIG. 121): Indene-C60 Bis-Adduct (ICBA, Lumtec, FIG. 121) (1:1, weight ratio) was filtered through 0.2-μm-pore PTFE filters and spin-coated on each substrate from a 34 mg/ml chlorobenzene solution at a speed of 700 rpm and at an acceleration of 10000 rpm/s; and then, annealed at 160° C. for 10 min on a hot plate in the glove box. The thickness of the active layer was 200 nm, measured using a profilometer (Dektak 6M Stylus, Veeco, Plainview, N.Y.).

A blend of two Poly(3,4-ethylenedioxythiophene):poly (styrenesulfonate) (PEDOT:PSS) formulations was used as the top electrode. The solution comprised PH1000 and CPP-PEDOT (CLEVIOS™ F CPP 105 DM, HC Stack Inc., MA) at a 3:1 by volume ratio. The blended PEDOT:PSS layer was prepared by spin coating at a speed of 1000 rpm for 30 s in air. Then, the samples were transferred into a glove box, where the top electrode was patterned by polydimethylsiloxane (PDMS) and annealed at 110° C. for 10 min. The thickness of the PEDOT:PSS blend was 160 nm. The effective area of the device was 1.0 mm².

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm² was used as the light source.

Figure 122:
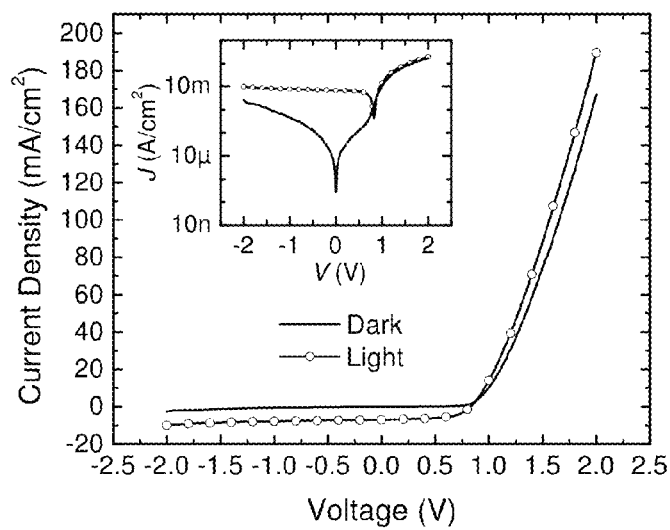

FIG. 122 shows J-V characteristics of a solar cell in the dark and under AM 1.5 100 mW/cm² illumination, according to an exemplary embodiment of the invention, and device performance is summarized in Table 49.

TABLE 49

Photovoltaic performance of a fully polymeric solar cell

| Sample | $V_{OC}$ (V) | $J_{SC}$ (mA/cm²) | FF | PCE (%) |
|---|---|---|---|---|
| YHZ-II-23E | 0.828 | 6.87 | 0.590 | 3.36 |

Example b10

Figure 123:
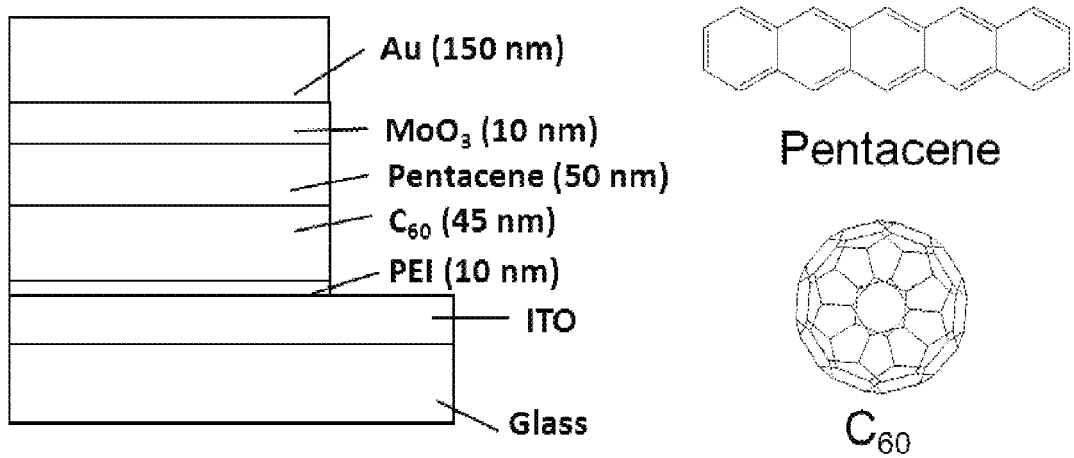

Inverted Solar Cells with ITO/PEI (10 nm; 25,000 g/mol) Bottom Electrode, $C_{60}$ (45 nm)/Pentance (50 nm), $MoO_3$/Ag Top Electrode FIG. 123 shows a device structure of an inverted solar cell and chemical structure of pentacene and $C_{60}$, according to an exemplary embodiment of the invention.

ITO-coated glass (Colorado Concept Coatings LLC) with a sheet resistivity of ~15 Ω/sq. was used as substrate. The ITO substrates were patterned with kapton tape and etched by acid vapor (1:3 by volume, $HNO_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Each ultrasonic bath lasted 20 min. Nitrogen was used to dry the substrates after each of the last three baths.

Polyethylenimine (PEI branched, $M_w$=25,000 g/mol from Aldrich) was diluted into methoxyethanol to a concentration of 0.5 wt. %. Then the solution was spin coated onto ITO glass at a speed of 5000 rpm for 1 min and at an acceleration of 1000 rpm/s; and then annealed at 100° C. for 10 min on a hot plate in ambient air. The thickness of PEI was 14 nm, determined by spectroscopic ellipsometry (J. A. Woollam Co.).

Samples were then loaded into a vacuum thermal evaporation system (SPECTROS, Kurt J. Lesker) where 45 nm of $C_{60}$, 50 nm of pentacene, 10 nm of $MoO_3$ and 150 nm of Ag were sequentially deposited at a base pressure of $2\times10^{-7}$ Torr. The effective area of the active layer was 10 $mm^2$. Device structure is shown in FIG. 123. The completed devices were transferred in a sealed container to another nitrogen-filled glove box for electrical measurements.

Current density-voltage (J-V) were measured inside the $N_2$-filled glove box by using a source meter (2400, Keithley Instruments, Cleveland, Ohio) and a calibrated photodiode integrated with a LabVIEW program.

Figure 124:
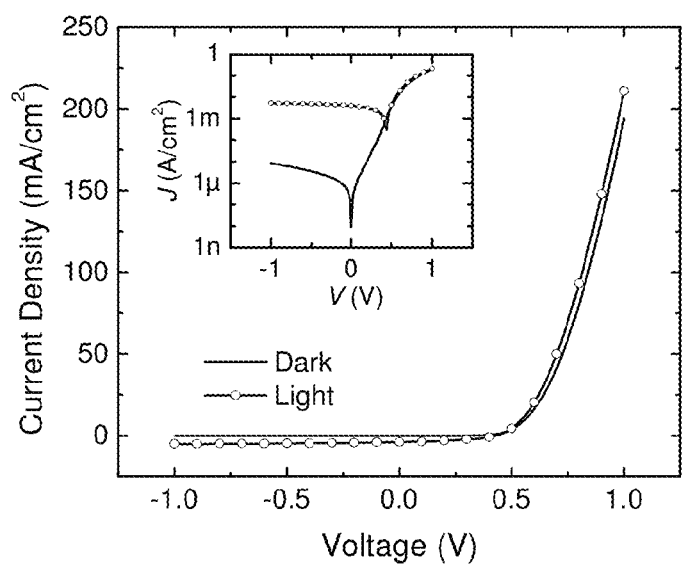

FIG. 124 shows J-V characteristics of the solar cells in dark and under AM 1.5 100 mW/$cm^2$ illumination, according to an exemplary embodiment of the invention, and device performance is summarized in Table 50.

TABLE 50

Photovoltaic parameters of solar cells, averaged over 5 devices

| Sample | $V_{OC}$ (V) | $J_{SC}$ (mA/$cm^2$) | FF | PCE (%) |
| --- | --- | --- | --- | --- |
| YHZ-II-28A | 0.429 ± 0.001 | 4.10 ± 0.16 | 0.404 ± 0.011 | 0.71 ± 0.05 |

Example b11

Figure 125:
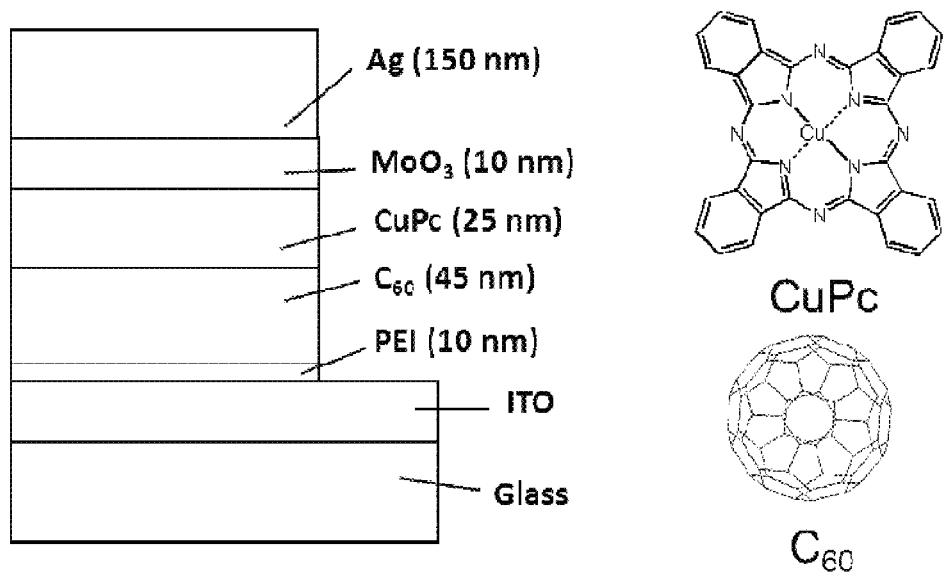

Inverted Solar Cells with ITO/PEI (10 nm; 25,000 g/mol) Bottom Electrode, $C_{60}$ (45 nm)/CuPc (25 nm), $MoO_3$/Ag Top Electrode FIG. 125 shows a device structure of an inverted solar cell and chemical structure of CuPc and $C_{60}$, according to an exemplary embodiment of the invention.

ITO-coated glass (Colorado Concept Coatings LLC) with a sheet resistivity of ~15 Ω/sq. was used as substrate. The ITO substrates were patterned with kapton tape and etched by acid vapor (1:3 by volume, $HNO_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Each ultrasonic bath lasted 20 min. Nitrogen was used to dry the substrates after each of the last three baths.

Polyethylenimine (PEI, branched, $M_w$=25,000 g/mol, Aldrich) was diluted into methoxyethanol to a concentration of 0.5 wt. %. Then the solution was spin coated onto some cleaned ITO substrates at a speed of 5000 rpm for 1 min and at an acceleration of 1000 rpm/s; and then, annealed at 100° C. for 10 min on hot plate in ambient air. The thickness of PEI was 10 nm, determined by spectroscopic ellipsometry (J. A. Woollam Co.).

Samples were then loaded into a vacuum thermal evaporation system (SPECTROS, Kurt J. Lesker), where 45 nm of $C_{60}$, 25 nm of CuPc, 10 nm of $MoO_3$ and 150 nm of Ag were sequentially deposited at a base pressure of $2\times10^{-7}$ Torr in sequence. The effective area of the active layer was 10 $mm^2$. The completed devices were transferred, in a sealed container, to another nitrogen-filled glove box for electrical measurements. Device structure is shown in FIG. 125.

Current density-voltage (J-V) were measured inside the $N_2$-filled glove box by using a source meter (2400, Keithley Instruments, Cleveland, Ohio) and a calibrated photodiode integrated with a LabVIEW program.

Figure 126:
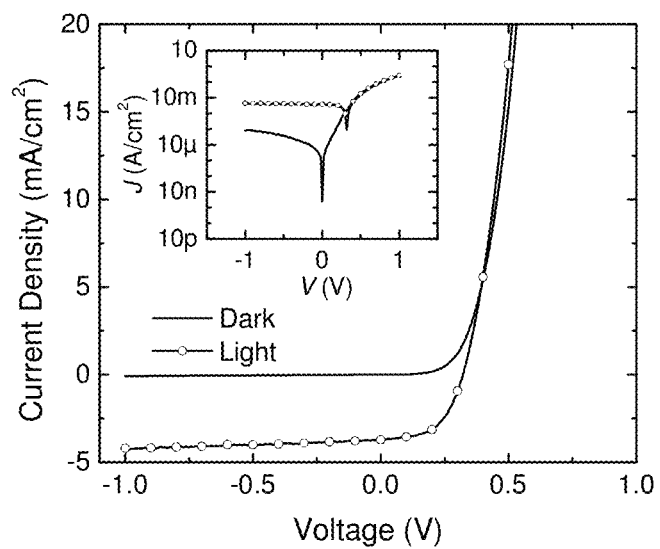

FIG. 126 shows J-V characteristics of a solar cell in the dark and under AM 1.5 100 mW/$cm^2$ illumination, according to an exemplary embodiment of the invention, and device performance is summarized in Table 51.

TABLE 51

Photovoltaic performance of solar cells, averaged over 10 devices

| Sample | $V_{OC}$ (V) | $J_{SC}$ (mA/$cm^2$) | FF | PCE (%) |
| --- | --- | --- | --- | --- |
| YHZ-II-30_D&E | 0.323 ± 0.003 | 3.65 ± 0.04 | 0.534 ± 0.006 | 0.63 ± 0.01 |

Examples c1-g1

Use of Other Amine Containing Polymers Modified Electrodes in OPVs

Examples c1-c2

Use of PAAm Modified Electrodes in OPVs

Example c1

Figure 127:
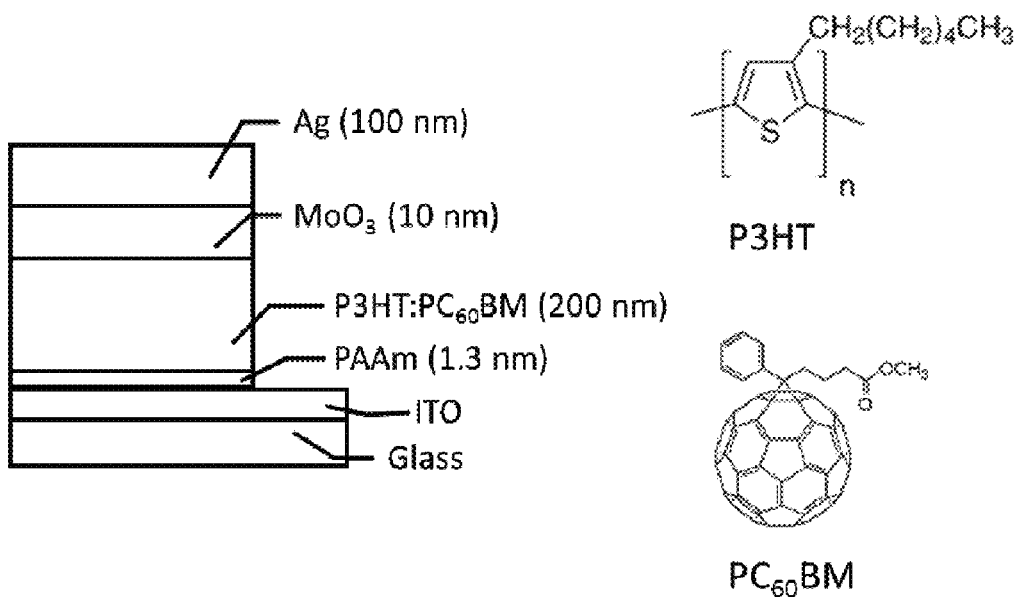

Inverted Solar Cells with ITO/PAAm (1.3 nm) Bottom Electrode, 200 nm P3HT:$PC_{60}$BM, $MoO_3$/Ag Top Electrode FIG. 127 shows a device structure of an inverted solar cell and chemical structure of P3HT and $PC_{60}$BM, according to an exemplary embodiment of the invention.

ITO-coated glass (Colorado Concept Coatings LLC) with a sheet resistivity of ~15 Ω/sq. was used as substrate. The ITO substrates were patterned with kapton tape and etched by acid vapor (1:3 by volume, $HNO_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths.

Poly(allylamine) (PAAm) solution ($M_w$=17,000 g/mol), which was dissolved in $H_2O$ with a concentration of 20 wt. % when received from Aldrich, and then further diluted into methoxyethanol to a concentration of 0.05 wt. %. Then the solution was spin coated onto cleaned ITO substrates at a speed of 5000 rpm for 1 min and at an acceleration of 1000 rpm/s; and then annealed at 100° C. for 10 min on a hot plate in ambient air. The thickness of PAAm was 1.3 nm, determined by spectroscopic ellipsometry (J. A. Woollam Co.).

Then the substrates were transferred into a $N_2$-filled glove box. The active layer of poly(3-hexylthiophene) (P3HT, 4002-E, BJ19-79, Rieke Metals, FIG. 127): [6,6]-phenyl $C_{61}$ butyric acid methyl ester ($PC_{60}$BM, Nano-C, FIG. 127) (1:0.7, weight ratio) was filtered through 0.2-μm-pore PTFE filters and spin-coated on each substrate from a 34 mg/ml chlorobenzene solution at a speed of 700 rpm and at an acceleration of 10000 rpm/s; and then annealed at 160° C. for 10 min on a hot plate in the glove box. The thickness of the active layer is 200 nm, measured using a profilometer (Dektak 6M Stylus, Veeco, Plainview, N.Y.).

Samples were then loaded into a vacuum thermal evaporation system (EvoVac, Angstrom Engineering Inc.) where 10 nm of MoO$_3$ followed by 100 nm of Ag were deposited through a shadow mask at a base pressure of 2×10$^{-7}$ Torr. The effective area of the active layer was 10 mm$^2$. The completed devices were transferred to another nitrogen-filled glove box for electrical measurements in a sealed container.

Current density-voltage (J-V) characteristics were measured inside the N$_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm$^2$ was used as the light source.

Figure 128:
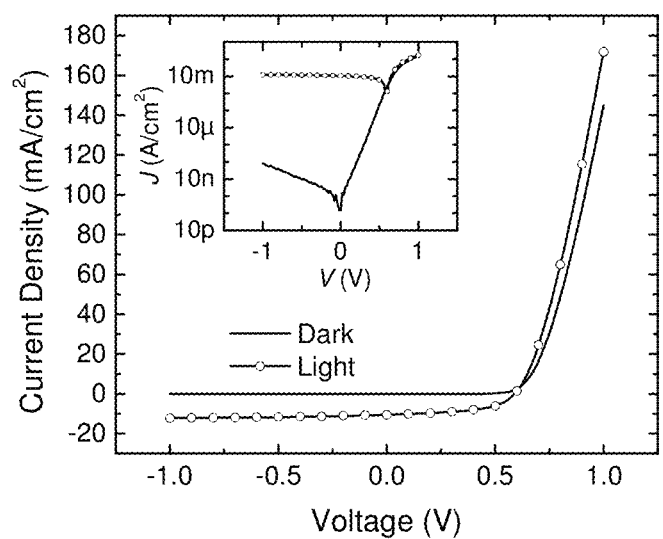

FIG. 128 shows J-V characteristics of a solar cell in dark and under AM 1.5 100 mW/cm$^2$ illumination, according to an exemplary embodiment of the invention, and device performance is summarized in Table 52.

TABLE 52

Photovoltaic performance of solar cells, averaged over 5 devices

| Sample | $V_{OC}$ (V) | $J_{SC}$ (mA/cm$^2$) | FF | PCE (%) |
|---|---|---|---|---|
| YHZ-II-17C | 0.587 ± 0.001 | 11.65 ± 0.65 | 0.521 ± 0.005 | 3.56 ± 0.16 |

Example c2

Figure 129:
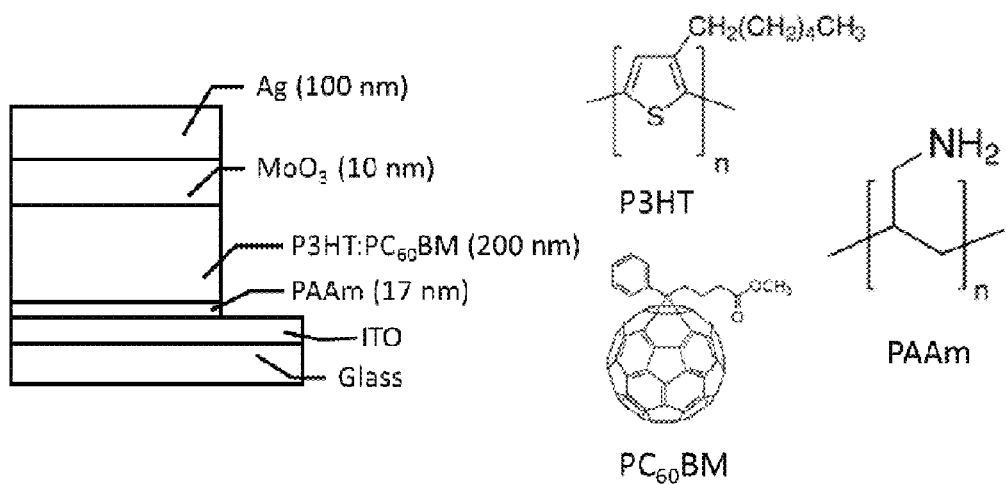

Inverted Solar Cells with ITO/PAAm (17 nm) Bottom Electrode, 200 nm P3HT:PC$_{60}$BM, MoO$_3$/Ag Top Electrode FIG. 129 shows a device structure of a solar cell and chemical structure of PAAm, P3HT and PC$_{60}$BM, according to an exemplary embodiment of the invention.

ITO-coated glass (Colorado Concept Coatings LLC) with a sheet resistivity of ~15 Ω/sq. was used as substrate. The ITO substrates were patterned with kapton tape and etched by acid vapor (1:3 by volume, HNO$_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths.

Poly(allylamine) (PAAm, FIG. 129) solution (M$_w$=17,000 g/mol), which was dissolved in H$_2$O with a concentration of 20 wt. % when received from Aldrich, and then further diluted into methoxyethanol to a concentration of 0.5 wt. %. Then the solution was spin coated onto cleaned ITO substrates at a speed of 5000 rpm for 1 min and at an acceleration of 1000 rpm/s; and then annealed at 100° C. for 10 min on a hot plate in ambient air. The thickness of PAAm was 17 nm, determined by spectroscopic ellipsometry (J. A. Woollam Co.).

Then the substrates were transferred into a N$_2$-filled glove box. The active layer of poly(3-hexylthiophene) (P3HT, 4002-E, BJ19-79, Rieke Metals, FIG. 129): [6,6]-phenyl C$_{61}$ butyric acid methyl ester (PC$_{60}$BM, Nano-C, FIG. 129) (1:0.7, weight ratio) was filtered through 0.2-μm-pore PTFE filters and spin-coated on each substrate from a 34 mg/ml chlorobenzene solution at a speed of 700 rpm and at an acceleration of 10000 rpm/s; and then annealed at 160° C. for 10 min on a hot plate in the glove box. The thickness of the active layer is 200 nm, measured using a profilometer (Dektak 6M Stylus, Veeco, Plainview, N.Y.).

Samples were then loaded into a vacuum thermal evaporation system (EvoVac, Angstrom Engineering Inc.) where 10 nm of MoO$_3$ followed by 100 nm of Ag were deposited through a shadow mask at a base pressure of 2×10$^{-7}$ Torr. The effective area of the active layer was 10 mm$^2$. The completed devices were transferred to another nitrogen-filled glove box for electrical measurements in a sealed container.

Current density-voltage (J-V) characteristics were measured inside the N$_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm$^2$ was used as the light source.

Figure 130:
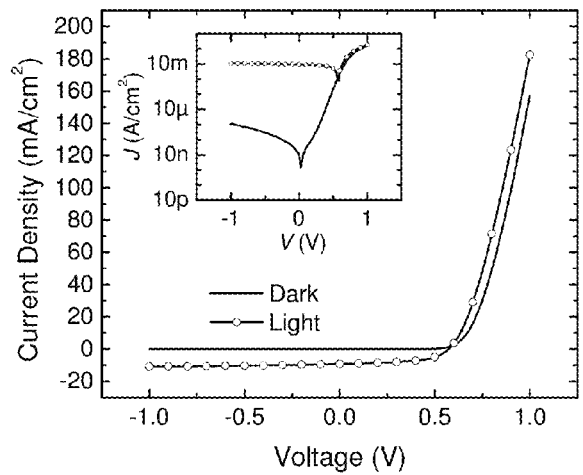

FIG. 130 shows J-V characteristics of a solar cell in dark and under AM 1.5 100 mW/cm$^2$ illumination, according to an exemplary embodiment of the invention, and device performance is summarized in Table 53.

TABLE 53

Photovoltaic performance of solar cells, averaged over 5 devices

| Sample | $V_{OC}$ (V) | $J_{SC}$ (mA/cm$^2$) | FF | PCE (%) |
|---|---|---|---|---|
| YHZ-II-17B | 0.575 ± 0.003 | 9.30 ± 0.39 | 0.552 ± 0.002 | 2.95 ± 0.11 |

Example d1

Use of PVP Modified Electrodes in OPVs. Inverted Solar Cells with ITO/PVP (1 nm) Bottom Electrode, 200 nm P3HT:PC$_{60}$BM, MoO$_3$/Ag Top Electrode FIG. 131 shows a device structure of a solar cell and chemical structure of PVP, P3HT and PC$_{60}$BM, according to an exemplary embodiment of the invention.

ITO-coated glass (Colorado Concept Coatings LLC) with a sheet resistivity of ~15 Ω/sq. was used as substrate. The substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths. A 300-nm-thick layer of SiO$_x$ was deposited on the ITO substrate through a shadow mask by e-beam deposition (AXXIS, Kurt J. Lesker) to pattern the cathode. Next, the substrates were ultrasonicated in isopropanol for 10 minutes, blown dry with nitrogen.

Polyvinylpyrrolidone (PVP, FIG. 131) was purchased from Aldrich and diluted in DI water to a concentration of 0.07 wt. %. This solution was spin-coated on ITO glass substrates at a speed of 3000 rpm and at an acceleration of 1000 rpm/s. The PVP film was then annealed at 80° C. for one minute.

Then, the substrates were transferred into a N$_2$-filled glove box. The active layer of poly(3-hexylthiophene) (P3HT, 4002-E, BJ19-79, Rieke Metals, FIG. 131): [6,6]-phenyl C$_{61}$ butyric acid methyl ester (PC$_{60}$BM, Nano-C, FIG. 131) (1:0.7, weight ratio) was filtered through 0.2-μm-pore PTFE filters and spin-coated on each substrate from a 34 mg/ml chlorobenzene solution at a speed of 700 rpm and at an acceleration of 10000 rpm/s; and then annealed at 160° C. for 10 min on a hot plate inside the glove box. The thickness of the active layer was 200 nm, measured using a profilometer (Dektak 6M Stylus, Veeco, Plainview, N.Y.).

Samples were transferred out of the glove box and a layer of poly(3,4-ethylenedioxythiophene):poly(styrenesulfonate) (CLEVIOS™ F CPP 105 DM, HC Stack Inc., MA, 90 nm) was spin coated on top of the active layer at a speed of 5000 rpm and at an acceleration of 1000 rpm/s. The samples were annealed at 110° C. for 10 min on hot plate in a N$_2$-filled glove box to dry PEDOT:PSS layer.

Samples were then loaded into a vacuum thermal evaporation system (EvoVac, Angstrom Engineering Inc.), and a 100 nm of Ag was deposited through a shadow mask at a base pressure of $2\times10^{-7}$ Torr. The effective area of the active layer was 10 mm$^2$. The completed devices were transferred in a sealed container to another nitrogen-filled glove box for electrical measurements.

Current density-voltage (J-V) characteristics were measured inside the N$_2$-filled glove box by using a source meter (2400, Keithley Instruments, Cleveland, Ohio) controlled by a LabVIEW program. To test the solar cell properties under illumination, an Oriel lamp with an air mass (AM) 1.5 filter and an intensity of 100 mW/cm$^2$ was used as the light source.

S-shaped kink appeared in the J-V curves of devices under illumination. To remove the kink, devices were kept and exposed under the Oriel lamp with AM 1.5 filter for 20 min inside the N$_2$-filled glove box. After soaking, J-V characteristics of the devices were measured again both in the dark and under illumination of the above-mentioned light source.

FIG. 132 shows J-V characteristics of a newly fabricated solar cell under AM 1.5 100 mW/cm$^2$ illumination, according to an exemplary embodiment of the invention.

FIG. 133 shows J-V characteristics of a solar cell exposed under solar simulator for 20 min under AM 1.5 100 mW/cm$^2$ illumination, according to an exemplary embodiment of the invention, and device performance is summarized in Table 54.

TABLE 54

Performance of solar cells exposed under solar simulator for 20 min, over 5 devices

| Sample | V$_{OC}$ (mV) | J$_{SC}$ (mA/cm$^2$) | FF | PCE (%) |
|---|---|---|---|---|
| JWS-II-45F__20minUV | 581 ± 6 | 9.04 ± 0.34 | 0.59 ± 0.01 | 3.10 ± 0.14 |

Example e1

Use of PDA-C Modified Electrodes in OPVs, Inverted Solar Cells with ITO/PDA-C (13 nm) Bottom Electrode, 200 nm P3HT:PC$_{60}$BM, PEDOT:PSS(CPP 105 D)/Ag Top Electrode FIG. 134 shows a device structure of a solar cell and chemical structure of PDA-C, P3HT and PC$_{60}$BM, according to an exemplary embodiment of the invention.

ITO-coated glass (Colorado Concept Coatings LLC) with a sheet resistivity of ~15 Ω/sq. was used as substrate. The ITO substrates were patterned with kapton tape and etched by acid vapor (1:3 by volume, HNO$_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths.

Poly(diallyldimethylammonium chloride) (PDA-C, FIG. 134) was dissolved in H$_2$O with a concentration of 35 wt. % when received from Aldrich, and then, further diluted into methoxyethanol to a concentration of 0.5 wt. %. Then the solution was spin coated onto cleaned ITO substrates at a speed of 5000 rpm for 1 min and an acceleration of 1000 rpm/s and annealed at 120° C. for 10 min on hot plate in ambient air. The thickness of PDA-C was 13 nm determined by spectroscopic ellipsometry (J. A. Woollam Co.).

Then, the substrates were transferred into a N$_2$-filled glove box. The active layer of poly(3-hexylthiophene) (P3HT, 4002-E, BJ19-79, Rieke Metals, FIG. 134): [6,6]-phenyl C$_{61}$ butyric acid methyl ester (PC$_{60}$BM, Nano-C, FIG. 134) (1:0.7, weight ratio) was filtered through 0.2-µm-pore PTFE filters and spin-coated on each substrate from a 34 mg/ml chlorobenzene solution at a speed of 700 rpm and at an acceleration of 10000 rpm/s; and then annealed at 160° C. for 10 min on a hot plate inside the glove box. The thickness of the active layer was 200 nm, measured using a profilometer (Dektak 6M Stylus, Veeco, Plainview, N.Y.).

Samples were transferred out of the glove box and a layer of poly(3,4-ethylenedioxythiophene):poly(styrenesulfonate) (CLEVIOS™ F CPP 105 DM, HC Stack Inc., MA, 90 nm) was spin coated on top of the active layer at a speed of 5000 rpm and at an acceleration of 1000 rpm/s. Samples were then annealed at 110° C. for 10 min on a hot plate inside a N$_2$-filled glove box to dry PEDOT:PSS layer.

Samples were then loaded into a vacuum thermal evaporation system (EvoVac, Angstrom Engineering Inc.), and a 100 nm of Ag was deposited through a shadow mask at a base pressure of $2\times10^{-7}$ Torr. The effective area of the active layer was 10 mm$^2$. The completed devices were transferred in a sealed container to another nitrogen-filled glove box for electrical measurements.

Current density-voltage (J-V) characteristics were measured inside the N$_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm$^2$ was used as the light source.

S-shaped kink appeared in the J-V curves of devices under illumination. To remove the kink, devices were kept and exposed under the Oriel lamp with AM 1.5 filter for 150 min inside the N$_2$-filled glove box. After soaking, J-V characteristics of the devices were measured again both in the dark and under illumination of the above-mentioned light source.

FIG. 135 shows J-V characteristics of a newly fabricated solar cell under AM 1.5 100 mW/cm$^2$ illumination, according to an exemplary embodiment of the invention.

FIG. 136 shows J-V characteristics of a solar cell exposed under solar simulator for 150 min under AM 1.5 100 mW/cm$^2$ illumination, according to an exemplary embodiment of the invention, and device performance is summarized in Table 55.

TABLE 55

Performance of solar cells exposed under solar simulator for 150 min, over 5 devices

| Sample | V$_{OC}$ (V) | J$_{SC}$ (mA/cm$^2$) | FF | PCE (%) |
|---|---|---|---|---|
| YHZ-I-154C | 0.557 ± 0.001 | 9.01 ± 0.53 | 0.492 ± 0.017 | 2.47 ± 0.23 |

Example f1

Use of PVP-DMA Modified Electrodes in OPVs, Solar Cells with ITO/PVP-DMA (14 nm) Bottom Electrode, 200 nm P3HT:PC$_{60}$BM, PEDOT:PSS(CPP 105 D)/Ag Top Electrode FIG. 137 shows a device structure of a solar cell and chemical structure of PVP-DMA, P3HT and PC$_{60}$BM, according to an exemplary embodiment of the invention.

ITO-coated glass (Colorado Concept Coatings LLC) with a sheet resistivity of ~15 Ω/sq. was used as substrate. The ITO substrates were patterned with kapton tape and etched by acid vapor (1:3 by volume, HNO$_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths.

Poly(1-vinylpyrrolidone-co-2-dimethylaminoethyl methacrylate) (PVP-DMA, FIG. 137) was dissolved in H$_2$O with a concentration of 19 wt. % when received from Aldrich and further diluted into methoxyethanol to a concentration of 0.5 wt. %. Then the solution was spin coated onto cleaned ITO substrates at a speed of 5000 rpm for 1 min and at an acceleration of 1000 rpm/s; and then annealed at 120° C. for 10 min on a hot plate in ambient air. The thickness of PVP-DMA was 14 nm determined by spectroscopic ellipsometry (J. A. Woollam Co.).

Then the substrates were transferred into a N$_2$-filled glove box. The active layer of poly(3-hexylthiophene) (P3HT, 4002-E, BJ19-79, Rieke Metals, FIG. 137): [6,6]-phenyl C$_{61}$ butyric acid methyl ester (PC$_{60}$BM, Nano-C, FIG. 137) (1:0.7, weight ratio) was filtered through 0.2-μm-pore PTFE filters and spin-coated on each substrate from a 34 mg/ml chlorobenzene solution at a speed of 700 rpm and at an acceleration of 10000 rpm/s; and then, annealed at 160° C. for 10 min on hot plate in the glove box. The thickness of the active layer was 200 nm, measured using a profilometer (Dektak 6M Stylus, Veeco, Plainview, N.Y.).

Samples were transferred out of the glove box and a layer of poly(3,4-ethylenedioxythiophene):poly(styrenesulfonate) (CLEVIOS™ F CPP 105 DM, HC Stack Inc., MA, 90 nm) was spin coated on top of the active layer at a speed of 5000 rpm and at an acceleration of 1000 rpm/s. Samples were annealed at 110° C. for 10 min on hot plate in a N$_2$-filled glove box to dry PEDOT:PSS layer.

Samples were then loaded into a vacuum thermal evaporation system (EvoVac, Angstrom Engineering Inc.) where 100 nm of Ag were deposited through a shadow mask at a base pressure of 2×10$^{-7}$ Torr. The effective area of the active layer was 10 mm$^2$. The completed devices were transferred in a sealed container to another nitrogen-filled glove box for electrical measurements.

Current density-voltage (J-V) characteristics were measured inside the N$_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm$^2$ was used as the light source.

S-shaped kink appeared in the J-V curves of devices under illumination. To remove the kink, devices were kept and exposed under the Oriel lamp with AM 1.5 filter for 36 min inside the N$_2$-filled glove box. After soaking, J-V characteristics of the devices were measured again both in the dark and under illumination of the above-mentioned light source.

FIG. 138 shows J-V characteristics of a newly fabricated solar cell under AM 1.5 100 mW/cm$^2$ illumination, according to an exemplary embodiment of the invention, and device performance is summarized in Table 56.

FIG. 139 shows J-V characteristics of a solar cell exposed under solar simulator for 36 min under AM 1.5 100 mW/cm$^2$ illumination, according to an exemplary embodiment of the invention.

TABLE 56

Performance of solar cells exposed under solar simulator for 36 min, over 5 devices

| Sample | $V_{OC}$ (V) | $J_{SC}$ (mA/cm$^2$) | FF | PCE (%) |
|---|---|---|---|---|
| YHZ-I-154E | 0.557 ± 0.001 | 9.28 ± 0.30 | 0.600 ± 0.010 | 3.10 ± 0.07 |

Example g1

Use of PVP-DMA Modified Electrodes in OPVs, Inverted Solar Cells with ITO/PBC-DMA (9.3 nm) Bottom Electrode, 200 nm P3HT:PC$_{60}$BM, PEDOT:PSS(CPP 105 D)/Ag Top Electrode FIG. 140 shows a device structure of a solar cell and chemical structure of PBC-DMA, P3HT and PC$_{60}$BM, according to an exemplary embodiment of the invention.

ITO-coated glass (Colorado Concept Coatings LLC) with a sheet resistivity of ~15 Ω/sq. was used as substrate. The ITO substrates were patterned with kapton tape and etched by acid vapor (1:3 by volume, HNO$_3$:HCl) for 5 min at 60° C. The patterned substrates were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths.

Poly[bis(2-chloroethyl)ether-alt-1,3-bis[3-(dimethylamino)propyl]urea] quaternized (PBC-DMA, FIG. 140) was dissolved in H$_2$O with a concentration of 62 wt. % as received from Aldrich and then further diluted into methoxyethanol to a concentration of 0.5 wt. %. Then, the solution was spin coated onto cleaned ITO substrates at a speed of 5000 rpm for 1 min and at an acceleration of 1000 rpm/s; and then annealed at 120° C. for 10 min on a hot plate in ambient air. The thickness of PBC-DMA was 9.3 nm determined by spectroscopic ellipsometry (J. A. Woollam Co.).

Then the substrates were transferred into a N$_2$-filled glove box. The active layer of poly(3-hexylthiophene) (P3HT, 4002-E, BJ19-79, Rieke Metals, FIG. 140): [6,6]-phenyl C$_{61}$ butyric acid methyl ester (PC$_{60}$BM, Nano-C, FIG. 140) (1:0.7, weight ratio) was filtered through 0.2-μm-pore PTFE filters and spin-coated on each substrate from a 34 mg/ml chlorobenzene solution at a speed of 700 rpm and an acceleration of 10000 rpm/s and annealed at 160° C. for 10 min on hot plate in the glove box. The thickness of the active layer was 200 nm, measured using a profilometer (Dektak 6M Stylus, Veeco, Plainview, N.Y.).

Samples were transferred out of the glove box and a layer of poly(3,4-ethylenedioxythiophene):poly(styrenesulfonate) (CLEVIOS™ F CPP 105 DM, HC Stack Inc., MA, 90 nm) was spin coated on top of the active layer at a speed of 5000 rpm and at an acceleration of 1000 rpm/s. Samples were annealed at 110° C. for 10 min on hot plate in a N$_2$-filled glove box to dry PEDOT:PSS layer. Its thickness was 90 nm.

Samples were then loaded into a vacuum thermal evaporation system (EvoVac, Angstrom Engineering Inc.), where 100 nm of Ag were deposited through a shadow mask at a base pressure of $2\times10^{-7}$ Torr. The effective area of the active layer was 10 mm$^2$. The completed devices were transferred in a sealed container to another nitrogen-filled glove box for electrical measurements.

Current density-voltage (J-V) characteristics were measured inside the N$_2$-filled glove box by using a source meter (2400, Keithley Instruments, Cleveland, Ohio) controlled by a LabVIEW program. To test the solar cell properties under illumination, an Oriel lamp with an air mass 1.5 filter and an intensity of 100 mW/cm$^2$ was used as the light source.

S-shaped kink appeared in the J-V curves of devices under illumination (FIG. 141). To remove the kink, devices were kept and exposed under the Oriel lamp with AM 1.5 filter for 5 min inside the N$_2$-filled glove box. After soaking, J-V characteristics of the devices were measured again both in the dark and under illumination of the above-mentioned light source.

FIG. 141 shows J-V characteristics of a newly fabricated solar cell under AM 1.5 100 mW/cm$^2$ illumination.

FIG. 142 shows J-V characteristics of a solar cell exposed under solar simulator for 5 min under AM 1.5 100 mW/cm$^2$ illumination, according to an exemplary embodiment of the invention. Device performance after light soaking is summarized in Table 57.

TABLE 57

Performance of solar cells exposed under solar simulator for 5 min, over 3 devices

| Sample | $V_{OC}$ (V) | $J_{SC}$ (mA/cm$^2$) | FF | PCE (%) |
|---|---|---|---|---|
| YHZ-I-154A | 0.571 ± 0.001 | 9.41 ± 0.27 | 0.574 ± 0.006 | 3.10 ± 0.05 |

Example h1

OPV Structures of Some Embodiments

FIG. 143 shows OPV structures, according to exemplary embodiments of the invention.

An important aspect enabled by semitransparent OPVs, is that the back metal reflector, typically used to collect carriers and reflect light into the active layer, could become independent from the OPV device. This makes its electrical properties irrelevant for the operation of the solar cell. With this, new possibilities for the optical design of back reflectors arise, since diffuse reflectors with large surface roughness could be used. These types of reflectors are used in crystalline-Si cells, but are not applicable to thin-film PVs since fabrication becomes extremely challenging due to the formation of pinholes and defects.

FIG. 143 shows an OPV geometry embodiment where a semitransparent OPV is fabricated on top of a first transparent substrate with a high conductivity grid, embedded or deposited, and covered with a second transparent substrate with a high conductivity grid, embedded or deposited. In such geometry, a first substrate, which in some embodiments is flexible, will have a metal-grid embedded or deposited on a first surface and a diffuse or specular reflector on its second surface. The reflector could be made of a metal or another material that reflects light back into the polymeric active area and improves the OPV collection efficiency. The OPV device consist of a first transparent electrode deposited on the first surface of the first transparent substrate and is modified by a thin amine-containing polymer layer such as, for example, the ones described herein. The first transparent electrode can comprise a metal, transparent conducting oxide or conductive polymer. A polymer active layer is then deposited on top of said amine-containing polymer layer and first transparent electrode. A second transparent electrode is then deposited on top of the polymer active layer. The second transparent electrode can comprise a metal, transparent conducting oxide or conductive polymer. A high conductivity grid is then deposited on top of the second transparent electrode or is deposited or embedded on a second semitransparent substrate. Finally, the second transparent substrate is then laminated, deposited or attached to the second transparent electrode. Those skilled in the art would understand that both transparent substrates will, in some embodiments, be light-weight, flexible, have good barrier properties to oxygen and water, and have a low cost.

Example i1

Air-Stability of ITO Modified by PEIE (10 nm)

Indium tin oxide (ITO)-coated glass substrates (Colorado Concept Coatings LLC) with a sheet resistivity of ~15 Ω/sq were cleaned in an ultrasonic bath of detergent water, rinsed with deionized water, and then cleaned in sequential ultrasonic baths of deionized water, acetone, and isopropanol. Each ultrasonic bath lasted for 20 minutes. Nitrogen was used to dry the substrates after each of the last three baths.

Polyethylenimine, 80% ethoxylated (PEIE) (Mw=70,000 g/mol), which was dissolved in H$_2$O with a concentration of 35-40 wt. % when received from Aldrich, was diluted into methoxyethanol to the weight concentration of 0.5%. It was spin coated onto the substrates at a speed of 5000 rpm for 1 min and an acceleration of 1000 rpm/s. Then these samples were annealed at 100° C. for 10 min on hotplate in ambient air. Its thickness was measured to be 10 nm by spectroscopic ellipsometry (J. A. Woollam Co.). The work function of the ITO/PEIE samples was measured in air after cumulative exposure times in ambient air using a Kelvin probe (Besocke Delta Phi) and averaged over three locations. A highly ordered pyrolytic graphite (HOPG) sample with a work function of 4.5 eV was used as the reference sample.

FIG. 150 shows a work function of ITO/PEIE (10 nm) after exposed in ambient air for various cumulative exposure times, according to an exemplary embodiment of the invention.

Example j1

Characterization of PEIE by IPES

Polyethylenimine, 80% ethoxylated (PEIE) (Mw=70,000 g/mol), which was dissolved in H$_2$O with a concentration of 35-40 wt. % when received from Aldrich, was diluted into methoxyethanol to the weight concentration of 0.5%. It was spin coated onto Au coated Si substrates at a speed of 5000 rpm for 1 min. Then these samples were transferred into an UHV analysis chamber to conduct inverse photoemission spectroscopy (IPES). IPES was carried out in the isochromat mode, with a resolution of 0.45 eV. Measurements were repeated two or three times per sample.

FIG. 151 shows an IPES spectrum of Au/PEIE (12 nm), according to an exemplary embodiment of the invention. FIG.

151 shows the energy levels of PEIE extracted from IPES and UPS measurements. The large band gap of 6.2 eV indicates that PEIE is an insulator.

Example k1

Inverted Tandem Solar Cells with ITO/PEIE (10 nm) Bottom Electrode and PEDOT:PSS/PEIE (10 nm) Recombination Layer FIG. 152 shows a structure of tandem solar cells and chemical structure of PEIE, P3HT ICBA, PBDTTT-C and $PC_{60}BM$, according to an exemplary embodiment of the invention.

ITO-coated glass (Colorado Concept Coatings LLC) with a sheet resistivity of ~15 Ω/sq. was used as substrate. The substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths. A 300-nm-thick layer of $SiO_x$ was deposited on the ITO substrate by e-beam deposition (AXXIS, Kurt J. Lesker) to pattern the anode. Next, the substrates were ultrasonicated in isopropanol for 10 minutes, blown dry with nitrogen.

Polyethylenimine, 80% ethoxylated (PEIE) ($M_w$=70,000 g/mol) was dissolved in $H_2O$ with a concentration of 35-40 wt. % as received from Aldrich and then further diluted into methoxyethanol to a concentration of 0.5 wt. %. Then, the solution was spin coated onto ITO glass at a speed of 5000 rpm for 1 min and an acceleration of 1000 rpm/s and annealed at 120° C. for 10 min on hot plate in ambient air. The thickness of PEIE was 10 nm, determined by spectroscopic ellipsometry (J. A. Woollam Co.).

Then, the substrates were transferred into a $N_2$-filled glove box. The first active layer of P3HT (Rieke Metals, 4002-E, FIG. 152): ICBA (Lumtec, FIG. 152) (1:1, weight ratio) was spin-coated on each substrate from a 40 mg/ml dichlorobenzene solution at a speed of 800 rpm for 30 s; and then annealed at 160° C. for 10 min on hot plate inside the glove box. The thickness of the active layer was 200 nm measured by spectroscopic ellipsometry.

After samples cooled down, they were transferred to ambient air and treated by with an $O_2$ plasma treatment for 1 s, to make the surface hydrophilic. PEDOT:PSS PH1000 was spin coated on top of the active layer at a speed of 4000 rpm for 1 min. Prior to spin coating, 5% (by weight) dimethyl sulfoxide was added into the as received PEDOT:PSS PH1000 (Heraeus) to enhance its conductivity. During spin coating, a piece of PDMS was coated onto the P3HT:ICBA layer, on the area without ITO. Samples were annealed at 100° C. for 10 min on a hot plate in a N2-filled glove box. The thickness of the PEDOT:PSS PH1000 layer was 50 nm by spectroscopic ellipsometry. PH1000 was coated with another PEIE layer (10 nm) following the same conditions previously described Then, the substrates were transferred back into a $N_2$-filled glove box. Poly[(4,8-bis-(2-ethylhexyloxy)-benzo[1,2-b:4,5-b']dithiophene)-2,6-diyl-alt-(4-(2-ethylhexanoyl)-thieno[3,4-b]thiophene))-2,6-diyl](PBDTTT-C, Solarmer): phenyl-C61-butyric acid methyl ester (PCBM, Nano-C) (1:1.5, weight ratio) was dissolved in a chlorobenzene:1,8 diiodooctane (97:3, v/v) solution with a total concentration of 25 mg/ml for the second layer. The second active layer of PBDTTT-C:PCBM was deposited by spin-coating at 1000 rpm for 20 s. The thickness of PBDTTT-C:PCBM wais estimated to be around 100 nm by ellipsometry.

Samples were then loaded into the vacuum thermal evaporation system (SPECTROS, Kurt J. Lesker) where 10 nm of $MoO_3$ followed by 150 nm of Ag were deposited at a rate of 1-3 Å/s through a shadow mask at a base pressure of $2\times10^{-7}$ Torr to finish the device fabrication. The effective area of the active layer was 10 $mm^2$. The completed devices were transferred, in a sealed container, to another nitrogen-filled glove box for electrical measurements.

Current density-voltage (J-V) characteristics were measured inside the $N_2$-filled glove box by using a source meter (2400, Keithley Instruments, Cleveland, Ohio) controlled by a LabVIEW program.

FIG. 153 shows J-V characteristics of a device in the dark and under AM 1.5 100 mW/$cm^2$ illumination, according to an exemplary embodiment of the invention, and device performance is summarized in Table 58.

To test the solar cell properties under illumination, an Oriel lamp with an air mass 1.5 filter and an intensity of 100 mW/$cm^2$ was used as the light source.

TABLE 58

Photovoltaic parameters of tandem solar cells, averaged over 25 devices

| Device | $V_{OC}$ (mV) | $J_{SC}$ (mA/$cm^2$) | FF | PCE (%) |
|---|---|---|---|---|
| Tandem solar cell | 1480 ± 2 | 7.4 ± 0.4 | 0.68 ± 0.01 | 7.5 ± 0.7 |

Examples 11-15

Use of PEIE in Photovoltaic Modules with High Area Efficiency

Exemplary embodiments of the invention include a solar cell module. The solar cell module includes a plurality of solar cell elements that include a plurality of electrodes, a photoactive layer, and a plurality of interlayers. The interlayers are disposed between the photoactive layer and at least a portion of the electrodes, where each solar cell element has an associated polarity, and adjacent solar cell elements are arranged with alternating polarity, where the polarity is based at least in part on an arrangement and orientation of the plurality of interlayers. In an exemplary embodiment, the electrodes include a plurality of first electrodes electrically connecting x(N) and x(N+1) adjacent solar cell elements in a first plane; and the electrodes further include a plurality of second electrodes electrically connecting x(N+1) and x(N+2) adjacent solar cell elements in a second plane; wherein x and N are integers.

In an exemplary embodiment, the plurality of interlayers associated with the solar cell module are selectively patterned to control a work function associated with the plurality of first electrodes or the plurality of second electrodes. According to exemplary embodiments, the plurality of interlayers include at least an ultra-thin layer disposed between the photoactive layer and at least a portion of the electrodes, and the ultra-thin layer reduces the work function associated with the electrode by greater than 0.5 eV. According to exemplary embodiments, the work function is stable in ambient air and varies by less than 20 percent over a period of greater than 10 hours after forming the plurality of interlayers.

In one exemplary embodiment, the plurality of interlayers include one or more insulating layers having thickness less than 50 nm and preferably less than 25 nm. In another exemplary embodiment, the plurality of interlayers include one or more insulating layers having thickness less than 10 nm and preferably less than 5 nm.

In accordance with exemplary embodiments of the invention, the solar cell module includes a plurality of interlayers that are formed from a solution comprising a Lewis basic oligomer or polymer. In one exemplary embodiment, the Lewis basic oligomer or polymer includes nitrogen in a trivalent state bonded to carbon in a tetravalent state. In another exemplary embodiment, the Lewis basic oligomer or polymer includes oxygen in a divalent state bonded to carbon in a tetravalent state. In another exemplary embodiment, the Lewis basic oligomer or polymer includes sulfur in a divalent state bonded to carbon in a tetravalent state.

In accordance with exemplary embodiments of the invention, the solar cell module includes a plurality of interlayers that are formed from a solution comprising a Lewis basic oligomer or polymer with molecules having molecular weight greater than 0.1 kDa and less than 1000 kDa.

In an exemplary embodiment, the solar cell module includes a plurality of interlayers that are disposed adjacent to one or more of an organic material, one or more polymers, a metal, a transparent conductive metal-oxide, graphene, metal nanorods, metal particles, or metal oxide particles, or a mixture thereof. According to an exemplary embodiment, the plurality of interlayers include one or more ultra-thin layer that reduce the work function associated with the electrode by forming an interfacial dipole at the interface between a surface of the electrode and a surface of the ultra-thin layer.

Example 11

Two-Cell Solar Module Comprising a P3HT:ICBA Active Layer with Solvent Annealing and Pre-Annealing, PEDOT:PSS and PEIE as Two Interlayers and Al as Top Electrode FIG. 154 shows a structure of inverted and conventional reference single solar cells, a solar cell module and chemical structure of PEIE, P3HT ICBA, PBDTTT-C and $PC_{60}BM$, according to an exemplary embodiment of the invention ITO-coated glass (Colorado Concept Coatings LLC) with a sheet resistivity of ~10 Ω/sq. was used as substrate. The ITO substrates were patterned with kapton tape and etched by acid vapor (1:3 by volume, $HNO_3$:HCl) for 10 min at 75° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths. Then the substrates were treated by oxygen plasma for 2 min.

Polyethylenimine, 80% ethoxylated (PEIE) ($M_w$=70,000 g/mol) was dissolved in $H_2O$ with a concentration of 35-40 wt. % when received from Aldrich. Then, it was diluted into methoxyethanol to a weight concentration of 0.2 wt. % and 0.02%.

For reference single solar cells with inverted, PETE (0.2 wt. %) was spin coated onto ITO substrates at a speed of 5000 rpm for 1 min and at an acceleration of 1000 rpm/s and annealed at 120° C. for 10 min on a hot plate in ambient air. The thickness of PETE was 5 nm determined by spectroscopic ellipsometry (J. A. Woollam Co.).

The substrates were transferred into a $N_2$-filled glove box. The active layer of poly(3-hexylthiophene) (P3HT, 4002-E, Rieke Metals): Indene-C60 Bis-Adduct (ICBA, Lumtec) (1:1, weight ratio) was filtered through 0.2-μm-pore PTFE filters and spin-coated on each substrate from a 40 mg/ml dichlorobenzene solution at a speed of 800 rpm for 30 s and an acceleration of 10000 rpm/s. Then the active layers were treated through solvent annealing for 1 hour and thermally annealed at 150° C. for 10 min on a hot plate in the glove box. The thickness of the active layer is 200 nm, measured by spectroscopic ellipsometer (J. A. Woollam Co.).

After samples cooled down for 20 min in the glove box, they were transferred in ambient air and treated by $O_2$ plasma treatment for 1 s to tune the surface hydrophilic. Then a layer of poly(3,4-ethylenedioxythiophene):poly(styrenesulfonate) (PEDOT:PSS) (HTL Solar formulation mixed with 10 volume % CPP105D) was spin coated on top of the active layer at a speed of 5000 rpm for 1 min and an acceleration of 1000 rpm/s. The thickness of PEDOT:PSS layer was about 40 nm.

For the reference single solar cells with conventional structures, PEDOT:PSS 4083 was spin coated onto ITO substrates at a speed of 5000 rpm for 1 min and at an acceleration of 1000 rpm/s and annealed at 120° C. for 10 min on hot plate in ambient air. The thickness of PEDOT:PSS was 40 nm. The P3HT:ICBA active layers were prepared in the same condition as prepared in the inverted single cells. Then a thin layer of PEIE was spin coated on top of plasma-treated active layer from a weight concentration of 0.02% at a speed of 5000 rpm for 1 min and an acceleration of 1000 rpm/s.

For a solar cell module comprising a first solar cell with an inverted structure and a second solar cell with a conventional structure an ITO substrate was etched with a gap about 1.7 mm to define two ITO electrodes. Then PETE (0.2%) and PEDOT:PSS 4083 were spin coated onto the two parts of ITO at a speed of 5000 rpm for 1 min and at an acceleration of 1000 rpm/s one after the other. A narrow (0.5-1 mm) polydimethylsiloxane (PDMS) was coated onto the gap between the patterned ITO electrodes prior to spin coating of PEIE and PEDOT:PSS, to selectively pattern PEIE and PEDOT:PSS. PDMS was peeled-off and the samples were annealed at 120° C. for 10 min on a hot plate in ambient air.

The active layers of P3HT:ICBA were prepared in the same condition as prepared for single solar cells. A thin layer of PEIE (from a 0.02 wt. % solution) and a layer of PEDOT:PSS (HTL Solar+10% v/v CPP 105D) were spin coated on top of the active layer at a speed of 5000 rpm for 1 min and an acceleration of 1000 rpm/s. Prior to spin coating, the active layer was treated by an $O_2$ plasma for 1 s and PDMS was coated on the active layer to selectively patterned PEIE and PEDOT:PSS.

All the samples were transferred into a $N_2$-filled glove box and annealed on a hot plate at 110° C. for 10 min to dry PEIE and cros slink PEDOT:PSS HTL-CPP. All samples were loaded into a vacuum thermal evaporation system (SPECTROS, Kurt J. Lesker) and a layer of Al (150 nm) was deposited onto all of the samples through a shadow mask. The area of the solar cell module devices was about 18 $mm^2$ not including the gap between the ITO electrodes having an area of 1.7 $mm^2$.

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an irradiance of 100 $mW/cm^2$ was used as the light source.

FIG. 155 shows J-V characteristics of a reference inverted single solar cell (glass/ITO/PEIE/P3HT:ICBA/PEDOT:PSS/Al) in dark and under AM 1.5 100 $mW/cm^2$ illumination, according to an exemplary embodiment of the invention. Device performance is summarized in Table 59.

FIG. 156 shows J-V characteristics of a reference conventional single solar cell (glass/ITO/PEDOT:PSS/P3HT:ICBA/

PEIE/Al) in dark and under AM 1.5 100 mW/cm² illumination, according to an exemplary embodiment of the invention. Device performance is summarized in Table 59.

FIG. 157 shows J-V characteristics of a solar cell module in dark and under AM 1.5 100 mW/cm² illumination, according to an exemplary embodiment of the invention. Device performance is summarized in Table 59.

TABLE 59

Photovoltaic performance of inverted single cells and conventional single cells (averaged over 2 devices) and module devices (averaged over 2 devices); Data in parentheses are calculated with the total area including the gap (no ITO).

| Sample | $V_{OC}$ (V) | $J_{SC}$ (mA/cm²) | FF | PCE (%) |
|---|---|---|---|---|
| Inverted single | 0.82 ± 0.01 | 10.2 ± 0.2 | 0.01 | 5.1 ± 0.1 |
| Conventional single | 0.74 ± 0.01 | 8.4 ± 0.1 | 0.57 ± 0.01 | 3.6 ± 0.1 |
| Module | 1.55 ± 0.01 | 4.3 ± 0.1 (4.0 ± 0.1) | 0.61 ± 0.01 | 4.1 ± 0.1 (3.8 ± 0.1) |

Example 12

Two-Cell Solar Module Comprising a P3HT:ICBA Active Layer with Solvent Annealing and Pre-Annealing, PEDOT:PSS and PEIE as Two Interlayers and Ag as Top Electrode FIG. 158 shows a structure of inverted and conventional reference single solar cells, a solar cell module and chemical structure of PEIE, P3HT ICBA, PBDTTT-C and PC60BM, according to an exemplary embodiment of the invention.

ITO-coated glass (Colorado Concept Coatings LLC) with a sheet resistivity of ~15 Ω/sq. was used as substrate. The ITO substrates were patterned with kapton tape and etched by acid vapor (1:3 by volume, $HNO_3$:HCl) for 10 min at 75° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths. Then the substrates were treated by oxygen plasma for 2 min.

Polyethylenimine, 80% ethoxylated (PEIE) ($M_w$=70,000 g/mol) was dissolved in $H_2O$ with a concentration of 35-40 wt. % when received from Aldrich. Then, it was diluted into methoxyethanol to a weight concentration of 0.2 wt. % and 0.02%.

For reference single solar cells with inverted, PETE (0.2 wt. %) was spin coated onto ITO substrates at a speed of 5000 rpm for 1 min and at an acceleration of 1000 rpm/s and annealed at 120° C. for 10 min on a hot plate in ambient air. The thickness of PETE was 5 nm determined by spectroscopic ellipsometry (J. A. Woollam Co.).

The substrates were transferred into a $N_2$-filled glove box. The active layer of poly(3-hexylthiophene) (P3HT, 4002-E, Rieke Metals): Indene-C60 Bis-Adduct (ICBA, Lumtec) (1:1, weight ratio) was filtered through 0.2-μm-pore PTFE filters and spin-coated on each substrate from a 40 mg/ml dichlorobenzene solution at a speed of 800 rpm for 30 s and an acceleration of 10000 rpm/s. Then the active layers were treated through solvent annealing for 1 hour and thermally annealed at 150° C. for 10 min on a hot plate in the glove box. The thickness of the active layer was 200 nm, measured by spectroscopic ellipsometer (J. A. Woollam Co.).

After samples cooled down for 20 min in the glove box, they were transferred in ambient air and treated by $O_2$ plasma treatment for 1 s to tune the surface hydrophilic. Then a layer of poly(3,4-ethylenedioxythiophene):poly(styrenesulfonate) (PEDOT:PSS) (HTL Solar formulation mixed with 10 volume % CPP105D) was spin coated on top of the active layer at a speed of 5000 rpm for 1 min and an acceleration of 1000 rpm/s. The thickness of PEDOT:PSS layer was about 40 nm.

For the reference single solar cells with conventional structures, PEDOT:PSS 4083 was spin coated onto ITO substrates at a speed of 5000 rpm for 1 min and at an acceleration of 1000 rpm/s and annealed at 120° C. for 10 min on hot plate in ambient air. The thickness of PEDOT:PSS was 40 nm. The P3HT:ICBA active layers were prepared in the same condition as prepared in the inverted single cells. Then a thin layer of PEIE was spin coated on top of plasma-treated active layer from a weight concentration of 0.02% at a speed of 5000 rpm for 1 min and an acceleration of 1000 rpm/s.

For a solar cell module comprising a first solar cell with an inverted structure and a second solar cell with a conventional structure an ITO substrate was etched with a gap about 1.7 mm to define two ITO electrodes. Then PEIE (0.2%) and PEDOT:PSS 4083 were spin coated onto the two parts of ITO at a speed of 5000 rpm for 1 min and at an acceleration of 1000 rpm/s one after the other. A narrow (0.5-1 mm) polydimethylsiloxane (PDMS) was coated onto the gap between the patterned ITO electrodes prior to spin coating of PEIE and PEDOT:PSS, to selectively pattern PEIE and PEDOT:PSS. PDMS was peeled-off and the samples were annealed at 120° C. for 10 min on a hot plate in ambient air.

The active layers of P3HT:ICBA were prepared in the same condition as prepared for single solar cells. A thin layer of PEIE (from a 0.02 wt. % solution) and a layer of PEDOT:PSS (HTL Solar+10% v/v CPP 105D) were spin coated on top of the active layer at a speed of 5000 rpm for 1 min and an acceleration of 1000 rpm/s. Prior to spin coating, the active layer was treated by an $O_2$ plasma for 1 s and PDMS was coated on the active layer to selectively patterned PEIE and PEDOT:PSS.

All the samples were transferred into a $N_2$-filled glove box and annealed on a hot plate at 110° C. for 10 min to dry PEIE and cros slink PEDOT:PSS HTL-CPP. All the samples were loaded into a vacuum thermal evaporation system (SPECTROS, Kurt J. Lesker) and a layer of Ag (150 nm) was deposited onto all of the samples through a shadow mask. The area of module devices was about 18 mm² not including the gap between the ITO electrodes having an area of 1.6 mm².

Current density-voltage (J-V) characteristics were measured inside the $N_2$-filled glove box by using a source meter (2400, Keithley Instruments, Cleveland, Ohio) controlled by a LabVIEW program. To test the solar cell properties under illumination, an Oriel lamp with an air mass 1.5 filter and an irradiance of 100 mW/cm² was used as the light source.

FIG. 159 shows J-V characteristics of a reference inverted single solar cell (glass/ITO/PEIE/P3HT:ICBA/PEDOT:PSS/Ag) in dark and under AM 1.5 100 mW/cm² illumination, according to an exemplary embodiment of the invention. Device performance is summarized in Table 60.

FIG. 160 shows J-V characteristics of a reference conventional single solar cell (glass/ITO/PEDOT:PSS/P3HT:ICBA/PEIE/Ag) in dark and under AM 1.5 100 mW/cm² illumination, according to an exemplary embodiment of the invention. Device performance is summarized in Table 60.

FIG. 161 shows J-V characteristics of a solar cell module in dark and under AM 1.5 100 mW/cm² illumination, according to an exemplary embodiment of the invention. Device performance is summarized in Table 59.

TABLE 60

Photovoltaic performance of inverted single cells and conventional single cells (averaged over 2 devices) and a module device; Data in parentheses are calculated with the area includes the gap (no ITO).

| Sample | $V_{OC}$ (V) | $J_{SC}$ (mA/cm$^2$) | FF | PCE (%) |
|---|---|---|---|---|
| Inverted single | 0.01 | 12.2 ± 0.3 | 0.61 ± 0.01 | 6.1 ± 0.2 |
| Conventional single | 0.71 | 8.7 | 0.57 | 3.5 |
| Module | 1.48 | 4.4 (4.0) | 0.58 | 3.8 (3.4) |

Example 13

Two-Cell Solar Module Comprising a P3HT:ICBA Active Layer with Pre-Annealing (No Solvent Annealing), PEDOT:PSS and PEIE as Two Interlayers and Al as Top Electrode FIG. 162 shows a structure of inverted and conventional reference single solar cells, a solar cell module and chemical structure of PEIE, P3HT ICBA, PBDTTT-C and PC60BM, according to an exemplary embodiment of the invention.

ITO-coated glass (Colorado Concept Coatings LLC) with a sheet resistivity of ~15 Ω/sq. was used as substrate. The ITO substrates were patterned with kapton tape and etched by acid vapor (1:3 by volume, HNO3:HCl) for 10 min at 75° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths. Then the substrates were treated by oxygen plasma for 2 min.

Polyethylenimine, 80% ethoxylated (PEIE) (Mw=70,000 g/mol) was dissolved in H2O with a concentration of 35-40 wt. % when received from Aldrich. Then, it was diluted into methoxyethanol to a weight concentration of 0.2 wt. % and 0.02%.

For reference single solar cells with inverted structure, PETE (0.2 wt. %) was spin coated onto ITO substrates at a speed of 5000 rpm for 1 min and at an acceleration of 1000 rpm/s and annealed at 120° C. for 10 min on a hot plate in ambient air. The thickness of PETE was 5 nm determined by spectroscopic ellipsometry (J. A. Woollam Co.).

The active layer of poly(3-hexylthiophene) (P3HT, 4002-E, Rieke Metals): Indene-C60 Bis-Adduct (ICBA, Lumtec) (1:1, weight ratio) was filtered through 0.2-μm-pore PTFE filters and spin-coated on each substrate from 40 mg/ml dichlorobenzene solution at a speed of 800 rpm for 30 s and an acceleration of 10000 rpm/s. Then the active layers were thermally annealed at 150° C. for 10 min on a hot plate in the glove box. The thickness of the active layer is 200 nm, measured by spectroscopic ellipsometer (J. A. Woollam Co.).

After samples cooled down for 20 min in the glove box, they were transferred in ambient air and treated by O$_2$ plasma treatment for 1 s to tune the surface hydrophilic. Then a layer of poly(3,4-ethylenedioxythiophene):poly(styrenesulfonate) (PEDOT:PSS) (HTL Solar formulation mixed with 10 volume % CPP105D) was spin coated on top of the active layer at a speed of 5000 rpm for 1 min and an acceleration of 1000 rpm/s. The thickness of PEDOT:PSS layer was 40 nm.

For reference single solar cells with conventional structure, PEDOT:PSS 4083 was spin coated onto ITO substrates at a speed of 5000 rpm for 1 min and at an acceleration of 1000 rpm/s and annealed at 120° C. for 10 min on hot plate in ambient air. The thickness of PEDOT:PSS was 40 nm. The P3HT:ICBA active layers were prepared in the same condition as prepared in the inverted single cells. Then a thin layer of PEIE was spin coated on top of plasma-treated active layer from a weight concentration of 0.02% at a speed of 5000 rpm for 1 min and an acceleration of 1000 rpm/s.

For a solar cell module comprising a first solar cell with an inverted structure and a second solar cell with a conventional structure an ITO substrate was etched with a gap about 1.7 mm to define two ITO electrodes. Then PEIE (0.2%) and PEDOT:PSS 4083 were spin coated onto the two parts of ITO at a speed of 5000 rpm for 1 min and at an acceleration of 1000 rpm/s one after the other. A narrow (0.5-1 mm) polydimethylsiloxane (PDMS) was coated onto the gap between the patterned ITO electrodes prior to spin coating of PEIE and PEDOT:PSS, to selectively pattern PEIE and PEDOT:PSS. PDMS was peeled-off and the samples were annealed at 120° C. for 10 min on a hot plate in ambient air.

The active layers of P3HT:ICBA were prepared in the same condition as prepared for single solar cells. A thin layer of PEIE (from a 0.02 wt. % solution) and a layer of PEDOT:PSS (HTL Solar+10% v/v CPP 105D) were spin coated on top of the active layer at a speed of 5000 rpm for 1 min and an acceleration of 1000 rpm/s. Prior to spin coating, the active layer was treated by an O$_2$ plasma for 1 s and PDMS was coated on the active layer to selectively patterned PEIE and PEDOT:PSS.

All the samples were transferred into a N2-filled glove box and annealed on a hot plate at 110° C. for 10 min to dry PEIE and cros slink PEDOT:PSS HTL-CPP. All the samples were loaded into a vacuum thermal evaporation system (SPECTROS, Kurt J. Lesker) and a layer of Al (150 nm) was deposited onto all of the samples through a shadow mask. The area of module devices was about 18 mm2 not including the gap between the ITO electrodes having an area of 1.6 mm2.

Current density-voltage (J-V) characteristics were measured inside the N2-filled glove box by using a source meter (2400, Keithley Instruments, Cleveland, Ohio) controlled by a LabVIEW program. To test the solar cell properties under illumination, an Oriel lamp with an air mass 1.5 filter and an irradiance of 100 mW/cm$^2$ was used as the light source.

FIG. 163 shows J-V characteristics of reference inverted single solar cell (glass/ITO/PEIE/P3HT:ICBA/PEDOT:PSS/Al) in dark and under AM 1.5 100 mW/cm$^2$ illumination, according to an exemplary embodiment of the invention. Device performance is summarized in Table 60.

FIG. 164 shows J-V characteristics of reference conventional single solar cell (glass/ITO/PEDOT:PSS/P3HT:ICBA/PEIE/Al) in dark and under AM 1.5 100 mW/cm$^2$ illumination, according to an exemplary embodiment of the invention. Device performance is summarized in Table 60.

FIG. 165 shows J-V characteristics of a solar cell module in dark and under AM 1.5 100 mW/cm$^2$ illumination, according to an exemplary embodiment of the invention. Device performance is summarized in Table 61.

TABLE 61

Photovoltaic performance of reference inverted single cells (averaged over 4 devices), reference conventional single cells (averaged over 3 devices) and a module solar cell devices; Data in parentheses are calculated with the area includes the gap (no ITO).

| Sample | $V_{OC}$ (V) | $J_{SC}$ (mA/cm$^2$) | FF | PCE (%) |
|---|---|---|---|---|
| Inverted single | 0.01 | 8.3 ± 0.7 | 0.59 ± 0.01 | 4.0 ± 0.3 |
| Conventional single | 0.80 ± 0.02 | 8.3 ± 0.1 | 0.46 ± 0.01 | 3.1 ± 0.1 |
| Module | 1.66 | 4.1 (3.0) | 0.49 | 3.3 (2.5) |

Example 14

Two-Cell Solar Module Comprising P3HT:ICBA Active Layer with Post-Annealing (No Solvent Annealing), PEDOT:PSS as Interlayer I (PEIE not Used in Single Cells with Conventional Geometry) and Al as Top Electrode

FIG. 166 shows a structure of inverted and conventional reference single solar cells, a solar cell module and chemical structure of PETE, P3HT ICBA, PBDTTT-C and PC60BM, according to an exemplary embodiment of the invention.

ITO-coated glass (Colorado Concept Coatings LLC) with a sheet resistivity of ~15 Ω/sq. was used as substrate. The ITO substrates were patterned with kapton tape and etched by acid vapor (1:3 by volume, HNO3: HCl) for 10 min at 75° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths. Then the substrates were treated by oxygen plasma for 2 min.

Polyethylenimine, 80% ethoxylated (PEIE) (Mw=70,000 g/mol) was dissolved in H2O with a concentration of 35-40 wt. % when received from Aldrich. Then, it was diluted into methoxyethanol to a weight concentration of 0.2 wt. % and 0.02%.

For reference single solar cells with inverted structure, PETE (0.2 wt. %) was spin coated onto ITO substrates at a speed of 5000 rpm for 1 min and at an acceleration of 1000 rpm/s and annealed at 120° C. for 10 min on a hot plate in ambient air. The thickness of PETE was 5 nm determined by spectroscopic ellipsometry (J. A. Woollam Co.).

The active layer of poly(3-hexylthiophene) (P3HT, 4002-E, Rieke Metals): Indene-C60 Bis-Adduct (ICBA, Lumtec) (1:1, weight ratio) was filtered through 0.2-μm-pore PTFE filters and spin-coated on each substrate from 40 mg/ml dichlorobenzene solution at a speed of 800 rpm for 30 s and an acceleration of 10000 rpm/s. Then the active layers were thermally annealed at 150° C. for 10 min on a hot plate in the glove box. The thickness of the active layer is 200 nm, measured by spectroscopic ellipsometer (J. A. Woollam Co.).

After samples cooled down for 20 min in the glove box, they were transferred in ambient air and treated by $O_2$ plasma treatment for 1 s to tune the surface hydrophilic. Then a layer of poly(3,4-ethylenedioxythiophene):poly(styrenesulfonate) (PEDOT:PSS) (HTL Solar formulation mixed with 10 volume % CPP105D) was spin coated on top of the active layer at a speed of 5000 rpm for 1 min and an acceleration of 1000 rpm/s. The thickness of PEDOT:PSS layer was 40 nm.

For reference single solar cells with conventional structure, PEDOT:PSS 4083 was spin coated onto ITO substrates at a speed of 5000 rpm for 1 min and at an acceleration of 1000 rpm/s and annealed at 120° C. for 10 min on hot plate in ambient air. The thickness of PEDOT:PSS was 40 nm. The P3HT:ICBA active layers were prepared in the same condition as prepared in the inverted single cells.

For a solar cell module comprising a first solar cell with an inverted structure and a second solar cell with a conventional structure an ITO substrate was etched with a gap about 1.7 mm to define two ITO electrodes. Then PETE (0.2%) and PEDOT:PSS 4083 were spin coated onto the two parts of ITO at a speed of 5000 rpm for 1 min and at an acceleration of 1000 rpm/s one after the other. A narrow (0.5-1 mm) polydimethylsiloxane (PDMS) was coated onto the gap between the patterned ITO electrodes prior to spin coating of PEIE and PEDOT:PSS, to selectively pattern PEIE and PEDOT:PSS. PDMS was peeled-off and the samples were annealed at 120° C. for 10 min on a hot plate in ambient air.

The active layers of P3HT:ICBA were prepared in the same condition as prepared for single solar cells. A layer of PEDOT:PSS (HTL Solar+10% v/v CPP 105D) were spin coated on top of the active layer at a speed of 5000 rpm for 1 min and an acceleration of 1000 rpm/s. Prior to spin coating, the active layer was treated by an $O_2$ plasma for 1 s and PDMS was coated on the active layer to selectively patterned PEDOT:PSS (to overlap the area containing PEIE underneath).

All the samples were transferred into a N2-filled glove box and annealed on a hot plate at 110° C. for 10 min to crosslink PEDOT:PSS HTL-CPP. All the samples were loaded into a vacuum thermal evaporation system (SPECTROS, Kurt J. Lesker) and a layer of Al (150 nm) was deposited onto all of the samples through a shadow mask. The area of module devices was about 18 mm² not including the gap between the ITO electrodes having an area of 1.6 mm².

Current density-voltage (J-V) characteristics were measured inside the N2-filled glove box by using a source meter (2400, Keithley Instruments, Cleveland, Ohio) controlled by a LabVIEW program. To test the solar cell properties under illumination, an Oriel lamp with an air mass 1.5 filter and an irradiance of 100 mW/cm² was used as the light source.

FIG. 167 shows J-V characteristics of a reference inverted single solar cell (glass/ITO/PEIE/P3HT:ICBA/PEDOT:PSS/Al) in dark and under AM 1.5 100 mW/cm² illumination, according to an exemplary embodiment of the invention. Device performance is summarized in Table 61.

FIG. 168 shows J-V characteristics of a reference conventional single solar cell (glass/ITO/PEDOT:PSS/P3HT:ICBA/Al) in dark and under AM 1.5 100 mW/cm² illumination, according to an exemplary embodiment of the invention. Device performance is summarized in Table 61.

FIG. 169 shows J-V characteristics of a solar cell module in dark and under AM 1.5 100 mW/cm² illumination, according to an exemplary embodiment of the invention. Device performance is summarized in Table 61.

TABLE 61

Photovoltaic performance of inverted single cells (averaged over 4 devices) and conventional single cells (averaged over 5 devices) and a module device; Data in parentheses are calculated with the area includes the gap (no ITO).

| Sample | $V_{OC}$ (V) | $J_{SC}$ (mA/cm²) | FF | PCE (%) |
|---|---|---|---|---|
| Inverted single | 0.83 ± 0.01 | 8.3 ± 0.7 | 0.59 ± 0.01 | 4.0 ± 0.3 |
| Conventional single | 0.61 ± 0.01 | 8.7 ± 0.2 | 0.57 ± 0.01 | 3.0 ± 0.1 |
| Module | 1.49 | 4.4 (3.7) | 0.58 | 3.8 (3.2) |

Example 15

Four-Cell Solar Module Comprising a P3HT:ICBA Active Layer with Pre-Annealing and Solvent Annealing, PEDOT:PSS and PEIE as Two Interlayers and Al as Top Electrode

FIG. 170 shows a structure of inverted and conventional reference single solar cells, a four-cell solar module and chemical structure of PEIE, P3HT ICBA, PBDTTT-C and PC60BM, according to an exemplary embodiment of the invention.

ITO-coated glass (Colorado Concept Coatings LLC) with a sheet resistivity of ~15 Ω/sq. was used as substrate. The ITO substrates were patterned with kapton tape and etched by acid vapor (1:3 by volume, HNO3:HCl) for 10 min at 75° C. The patterned substrates were cleaned in an ultrasonic bath of detergent water, rinsed with deionized water, and then cleaned in sequential ultrasonic baths of deionized water, acetone, and isopropanol. Nitrogen was used to dry the substrates after each of the last three baths. Then the substrates were treated by oxygen plasma for 2 min.

Polyethylenimine, 80% ethoxylated (PEIE) (Mw=70,000 g/mol) was dissolved in H2O with a concentration of 35-40 wt. % when received from Aldrich. Then, it was diluted into methoxyethanol to a weight concentration of 0.2 wt. % and 0.02%.

For reference single solar cells with inverted, PEIE (0.2 wt. %) was spin coated onto ITO substrates at a speed of 5000 rpm for 1 min and at an acceleration of 1000 rpm/s and annealed at 120° C. for 10 min on a hot plate in ambient air. The thickness of PEIE was 5 nm determined by spectroscopic ellipsometry (J. A. Woollam Co.).

The substrates were transferred into a $N_2$-filled glove box. The active layer of poly(3-hexylthiophene) (P3HT, 4002-E, Rieke Metals): Indene-$C_{60}$ Bis-Adduct (ICBA, Lumtec) (1:1, weight ratio) was filtered through 0.2-μm-pore PTFE filters and spin-coated on each substrate from a 40 mg/ml dichlorobenzene solution at a speed of 800 rpm for 30 s and an acceleration of 10000 rpm/s. Then the active layers were treated through solvent annealing for 1 hour and thermally annealed at 150° C. for 10 min on a hot plate in the glove box. The thickness of the active layer is 200 nm, measured by spectroscopic ellipsometer (J. A. Woollam Co.).

After samples cooled down for 20 min in the glove box, they were transferred in ambient air and treated by $O_2$ plasma treatment for 1 s to tune the surface hydrophilic. Then a layer of poly(3,4-ethylenedioxythiophene):poly(styrenesulfonate) (PEDOT:PSS) (HTL Solar formulation mixed with 10 volume % CPP105D) was spin coated on top of the active layer at a speed of 5000 rpm for 1 min and an acceleration of 1000 rpm/s. The thickness of PEDOT:PSS layer was about 40 nm.

For the reference single solar cells with conventional structures, PEDOT:PSS 4083 was spin coated onto ITO substrates at a speed of 5000 rpm for 1 min and at an acceleration of 1000 rpm/s and annealed at 120° C. for 10 min on hot plate in ambient air. The thickness of PEDOT:PSS was 40 nm. The P3HT:ICBA active layers were prepared in the same condition as prepared in the inverted single cells. Then a thin layer of PEIE was spin coated on top of plasma-treated active layer from a weight concentration of 0.02% at a speed of 5000 rpm for 1 min and an acceleration of 1000 rpm/s.

A four-cell module comprising two solar cells with an inverted structure and two solar cells with a conventional structure, as shown in FIG. 170. An ITO substrate was etched with two gaps about 2.0 mm to define ITO electrodes. Then PEIE (0.4%) and PEDOT:PSS 4083 were spin coated onto four parts of ITO at a speed of 5000 rpm for 1 min and at an acceleration of 1000 rpm/s one after the other. Narrow pieces of (0.5-1 mm) polydimethylsiloxane (PDMS) were coated onto the gaps prior to spin coating to pattern the PEIE and PEDOT:PSS. After subsequent spin coatings of PEIE and PEDOT:PSS, PDMS was peeled off and the samples were annealed at 120° C. for 10 min on a hot plate in ambient air.

The active layers of P3HT:ICBA were prepared in the same condition as prepared for single solar cells. Then a thin layer of PEIE from a weight concentration of 0.04% and a layer of PEDOT:PSS HTL Solar were spin coated on top of the active layer at a speed of 5000 rpm for 1 min and an acceleration of 1000 rpm/s. Prior to spin coating, the active layer was treated by $O_2$ plasma for 1 s and PDMS was coated on the active layer to pattern PEIE and PEDOT:PSS.

All the samples were transferred into a N2-filled glove box and annealed on a hot plate at 110° C. for 10 min to dry PEIE and crosslink PEDOT:PSS HTL-CPP. All samples were loaded into a vacuum thermal evaporation system (SPECTROS, Kurt J. Lesker) and a layer of Al (150 nm) was deposited onto all of the samples through a shadow mask. Area of module devices was about 15 $mm^2$ not including the gap between the ITO electrodes.

Current density-voltage (J-V) characteristics were measured inside the N2-filled glove box by using a source meter (2400, Keithley Instruments, Cleveland, Ohio) controlled by a LabVIEW program. To test the solar cell properties under illumination, an Oriel lamp with an air mass 1.5 filter and an irradiance of 100 mW/$cm^2$ was used as the light source.

FIG. 171 shows J-V characteristics of a reference inverted single solar cell (glass/ITO/PEIE/P3HT:ICBA/PEDOT:PSS/Al) in dark and under AM 1.5 100 mW/$cm^2$ illumination, according to an exemplary embodiment of the invention. Device performance is summarized in Table 62.

FIG. 172 shows J-V characteristics of a reference conventional single solar cell (glass/ITO/PEDOT:PSS/P3HT:ICBA/PEIE/Al) in dark and under AM 1.5 100 mW/$cm^2$ illumination, according to an exemplary embodiment of the invention. Device performance is summarized in Table 62.

FIG. 173 shows J-V characteristics of a solar cell module in dark and under AM 1.5 100 mW/$cm^2$ illumination, according to an exemplary embodiment of the invention. Device performance is summarized in Table 62.

TABLE 62

Photovoltaic performance of inverted single cells (averaged over 4 devices) and conventional single cells (averaged over 4 devices) and a module device:

| Sample | $V_{OC}$ (V) | $J_{SC}$ (mA/$cm^2$) | FF | PCE (%) |
| --- | --- | --- | --- | --- |
| Inverted single | ±0.01 | ±0.1 | ±0.01 | 5.2 ± 0.1 |
| Conventional single | ±0.01 | ±0.2 | ±0.01 | 4.6 ± 0.1 |
| 4-cell Module | 3.18 | 2.3 | 0.70 | 5.1 |

Examples m1-m2

Recyclable Organic Solar Cells Utilizing Substrates Comprising Cellulose Nanocrystals (CNC)

Organic solar cells represent a cost-effective and an environmentally friendly technology for the generation of renewable energy. Over the last decade, the power conversion efficiency (PCE) of organic solar cells has been significantly improved up to values of about 10%. Due to the ease of fabrication, organic solar cells have been demonstrated on various kinds of substrates, such as glass, plastic, metal foil and paper substrates. From a life-cycle perspective, substrate materials that can be synthesized from renewable feedstocks at a low-cost are particularly attractive for the realization of a sustainable solar cell technology. Paper is considered a promising substrate for organic solar cells, because it is inexpensive, low-weight, flexible and recyclable. Recyclable organic solar cells will now be discussed with reference to FIG. 174 through FIG. 186.

Example m1

Recyclable Organic Solar Cells Using Film Transfer Lamination

Example embodiments of the disclosed technology include solar cells on recyclable substrates comprising cellulose nanocrystals (CNC). A new example device structure is disclosed herein. In one example implementation, polyethylenimine-modified Ag may be utilized as the bottom electron-collecting electrode. According to an example implementation of the disclosed technology, a high-conductivity poly(3,4-ethylenedioxythiophene):poly(styrenesulfonate) (PEDOT:PSS, PH1000) may be used as the semitransparent top hole collecting electrode. According to an example implementation of the disclosed technology, one or both electrodes (and/or other layers associated with the recyclable organic solar cell) may be applied or deposited using a film transfer lamination technique. For example, in one embodiment, PEDOT:PSS top electrode may be deposited by a film-transfer lamination technique. This dry process avoids swelling damage to the CNC substrate, which is observed when PEDOT:PSS is directly spin-coated from an aqueous solution.

Experimental solar cells made on recyclable CNC substrates were measured to exhibit a power conversion efficiency of 4.0% with a large fill factor of 0.64±0.02 when illuminated through the top semitransparent PEDOT:PSS electrode. The performance of solar cells on CNC substrates is comparable to that of reference solar cells on polyethersulfone substrates.

Certain embodiments of the disclosed technology utilize the conducting polymer poly(3,4-ethylenedioxythiophene):poly(styrenesulfonate) (PEDOT:PSS) as an electrode material. Certain advantages are realized by utilizing this electrode material, due in part to the high transmittance values across the visible spectrum and high-conductivity (over 1000 S/cm). However, it was experimentally determined that direct coating of PEDOT:PSS, which is processed from an aqueous solution, may damage the CNC substrates. CNC films can readily be re-dispersed at room temperature in water (as will be discussed further in section m2), thus leading to easily recyclable solar cell devices. The damage of CNC substrates by the aqueous processing of PEDOT:PSS may lead to poor performance of solar cells. We disclose a dry deposition method for PEDOT:PSS PH1000 (Heraeus Clevios) electrodes on substrates comprising cellulose nanocrystals (CNC) to produce efficient recyclable solar cells.

FIG. 174 depicts an example embodiment of a recyclable organic solar cell having a semitransparent PEDOT:PSS top hole-collecting electrode applied by film-transfer lamination technique. The thickness values of the various layers are shown for example purposes and are representative of the experimental devices. However, embodiments of the disclosed technology may include layers having thicknesses that differ from the example depiction. Also, in FIG. 174, the top electrode is denoted as PH1000-L to indicate that the PEDOT:PSS PH1000 is prepared by film-transfer lamination. A reflective bottom Ag electrode is also shown in this example embodiment.

In other embodiments (not shown) one or more of the electrodes may be made from organic material, a polymer, a metal, a transparent conductive metal-oxide, graphene, metal nanorods, metal particles, metal oxide particles, carbon nanotubes, or a mixture thereof. In certain example embodiments, one or more of the electrodes may include a conducting polymer comprising poly(3,4-ethylenedioxythiophene):poly(styrenesulfonate) (PEDOT:PSS). In certain example implementations, the bottom electrode may also be applied using a film-transfer lamination technique. In other implementations, the bottom electrode may be applied using traditional methods, as known to those of skill in the art.

FIG. 174 also depicts a polyethylenimine (PEI) layer in contact with the bottom Ag electron-collecting electrode. This PEI layer is utilized, according to example implementations of the disclosed technology, to modify the work function of the electrode. See sections B1-B7 above for additional discussions related to PEI and the work function modification.

According to an example implementation, the recyclable organic solar cell, as depicted in FIG. 174, includes a poly(3-hexylthiophene)(P3HT):indene-C60 bisadduct (ICBA) photoactive layer and displays a high fill factor (FF) of 0.64±0.02 and a high average PCE of 3.8±0.2%; a level of performance that is identical to that of solar cells fabricated on polyethersulfone (PES) substrates.

m1.2 Experimental Descriptions

Solar cells fabricated on CNC and PES (Ref. device) substrates with PH1000-L top electrodes CNC substrates were prepared. CNC and PES (i-components Co., Ltd.) substrates were adhered onto polydimethylsiloxane (PDMS)-coated glass. Then, an 80 nm thick Ag film was deposited on half of the area of the CNC substrates through a shadow mask using a thermal evaporation system (SPECTROS, Kurt J. Lesker). Polyethylenimine (PEI, branched, #408727, Sigma-Aldrich) was spin-coated on Ag at 5000 rpm for 1 min in a $N_2$-filled glove box from a 0.4 wt. % solution in 2-methoxyethanol (#284467, Sigma-Aldrich) and annealed at 100 degrees C. for 10 min. An effective thickness of 10 nm (PEI) was derived through measurement and modeling with spectroscopic ellipsometry (J.A. Woollam Co., M-2000). P3HT (4002-E, Rieke Metals Inc.):ICBA (Luminescence Technology Corp.) (1:1, weight ratio, total 40 mg/ml) was spin-coated at 800 rpm for 30 s in the $N_2$-filled glove box from a chlorobenzene (#284513, Sigma-Aldrich) solution and annealed on a hot plate at 150 degrees C. for 15 min. The film thickness was about 200 nm as measured by spectroscopic ellipsometry.

To deposit PEDOT:PSS PH1000 (Heraeus Clevios) by film-transfer lamination, first, a piece of PDMS (1-2 mm thick) was attached to a glass substrate and exposed to $O_2$-plasma (Plasmatic Systems Inc.) for 5 s to tune its surface hydrophilicity. PH1000 with 5 wt % DMSO (#472301, Sigma-Aldrich) was spin-coated onto the PDMS at 1000 rpm for 30 s and drying in air for 10 min without thermal annealing. The film thickness was about 150 nm. Before transfer, samples of CNC (or PES)/Ag/PEI/P3HT:ICBA were exposed to $O_2$-plasma for about 1 s (flash). Then, the PDMS with PH1000 was cut into 2 mm-wide finger-electrode shapes and transferred onto the P3HT:ICBA active layer face down with PH1000 contacting the photoactive layer.

Then, the top PDMS was slowly peeled off and PH1000-L was left on the active layer to finish the PH1000-L lamination process. Ag paint (#16035, Ted Pella Inc.) was applied onto PH1000-L for electrical contact during the measurement. The cells were annealed in a $N_2$-filled glove box at 110 degrees C. for 5 min to dry the PH1000-L top electrode. The device areas ranged between 1 and 6 $mm_2$, as determined under an optical microscope (BX51, Olympus).

m1.3 Characterization

Current density-voltage (J-V) characteristics were measured inside a $N_2$-filled glove box using a source meter (2400, Keithley Instruments). A solar simulator (91160, Newport Oriel) equipped with a 300 W xenon lamp (6258, Newport) with an air mass (AM) 1.5 filter and providing an irradiance of 100 mW/cm$^2$ was used as the light source. A Si photodiode (Hamamatsu S1133) calibrated by NREL was used to calibrate the intensity of the solar simulator. Optical images of the photoactive layers on CNC/Ag/PEI and PES/Ag/PEI were taken using an optical microscope (BX51, Olympus). The surface profile of CNC films and PES films was characterized using a stylus profiler (Dektak 6 M, Veeco).

m1.4 Results and Discussion

The new recyclable organic solar cell device structure, prepared by film-transfer lamination process, as shown in FIG. 174, included a reflective 80 nm-thick Ag film modified by a thin layer of PEI is used as the bottom electrode. As discussed extensively herein, PEI or PETE modification leads to significant improvement of the electron collection and enhancement of the PCE values of various types of solar cells. FIG. 175 depicts a chemical structure of PEI.

FIG. 176 illustrates an example procedure for fabricating solar cells on a CNC substrate, according to an example implementation of the disclosed technology. The example procedure may include: (1) thermal deposition of Ag and spin coating of PEI and P3HT:ICBA on top of the CNC substrates; thermal annealing applied on PEI and P3HT:ICBA layers after each spin coating; (2) mild $O_2$-plasma treatment (5 s) on PDMS followed by spin coating of PH1000; (3) PDMS with PH1000 transferred onto mild plasma treated (1 s) P3HT:ICBA surface facedown with PH1000 contacting the active layer; (4) Peeling-off the PDMS and thermal annealing to cure PH1000-L to finish the device fabrication. Light was illuminated through the top PH1000-L electrode during the photovoltaic performance measurement.

In an example embodiment, the procedure may include starting with a CNC substrate and an Ag film (for example, approximately 80 nm-thick) may be thermally evaporated on top of the CNC substrate. In another example implementation, the Ag may be applied by a film transfer lamination technique, as disclosed herein. According to an example implementation of the disclosed technology, a thin layer of PEI may be applied (for example, spin-coated) on Ag to reduce its work function to enable efficient electron collection in solar cells. Samples may then be thermally annealed (for example, in a $N_2$-filled environment). The next step may involve applying a P3HT:ICBA photoactive layer onto the CNC/Ag/PEI substrate. According to one example implementation, the photoactive layer may be spin coated onto the CNC/Ag/PEI substrate. According to another example implementation, the photoactive layer may be applied to the CNC/Ag/PEI substrate by the film transfer lamination technique. In certain example implementations, samples may undergo a second annealing step (for example, in a $N_2$-filled environment). It was observed that CNC films attached onto glass slides do not deform during the two thermal annealing steps performed during solar cell fabrication.

According to an example implementation, a PH1000-L layer may be fabricated independently, then applied to the P3HT:ICBA photoactive layer using a film transfer lamination technique. In an example implementation, PH1000 may be spin-coated onto a plasma-treated PDMS substrate and left to dry in air (for example, for 10 min). To produce top PH1000-L electrodes, the PH1000 layer on PDMS may cut into a stamp that has the shape of the desired top finger-electrodes. This pattern may then be transferred to the top of the active layer by contact lamination.

The ease of patterning is an advantage of the film-transfer technique as compared to the spin-coating technique. The patterned PH1000/PDMS stamp may be transferred to the top of the photoactive layer (P3HT:ICBA) with the PH1000 side facing down onto the active layer. The transfer of PH1000 onto the photoactive layer may then be completed by peeling-off the thick PDMS substrate. Prior to transfer of the PH1000 film, and according to an example implementation, the surface of P3HT:ICBA may be treated by a flash of an $O_2$-plasma (about 1 s) to turn the surface hydrophilic and to assist the separation of the thick PDMS substrate from the PH1000 layer. To make the transfer reliable, it was experimentally determined that the PH1000 layer should not be left to dry in air for more than 20 min nor be thermally annealed. Otherwise, the transfer of the PEDOT:PSS layer and the delamination from the PDMS substrate is more difficult.

Devices, fabricated according to the preceding example process, were experimentally tested in the dark and under illumination inside a $N_2$-filled glove box. Top-side illumination through the PH1000-L layer is utilized in this device architecture. FIG. 177 shows the current density-voltage (J-V) characteristics of a solar cell fabricated on a CNC substrate in the dark (i) and under illumination (ii). In the dark, the device shows low reverse saturation current and a large rectification ratio of $10^4$ at $\pm 1$ V. This indicates an active layer with a low density of defects and a large work function contrast between Ag/PEI and PH1000-L. This also indicates that the steps of thermal annealing and dry deposition of the PH1000-L layer do not damage the CNC substrate. Under 100 mW/cm$^2$ of AM 1.5G illumination, the devices show $V_{oc}=0.80\pm0.01$ V, $J_{sc}=7.3\pm0.4$ mA/cm$^2$, and FF=0.64$\pm$0.01, yielding average PCE=3.8$\pm$0.2%, averaged over 7 devices (see table m1). This efficiency is significantly higher than that reported previously in solar cells on CNC substrates with a thin semitransparent Ag electrode (PCE of 2.7$\pm$0.1%). This improvement represents a significant step towards the realization of a truly recyclable solar cell technology. This enhancement is attributed, at least in part, to the higher transmittance of the PH1000-L layer as compared to illumination through the Ag electrode layer.

Identical solar cells on PES substrates were fabricated (Ref. device) to compare their performance with devices fabricated on CNC substrates. FIG. 178 shows the J-V characteristics of a Ref. device in the dark (i) and under illumination (ii). Again, the devices exhibit a large rectification ratio in the dark J-V characteristics and under illumination, display values of PCE=4.0$\pm$0.2%, averaged over 15 devices. The results are comparable to those obtained in devices fabricated on CNC substrates; with differences found to be within the statistical variations from batch-to-batch. The only clear difference between processing devices onto PES vs. CNC substrates was found on the device yield. For PES substrates, 15 out of 16 devices worked, whereas for CNC substrates only 7 out of 16 devices worked. This low yield is may be attributed to the rougher surface of the batch of CNC substrates.

Table m1 summarizes the experimentally determined photovoltaic performance of top-illuminated solar cells on CNC substrates (CNC/Ag/PEI/P3HT:ICBA/PH1000-L, averaged over 7 devices) and PES substrates (Ref. device, averaged over 15 devices) with PH1000-L as the top electrodes. Numbers in parentheses indicate the photovoltaic performance of the most efficient solar cell on a CNC substrate.

TABLE m1

| Substrate | $V_{OC}$ (V), (Maximum Value) | $J_{SC}$ (mA/cm$^2$), (Maximum Value) | FF, (Maximum Value) | PCE (%), (Maximum Value) | Yield |
|---|---|---|---|---|---|
| CNC | 0.80 ± 0.01, (0.81) | 7.3 ± 0.5, (7.8) | 0.64 ± 0.02, (0.64) | 3.8 ± 0.2, (4.0) | 7/15 |
| PES (Ref. device I) | 0.80 ± 0.01 | 7.8 ± 0.4 | 0.63 ± 0.01 | 4.0 ± 0.2 | 15/16 |

FIG. 179 shows a representative surface profile of a CNC film (ii) compared with that of a PES substrate (i). The height variation of the CNC film is approximately 200-300 nm. The thickness of the photoactive layer in this experimental device was approximately 200 nm. The large height variation of the CNC film can cause the devices to short circuit thereby reducing device yield. Inhomogeneities of the photoactive layer CNC/Ag/PEI can be observed. On the contrary, the surface of PES films is very smooth. As shown in FIG. 180, the height variation is within about 5 nm. The photoactive layer on PES/Ag/PEI also turns out to be very smooth. The Ref. Devices on the PES substrates exhibit high yield. Although the surface of the CNC substrate is inhomogeneous, working devices perform similarly to those on PES substrates. Optimization of the processing conditions for the CNC films may be utilized to achieve higher device yield.

Example m2

Methods for Recycling Organic Solar Cells

According to an example implementation, a recyclable polymer solar cell is disclosed. The example solar cell may be fabricated on substrates comprising cellulose nanocrystals (CNC), with the structure: CNC/Ag/polyethylenimine ethoxylated (PEIE)/active layer/MoO$_3$/Ag, as shown in FIG. 181. In certain example embodiments, light may travel through the semitransparent Ag layer for interaction with the active layer. The active layer in these solar cells may include blends of poly[(4,8-bis-(2-ethylhexyloxy)-benzo[1,2-b:4,5-b0]dithiophene)-2,6-diyl-alt-(4-(2-ethylhexanoyl)-thieno[3,4-b]thiophene)-2,6-diyl]:phenyl-C61-butyric acid methyl ester (PBDTTT-C:PC60BM).

Experimental solar cells on CNC substrates, as discussed in this section, yielded a PCE of 2.7%. The efficiency of solar cells with a similar structure, but fabricated on glass/indium-tin oxide (ITO) substrates have yielded PCE values of around 6%. The lower PCE values displayed by solar cells on CNC substrates may be attributed to the low transmittance of the semitransparent Ag (20 nm) bottom electrode. With improvements disclosed herein (for example, see section m1), the PCE of solar cells fabricated on CNC substrates reach values comparable to those obtained with devices fabricated on plastic substrates, for example, if electrodes with higher transmittance are employed.

Cellulose nanomaterials (CN) are cellulose-based nanoparticles that have good mechanical properties, high aspect ratio, low density, low thermal expansion, surfaces that can be readily chemically functionalized, low toxicity, are inherently renewable/sustainable, and have the potential to be produced in industrial-size quantities. CNs have been studied for a wide variety of potential applications, including reinforcement phases in polymer composites, protective coatings, barrier/filter membrane systems, antimicrobial films, network structures for tissue engineering, and substrates for flexible electronics. Two general classes of CNs that can be extracted from plants, are cellulose nanocrystals (CNC) and cellulose nanofibers (CNF). Variable nomenclature, including cellulose nanowhiskers (CNW), nanocrystalline cellulose (NCC) and/or crystalline nanocellulose, has been used in the past for identifying and describing cellulose nanocrystals (CNC). Unless stated otherwise, the term cellulose nanocrystals (CNC) may include the previous nomenclature CNW, NCC, crystalline nanocellulose and/or other materials having a similar material type, morphology, and geometry as CNC.

Neat and polymer composite films produced from CNCs and CNFs are attractive as substrates for organic electronic devices, and organic solar cells in particular, because they combine low density (1-1.5 g/cm$^3$) with high tensile strength (30-240 MPa), high elastic modulus (6-30 GPa) and low coefficient of thermal expansion (CTE, 2-25 ppm/K). CNCs are also found to be thermally stable up to 210 degrees C., and after processing optimization, up to 350 degrees C.; hence, they are compatible with the processing of organic semiconductors.

Previously fabricated polymer solar cells on CNF substrates exhibited poor performance (with a maximum PCE of 0.4%) and poor rectification, mainly because of the relatively rough surface of the CNF substrates (with a surface height variation of 40 nm).

Disclosed herein are example embodiments of polymer solar cells fabricated on free-standing transparent CNC substrates with much lower surface roughness compared with the CNF-based films. In one example implementation, solar cells may be fabricated with Ag/polymer surface modification as the bottom electrode and Mo03/Ag as the top electrode without the need of aqueous solution.

The disclosed solar cells show a large rectification in the dark and an average PCE of 2.7% and an average fill factor of 0.54 under illumination. The performance of these example polymer solar cell embodiments is shown to be limited primarily by the transmittance of the thin Ag layer used as the semitransparent bottom electrode. According to an example implementation of the disclosed technology, polymer solar cells fabricated on CNC substrates are found to be easily recycled at room temperature by simply immersing them in water, where the CNC substrate is redispersed. The dissolution of the substrate in water leads to a separation of the rest of the components of the solar cell in the form of a thin polymer solar cell membrane comprised of the synthetic organic photoactive layer and the metal layers. These membranes can be easily filtered out of the water solution, and the organic and metal components can then be separated by immersing the membrane into an organic solvent in which the photoactive layer can be dissolved, leaving behind the metal and oxide electrode that can be filtered out of the solution.

According to an example implementation of the disclosed technology, CNC film may be produced with high optical transparency that may enable incident sunlight to pass through the substrate. The optical transparency may be improved, according to certain embodiments, by producing thinner films. The limited transmittance of CNC films is believed to be due to scattering, not absorption, caused by the random distribution of CNCs in the film that are typically few hundred nanometers long which causes refractive index inhomogeneities over areas with dimensions that are of the same order of magnitude of the wavelength of visible light. Scattering spreads the incident light into a large solid angle, reducing the intensity (energy per solid angle) reaching a detector and thus resulting in a reduced transmittance. However, when a solar cell is fabricated on a CNC substrate, after light passes through the substrate, even those components that are scattered far away from the sample normal can reach the active layer, where they can be absorbed and contribute to the current generated by the solar cell. Surface morphology of a CNC substrate was measured and averaged over three locations, with the root-mean square (RMS) value of the surface roughness of 1.8+/−0.6 nm. The very smooth surface may eliminate the need for any surface planarization.

According to an example implementation of the disclosed technology, polymer solar cells may be fabricated on the CNC substrates using a transparent or semitransparent electrode to enable for light to reach the photoactive layer. In one example implementation, the bottom electrode (i.e. in contact with the CNC substrate) may include a semitransparent 20-nm thick Ag layer deposited by vacuum thermal evaporation on a CNC substrate. In this example implementation, this deposited Ag layer may be conductive (i.e. above percolation). Ag films deposited simultaneously on bare glass were found to be below the percolation threshold due to wetting limitations, and were consequently nonconductive.

According to an example implementation of the disclosed technology, the Ag film may be modified using a thin layer of ethoxylated polyethylenimine (PEIE) to turn silver into an efficient electron-collecting electrode. In an example implementation, the top electrode, $MoO_3$/Ag may be evaporated onto the photoactive layer of [poly[(4,8-bis-(2-ethylhexyloxy)-benzo[1,2-b:4,5-b9] dithiophene)-2,6-diyhalt-(4-(2-ethylhexanoyl)-thieno[3,4-b]thiophene)-2,6-diyl]:phenyl-C61-butyric acid methyl ester] (PBDTTT-C:PCBM), as shown in FIG. 182 to collect holes. It should be noted that the spin-coating of PEIE from a 2-methoxyethanol solution did not damage the CNC substrates. The latter were also found to allow the spin-coating of the PBDTTT-C:PCBM photoactive layer from a chlorobenzene: 1,8-diiodooctane (9753, v/v) solution. A fabricated solar cell had high and specular reflectivity of the Ag top electrode, which further demonstrates the surface smoothness of the CNC substrates and the uniformity of the active layer on the CNC substrates.

m2.1 Performance of Solar Cells on CNC Substrates

FIG. 183 shows the current density-voltage (J-V) characteristic of a solar cell fabricated on a CNC substrate in the dark (i) and under illumination (ii). FIG. 184 shows the device results in the dark (i) and under illumination (ii) having a low reverse saturation current and large rectification ratio of $10^3$ at ±1 V. This may be indicative of a few pin holes and a large work function contrast between Ag/PETE and $MoO_3$/Ag. Under 95 mW/cm$^2$ of AM 1.5G illumination, the devices show $V_{OC}$=0.65+/−0.01 V, $J_{SC}$=7.5+/−0.1 mA/cm$^2$, and FF=0.54+/−0.01, yielding PCE=2.7+/−0.1%, averaged over 3 devices. Although this is still modest performance compared to state-of-the-art devices, it represents a significant improvement over previously demonstrated organic solar cells on paper-like or CNF substrates. Furthermore, experiments with a structure: Glass/ITO/PEIE/PBDTTT-C:PCBM/$MoO_3$/Ag yield values of $V_{OC}$=0.68+/−0.01 V, $J_{SC}$=16.1+/−0.4 mA/cm$^2$, FF=0.61+/−0.01, and PCE=6.6+/−0.2%, averaged over 5 devices.

Remarkably, the $V_{OC}$ and FF of the solar cells on a CNC substrate are not that different to the ones obtained on a glass/ITO substrate. This is in contrast to previous realizations of polymer solar cells on paper-like substrates, wherein the electrical performance of the solar cells, namely the $V_{OC}$ and FF values, were found to be significantly lower than those on devices fabricated on glass or plastic substrates. Hence, the lower PCE value obtained may be attributed to the smaller $J_{SC}$ value on solar cells processed on CNC/Ag substrates as compared to the $J_{SC}$ value obtained on glass/ITO substrates. This may be caused by the lower transmittance of both the CNC substrates compared to glass, and of the 20-nm-thick Ag electrode compared to ITO. Example implementations of the disclosed technology include the ability to tune CNC substrates (composition, orientation, interfaces, etc.) to allow further optimization of its optical and mechanical properties. Likewise, and as shown herein (for example, in section m1), that if the Ag film electrode is replaced with a higher transmittance material (e.g. metal-oxide or conducting polymer) or different device geometries are utilized (such as shown in FIG. 174) further improvements in the performance level of these polymer solar cells fabricated on CNC substrates can be achieved, and possibly comparable to devices fabricated on glass or petroleum-based flexible substrates.

m2.2 Recyclability of Solar Cells on CNC Substrates

Recyclability of the solar cells was tested by immersing the devices into distilled water. The CNC film quickly swells after being immersed into water and completely disintegrates within approximately 30 min. The redispersed CNC turns into a solid residue on the after the water has evaporated. This residue can be recovered and recycled. As for the solar cell, the CNC substrate also swells rapidly producing clear warping of the photoactive layer and electrodes until they turn into a free-standing film or membrane. This allows for the full separation of the solar cell components (substrate, organic and inorganic materials) at room temperature by using a filter paper.

A process for recycling the recyclable organic solar cell, according to an example implementation, is described as follows: a solar cell may be immersed into the vial containing distilled water until the CNC substrate disintegrated (shaking accelerates the disintegration to less than 10 min). Solid residues may be filtered from the liquid using a filter paper. The resulting distilled water waste may appear as a milky dispersion of CNCs in water. The photoactive layer may then be separated from the electrodes by rinsing the solid residues on the filter paper, for example, with chlorobenzene. This process may result in a green-colored solution of a mixture of chlorobenzene and PBDTTT-C:PCBM. The solid waste left in the filter paper, corresponds primarily to the Ag and MoO3 used as electrodes on the solar cell. In this way, organic solar cells fabricated on CNC substrates can be easily separated into their major components using a minimal amount of solvents and energy. Furthermore, in an example embodiment, solar cells on CNC substrates may exposed to low temperature flame (to burn off the polymer components), to produce ashes from which the metal components can be recovered.

According to an example implementation of the disclosed technology, solar cells can be easily separated into their major components using low-energy processes at room temperature, opening the door for a truly fully recyclable solar cell technology. Efficient and easily recyclable polymer solar cells on cellulose nanocrystals substrates may be an ideal technology for sustainable, scalable and environmentally-friendly energy production and could have an overreaching impact for the sustainability of printed electronics.

m2.3 Preparation and Characterization of CNC Samples

CNCs were produced at USDA Forest Service-Forest Products Laboratory (Madison, Wis.). CNC suspensions were produced by sulfuric acid hydrolysis of softwood pulp (64% sulfuric acid, 8 to 1 acid to pulp weight ratio, 45 uC, 60 minutes) followed by quenching with deionized water, centrifuge rinsing, washing, and then dialysis for about a week to remove remaining acid. The suspension was then ultrasonicated to disperse the CNCs via mechanical agitation and centrifuged a final time for macroparticle removal. Films were prepared by blending 1.65 wt. % CNC suspension (30 g) with 1 wt. % glycerol solution (4.95 g) for 24 hours. Glycerol (Aldrich) was added to make the films more flexible for handling. The homogeneous glycerol/CNC water suspension was then poured into 80 mm diameter plastic petri dishes and allowed to dry at 23 degrees C. and 30%-40% relative humidity. The dried CNC/glycerol films were detached from petri dishes and cut into 2.5 cm×2.5 cm glycerol/CNC substrates. Note that the addition glycerol is consistent with renewable and biodegrade theme of the CNC film and it is non-toxic and is a byproduct of biodiesel production. The optical transmittance of CNC substrates was measured using a spectroscopic ellipsometer apparatus (M–2000UI, J.A. Woollam Co.). The surface roughness of the CNC samples was measured under atmospheric conditions using atomic force microscopy (Dimension 3100, Veeco) equipped with a NanoScope III controller.

m2.4 Fabrication and Characterization of Solar Cells on CNC Substrates

According to an example implementation of the disclosed technology, the CNC films may be attached to rigid glass substrates with a piece of cured polydimethylsiloxane (PDMS). In certain example implementations, a 20 nm thick Ag film may be deposited on half of the CNC substrates through a shadow mask, using a vacuum thermal evaporation system (SPECTROS, Kurt J. Lesker). Then, in an example embodiment, the polymer modification layer, PEIE (423475, Mw 5 70,000 g/mol, from Sigma-Aldrich) may be deposited on Ag by spin-coating at a speed of 4000 rpm for 1 minute from a 0.4 wt. % 2-methoxyethanol (284467, 99.8% anhydrous, from Sigma-Aldrich Co.) solution and annealed on a hot plate at 80 degrees C. for 5 minutes. In an example implementation, after the substrates are cooled down for 10 minutes, a layer of PBDTTT-C (Solarmer Materials Inc):PCBM (151.5 by weight, Nano-C Inc.) may be spin-coated on the substrates as the photoactive layer from a mixture of chlorobenzene:1,8-diiodooctane (9753, v/v) solution with a total concentration of 25 mg/ml at a speed of 1000 rpm and 10000 rpm/s acceleration for 1 minute. In certain example implementations, combustion may be utilized to further purify and/or separate the various materials associated with the organic recyclable solar cells disclosed herein.

In experimental samples prepared as disclosed above, the thickness of the photoactive layer is about 90 nm. The average thickness of the PEIE layer is estimated to be 10 nm from measurements by spectroscopic ellipsometry on independent films deposited on Si substrates. All the processing was done in a N2-filled glove box. Samples were transferred into the vacuum thermal evaporation system (SPECTROS, Kurt J. Lesker) and the top electrode of $MoO_3$/Ag (15 nm/150 nm) was deposited to finish the device fabrication. Current density-voltage (J-V) characteristics of the solar cells were measured inside the N2-filled glove box by using a source meter (2400, Keithley Instruments, Cleveland, Ohio) controlled by a LabVIEW program. To test the solar cell properties under illumination, a calibrated 300 W Oriel solar simulator (91160, Newport) with an intensity of 95 mW/cm$^2$ was used as the light source.

FIG. 185 shows a flow-diagram of a method 18500 for recycling a solar cell, as disclosed herein. The method 18500 begins in block 18502 and includes immersing, in a water-based liquid, a recyclable solar cell comprising: a first electrode; a second electrode; a photoactive layer disposed between the first electrode and the second electrode; an interlayer comprising a Lewis basic oligomer or polymer disposed between the photoactive layer and at least a portion of the first electrode or the second electrode; and a water-soluble substrate disposed adjacent to the first electrode or the second electrode. In block 18504, the method 18500 includes continuing the immersion until the water-soluble substrate substantially disintegrates. In block 18506, the method 18500 includes filtering the liquid to remove solid residue.

Certain example implementations may further include rinsing the filtered solid residues with a rinsing fluid, such as chlorobenzene, for example to dissolve the photoactive layer. In accordance with an example implementation of the disclosed technology, the recyclable solar cell may be immersed in the water-based liquid, wherein the water-based liquid is at room temperature.

FIG. 186 shows a flow-diagram of a method 18600 for producing a recyclable solar cell using film transfer lamination. In block 18602, the method 18600 includes preparing a water-soluble substrate. In block 18604, the method 18600 includes applying to the water-soluble substrate, a first electrode. In block 18606, the method 18600 includes depositing on at least a portion of the first electrode, an interlayer comprising a Lewis basic oligomer or polymer. In block 18608, the method 18600 includes applying to the interlayer, a photoactive layer. In block 18610, the method 18600 includes applying to the photoactive layer, a second electrode comprising a conducting polymer. One or more of the first electrode, the photoactive layer, and the second electrode are applied by film transfer lamination.

In accordance with an example implementation of the disclosed technology, preparing a water-soluble substrate may include preparing a cellulose nanocrystal substrate. According to an example implementation of the disclosed technology, the interlayer includes polyethylenimine (PEI) and the interlayer reduces the work function associated with the first electrode by greater than 0.5 eV. According to an example implementation of the disclosed technology, the first electrode includes one or more of an organic material, a polymer, a metal, a transparent conductive metal-oxide, graphene, metal nanorods, metal particles, metal oxide particles, carbon nanotubes, or a mixture thereof. In an example implementation, the second electrode includes poly(3,4-ethylenedioxythiophene):poly(styrenesulfonate) (PEDOT:PSS). According to an example implementation of the disclosed technology, the photoactive layer includes poly(3-hexylthiophene): Indene-$C_{60}$ Bis-Adduct (P3HT:ICBA).

As desired, embodiments of the invention may include the materials, layers, processes, and/or structures with more or less of the components illustrated in FIGS. 1-186.

While certain embodiments of the invention have been described in connection with what is presently considered to be the most practical and various embodiments, it is to be understood that the invention is not to be limited to the disclosed embodiments, but on the contrary, is intended to cover various modifications and equivalent arrangements included within the scope of the appended claims. Although specific terms are employed herein, they are used in a generic and descriptive sense only and not for purposes of limitation.

This written description uses examples to disclose certain embodiments of the invention, including the best mode, and also to enable any person skilled in the art to practice certain embodiments of the invention, including making and using any devices or systems and performing any incorporated methods. The patentable scope of certain embodiments of the invention is defined in the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

We claim:

1. A recyclable organic solar cell comprising:
   a first electrode;
   a second electrode;
   a photoactive layer disposed between the first electrode and the second electrode;
   an interlayer comprising a Lewis basic oligomer or polymer disposed between the photoactive layer and at least a portion of the first electrode or the second electrode; and
   a substrate comprising cellulose nanocrystals disposed adjacent to the first electrode or the second electrode;
   wherein one or more of the first electrode, the second electrode, the photoactive layer, the interlayer, and the substrate of the organic solar cell comprise recyclable material.

2. The recyclable organic solar cell of claim 1, wherein the interlayer comprises polyethylenimine (PEI) and wherein the interlayer reduces the work function associated with the first or second electrode.

3. The recyclable organic solar cell of claim 1, wherein the first electrode comprises one or more of an organic material, a polymer, a metal, a transparent conductive metal-oxide, graphene, metal nanorods, metal particles, metal oxide particles, carbon nanotubes, or a mixture thereof.

4. The recyclable organic solar cell of claim 1, wherein the second electrode comprises one or more of an organic material, a polymer, a metal, a transparent conductive metal-oxide, graphene, metal nanorods, metal particles, metal oxide particles, carbon nanotubes, or a mixture thereof.

5. The recyclable organic solar cell of claim 1, wherein the second electrode comprises a conducting polymer comprising poly(3,4-ethylenedioxythiophene):poly(styrenesulfonate) (PEDOT:PSS).

6. The recyclable organic solar cell of claim 1, wherein the photoactive layer comprises poly(3-hexylthiophene):Indene-$C_{60}$ Bis-Adduct (P3HT:ICBA).

7. The recyclable organic solar cell of claim 1, wherein the substrate is water-soluble.

8. The recyclable organic solar cell of claim 1, wherein interlayer reduces the work function associated with the first electrode or the second electrode by greater than 0.5 eV.

9. A recyclable organic solar cell module comprising:
   a plurality of solar cell elements, each solar cell element including:
      a first electrode;
      a second electrode;
      a photoactive layer disposed between the first electrode and the second electrode;
      an interlayer comprising a Lewis basic oligomer or polymer disposed between the photoactive layer and at least a portion of the first electrode or the second electrode; and
      a substrate comprising cellulose nanocrystals disposed adjacent to the first electrode or the second electrode;
   each solar cell element having an associated polarity based at least in part on an arrangement and orientation of the interlayer.

10. The recyclable organic solar cell module of claim 9, wherein the first electrodes of adjacent solar cell elements $x(N)$ and $x(N+1)$ are connected in a first plane, and wherein the second electrodes of adjacent solar cell elements $x(N+1)$ and $x(N+2)$ are connected in a second plane, wherein x and N are integers.

11. The recyclable organic solar cell module of claim 9, wherein the interlayer comprises polyethylenimine (PEI) and wherein the interlayer reduces the work function associated with the first or second electrode.

12. The recyclable organic solar cell module of claim 9, wherein the first electrode comprises one or more of an organic material, a polymer, a metal, a transparent conductive metal-oxide, graphene, metal nanorods, metal particles, metal oxide particles, carbon nanotubes, or a mixture thereof.

13. The recyclable organic solar cell module of claim 9, wherein the second electrode comprises one or more of an organic material, a polymer, a metal, a transparent conductive metal-oxide, graphene, metal nanorods, metal particles, metal oxide particles, carbon nanotubes, or a mixture thereof.

14. The recyclable organic solar cell module of claim 9, wherein the second electrode comprises a conducting polymer comprising poly(3,4-ethylenedioxythiophene):poly(styrenesulfonate) (PEDOT:PSS).

15. The recyclable organic solar cell module of claim 9, wherein the photoactive layer comprises poly(3-hexylthiophene) Indene-$C_{60}$ Bis-Adduct (P3HT:ICBA).

16. The recyclable organic solar cell module of claim 9, wherein the substrate is water-soluble.

17. The recyclable organic solar cell module of claim 9, wherein interlayer reduces the work function associated with the first electrode or the second electrode by greater than 0.5 eV.

* * * * *